United States Patent
Yoshida et al.

(10) Patent No.: US 9,947,889 B2
(45) Date of Patent: Apr. 17, 2018

(54) TRANSPARENT ELECTRODE, ELECTRONIC DEVICE, AND ORGANIC ELECTROLUMINESCENT ELEMENT

(71) Applicant: Konica Minolta, Inc., Chiyoda-ku, Tokyo (JP)

(72) Inventors: Kazuhiro Yoshida, Hachioji (JP); Takeshi Hakii, Sagamihara (JP); Hiroshi Ishidai, Hachioji (JP); Toshiyuki Kinoshita, Hino (JP); Takatoshi Tsujimura, Fujisawa (JP); Minako Ono, Hachioji (JP)

(73) Assignee: KONICA MINOLTA INC., Tokyo (JP)

( * ) Notice: Subject to any disclaimer, the term of this patent is extended or adjusted under 35 U.S.C. 154(b) by 576 days.

(21) Appl. No.: 14/396,604

(22) PCT Filed: Apr. 15, 2013

(86) PCT No.: PCT/JP2013/061170
§ 371 (c)(1),
(2) Date: Oct. 23, 2014

(87) PCT Pub. No.: WO2013/161602
PCT Pub. Date: Oct. 31, 2013

(65) Prior Publication Data
US 2015/0090978 A1    Apr. 2, 2015

(30) Foreign Application Priority Data

Apr. 23, 2012 (JP) .................................. 2012-097977
Aug. 27, 2012 (JP) .................................. 2012-187054

(51) Int. Cl.
*H01L 51/50* (2006.01)
*H01L 51/52* (2006.01)
(Continued)

(52) U.S. Cl.
CPC .......... *H01L 51/5234* (2013.01); *H01B 1/22* (2013.01); *H01L 51/0065* (2013.01);
(Continued)

(58) Field of Classification Search
None
See application file for complete search history.

(56) References Cited

U.S. PATENT DOCUMENTS

2004/0251466 A1    12/2004 Nakamura
2005/0147847 A1    7/2005 Nakamura
(Continued)

FOREIGN PATENT DOCUMENTS

EP    2123733 A2    11/2009
EP    2265093 A1    12/2010
(Continued)

OTHER PUBLICATIONS

Chinese First Notification of Opinions of Examination corresponding to Application No. 201380021171.6; dated Dec. 2, 2015, with English translation.
(Continued)

*Primary Examiner* — Gregory D Clark
(74) *Attorney, Agent, or Firm* — Cantor Colburn LLP

(57) ABSTRACT

A transparent electrode comprising a nitrogen-containing layer, and an electrode layer provided adjacent to the nitrogen-containing layer and having silver as a main component. The nitrogen-containing layer is configured using a compound containing nitrogen atoms, wherein the effective unshared electron pair content [n/M] is $2.0 \times 10^{-3} \leq [n/M]$, n being the number of unshared electron pairs that are not involved in aromaticity and that are not coordinated with the metal from among the unshared electron pairs of the nitrogen atoms, and M being the molecular weight.

20 Claims, 5 Drawing Sheets

(51) Int. Cl.
*H01L 51/00* (2006.01)
*H01B 1/22* (2006.01)

(52) U.S. Cl.
CPC ...... *H01L 51/0067* (2013.01); *H01L 51/0069* (2013.01); *H01L 51/0072* (2013.01); *H01L 51/0073* (2013.01); *H01L 51/0074* (2013.01); *H01L 51/0094* (2013.01); *H01L 51/5092* (2013.01); *H01L 51/5215* (2013.01); *H01L 51/5275* (2013.01); *H01L 51/006* (2013.01); *H01L 51/0052* (2013.01); *H01L 51/0081* (2013.01); *H01L 51/524* (2013.01); *H01L 2251/303* (2013.01); *Y10T 428/31678* (2015.04)

(56) References Cited

U.S. PATENT DOCUMENTS

| | | |
|---|---|---|
| 2007/0126347 A1 | 6/2007 | Jarikov et al. |
| 2007/0164285 A1 | 7/2007 | Nakamura |
| 2009/0284138 A1 | 11/2009 | Yasukawa et al. |
| 2011/0042695 A1 | 2/2011 | Oyamada et al. |
| 2011/0057920 A1 | 3/2011 | Matsuura et al. |
| 2012/0261654 A1 | 10/2012 | Yasukawa et al. |
| 2012/0326601 A1 | 12/2012 | Yasukawa et al. |

FOREIGN PATENT DOCUMENTS

| | | | | |
|---|---|---|---|---|
| JP | 2002015623 A | | 1/2002 | |
| JP | 2002-313139 | * | 10/2002 | ............... H01B 5/14 |
| JP | 2005026221 A | | 1/2005 | |
| JP | 2006164961 A | | 6/2006 | |
| JP | 2009151963 A | | 7/2009 | |
| JP | 2010251675 A | | 11/2010 | |
| JP | 2011-054419 | * | 3/2011 | ............ H01L 51/50 |
| JP | 2011054419 A | | 3/2011 | |
| JP | 2011-077028 | * | 4/2011 | ............ H01L 51/50 |
| JP | 2011077028 A | | 4/2011 | |
| JP | 2012049551 A | | 3/2012 | |
| WO | 2009054253 A1 | | 4/2009 | |
| WO | 2009125472 A1 | | 10/2009 | |
| WO | 2009125519 A1 | | 10/2009 | |
| WO | 2011004807 A1 | | 1/2011 | |
| WO | 2011136022 A1 | | 11/2011 | |

OTHER PUBLICATIONS

Japanese Notification of Reasons for Refusal corresponding to Application No. JP2014-512472; dated Apr. 12, 2016, with English translation.

Extended European Search Report correspondirag to Application No. 13781774.8-1555/2844039 PCT/JP2013/051170; dated Jun. 3, 2016.

International Search Report corresponding to PCT/JP2013/061170; dated Jul. 16, 2013; 4 pages.

Extended European Search Report corresponding to Application No. 13781774.8-1555/2844039 PCT/JP2013/061170; dated Jan. 29, 2016.

G. Gu et al, "High-efficiency, low-drive-voltage, semitransparent stacked organic light-emitting device", Applied Physics Letters vol. 73, No. 17, Oct. 1998. pp. 2399-2401.

* cited by examiner

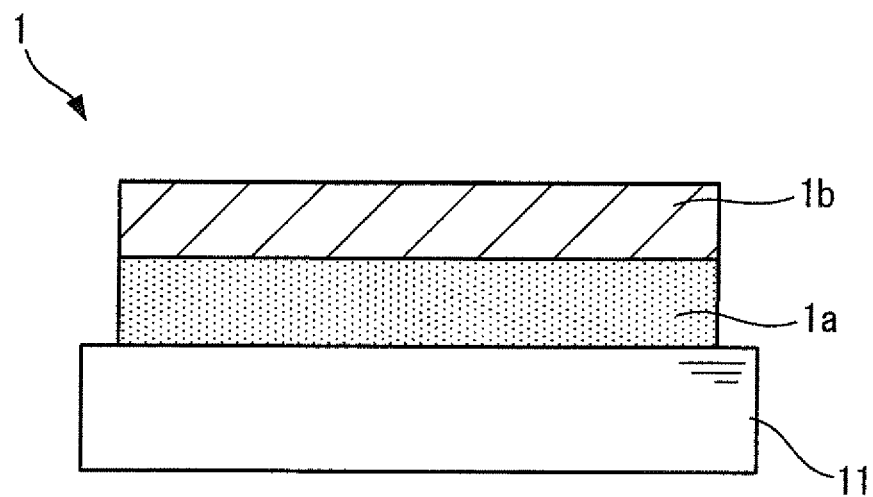
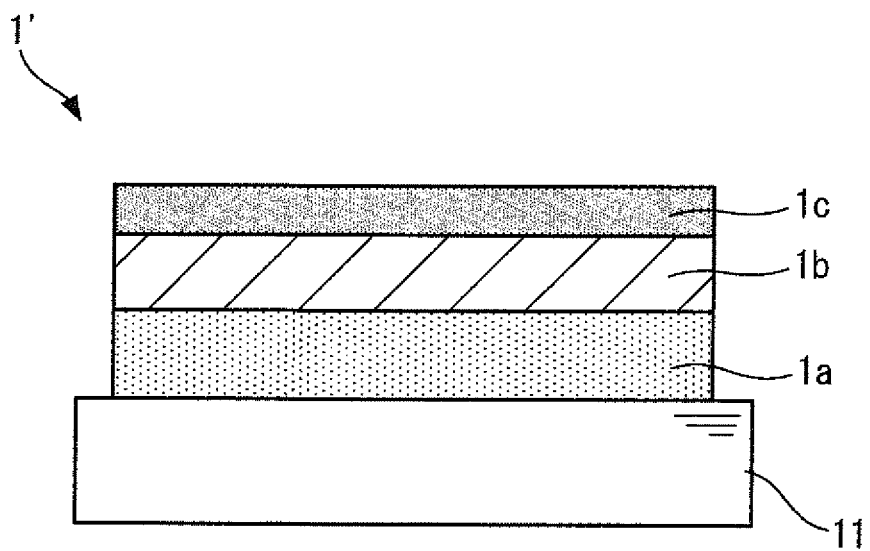

TRANSPARENT ELECTRODE, ELECTRONIC DEVICE, AND ORGANIC ELECTROLUMINESCENT ELEMENT

This is the U.S. national stage of application No. PCT/JP2013/061170, filed on 15 Apr. 2013. Priority under 35 U.S.C. § 119(a) and 35 U.S.C. § 365(b) is claimed from Japanese Application No. 2012-097977 filed 23 Apr. 2012 and Japanese Application No. 2012-187054, filed 27 Aug. 2012, the disclosures of both which are also incorporated herein by reference.

TECHNICAL FIELD

The present invention relates to a transparent electrode, an electronic device, and an organic electroluminescent element, particularly relates to a transparent electrode having both electrical conductivity and light transmission property, and further to an electronic device and an organic electroluminescent element using the transparent electrode.

BACKGROUND ART

An organic electroluminescent element (hereinafter, referred to as "organic EL element") utilizing electroluminescence (hereinafter, referred to as "EL") of an organic material is a thin-film type completely-solid state element capable of emitting light at a low voltage of several volts to several ten volts, and has many excellent features such as high luminance, high light emission efficiency, small thickness and light weight. Accordingly, in recent years, the element has attracted attention, as backlights for various kinds of displays, display boards such as a signboard and an emergency lamp, and surface emitting bodies such as illumination light sources.

Such an organic electroluminescent element has a configuration obtained by holding a light emitting layer formed of an organic material between two electrodes, the emitted light generated in the light emitting layer is extracted to the outside through the electrode. Therefore, at least one of the two electrodes is constituted as a transparent electrode.

As the transparent electrode, there is used generally a material of an oxide semiconductor type such as indium tin oxide (SnO2-In2O3: Indium Tin Oxide: ITO), and examination aiming at lowering electric resistance by laminating ITO and silver has been carried out (e.g. referring to the following Patent Literatures 1, 2). However, ITO has a high raw cost because of using a rare metal indium, and is required to be subjected to annealing treatment at about 300° C. after film formation in order to lower its electric resistance. Accordingly, there have been proposed a configuration in which a metallic material such as silver having a high electrical conductivity is made into a thin film, and a configuration in which an electrical conductivity is ensured even at a film thickness smaller than that of silver alone by blending aluminum with silver (e.g. referring to the following Patent Literature 3).

CITATION LIST

Patent Literature

PTL 1: Japanese Patent Laid-Open No. 2002-15623
PTL 2: Japanese Patent Laid-Open No. 2006-164961
PTL 3: Japanese Patent Laid-Open No. 2009-151963

SUMMARY OF INVENTION

Technical Problem

However, even by using the transparent electrode constituted using silver and aluminum with a high electrical conductivity, it has been difficult to attain sufficient electrical conductivity and light transmission property, at the same time.

Accordingly, objects of the present invention are to provide a transparent electrode having both electrical conductivity and light transmission property, and to provide an electronic device and an organic electroluminescent element in which performances are improved by using the transparent electrode.

Solution to Problem

The aforementioned objects of the present invention can be achieved by the following configurations.

1. A transparent electrode including:
a nitrogen-containing layer that is constituted using a compound containing nitrogen atoms, and that has an effective unshared electron pair content [n/M] of $2.0\times10^{-3} \leq [n/M]$ when n is a number of unshared electron pairs that are not involved in aromaticity and that are not coordinated with a metal from among the unshared electron pairs of the nitrogen atom and M is a molecular weight, and an electrode layer provided adjacent to the nitrogen-containing layer, and having silver as a main component.

2. The transparent electrode according to the above 1, wherein the effective unshared electron pair content [n/M] of the compound is $3.9\times10^{-3} \leq [n/M]$.

3. The transparent electrode according to the above 1, wherein the effective unshared electron pair content [n/M] of the compound is $6.5\times10^{-3} \leq [n/M]$.

4. The transparent electrode according to any of the above 1 to 3, wherein, with respect to the nitrogen-containing layer, the effective unshared electron pair content [n/M] in an interface layer on the electrode side is $2.0\times10^{-3} \leq [n/M]$.

5. The transparent electrode according to any of the above 1 to 4, wherein the nitrogen-containing layer contains a compound represented by the following general formula (1):

[Chem. 1]

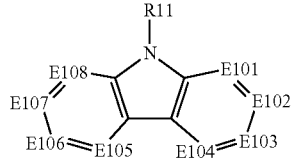

General formula (1)

where, in the general formula (1), E101 to E108 each represent —C(R12)= or —N=; at least one of E101 to E108 is —N=; and R11 and the aforementioned R12 represent hydrogen atom or a substituent.

6. The transparent electrode according to any of the above 1 to 4, wherein the nitrogen-containing layer contains a compound represented by the following general formula (2):

[Chem. 2]

General formula (2)

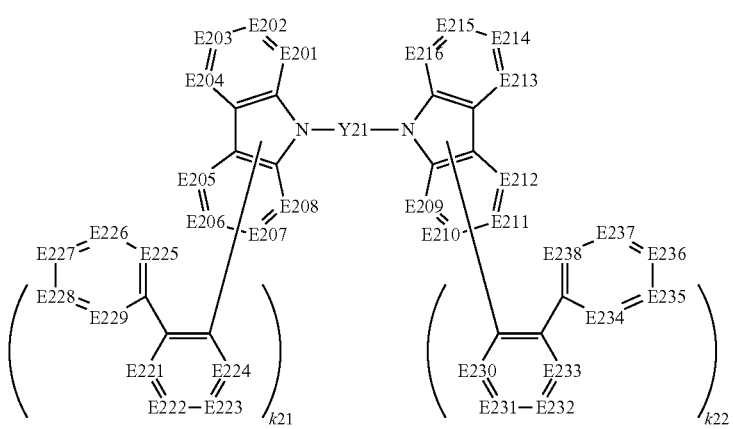

where, in the general formula (2), Y21 represents a divalent linking group of an arylene group, a heteroarylene group or combination thereof;

E201 to E216, E221 to E238 each represent —C(R21)= or —N=, and the aforementioned R21 represents hydrogen atom or a substituent;

at least one of E221 to E229 and at least one of E230 to E238 represent —N=; and k21 and k22 represent an integer of 0 to 4, and k21+k22 is an integer of 2 or more.

7. The transparent electrode according to any of the above 1 to 4, wherein the nitrogen-containing layer contains a compound represented by the following general formula (3):

[Chem. 3]

General formula (3)

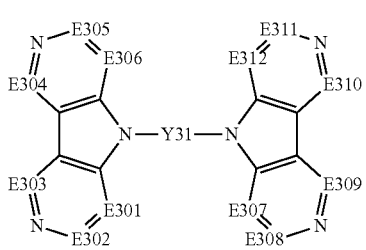

where, in the general formula (3), E301 to E312 each represent —C(R31)=, and the aforementioned R31 represents hydrogen atom or a substituent; and Y31 represents a divalent linking group of an arylene group, a heteroarylene group or combination thereof.

8. The transparent electrode according to any of the above 1 to 4, wherein the nitrogen-containing layer contains a compound represented by the following general formula (4):

[Chem. 4]

General formula (4)

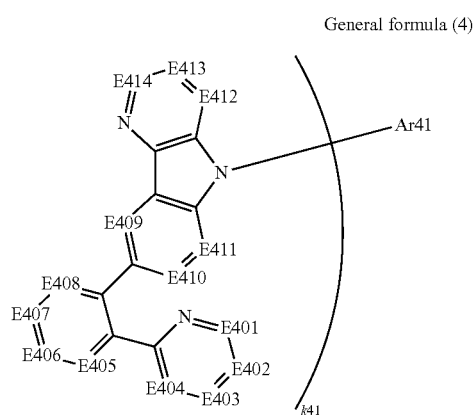

where, in the general formula (4), E401 to E414 each represent —C(R41)=, and the aforementioned R41 represents hydrogen atom or a substituent;

Ar41 represents a substituted or un-substituted aromatic hydrocarbon ring or aromatic heterocyclic ring; and k41 represents an integer of 3 or more.

9. The transparent electrode according to any of the above 1 to 4, wherein the nitrogen-containing layer contains a compound represented by the following general formula (5):

[Chem. 5]

General formula (5)

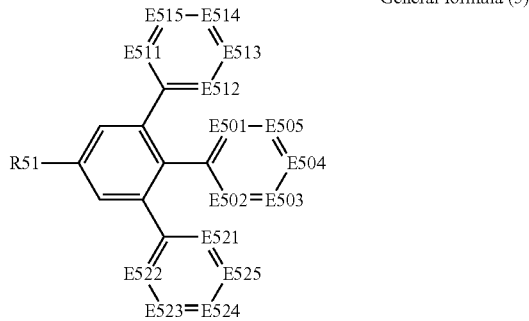

where, in the general formula (5),
R51 represents a substituent,
E501, E502, E511 to E515, E521 to E525 each represent —C(R52)= or —N=,
E503 to E505 each represent —C(R52)=,
the aforementioned R52 represents hydrogen atom (H) or a substituent,
at least one of E501 and E502 is —N=,
at least one of E511 to E515 is —N=, and
at least one of E521 to E525 is —N=.

10. The transparent electrode according to any of the above 1 to 4, wherein the nitrogen-containing layer contains a compound represented by the following general formula (6):

[Chem. 6]

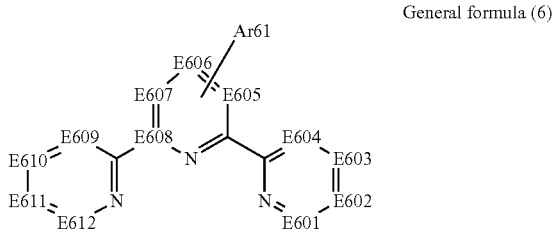

General formula (6)

where, in the general formula (6), E601 to E612 each represent —C(R61)= or —N=, R61 represents hydrogen atom or a substituent; and
Ar61 represents a substituted or un-substituted aromatic hydrocarbon ring or aromatic heterocyclic ring.

11. The transparent electrode according to any of the above 1 to 10, further including a cap layer that holds the electrode layer between the nitrogen-containing layer and the cap layer, and that is constituted using a compound containing nitrogen atoms.

12. The transparent electrode according to the above 11, wherein the cap layer is constituted using a compound having the effective unshared electron pair content [n/M] of is $2.0 \times 10^{-3} \leq [n/M]$.

13. The transparent electrode according to the above 11 or 12, wherein the cap layer is constituted using a compound having the effective unshared electron pair content [n/M] of is $3.9 \times 10^{-3} \leq [n/M]$.

14. The transparent electrode according to any of the above 11 to 13, wherein, with respect to the cap layer, the effective unshared electron pair content [n/M] in an interface layer on the electrode side is $2.0 \times 10^{-3} \leq [n/M]$.

15. The transparent electrode according to any of the above 1 to 14, further including a high refractive layer that is provided by holding the nitrogen-containing layer between the electrode layer and the high refractive layer, and that has a refractive index higher than that of the nitrogen-containing layer.

16. The transparent electrode according to the above 15, wherein the high refractive layer is constituted of titanium oxide or niobium oxide.

17. An electronic device including the transparent electrode according to any of the above 1 to 16.

18. The electronic device according to the above 17, wherein the electronic device is an organic electroluminescent element.

19. An organic electroluminescent element, comprising: the transparent electrode according to any of the above 1 to 16, a light emitting functional layer which is provided in a state of holding the electrode layer between the nitrogen-containing layer and the light emitting functional layer in the transparent electrode, and a counter electrode which is provided in a state of holding the light emitting functional layer between the transparent electrode and the counter electrode.

20. An organic electroluminescent element, comprising: the transparent electrode according to any of the above 1 to 14, a light emitting functional layer which is provided in a state of holding the nitrogen-containing layer between the electrode layer and the light emitting functional layer in the transparent electrode, and a counter electrode which is provided in a state of holding the light emitting functional layer between the transparent electrode and the counter electrode.

The transparent electrode constituted as described above has a configuration in which an electrode layer having silver as a main component is provided adjacent to the nitrogen-containing layer formed using a compound containing nitrogen atoms. According to the configuration, silver atoms constituting the electrode layer interact with the compound containing nitrogen atoms constituting the nitrogen-containing layer to thereby reduce a diffusion length of the silver atoms on the surface of the nitrogen-containing layer, which causes the suppression of agglomeration of silver. As a result, the electrode layer is a layer in which generally, a silver thin film that is easily isolated in the form of island due to film growth through Volumer-Weber (VW) type (nucleas growth type) is formed due to film growth through Frank-van der Merwe (FM) type (mono-layer growth type). Therefore, an electrode layer having a uniform thickness can be obtained even though the layer is thin.

In addition, particularly, as an index of biding stability of the silver constituting the electrode layer with respect to the nitrogen-containing layer, the aforementioned effective unshared electron pair content [n/M] is applied, and the nitrogen-containing layer is constituted using the compound having a value of $2.0 \times 10^{-3} \leq [n/M]$. As a result, it becomes possible to provide the nitrogen-containing layer in which the aforementioned effect of "suppressing agglomeration of silver" can be reliably provided adjacent to the electrode layer. As explained in examples mentioned below in detail, this has been confirmed by the fact that there is formed an electrode layer capable of measuring a sheet resistance even though the electrode layer has a film as remarkably thin as 6 nm, on such a nitrogen-containing layer 1a.

As a result, the electrode layer having ensured electrical conductivity due to uniform film thickness while ensuring light transmission property due to small film thickness can be reliably obtained in the upper portion of such a nitrogen-containing layer, and thus it is possible to attain both of the improvement of electrical conductivity and the improvement of light transmission property, in the transparent electrode using silver.

Advantageous Effects of Invention

As explained above, according to the present invention, it becomes possible to attain both of the improvement of electrical conductivity and improvement of light transmission property, in the transparent electrode, and it becomes possible to attain the performances of the electronic device and organic electroluminescent element using the transparent electrode.

BRIEF DESCRIPTION OF DRAWINGS

FIG. 1 is a schematic cross-sectional view illustrating the configuration of the transparent electrode according to the present invention.

FIG. 2 is a schematic cross-sectional view illustrating the configuration of the transparent electrode provided with the cap layer according to the present invention.

DESCRIPTION OF EMBODIMENTS

Figure 3:
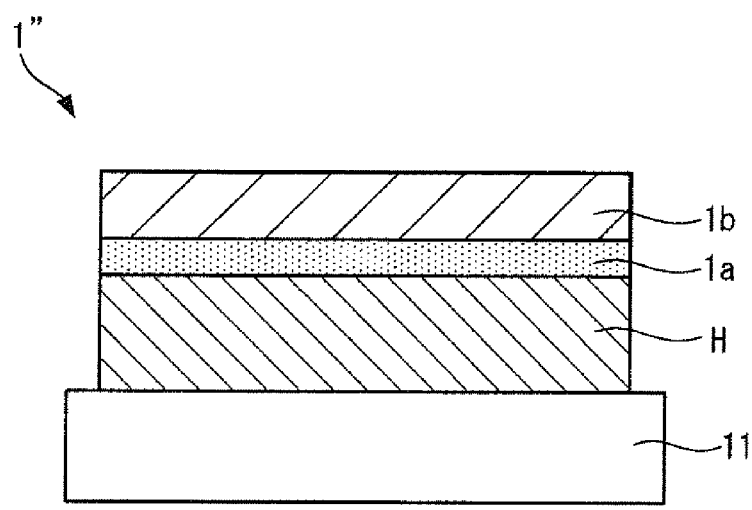
FIG. 3 is a schematic cross-sectional view illustrating the configuration of the transparent electrode provided with the high refractive layer according to the present invention.

Hereinafter, the embodiments according to the present invention will be explained by referring drawings in the order mentioned below.
1. Transparent electrode
2. Transparent electrode provided with the cap layer
3. Transparent electrode provided with the high refractive layer
4. Intended use of the transparent electrode
5. First embodiment of the organic electroluminescent element (top emission type)
6. Second embodiment of the organic electroluminescent element (bottom emission type)
7. Third embodiment of the organic electroluminescent element (both emission type)
8. Fourth embodiment of the organic electroluminescent element (reversely laminated configuration)
9. Intended use of the organic electroluminescent element
10. Lighting device-1
11. Lighting device-2

<<1. Transparent Electrode>>

FIG. 1 is a schematic cross-sectional view illustrating the configuration of the transparent electrode. As shown in the diagram, the transparent electrode 1 is a two-layered structure obtained by laminating a nitrogen-containing layer 1a and an electrode layer 1b which is provided adjacent thereto, and for example, the nitrogen-containing layer 1a and the electrode layer 1b are provided in this order in the upper portion of a substrate 11. In the layers, the electrode layer 1b constituting an electrode part of the transparent electrode 1 is a layer constituted using silver (Ag) as a main component. The nitrogen-containing layer 1a in contrast to the electrode layer 1b is constituted using a compound containing nitrogen atom (N), and when an unshared electron pair of, particularly, a nitrogen atom stably binding to silver which is a main material constituting the electrode layer 1b is assumed to be the [effective unshared electron pair], the nitrogen-containing layer 1a is characterized by using a compound in which a content rate of the [effective unshared electron pair] is within a predetermined range.

Hereinafter, detailed configurations of the substrate 11 in which the transparent electrode 1 having such a laminated structure is provided, the nitrogen-containing layer 1a and the electrode layer 1b which constitute the transparent electrode 1 will be explained in this order. The transparency of the transparent electrode 1 according to the present invention means a light transmittance of 50% or more at a wavelength of 550 nm.

<Substrate 11>

The substrate 11 on which the transparent electrode 1 of the present invention is formed can include, for example, glass, plastic and the like, but is not limited thereto. In addition, the substrate 11 may be transparent or may not be transparent. When the transparent electrode 1 of the present invention is used as an electronic device that takes out light from the side of the substrate 11, the substrate 11 is preferably transparent. Preferably used transparent substrate 11 can include glass, quartz, transparent resin film.

Examples of the glass include, for example, silica glass, soda lime silica glass, lead glass, borosilicate glass, non-alkali glass, and the like. From the viewpoints of adhesion to the nitrogen-containing layer 1a, durability, evenness, as necessary, the surface of these glass materials is subjected to physical treatment such as grinding, or a coating film formed of an inorganic material or an organic material, or a hybrid coating film obtained by combining these films is formed on the surface.

Examples of the resin film include, for example, polyesters such as polyethylene terephthalate (PET) and polyethylene naphthalate (PEN); polyethylene; polypropylene; cellulose esters or derivative thereof such as cellophane, cellulose diacetate, cellulose triacetate, cellulose acetate butylate, cellulose acetate propionate (CAP), cellulose acetate phthalate (TAC) and cellulose nitrate; polyvinylidene chloride; polyvinyl alcohol; polyethylene vinyl alcohol; syndiotactic polystyrene; polycarbonate; norbornen resin; polymethylpenten; polyether ketone; polyimide; polyether sulphone (PES); polyphenylene sulfide; polysulphones; polyether imide; polyether ketone imide; polyamide; fluoro resin; Nylon; polymethyl methacrylate; acryl or polyallylates; cycloolefins-based resins such as Alton (commercial name of JSR) or APEL (commercial name of Mitsui Chemicals).

A coating film formed of an inorganic material or an organic material, or a hybrid coating film obtained by combining those films may be formed on the surface of the resin film. Such a coating film and a hybrid coating film are each preferably a barrier film (also referred to as barrier membrane or the like) having a water vapor permeability (25±0.5° C., relative humidity 90±2% RH) measured in accordance with the method of JIS-K-7129-1992 of 0.01 g/(m$^2$·24 hr) or less. Furthermore, the coating films are each preferably a high barrier film having an oxygen permeability measured in accordance with the method of JIS-K-7126-

1987 of $10^{-3}$ ml/(m²·24 hrs·atm) or less and a water vapor permeability of $10^{-5}$ g/(m²·24 hr) or less.

A material for forming the barrier film as described above may be a material having a function of suppressing penetration of water vapor, oxygen and the like which cause deterioration of the element, and for example, there can be used silicon oxide, silicon dioxide, silicon nitride and the like. Furthermore, in order to improve fragility of the barrier film, it is more preferable to have a laminated structure of the inorganic layer and a layer formed of organic materials (organic layer). The order of lamination of the inorganic layer and the organic layer is not particularly limited, and it is preferable to laminate alternately both of the layers a plurality of times.

The method of forming the barrier film is not particularly limited, and there can be used, for example, vacuum deposition method, spattering method, reactive spattering method, molecular beam epitaxial method, cluster ion beam method, ion platting method, plasma polymerization method, atmospheric pressure plasma polymerization method, plasma CVD method, laser CVD method, thermal CVD method, coating method, and the like. The atmospheric pressure plasma polymerization method described in Japanese Patent Application Laid-Open Publication No. 2004-68143 is particularly preferable.

In contrast, when the substrate 11 is opaque, there can be used, for example, a metal substrate such as aluminum or stainless steel, an opaque resin substrate, a ceramic substrate and the like. These substrates may be in the form of films which can be flexibly bended.

<Nitrogen-Containing Layer 1a>

The nitrogen-containing layer 1a is a layer provided adjacent to the electrode layer 1b, and is constituted using a compound containing nitrogen atom (N). When an unshared electron pair of, particularly, a nitrogen atom stably binding to silver which is a main material constituting the electrode layer 1b among the nitrogen atoms contained in the compound is assumed to be the [effective unshared electron pair], in particular, the compound is characterized in that a content rate of the [effective unshared electron pair] is within a predetermined range.

Here, the [effective unshared electron pair] is defined as an unshared electron pair which is not involved in aromaticity and is not coordinated with a metal among the unshared electron pairs of the nitrogen atom contained in the compound. The aromaticity here is an unsaturated cyclic structure in which atoms having Π electron are arranged annularly, and is an aromaticity according to the so-called "Hueckel's rule", and satisfies the condition that the number of electrons which are contained in a Π electron system on the ring is "4n+2" (N=0, or natural number).

The [effective unshared electron pair] described above is selected depending on whether or not an unshared electron pair contained in a nitrogen atom is involved in the aromaticity, regardless of whether or not the nitrogen atom itself provided with the unshared electron pair is a hetero atom which forms the aromatic ring. For example, even when a certain nitrogen atom is a hetero atom which forms the aromatic ring, if the nitrogen atom has an unshared electron pair which is not involved in aromaticity, the unshared electron pair is counted as one of the [effective unshared electron pair]. In contrast, when a certain nitrogen atom is not a hetero atom which forms the aromatic ring, if all of the unshared electron pairs of the nitrogen atom are involved in the aromaticity, the unshared electron pair is not counted as the [effective unshared electron pair]. Meanwhile, in each compound, a number n of the [effective unshared electron pairs] is equal to the number of nitrogen atoms having the [effective unshared electron pair].

Particularly, in the present embodiments, a number n of the [effective unshared electron pairs] to a molecular weight M of the compound is defined, for example, as effective unshared electron pair content [n/M]. The feature of the nitrogen-containing layer 1a is constituted using a compound selected so that the [n/M] is $2.0 \times 10^{-3} \leq [n/M]$. In addition, more preferably, the nitrogen-containing layer 1a has the effective unshared electron pair content [n/M] defined above of within a range of $3.9 \times 10^{-3} \leq [n/M]$.

The nitrogen-containing layer 1a may be constituted using the compound having the effective unshared electron pair content [n/M] of the aforementioned predetermined range, may be constituted by such a compound alone, or may be constituted using a mixture of such a compound and other compound. The other compound may or may not have a nitrogen atom, and furthermore may not have the effective unshared electron pair content [n/M] of the aforementioned predetermined range.

When the nitrogen-containing layer 1a is constituted using a plurality of compounds, a molecular weight M of the mixed compounds is obtained on the basis of, for example, a mixing ratio of the compounds, a total number n of the [effective unshared electron pair] to the molecular weight M is obtained as an average value of the effective unshared electron pair content [n/M], and the value is preferably within the aforementioned predetermined range. Namely, it is preferable that an effective unshared electron pair content [n/M] of the nitrogen-containing layer 1a itself is within the predetermined range.

Meanwhile, in case in which the nitrogen-containing layer 1a is constituted using a plurality of compounds and a mixing ratio (content ratio) of the compounds in the direction of the film thickness is different, it is sufficient that an effective unshared electron pair content [n/M] in the interface layer of the nitrogen-containing layer 1a on the side which comes into contact with the electrode layer 1b is within the predetermined range.

[Compound-1]

Hereinafter, as the compounds constituting the nitrogen-containing layer 1a, specific examples (No. 1 to No. 45) of the compounds which satisfy the aforementioned effective unshared electron pair content [n/M] of $2.0 \times 10^{-3} \leq [n/M]$ are shown. In each compound of No to No a nitrogen atom having the [effective unshared electron pair] is marked by 0. In addition, in the following Table 1, the molecular weight M, number n of the [effective unshared electron pair], and the effective unshared electron pair content [n/M] of the compounds No. 1 to No. 45 are shown. In the copper phthalocyanine of the compound 33, among unshared electron pairs of the nitrogen atom, an unshared electron pair which are not coordinated with copper is counted as the [effective unshared electron pair].

[Chem. 7]
No. 1
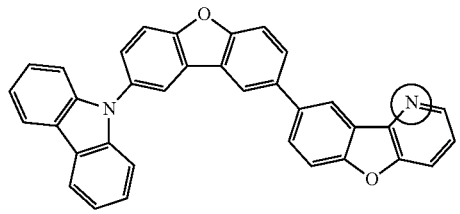
No. 2
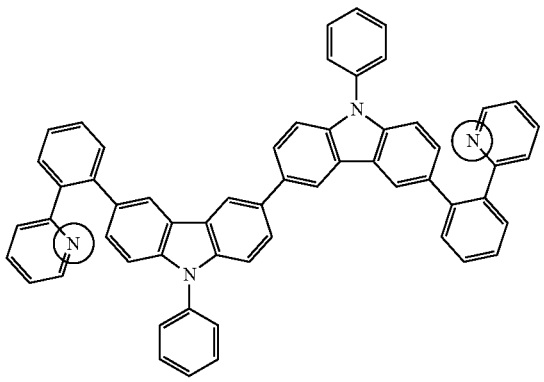
No. 3
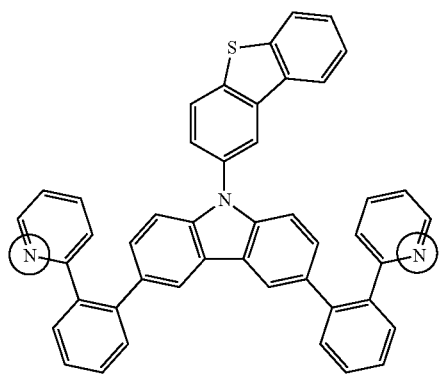
No. 4
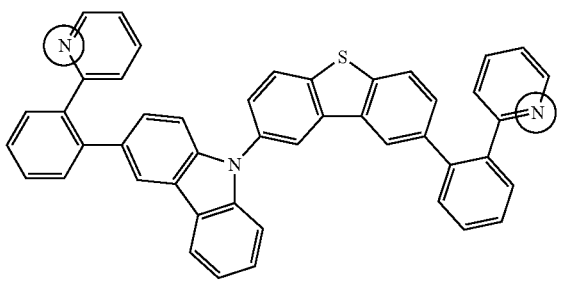
No. 5
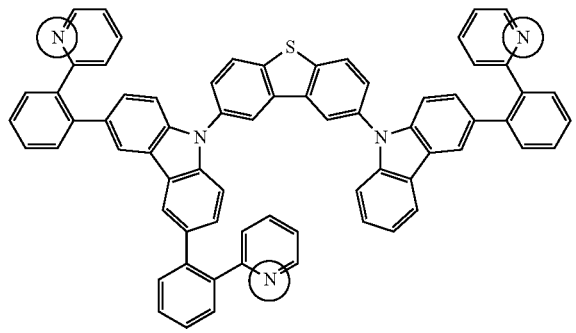
No. 6
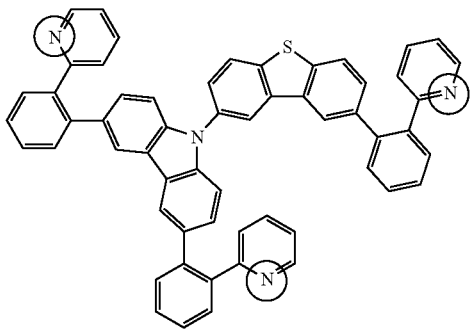
No. 7
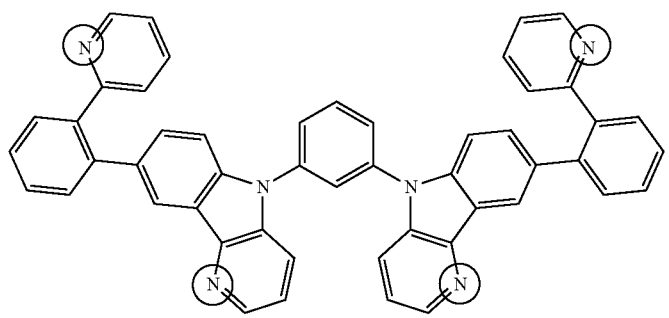

-continued
[Chem. 8]
No. 8
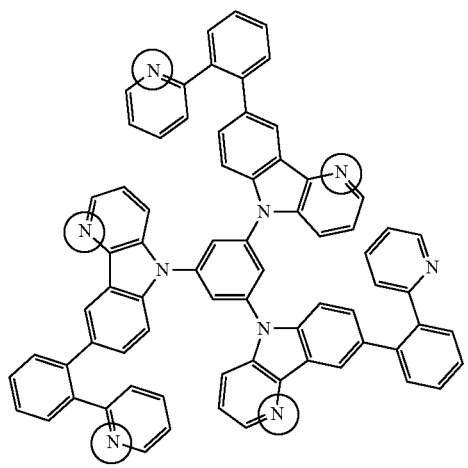
No. 9
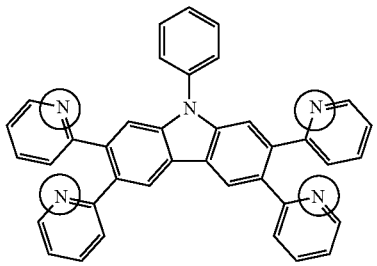
No. 10
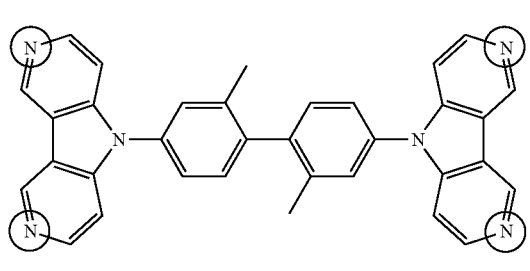
No. 11
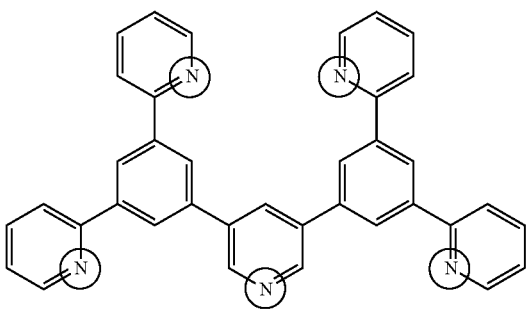
No. 12
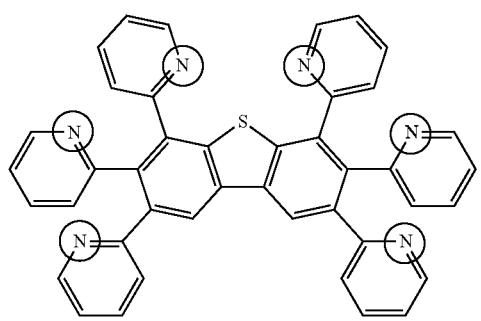
No. 13
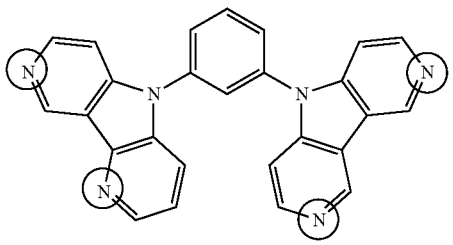
No. 14
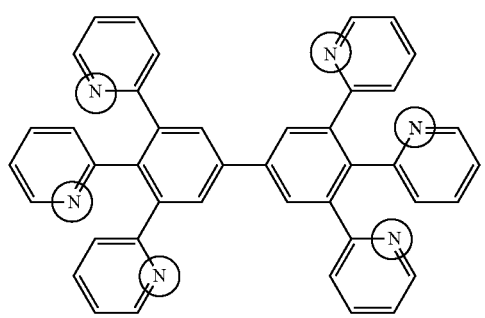
No. 15
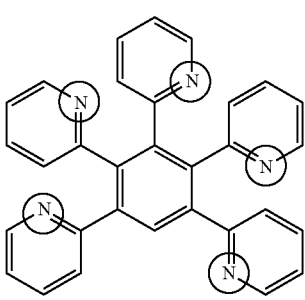

No. 16
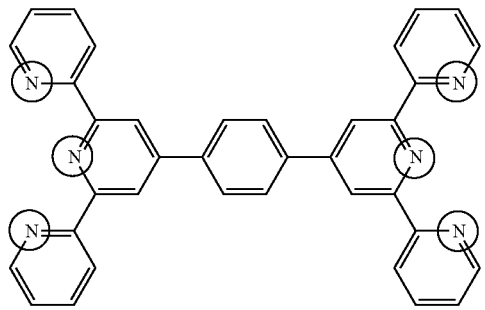
[Chem. 9]
No. 17
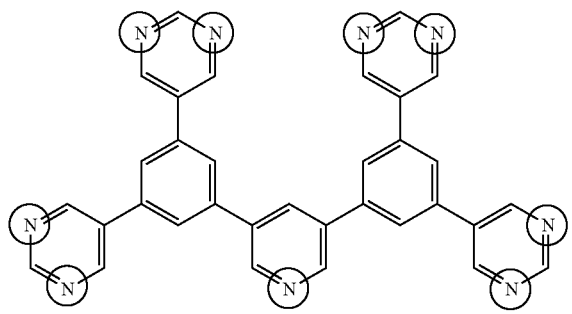
No. 18
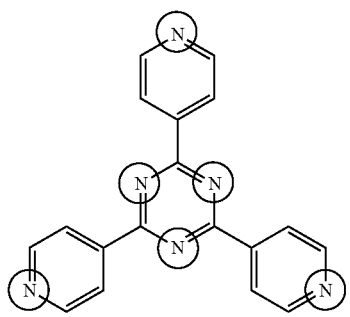
No. 19
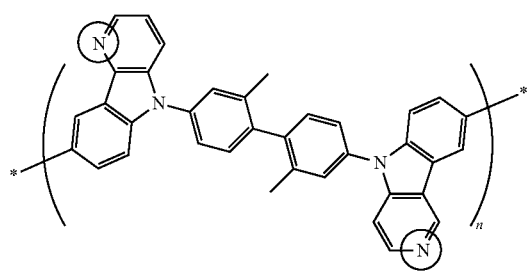
No. 20
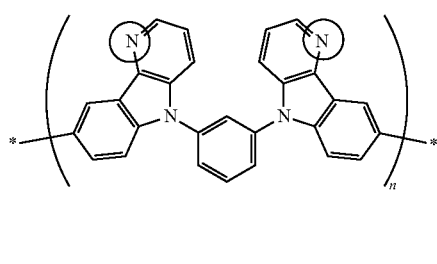
No. 21
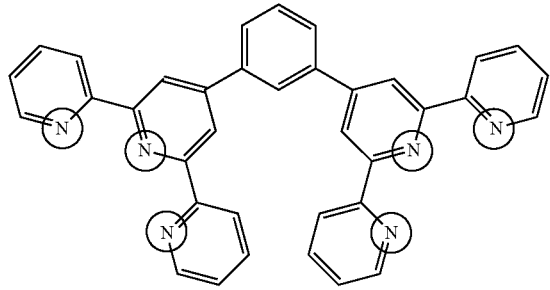
No. 22
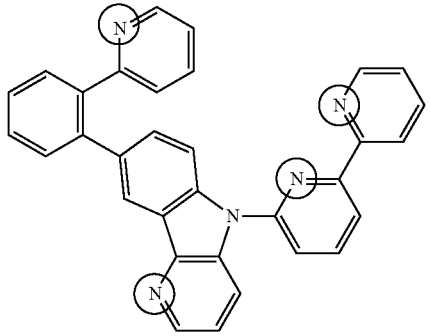
No. 23
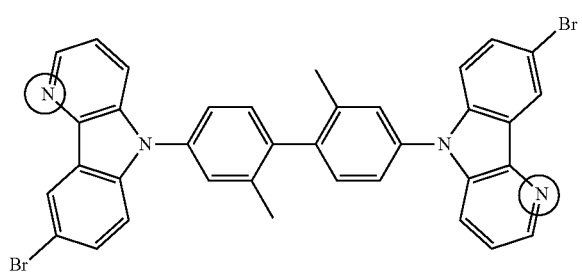

-continued
No. 24
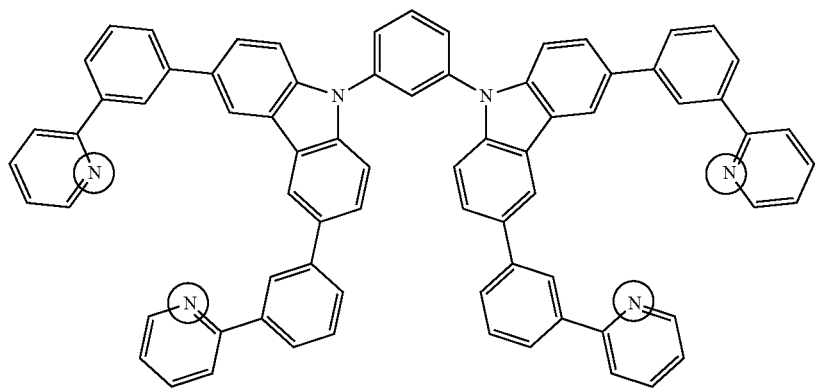
No. 25
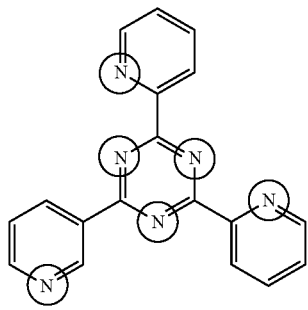
[Chem. 10]
No. 26
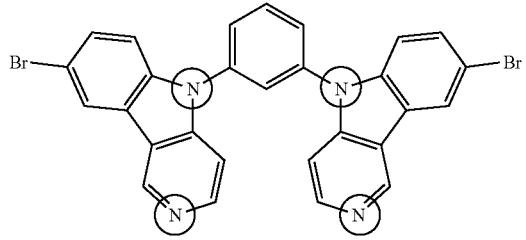
No. 27
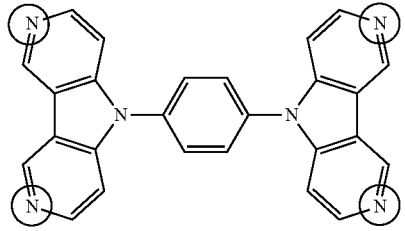
No. 28
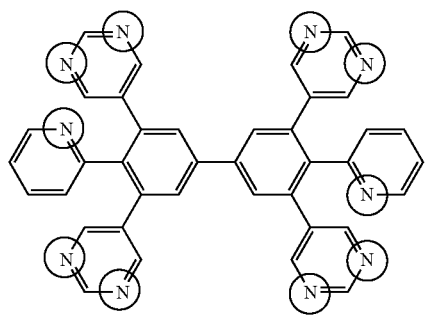
No. 29
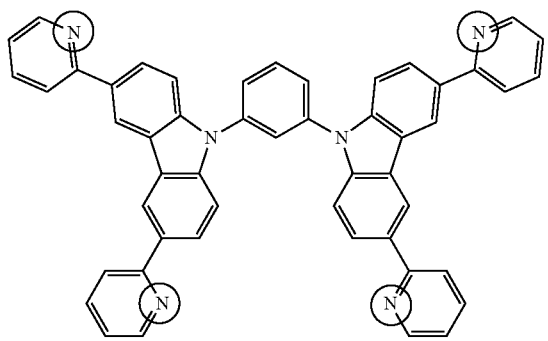
No. 30
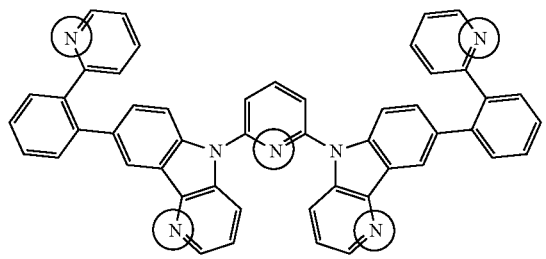
No. 31
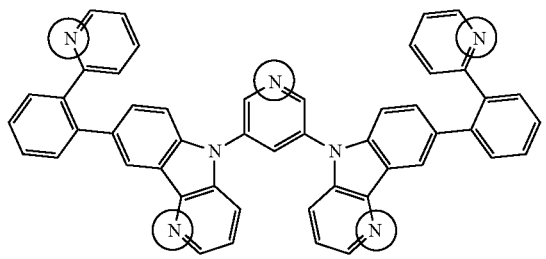

-continued
No. 32
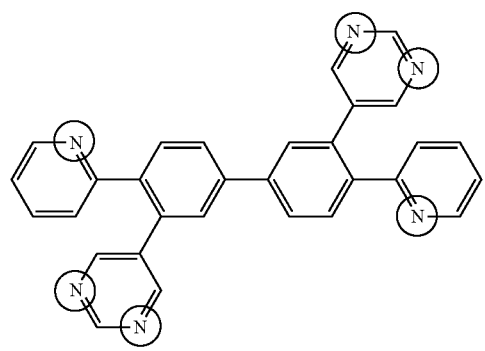
No. 33
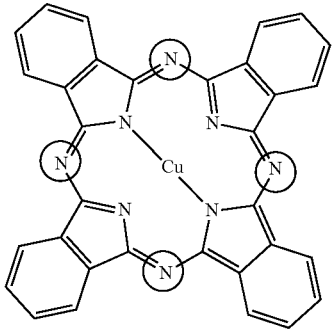
No. 34
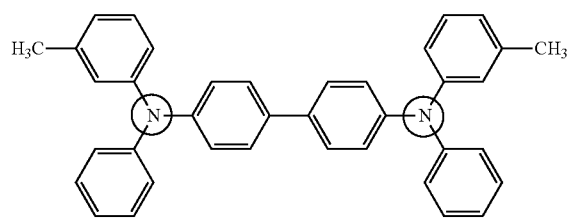
No. 35
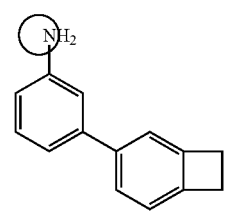
[Chem. 11]
No. 36
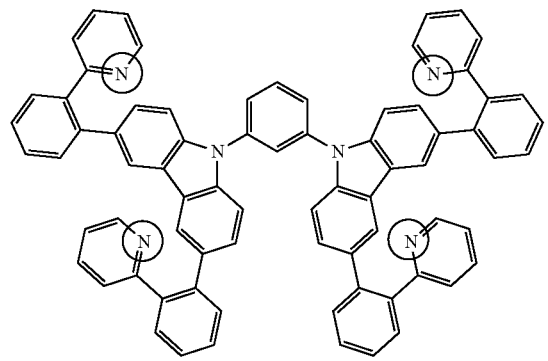
No. 37
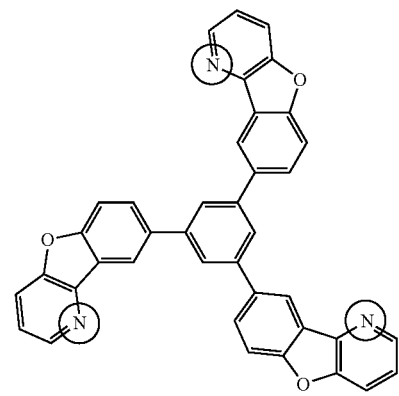
No. 38
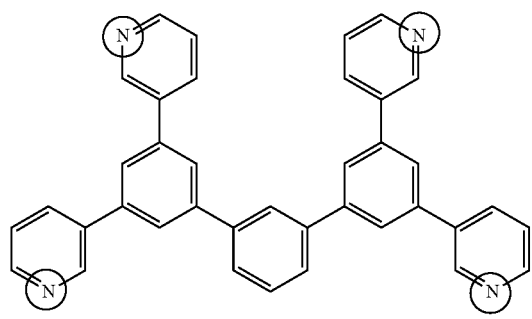
No. 39
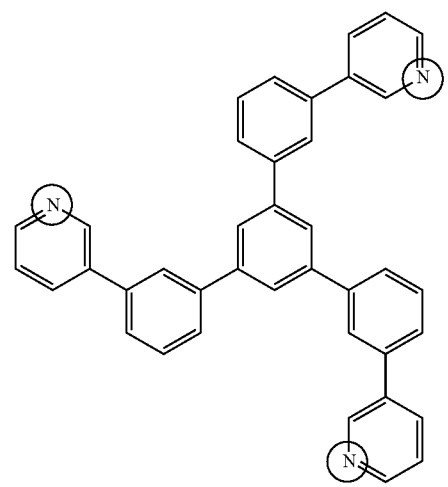

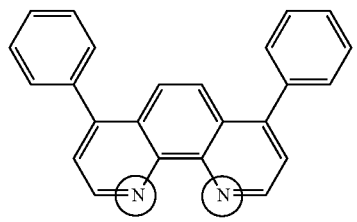
No. 40
[Chem. 12]
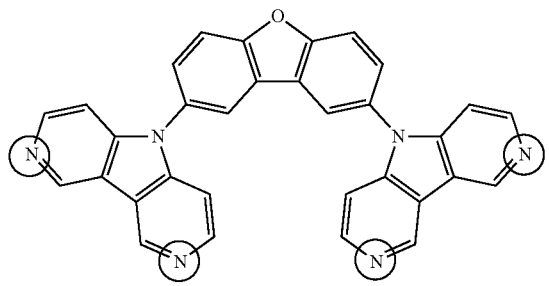
No. 41
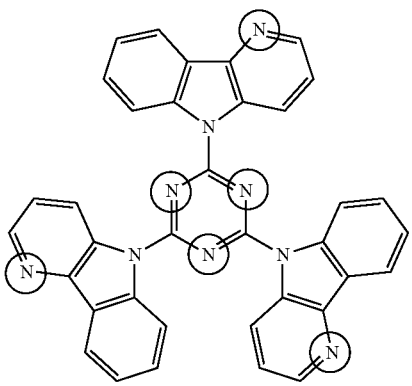
No. 42
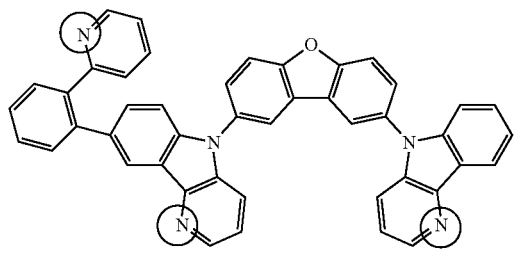
No. 43
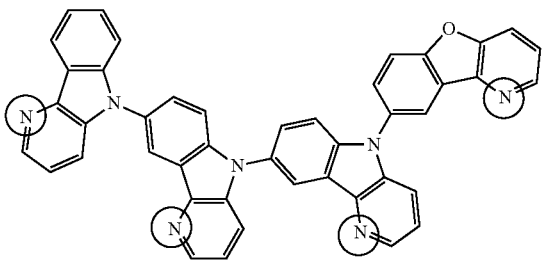
No. 44
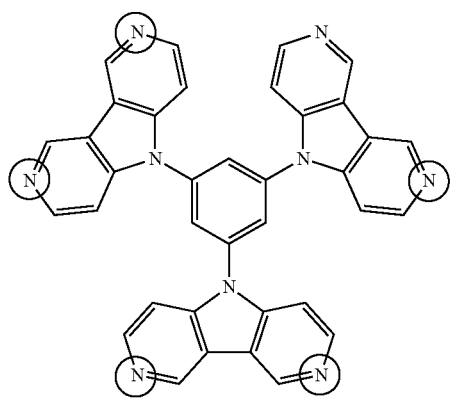
No. 45
TABLE 1
| Compound | Number of effective unshared electron pairs [n] | Molecular weight [M] | [n/M] | Corresponding general formula |
|---|---|---|---|---|
| No. 1 | 1 | 500.55 | 2.00E−03 | |
| No. 2 | 2 | 790.95 | 2.50E−03 | |
| No. 3 | 2 | 655.81 | 3.00E−03 | |
| No. 4 | 2 | 655.81 | 3.00E−03 | |
| No. 5 | 3 | 974.18 | 3.10E−03 | −2 |
| No. 6 | 3 | 808.99 | 3.70E−03 | |

TABLE 1-continued

| Compound | Number of effective unshared electron pairs [n] | Molecular weight [M] | [n/M] | Corresponding general formula |
|---|---|---|---|---|
| No. 7 | 4 | 716.83 | 5.60E−03 | (1), (2) |
| No. 8 | 6 | 1036.19 | 5.80E−03 | (1), (4) |
| No. 9 | 4 | 551.64 | 7.30E−03 | |
| No. 10 | 4 | 516.6 | 7.70E−03 | (1), (3) |
| No. 11 | 5 | 539.63 | 9.30E−03 | |
| No. 12 | 6 | 646.76 | 9.30E−03 | −5 |
| No. 13 | 4 | 412.45 | 9.70E−03 | (1), (3) |
| No. 14 | 6 | 616.71 | 9.70E−03 | −5 |
| No. 15 | 5 | 463.53 | 1.10E−02 | −2 |
| No. 16 | 6 | 540.62 | 1.10E−02 | −6 |
| No. 17 | 9 | 543.58 | 1.70E−02 | |
| No. 18 | 6 | 312.33 | 1.90E−02 | |
| No. 19 | 2 | 512.6 | 3.90E−03 | −1 |
| No. 20 | 2 | 408.45 | 4.90E−03 | −1 |
| No. 21 | 6 | 540.62 | 1.10E−02 | −6 |
| No. 22 | 4 | 475.54 | 8.40E−03 | −1 |
| No. 23 | 2 | 672.41 | 3.00E−03 | −1 |
| No. 24 | 4 | 1021.21 | 3.90E−03 | |
| No. 25 | 6 | 312.33 | 1.90E−02 | −6 |
| No. 26 | 4 | 568.26 | 7.00E−03 | −1 |
| No. 27 | 4 | 412.45 | 9.70E−03 | (1), (3) |
| No. 28 | 10 | 620.66 | 1.60E−02 | −5 |
| No. 29 | 4 | 716.83 | 5.60E−03 | |
| No. 30 | 5 | 717.82 | 7.00E−03 | (1), (2) |
| No. 31 | 5 | 717.82 | 7.00E−03 | (1), (2) |
| No. 32 | 6 | 464.52 | 1.30E−02 | |
| No. 33 | 4 | 576.1 | 6.90E−03 | |
| No. 34 | 2 | 516.67 | 3.90E−03 | |
| No. 35 | 1 | 195.26 | 5.10E−03 | |
| No. 36 | 4 | 1021.21 | 3.90E−03 | −2 |
| No. 37 | 3 | 579.6 | 5.20E−03 | |
| No. 38 | 4 | 538.64 | 7.40E−03 | |
| No. 39 | 3 | 537.65 | 5.60E−03 | |
| No. 40 | 2 | 332.4 | 6.00E−03 | |
| No. 41 | 4 | 502.15 | 8.00E−03 | (1), (3) |
| No. 42 | 6 | 579.19 | 1.00E−02 | −1 |
| No. 43 | 3 | 653.22 | 4.60E−03 | −1 |
| No. 44 | 4 | 667.21 | 6.00E−03 | −1 |
| No. 45 | 6 | 579.19 | 1.00E−02 | (1), (3) |

In the above Table 1, when those exemplified compounds are also involved in the general formulae (1) to (6) which represent other compounds explained herein below, the corresponding general formulae are indicated.

[Compound-2]

In addition, as the compound constituting the nitrogen-containing layer 1a, other than the above compound having the effective unshared electron pair content [n/M] of the aforementioned predetermined range, compounds having properties to be required for each of the electronic devices to which the transparent electrode 1 provided with the nitrogen-containing layer 1a is applied are used. For example, in case in which the transparent electrode 1 is used as an electrode of an organic electroluminescent element, the following compounds represented by the general formulae (1) to (6) are used as the compound constituting the nitrogen-containing layer 1a from the viewpoints of film formation and electron transport property.

Among these compounds represented by the general formulae (1) to (6), a compound which falls within the aforementioned range of the effective unshared electron pair content [n/M] is included, and such a compound can be used alone as the compound constituting the nitrogen-containing layer 1a (See Table 1). On the other hand, if a compound represented by the general formulae (1) to (6) does not fall within the aforementioned range of the effective unshared electron pair content [n/M], the compound can be used as the compound constituting the nitrogen-containing layer 1a by mixing with the compound having the aforementioned range of the effective unshared electron pair content [n/M].

[Chem.13]

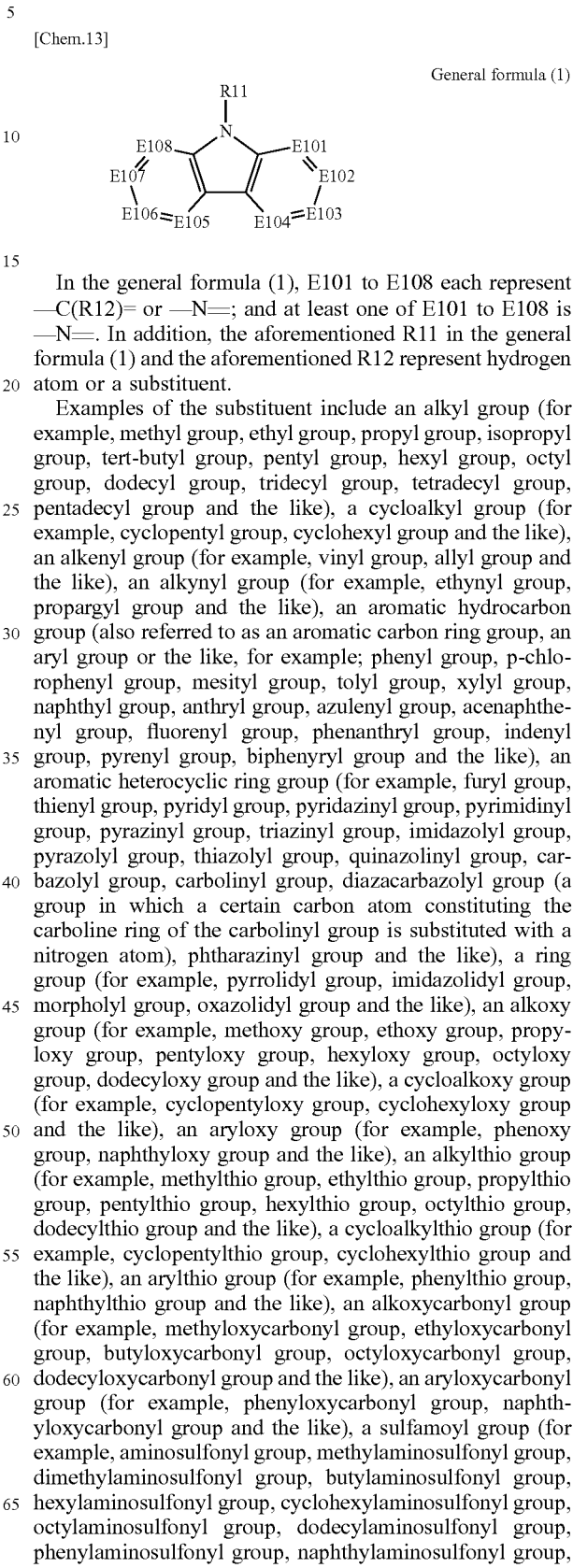

General formula (1)

In the general formula (1), E101 to E108 each represent —C(R12)= or —N=; and at least one of E101 to E108 is —N=. In addition, the aforementioned R11 in the general formula (1) and the aforementioned R12 represent hydrogen atom or a substituent.

Examples of the substituent include an alkyl group (for example, methyl group, ethyl group, propyl group, isopropyl group, tert-butyl group, pentyl group, hexyl group, octyl group, dodecyl group, tridecyl group, tetradecyl group, pentadecyl group and the like), a cycloalkyl group (for example, cyclopentyl group, cyclohexyl group and the like), an alkenyl group (for example, vinyl group, allyl group and the like), an alkynyl group (for example, ethynyl group, propargyl group and the like), an aromatic hydrocarbon group (also referred to as an aromatic carbon ring group, an aryl group or the like, for example; phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, biphenyryl group and the like), an aromatic heterocyclic ring group (for example, furyl group, thienyl group, pyridyl group, pyridazinyl group, pyrimidinyl group, pyrazinyl group, triazinyl group, imidazolyl group, pyrazolyl group, thiazolyl group, quinazolinyl group, carbazolyl group, carbolinyl group, diazacarbazolyl group (a group in which a certain carbon atom constituting the carboline ring of the carbolinyl group is substituted with a nitrogen atom), phtharazinyl group and the like), a ring group (for example, pyrrolidyl group, imidazolidyl group, morpholyl group, oxazolidyl group and the like), an alkoxy group (for example, methoxy group, ethoxy group, propyloxy group, pentyloxy group, hexyloxy group, octyloxy group, dodecyloxy group and the like), a cycloalkoxy group (for example, cyclopentyloxy group, cyclohexyloxy group and the like), an aryloxy group (for example, phenoxy group, naphthyloxy group and the like), an alkylthio group (for example, methylthio group, ethylthio group, propylthio group, pentylthio group, hexylthio group, octylthio group, dodecylthio group and the like), a cycloalkylthio group (for example, cyclopentylthio group, cyclohexylthio group and the like), an arylthio group (for example, phenylthio group, naphthylthio group and the like), an alkoxycarbonyl group (for example, methyloxycarbonyl group, ethyloxycarbonyl group, butyloxycarbonyl group, octyloxycarbonyl group, dodecyloxycarbonyl group and the like), an aryloxycarbonyl group (for example, phenyloxycarbonyl group, naphthyloxycarbonyl group and the like), a sulfamoyl group (for example, aminosulfonyl group, methylaminosulfonyl group, dimethylaminosulfonyl group, butylaminosulfonyl group, hexylaminosulfonyl group, cyclohexylaminosulfonyl group, octylaminosulfonyl group, dodecylaminosulfonyl group, phenylaminosulfonyl group, naphthylaminosulfonyl group, 2-pyridylaminosulfonyl group and the like), an acyl group (for example, acetyl group, ethylcarbonyl group, propylcarbonyl group, pentylcarbonyl group, cyclohexylcarbonyl group, octylcarbonyl group, 2-ethylhexylcarbonyl group, dodecylcarbonyl group, phenylcarbonyl group, naphthylcarbonyl group, pyridylcarbonyl group and the like), an acyloxy group (for example, acetyloxy group, ethylcarbonyloxy group, butylcarbonyloxy group, octylcarbonyloxy group, dodecylcarbonyloxy group, phenylcarbonyloxy group and the like), an amido group (for example, methylcarbonylamino group, ethylcarbonylamino group, dimethylcarbonylamino group, propylcarbonylamino group, pentylcarbonylamino group, cyclohexylcarbonylamino group, 2-ethylhexylcarbonylamino group, octylcarbonylamino group, dodecylcarbonylamino group, phenylcarbonylamino group, naphthylcarbonylamino group and the like), a carbamoyl group (for example, aminocarbonyl group, methylaminocarbonyl group, dimethylaminocarbonyl group, propylaminocarbonyl group, pentylaminocarbonyl group, cyclohexylaminocarbonyl group, octylaminocarbonyl group, 2-ethylhexylaminocarbonyl group, dodecylaminocarbonyl group, phenylaminocarbonyl group, naphthylaminocarbonyl group, 2-pyridylaminocarbonyl group and the like), an ureido group (for example, methylureido group, ethylureido group, pentylureido group, cyclohexylureido group, octylureido group, dodecylureido group, phenylureido group, naphthylureido group, 2-pyridylaminoureido group and the like), a sulfinyl group (for example, methylsulfinyl group, ethylsulfinyl group, butylsulfinyl group, cyclohexylsulfinyl group, 2-ethylhexylsulfinyl group, dodecylsulfinyl group, phenylsulfinyl group, naphthylsulfinyl group, 2-pyridylsulfinyl group and the like), an alkylsulfonyl group (for example, methylsulfonyl group, ethylsulfonyl group, butylsulfonyl group, cyclohexylsulfonyl group, 2-ethylhexylsulfonyl group, dodecylsulfonyl group and the like), an arylsulfonyl group or a heteroarylsulfonyl group (for example, phenylsulfonyl group, naphthylsulfonyl group, 2-pyridylsulfonyl group and the like), an amino group (for example, amino group, ethylamino group, dimethylamino group, butylamino group, cyclopentylamino group, 2-ethylhexylamino group, dodecylamino group, anilino group, naphthylamino group, 2-pyridylamino group, piperidyl group (also referred to as piperidinyl group), 2,2,6,6-tetramethylpiperidinyl group and the like), a halogen atom (for example, fluorine atom, chlorine atom, bromine atom and the like), a fluorinated hydrocarbon group (for example, fluoromethyl group, trifluoromethyl group, pentafluoroethyl group, pentafluorophenyl group and the like), cyano group, nitro group, hydroxyl group, mercapto group, a silyl group (for example, trimethylsilyl group, triisopropylsilyl group, triphenylsilyl group, phenyldiethylsilyl group and the like), a phosphate group (for example, dihexylphosphoryl group and the like), a phosphite group (for example, diphenylphosphinyl group and the like), phosphono group, and the like.

Some of these substituents may further be substituted by the aforementioned substituent. In addition, two or more of these substituents may bind to each other to form a ring.

[Chem. 14]

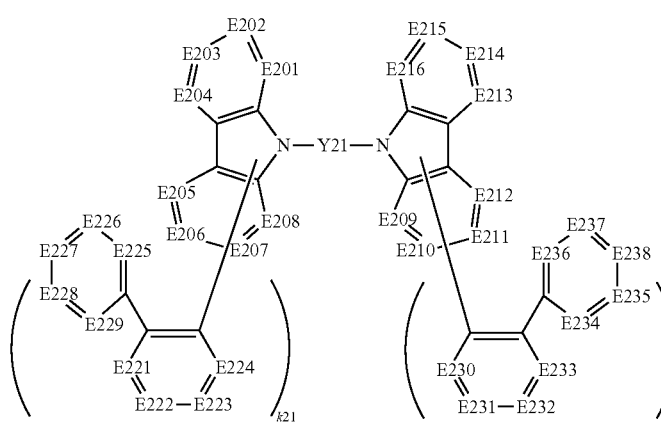

General formula (2)

The general formula (2) is also one embodiment of the general formula (1). In the general formula (2), Y21 represents a divalent linking group of an arylene group, a heteroarylene group or a combination thereof. E201 to E216 and E221 to E238 each represent —C(R21)= or —N=, and the aforementioned R21 represents hydrogen atom or a substituent. However, at least one of E221 to E229 and at least one of E230 to E238 represent —N=. k21 and k22 represent an integer of 0 to 4, and k21+k22 is an integer of 2 or more.

In the general formula (2), examples of an arylene group represented by Y21 include, for example, o-phenylene group, p-phenylene group, naphthalenediyl group, anthracenediyl group, naphthacenediyl group, pyrenediyl group, naphthylnaphthalenediyl group, biphenyldiyl group (for example, [1,1'-biphenyl]-4,4'-diyl group, 3,3'-biphenyldiyl group, 3,6-biphenyldiyl group and the like), terphenyldiyl group, quaterphenyldiyl group, quinquephenyldiyl group, sexiphenyldiyl group, septiphenyldiyl group, octiphenyldiyl group, nobiphenyldiyl group, deciphenyldiyl group and the like.

Furthermore, in the general formula (2), examples of a heteroarylene group represented by Y21 include, for example, a divalent group derived from a group consisting of carbazole ring, carboline ring, diazacarbazole ring (also referred to as monoazacarboline ring, and indicating a ring structure in which one carbon atom constituting the carboline ring is substituted with a nitrogen atom), triazole ring, pyrrole ring, pyridine ring, pyrazine ring, quinoxaline ring, thiophene ring, oxadiazole ring, dibenzofuran ring, dibenzothiophene ring, indole ring and the like.

As a preferable divalent linking group which is an arylene group, a heteroarylene group or a combination thereof represented by Y21 contain, among the heteroarylene groups, preferable is a group which is derived from a condensed aromatic heterocyclic ring formed by condensing three or more rings, and as the group derived from the condensed aromatic heterocyclic ring formed by condensing three or more rings, preferable is a group derived from dibenzofuran ring or a group derived from dibenzothiophene ring.

In the general formula (2), when the aforementioned R21 of —C(R21)= each represented by E201 to E216, E221 to E238 is a substituent, as examples of its substituent, the substituent exemplified as R11, R12 of the general formula (1) are applied in the same manner.

In the general formula (2), it is preferable that six or more of E201 to E208 and six or more of E209 to E216 each represent —C(R21)=.

In the general formula (2), it is preferable that at least one of E225 to E229 and at least one of E234 to E238 represent —N=.

Furthermore, in the general formula (2), it is preferable that at least one of E225 to E229 and at least one of E234 to E238 represent —N=.

In the general formula (2), preferable embodiment is that E221 to E224 and six or more of E230 to E233 each represent —C(R21)=.

Moreover, in the compound represented by the general formula (2), it is preferable that E203 represents —C(R21)=, and R21 represents a linking moiety, and furthermore it is also preferable that E211 represents —C(R21)=, and R21 represents a linking moiety.

Furthermore, it is preferable that E225 and E234 represent —N=, and it is preferable that E221 to E224 and E230 to E233 each represent —C(R21)=.

[Chem. 15]

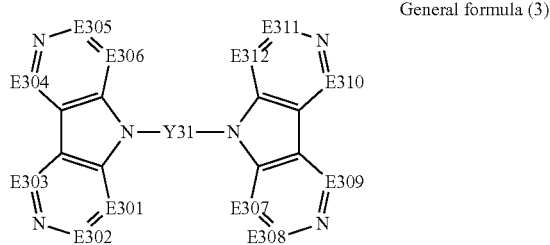

General formula (3)

The general formula (3) is also one embodiment of the general formula (1). In the general formula (3), E301 to E312 each represent —C(R31)=, and the aforementioned R31 represents hydrogen atom or a substituent. Y31 represents a divalent linking group of an arylene group, a heteroarylene group or combination thereof.

In the aforementioned general formula (3), when the aforementioned R31 of —C(R31)= each represented by E301 to E312 is a substituent, as examples of its substituent, the substituent exemplified as R11, R12 of the general formula (1) are applied in the same manner.

In addition, in the general formula (3), a preferable embodiment of the divalent linking group of an arylene group, a heteroarylene group or combination thereof represented by Y31, is the same as that in Y21 of the general formula (2).

[Chem. 16]

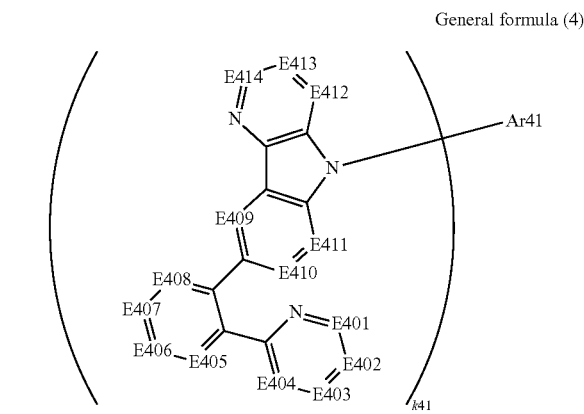

General formula (4)

The general formula (4) is also one embodiment of the general formula (1). In the aforementioned the general formula (4), E401 to E414 each represent —C(R41)=, and the aforementioned R41 represents hydrogen atom or a substituent. Ar41 represents a substituted or un-substituted aromatic hydrocarbon ring or aromatic heterocyclic ring. k41 represents an integer of 3 or more.

In the aforementioned general formula (4), when the aforementioned R41 of —C(R41)= each represented by E401 to E414 is a substituent, as examples of its substituent, the substituent exemplified as R11, R12 of the general formula (1) are applied in the same manner.

In the general formula (4), when Ar41 represents an aromatic hydrocarbon ring, examples of the aromatic hydrocarbon ring include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring, and the like. Furthermore, these rings may also have a substituent represented by R11, R21 of the general formula (1).

In the general formula (4), when Ar41 represents an aromatic heterocyclic ring, examples of the aromatic heterocyclic ring include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, benzimidazole ring, benzothiazole ring, benzoxazole ring, quinoxaline ring, quinazoline ring, phthalazine ring, carbazole ring, azacarbazole ring, and the like. Furthermore, these rings may also have a substituent represented by R11, R21 of the general formula (1).

[Chem. 17]

General formula (5)

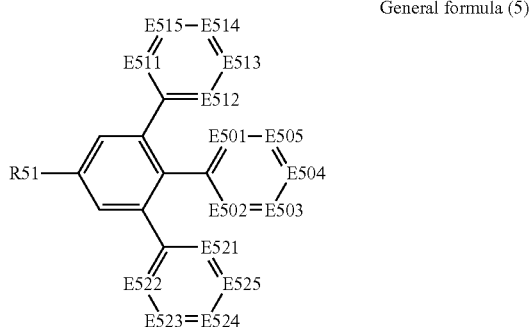

In the aforementioned general formula (5), R51 represents a substituent, E501, E502, E511 to E515, E521 to E525 each represent —C(R52)= or —N=, E503 to E505 each represent —C(R52)=. R52 represents hydrogen atom (H) or a substituent. At least one of E501 and E502 is —N= (nitrogen atom), at least one of E511 to E515 is —N= (nitrogen atom), at least one of E521 to E525 is —N= (nitrogen atom).

In the aforementioned general formula (5), when the aforementioned R51, R52 represent a substituent, as examples of the substituent, the substituent exemplified as R11, R12 of the general formula (1) are applied in the same manner.

[Chem. 18]

General formula (6)

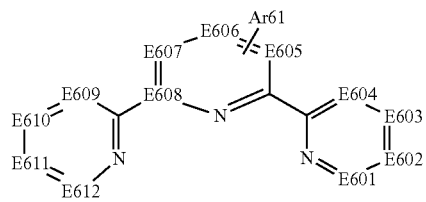

In the aforementioned general formula (6), E601 to E612 each represent —C(R61)= or —N=, R61 represents hydrogen atom or a substituent. Ar61 represents a substituted or un-substituted aromatic hydrocarbon ring or aromatic heterocyclic ring.

In the aforementioned general formula (6), when the aforementioned R61 of —C(R61)= each represented by E601 to E612 is a substituent, as examples of its substituent, the substituent exemplified as R11, R12 of the general formula (1) are applied in the same manner.

In addition, in the general formula (6), the substituted or un-substituted aromatic hydrocarbon ring or aromatic heterocyclic ring represented by Ar61 is the same as that in Ar41 of the general formula (4).

[Compound-3]

In addition, as the other compound constituting the nitrogen-containing layer 1a, other than the above compounds represented by the general formulae (1) to (6), there are compounds 1 to 134 exemplified in the followings. These compound are materials having electron transport property or electron injection property. Accordingly, the transparent electrode 1 wherein the nitrogen-containing layer 1a is constituted using such a compound is suitable to a transparent electrode in the organic electroluminescent element, and the nitrogen-containing layer 1a can be used as an electron transport layer or an electron injection layer in the organic electroluminescent element. Besides, among these compounds 1 to 134, a compound which falls within the aforementioned range of the effective unshared electron pair content [n/M] is included, and such a compound can be used alone as the compound constituting the nitrogen-containing layer 1a. Furthermore, in the compounds 1 to 134, there are compounds which fall in the aforementioned general formulae (1) to (6).

[Chem. 19]

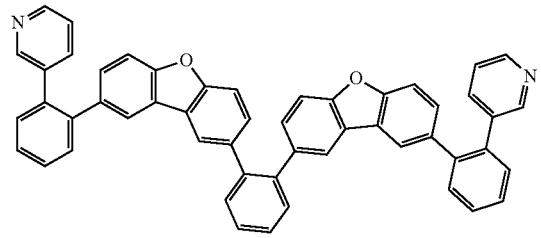

1

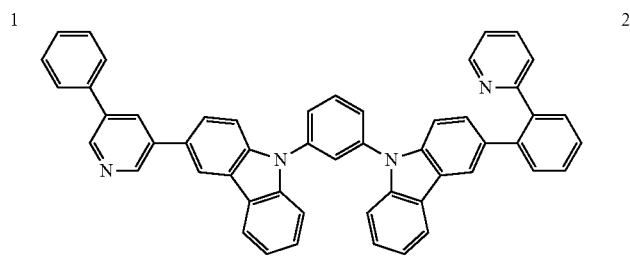

2

-continued
3
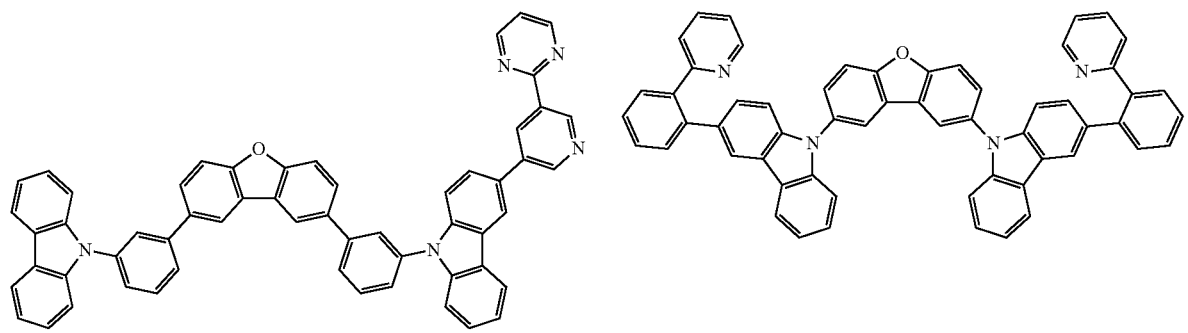
4
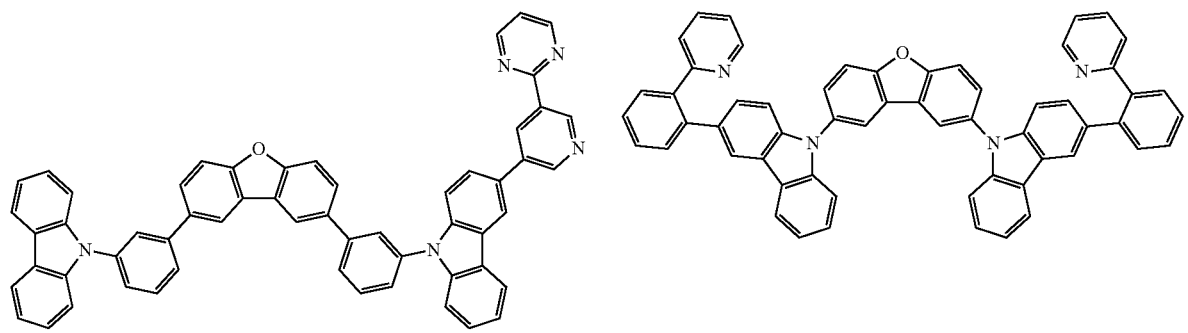
5
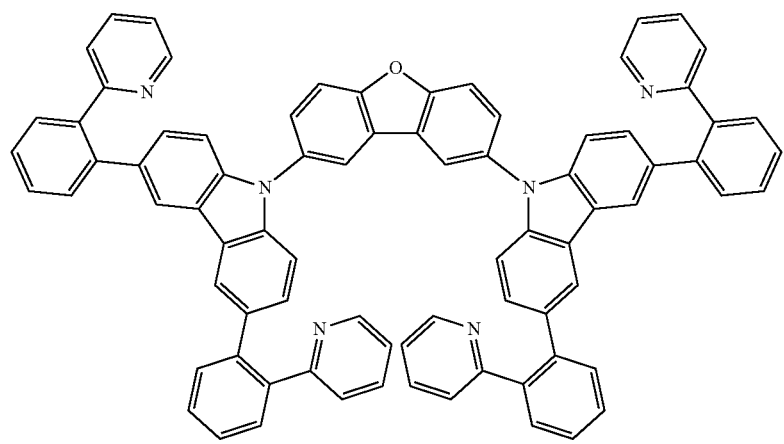
[Chem. 20]
6
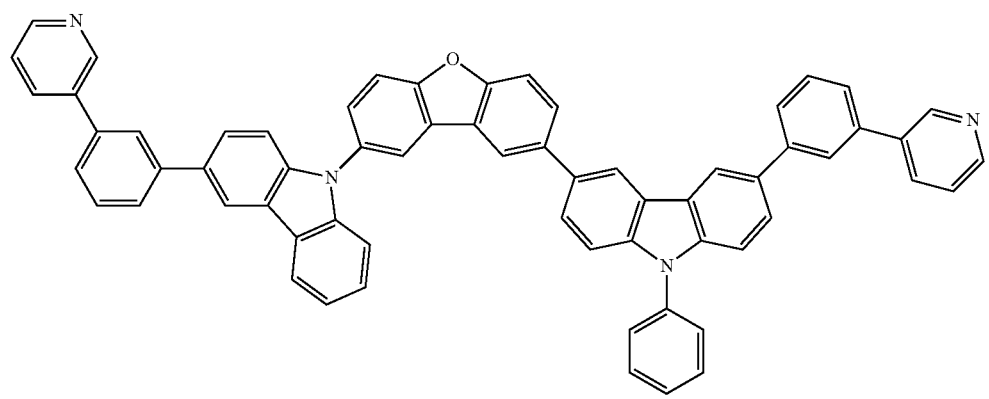
7
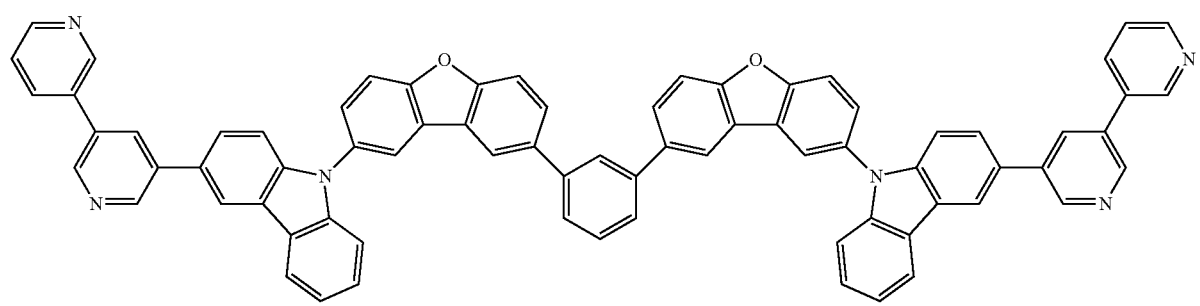

-continued
8
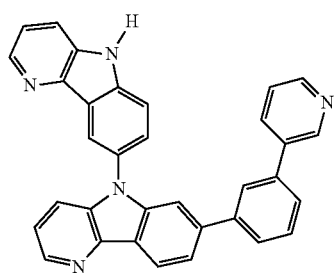
[Chem. 21]
9
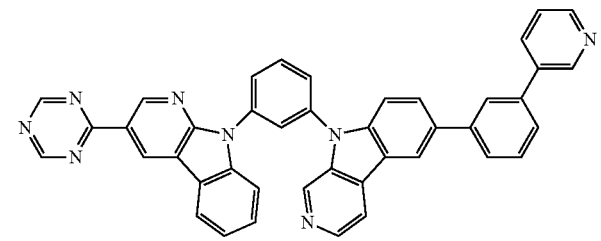
10
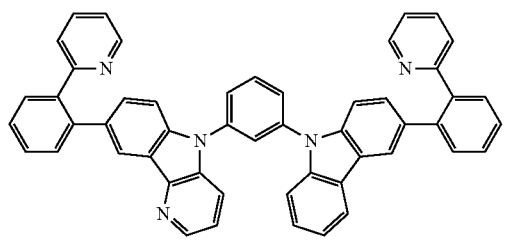
11
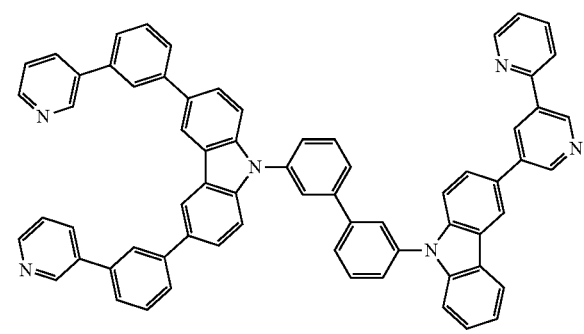
12
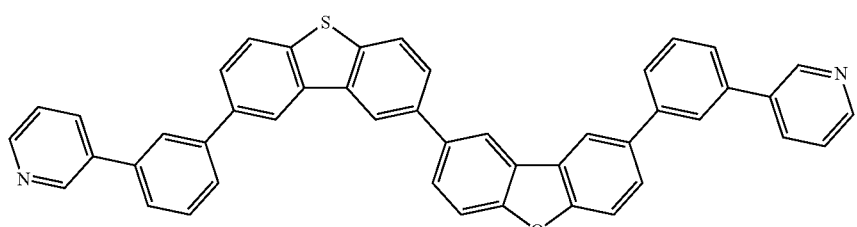
13
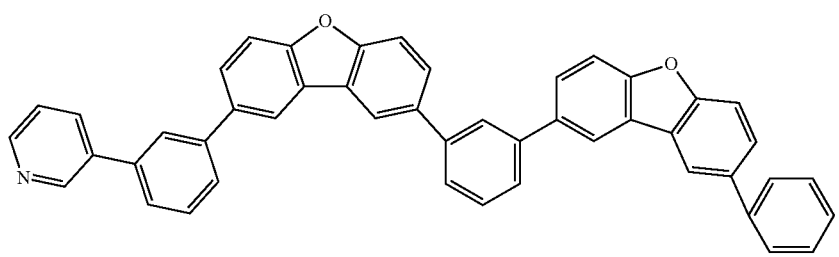
14
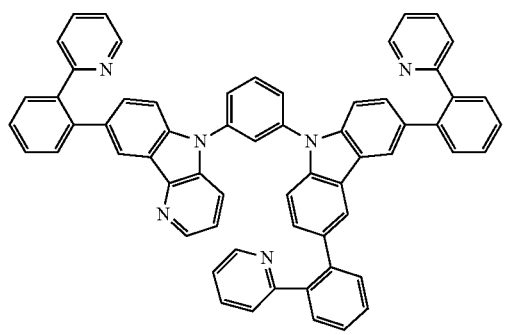
15
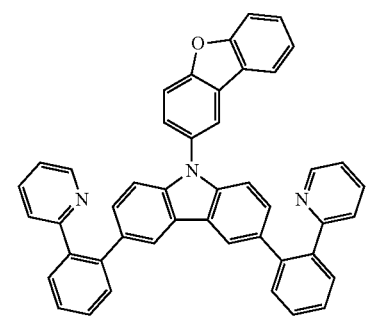

[Chem. 22]
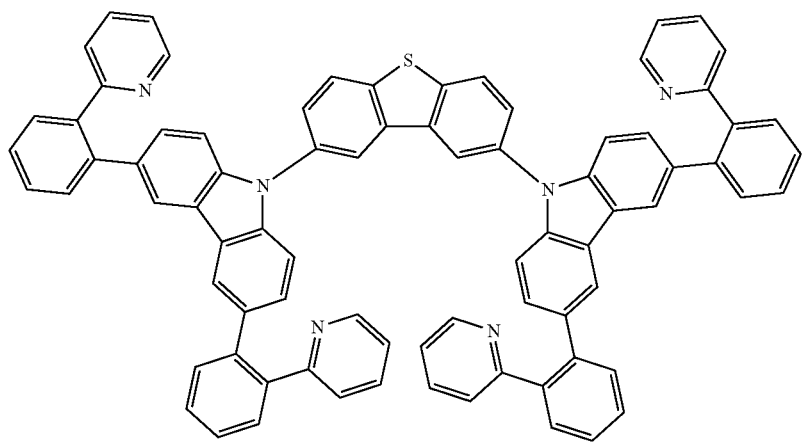
16
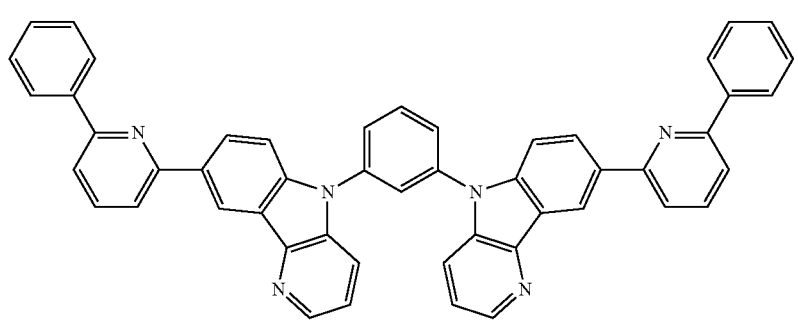
17
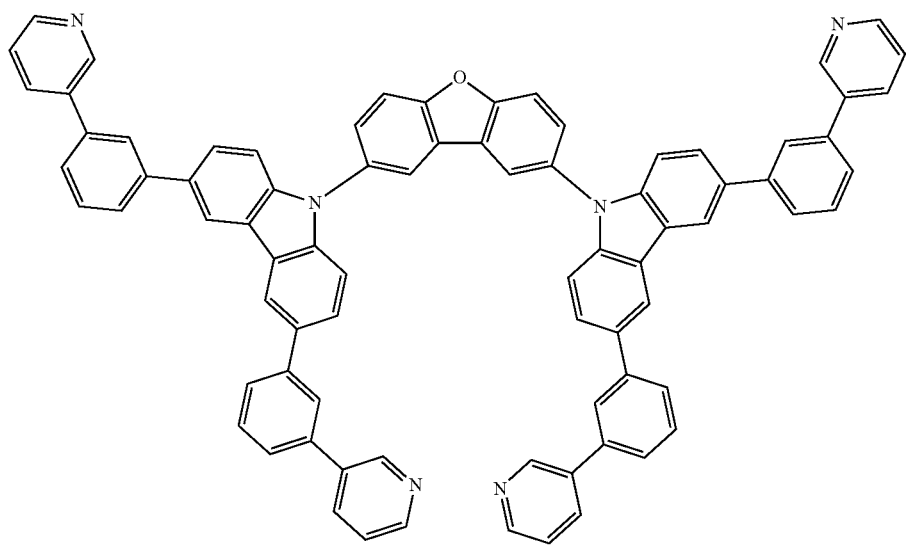
18
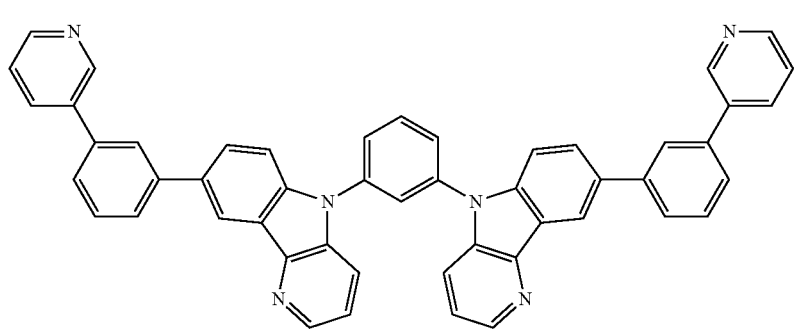
19

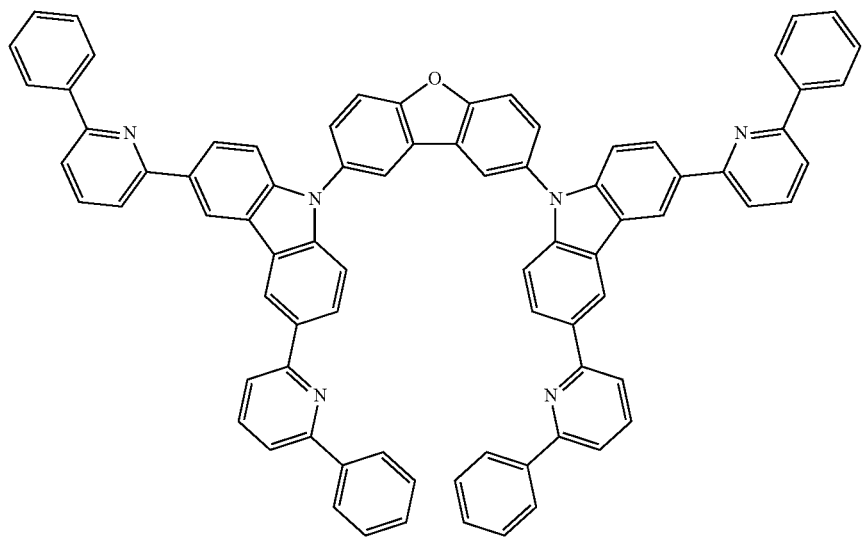
20
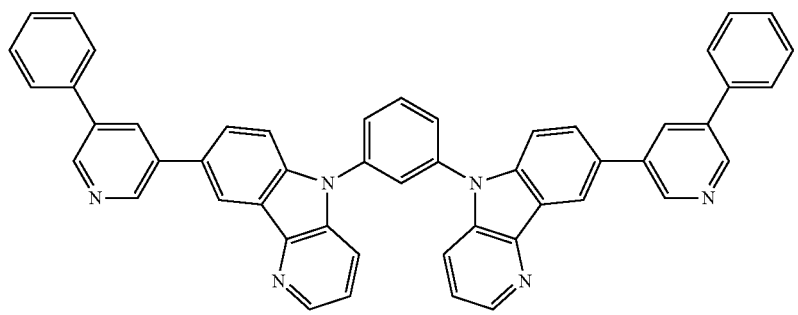
21
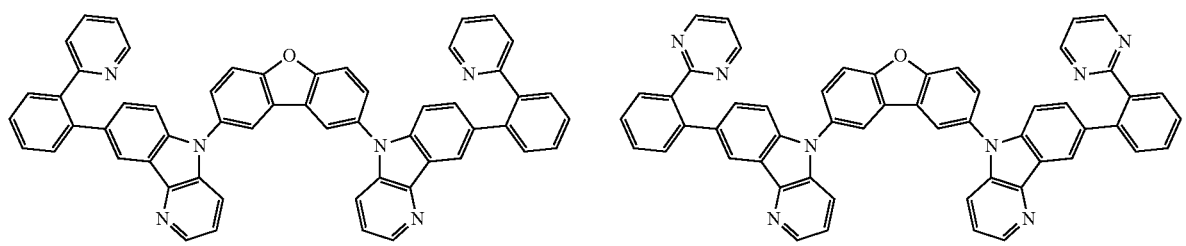
22  23
[Chem. 24]
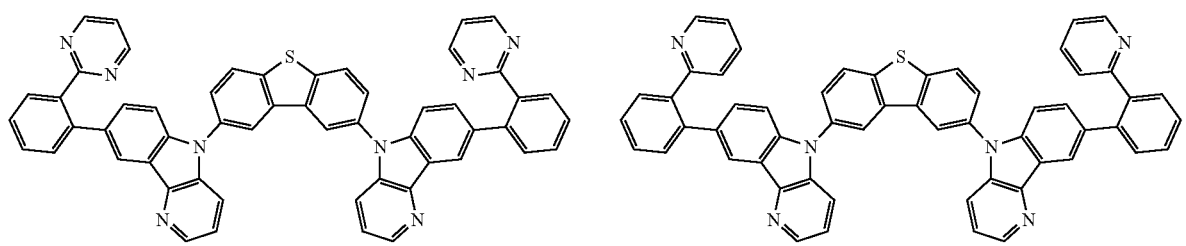
24  25

26
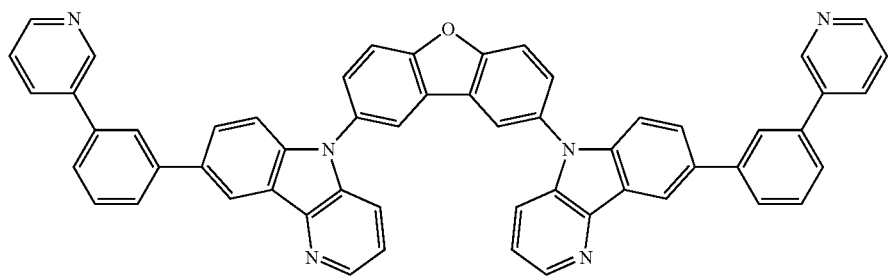
27
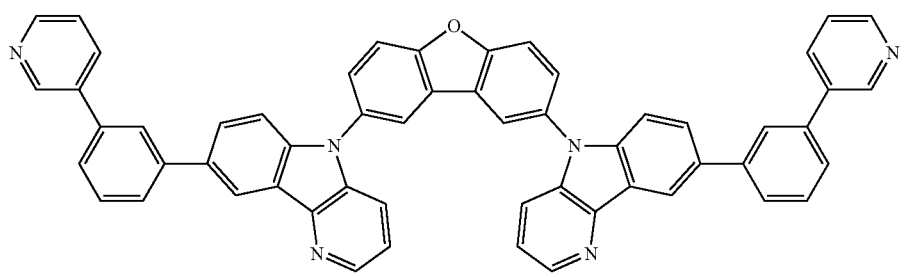
28
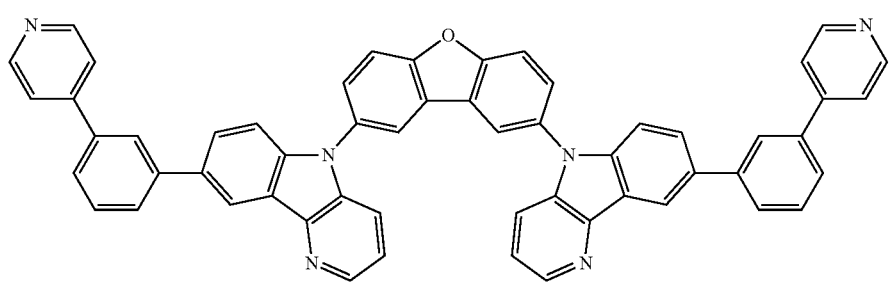
29
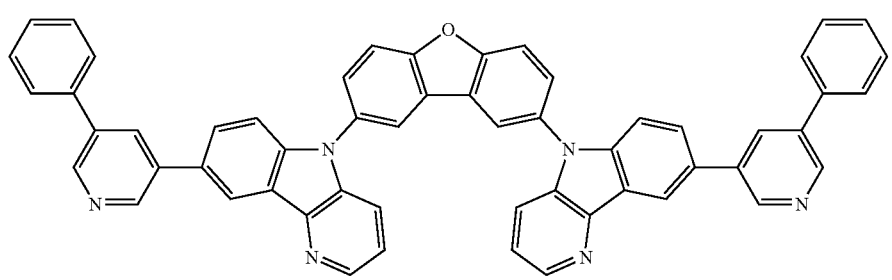
[Chem. 25]
30
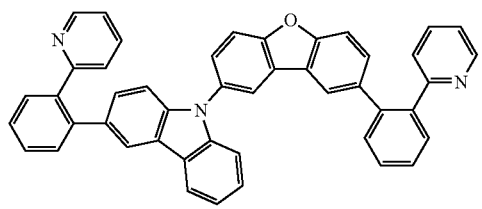
31
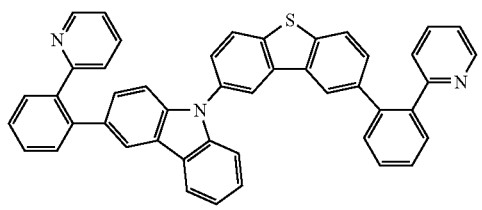

-continued
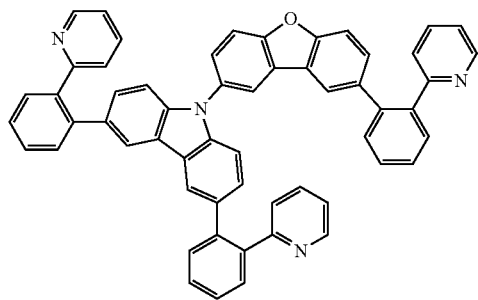
32
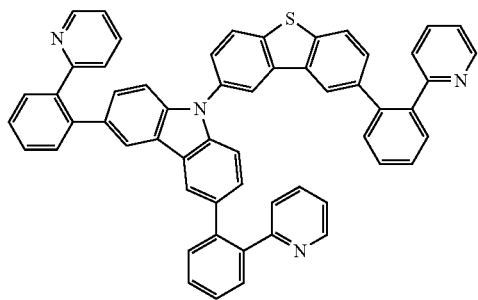
33
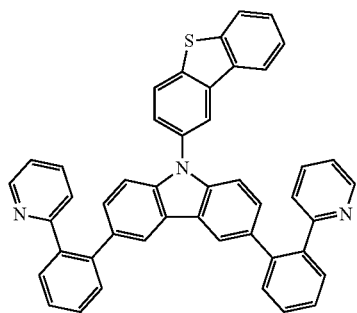
34
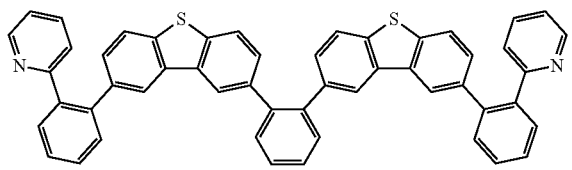
35
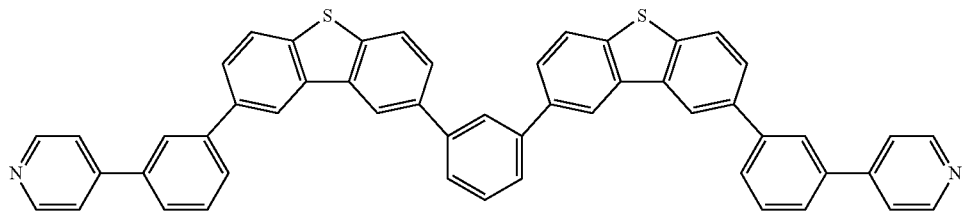
36
[Chem. 26]
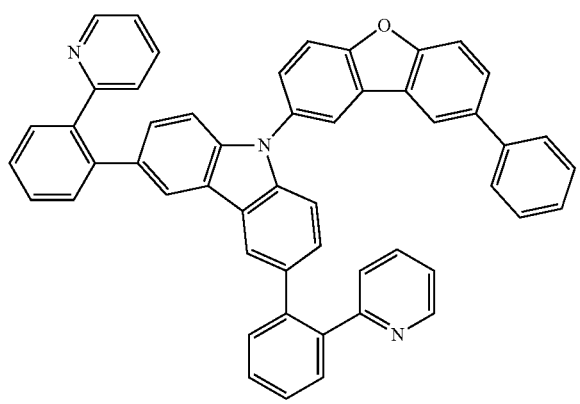
37
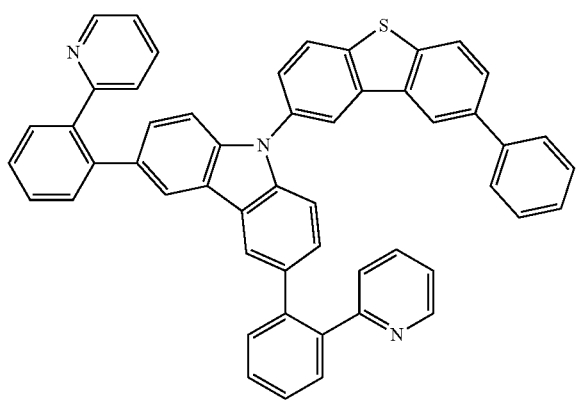
38

-continued
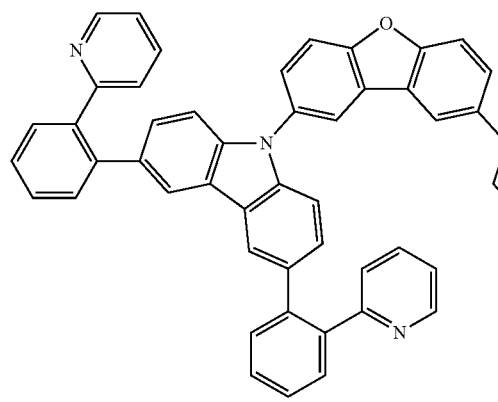
39
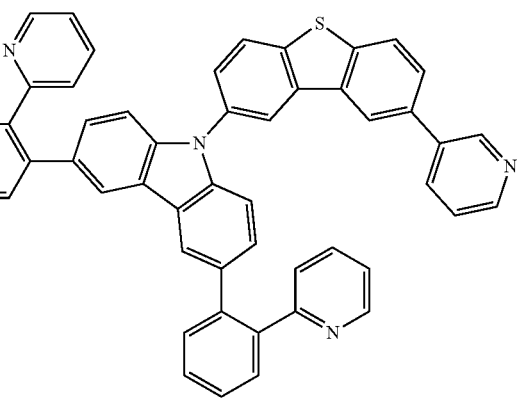
40
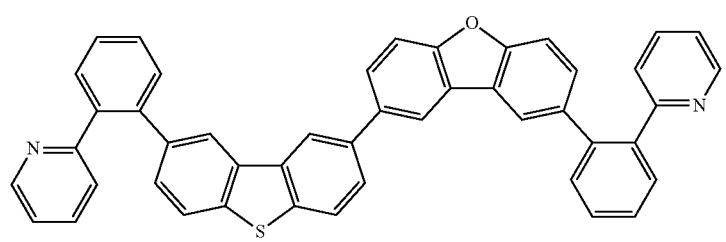
41
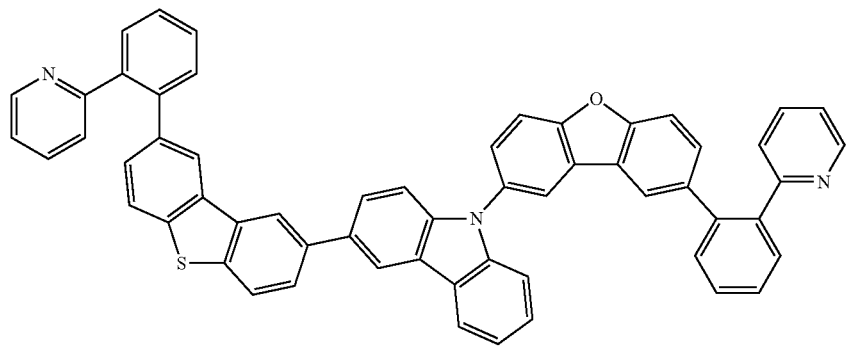
42
[Chem. 27]
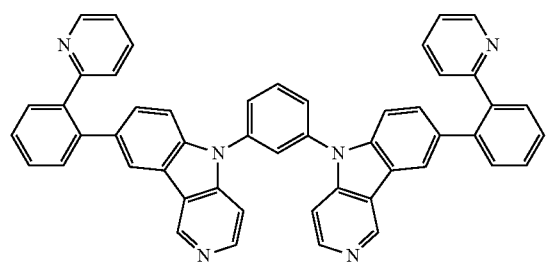
43
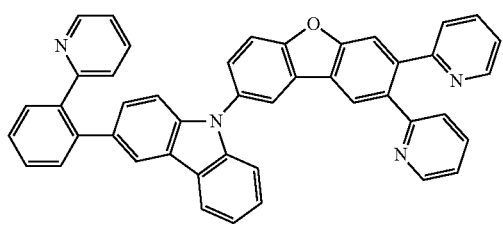
44

-continued
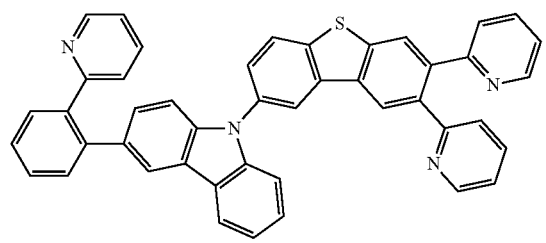
45
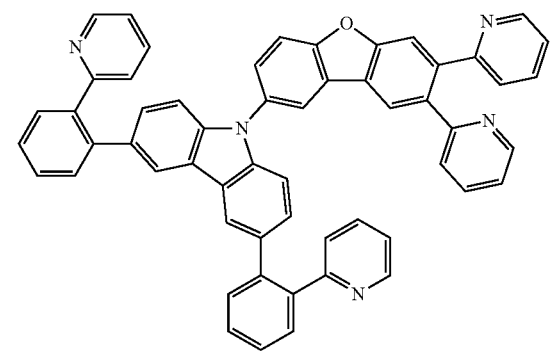
46
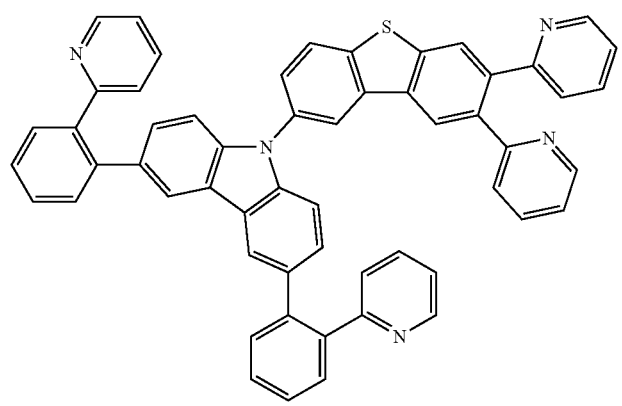
47
[Chem. 28]
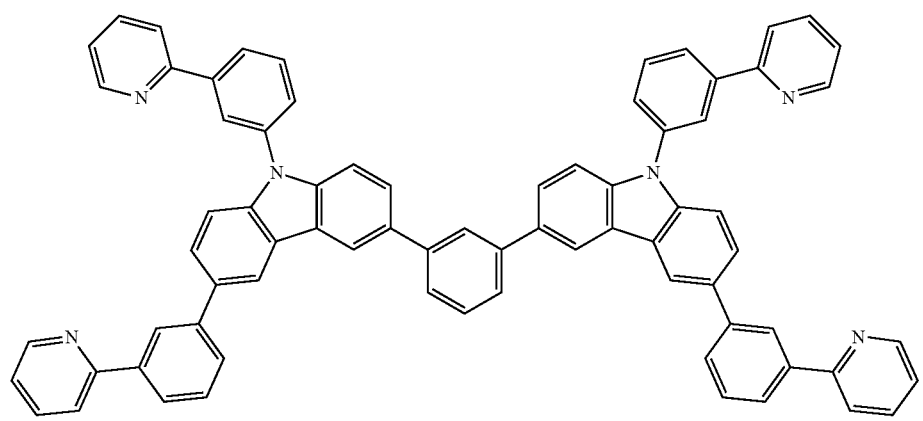
48
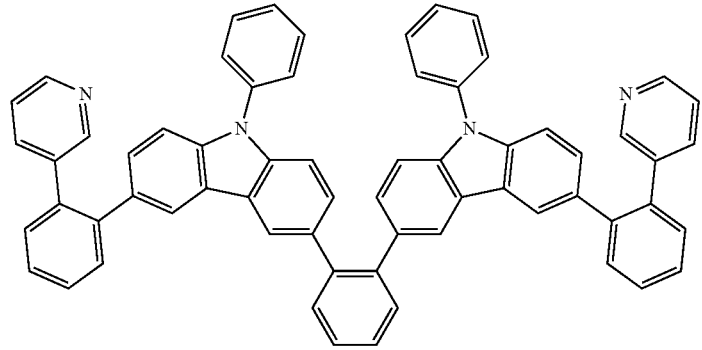
49

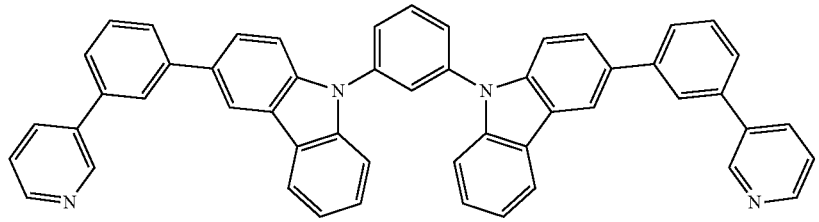
50
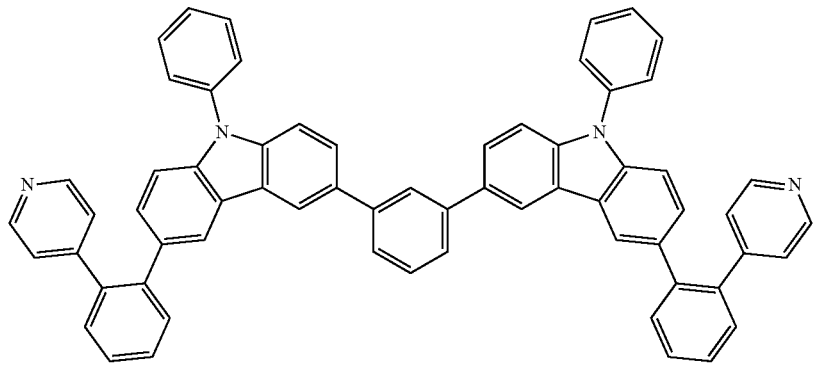
51
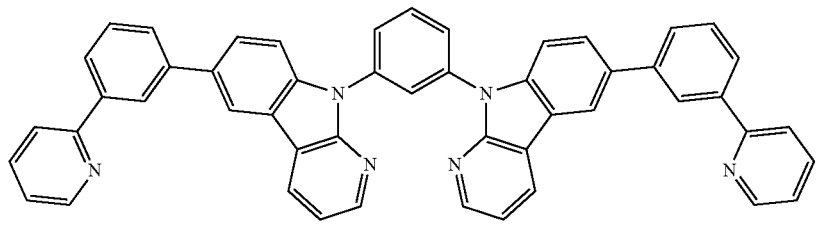
52
[Chem. 29]
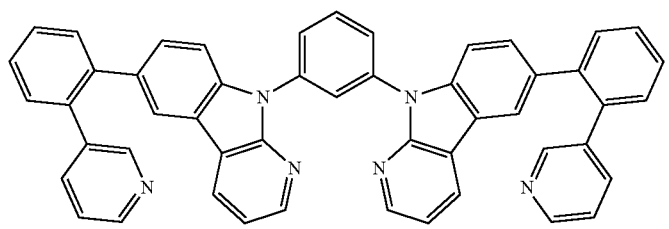
53
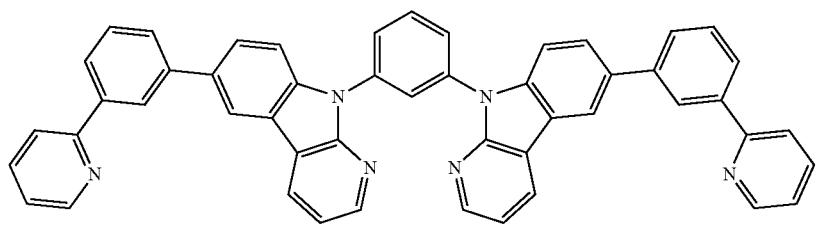
54
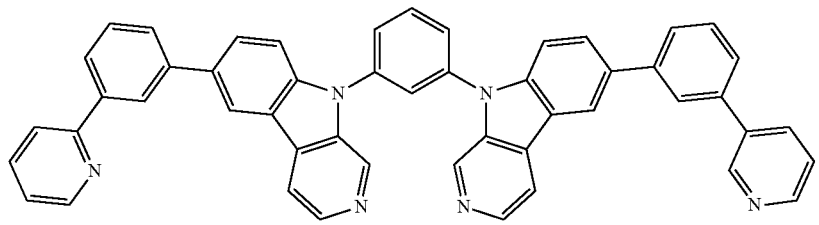
55

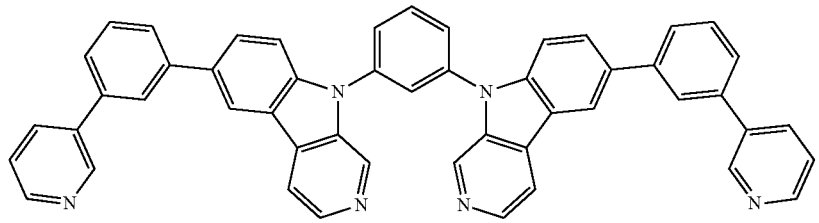
56
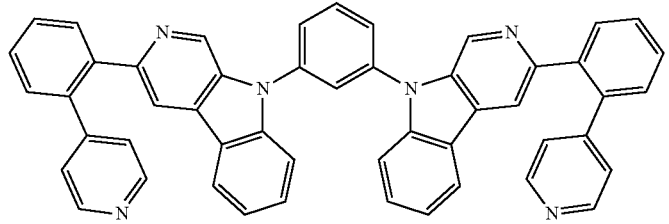
57
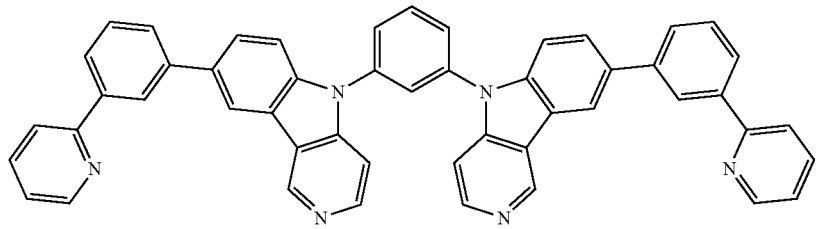
58
[Chem. 30]
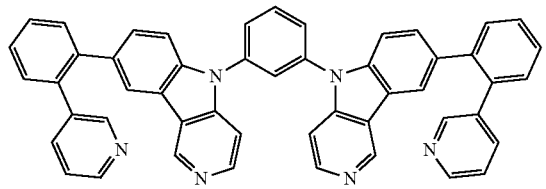
59
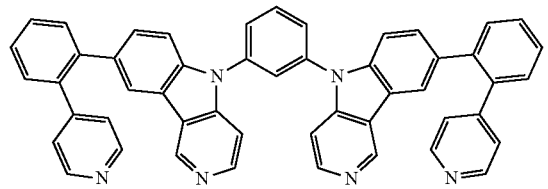
60
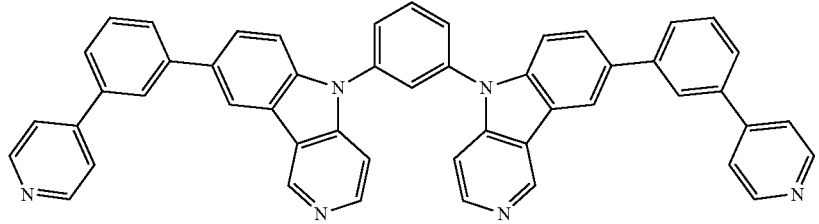
61
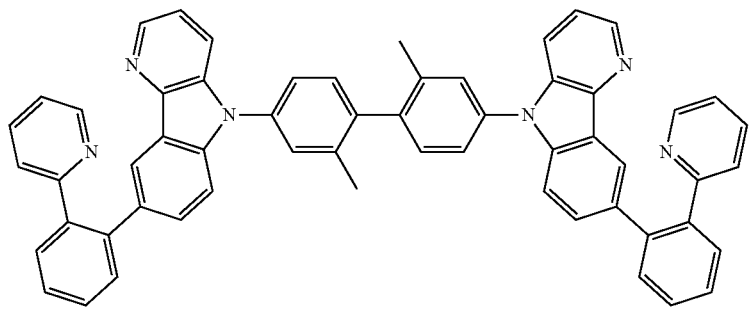
62

-continued
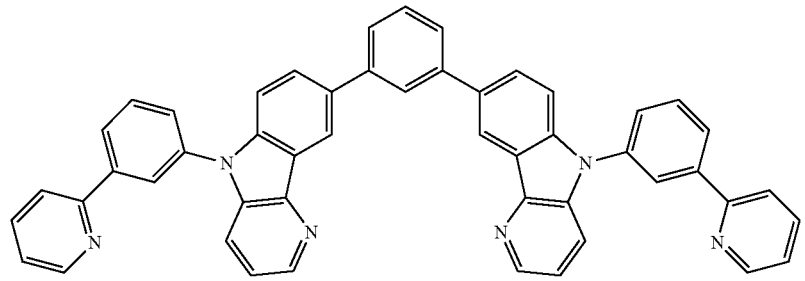
63
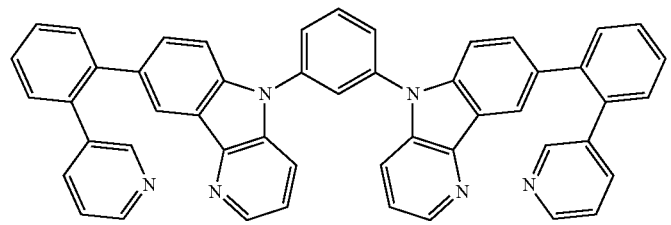
64
[Chem. 31]
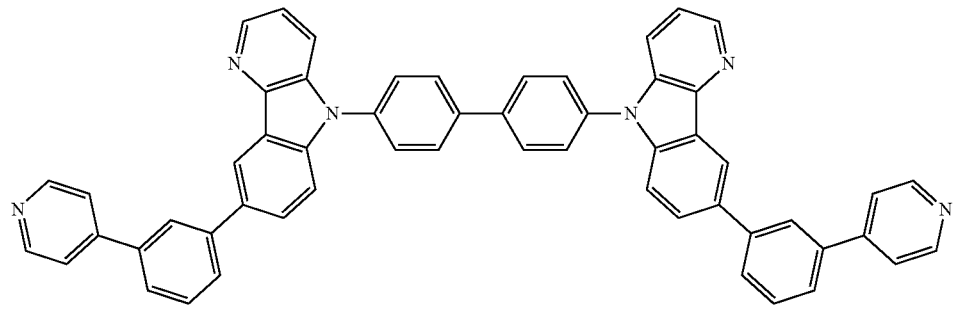
65
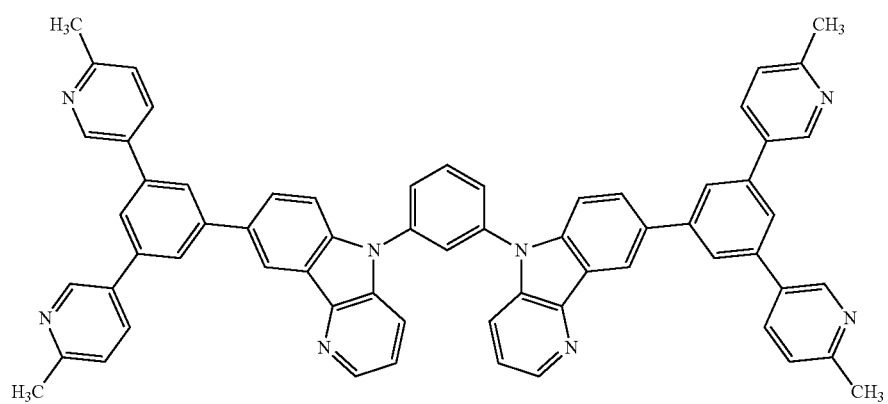
66

67
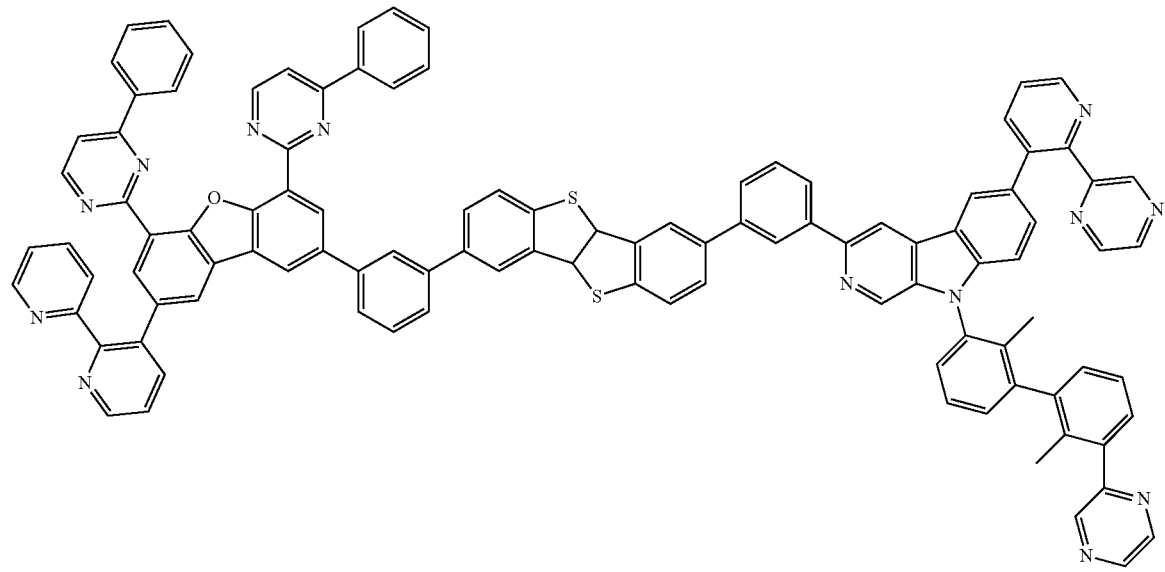
[Chem. 32]
68
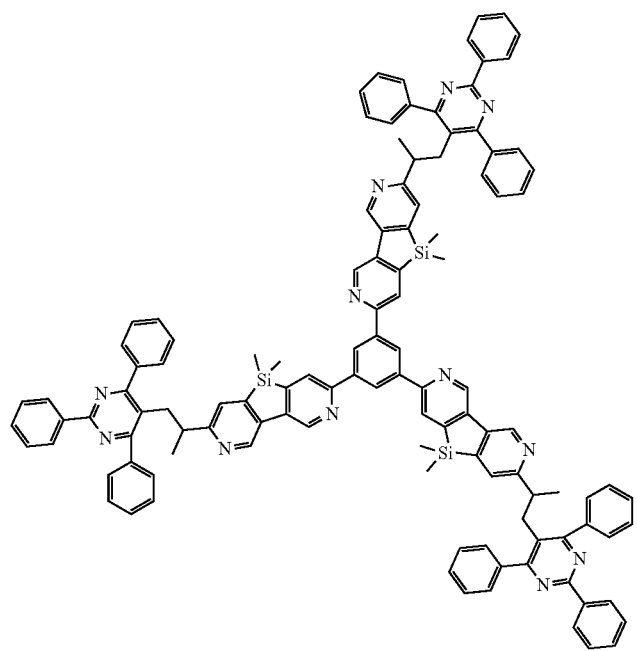

-continued
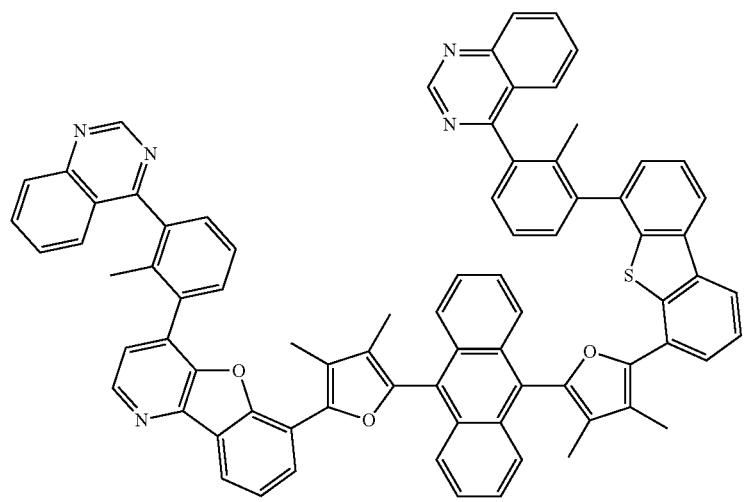
69
[Chem. 33]
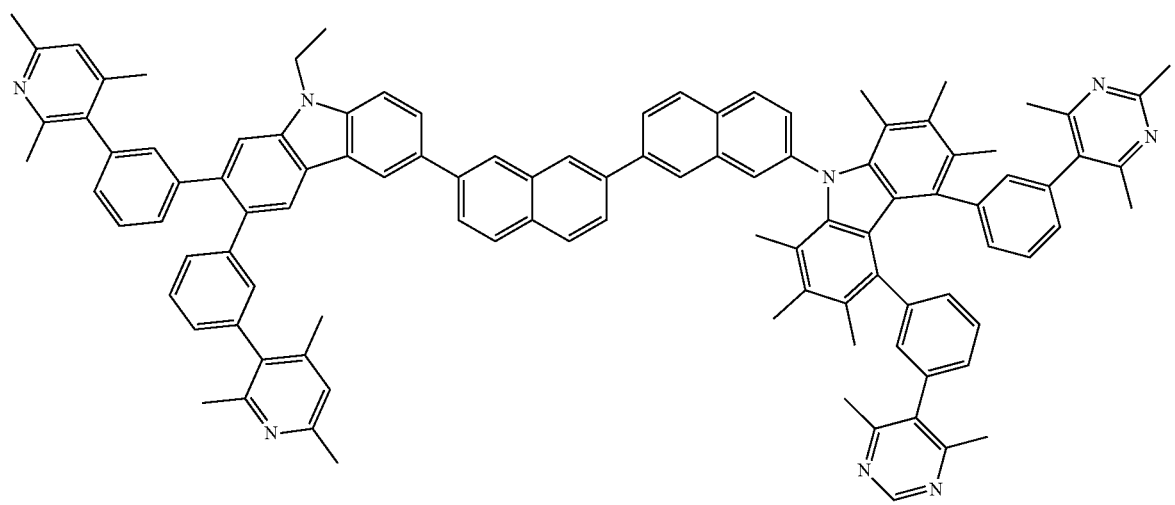
70
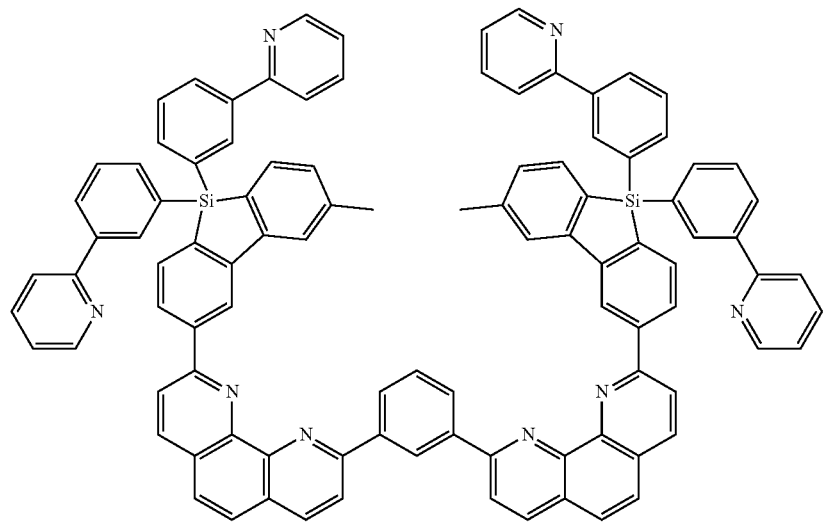
71

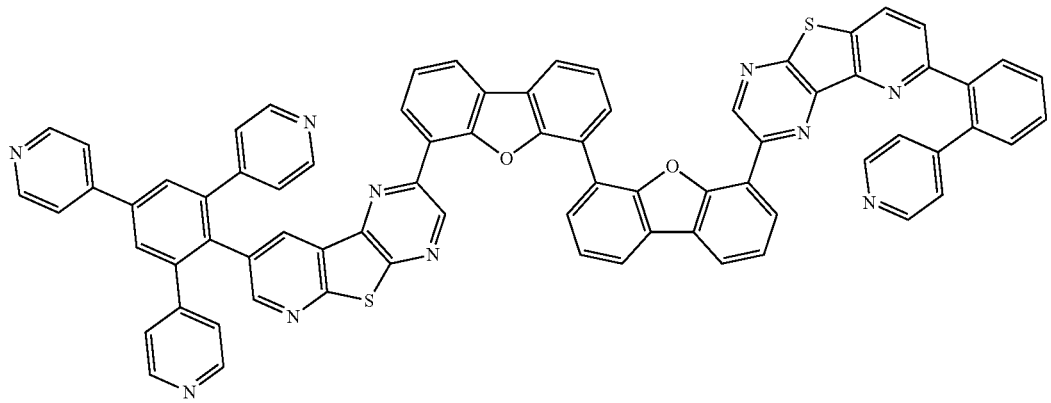
72
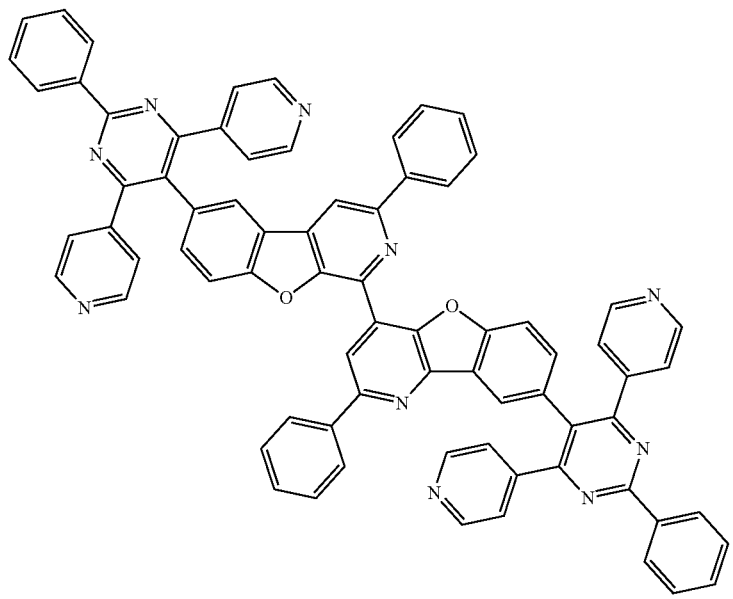
73
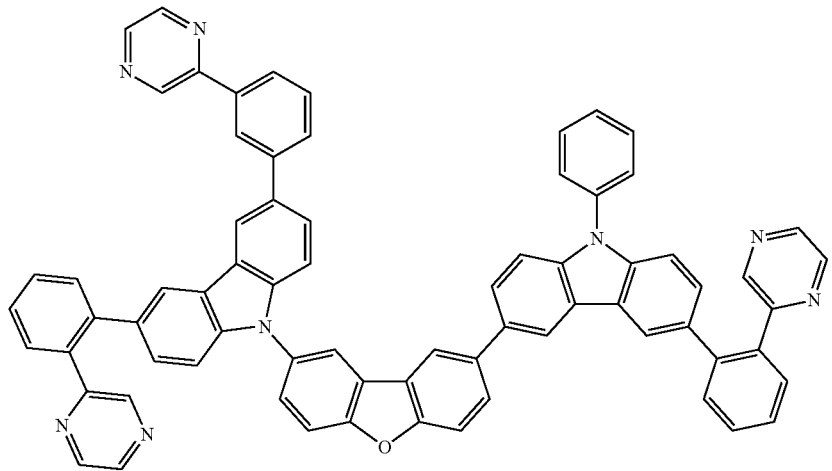
74
[Chem. 34]

-continued
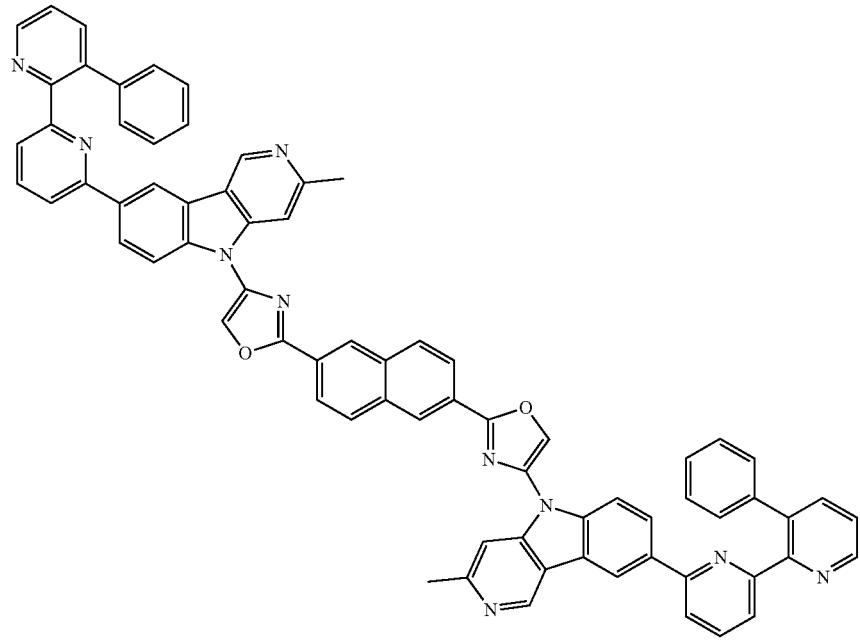
75
[Chem. 35]
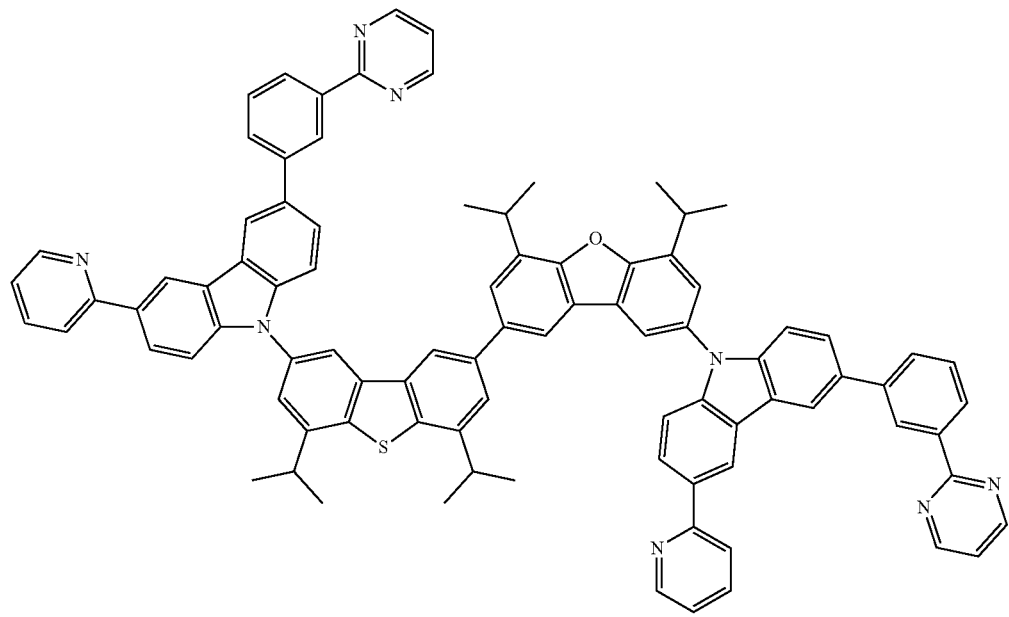
76

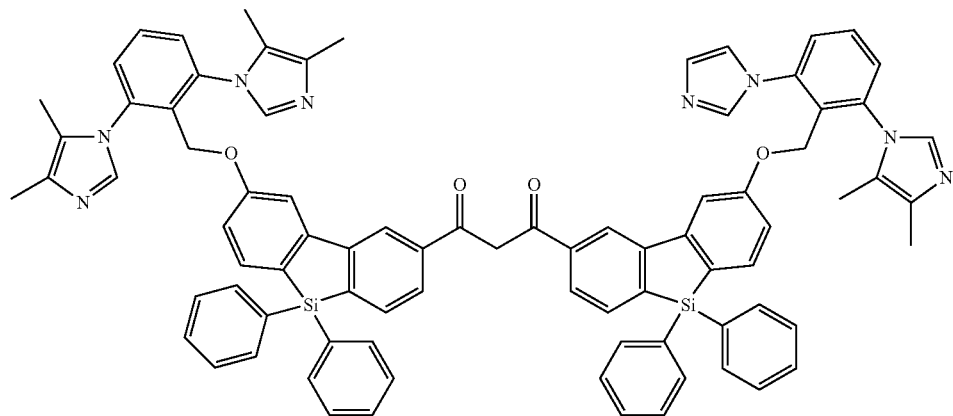
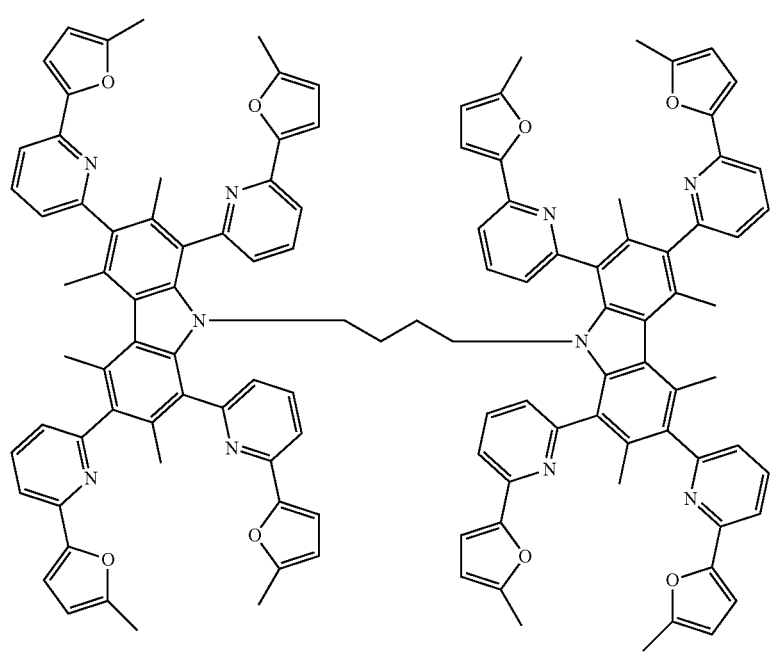

[Chem. 36]
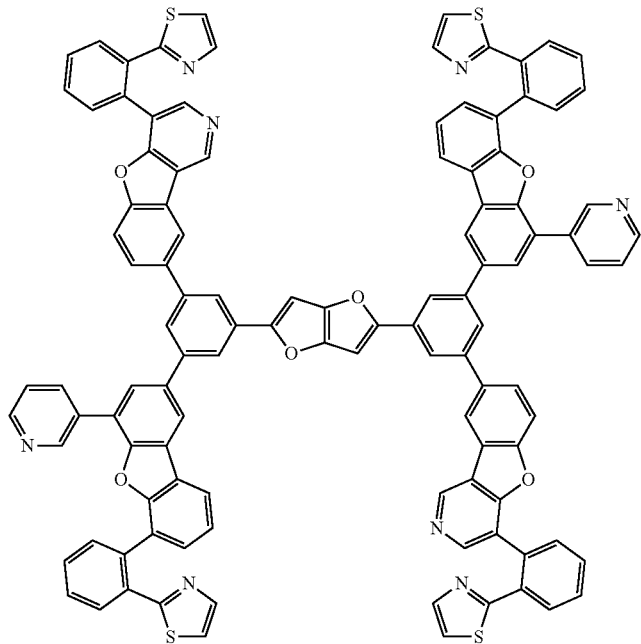
79
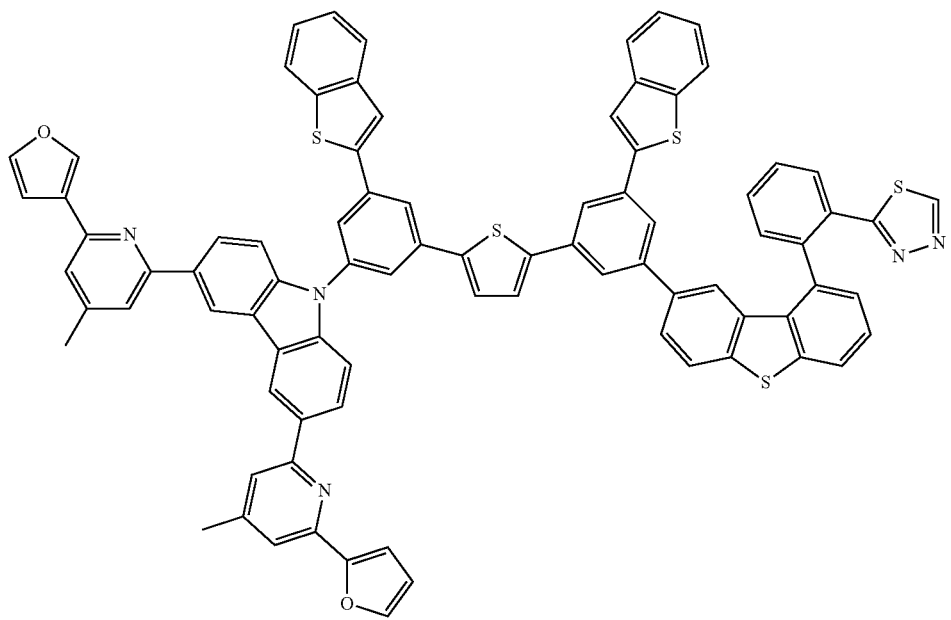
80

[Chem. 37]
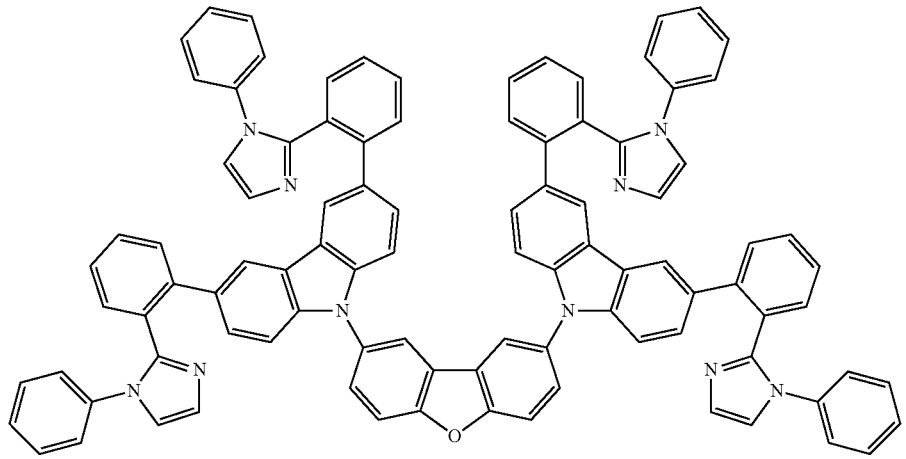
81
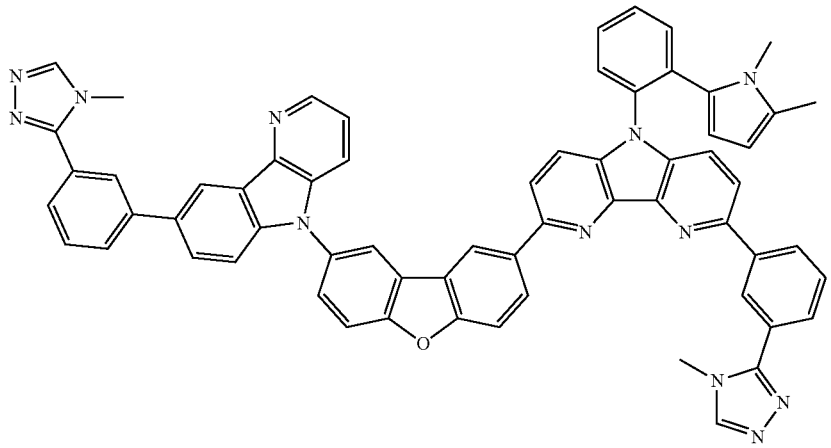
82
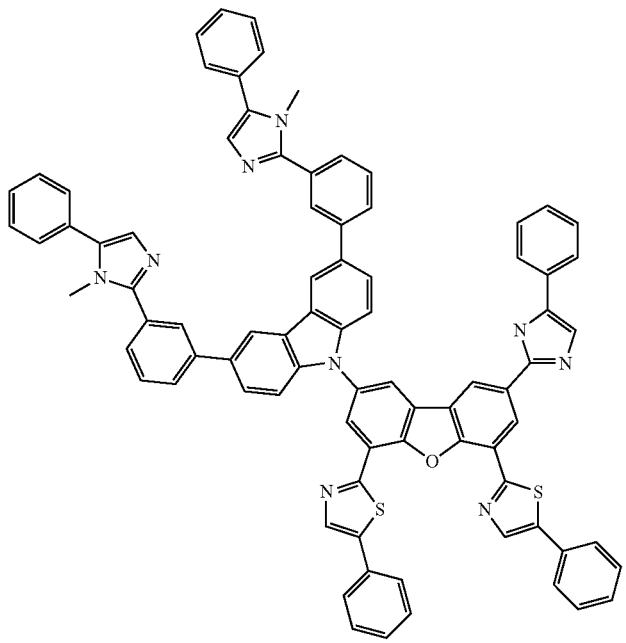
83

-continued
[Chem. 38]
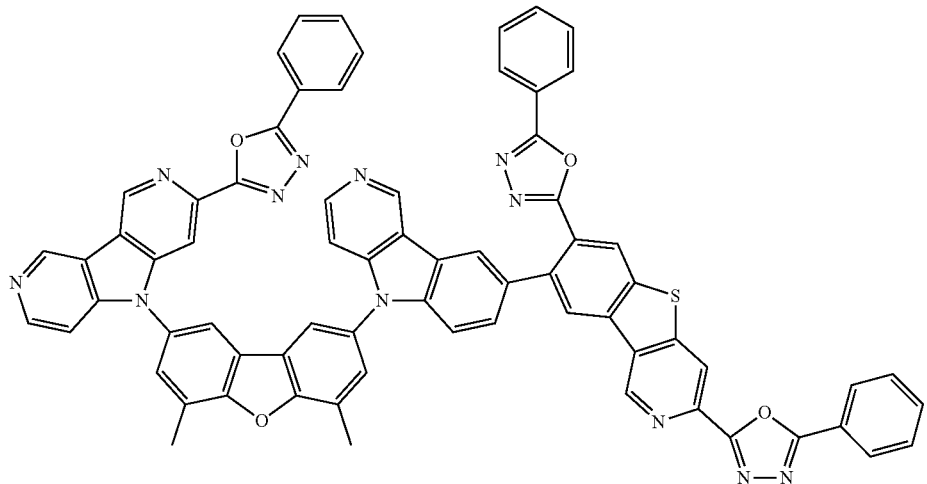
84
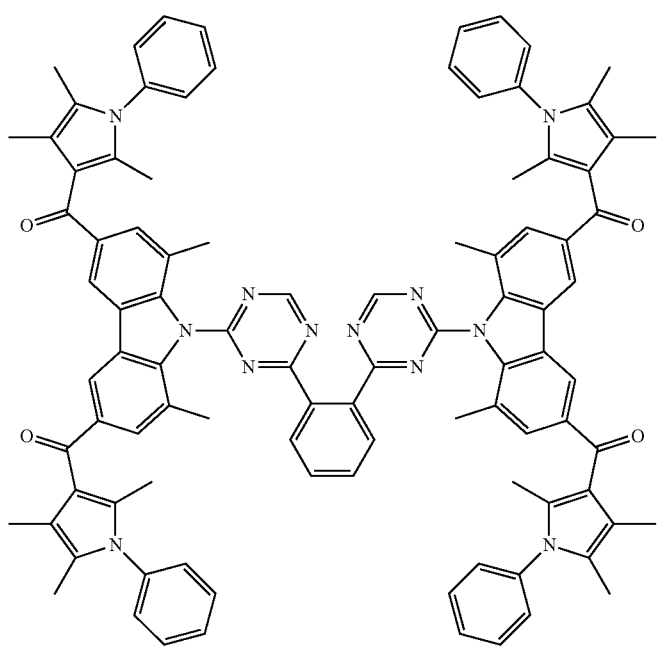
85

[Chem. 39]
86
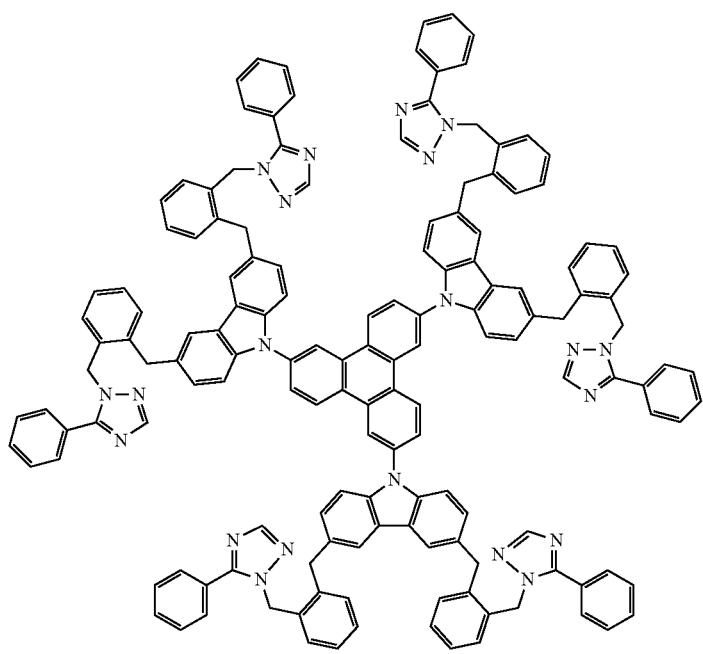
87
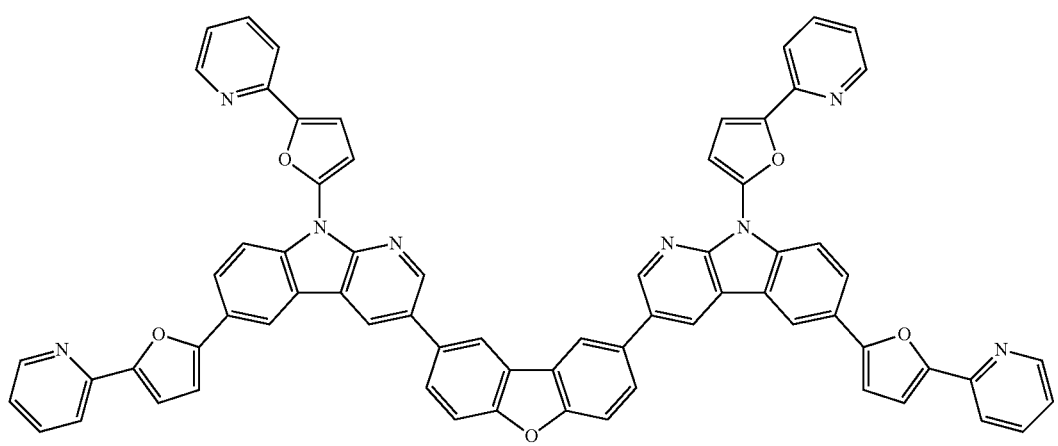
88
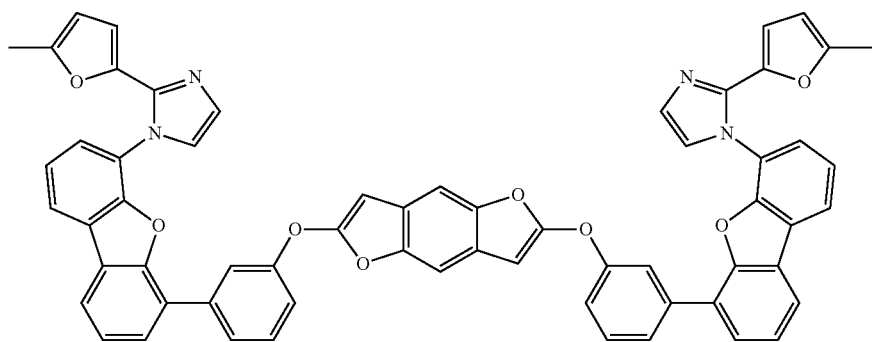

[Chem. 40]
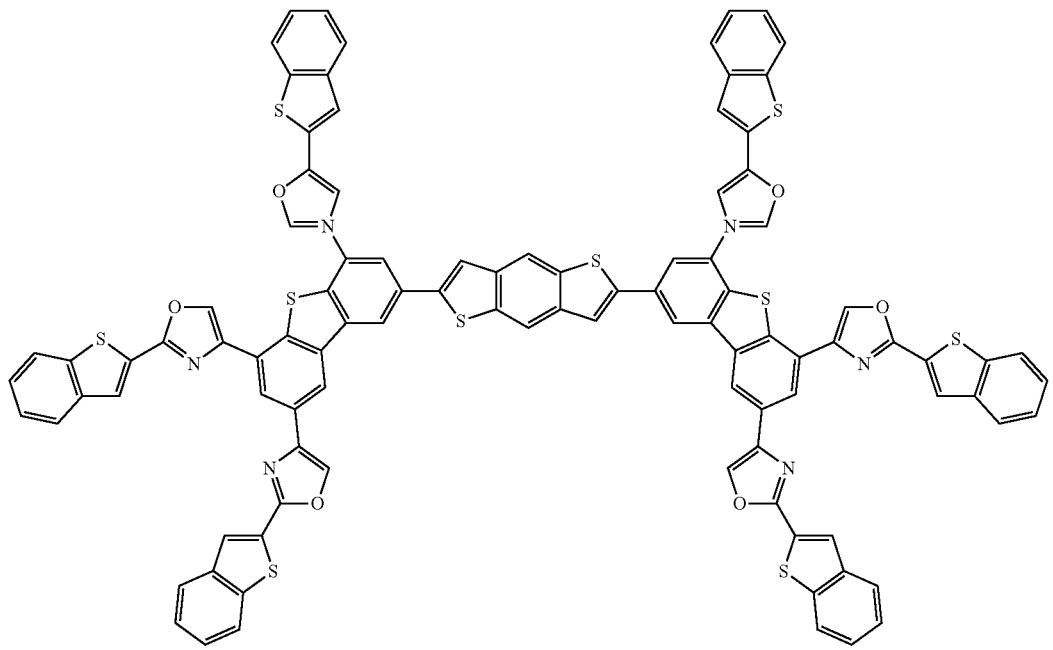
89
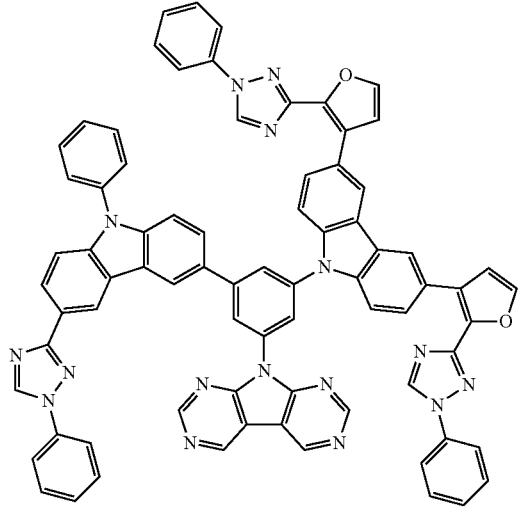
90
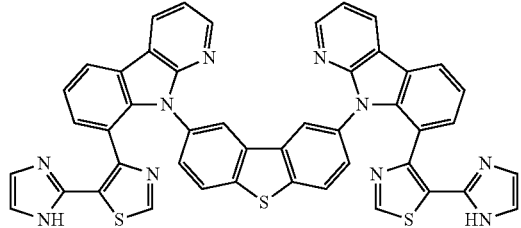
91

92
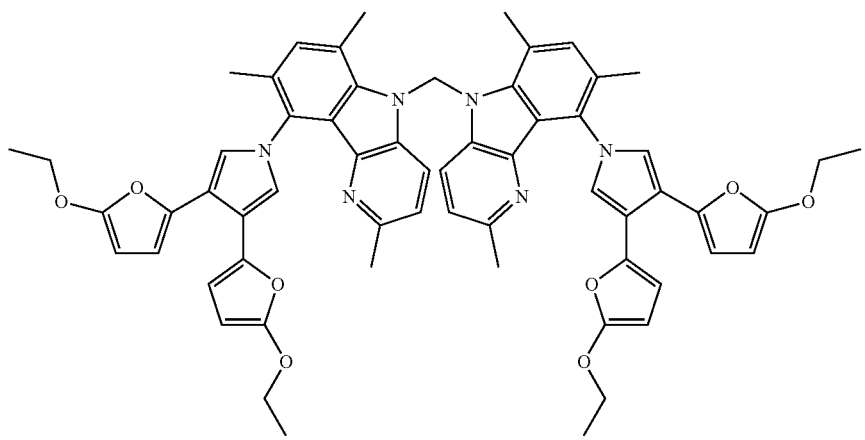
93
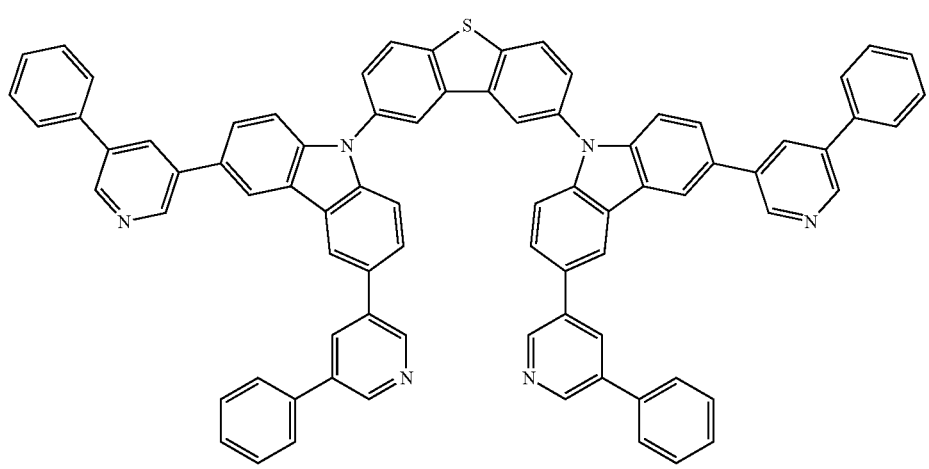
94
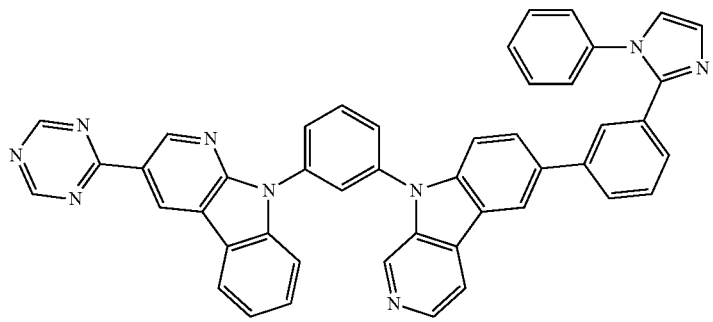
95
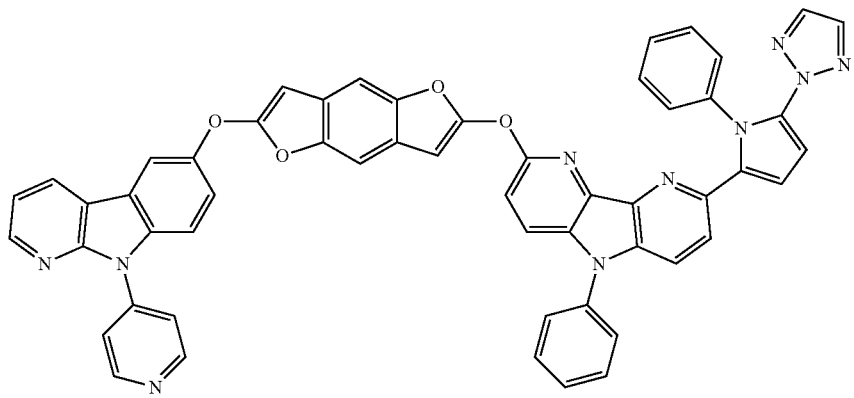

[Chem. 42]
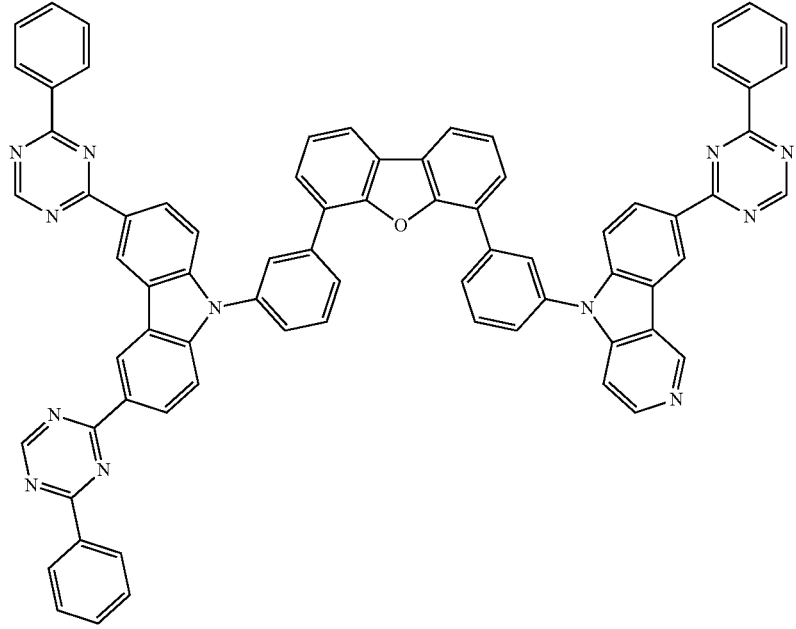
96
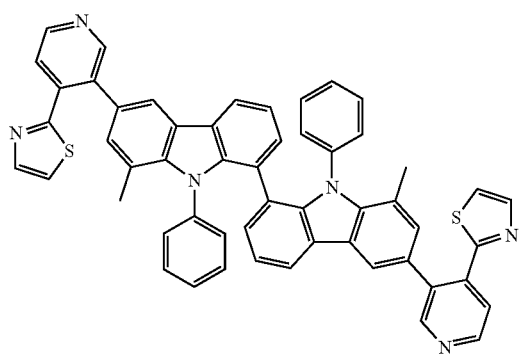
97
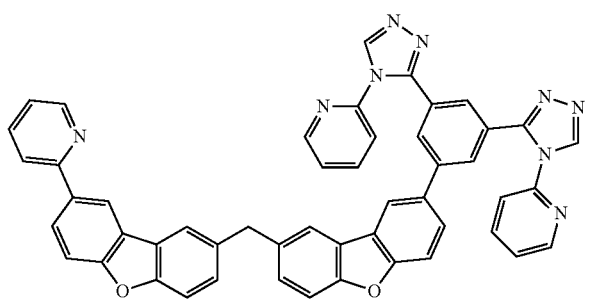
98
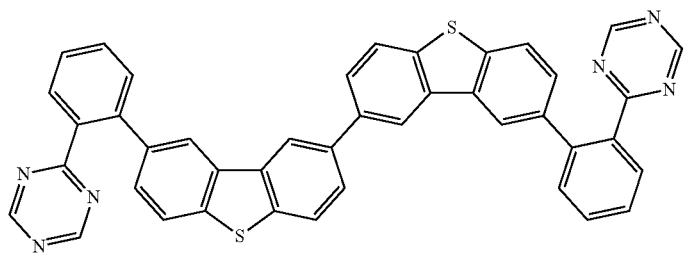
99

[Chem. 43]
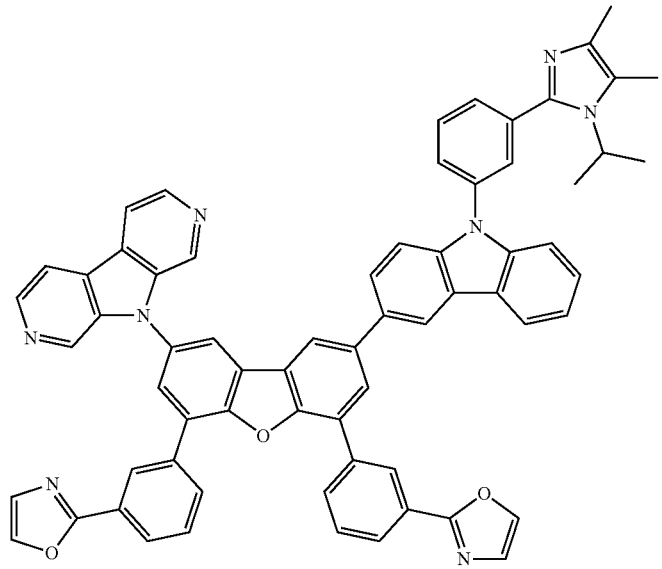
100
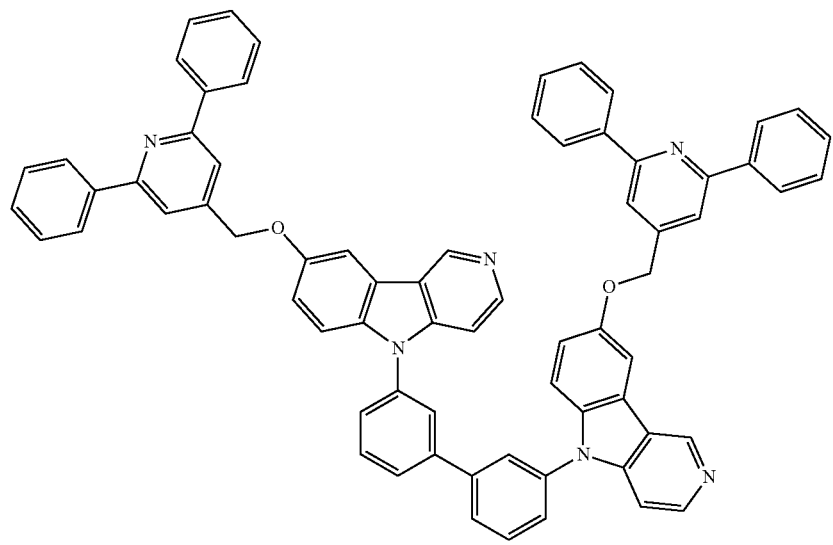
101

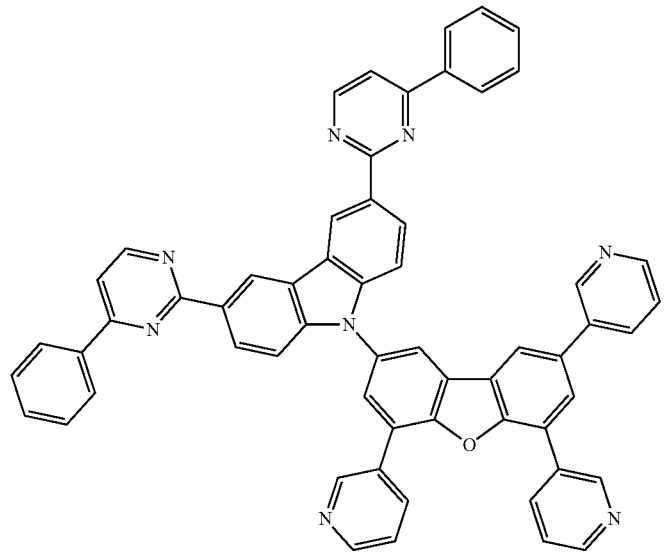
102
[Chem. 44]
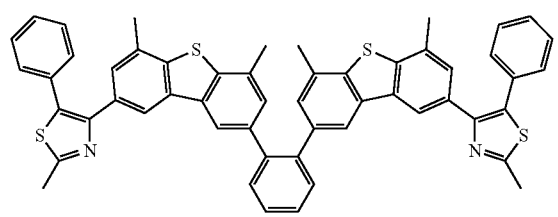
103
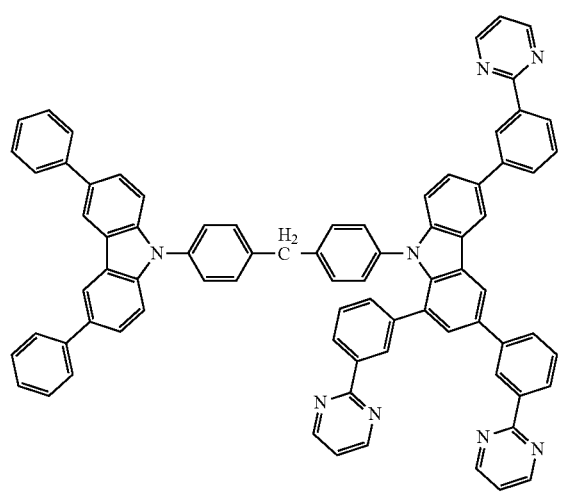
104
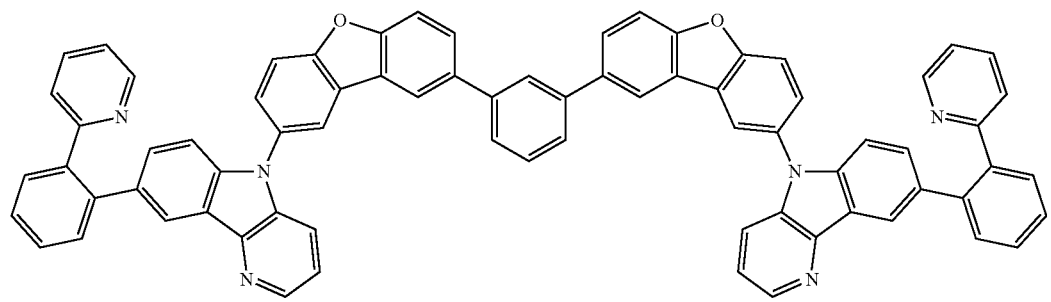
105

106
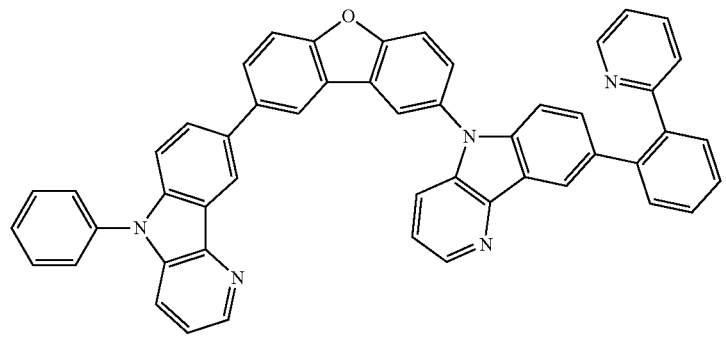
107
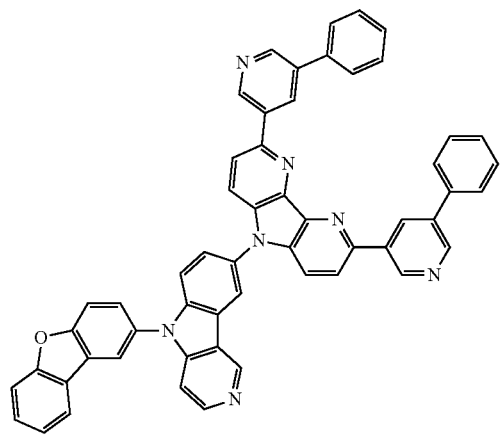
108
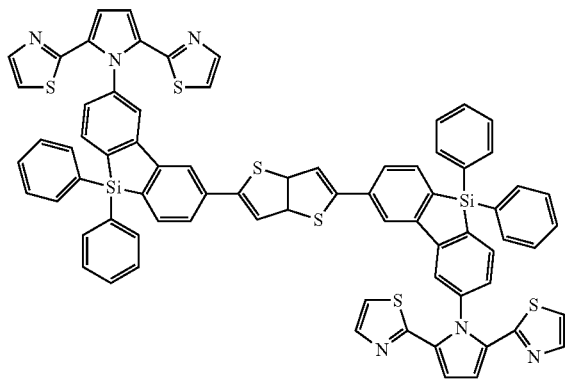
109
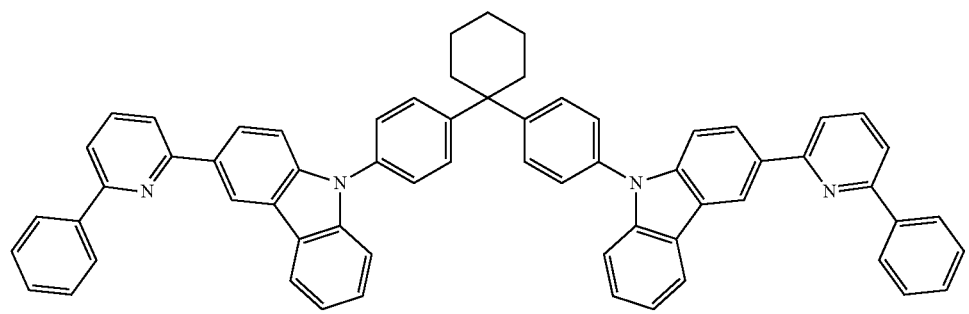
110
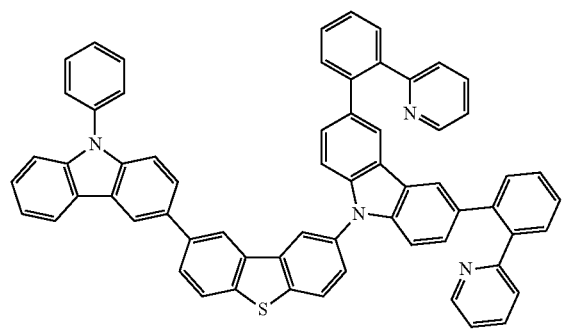
111
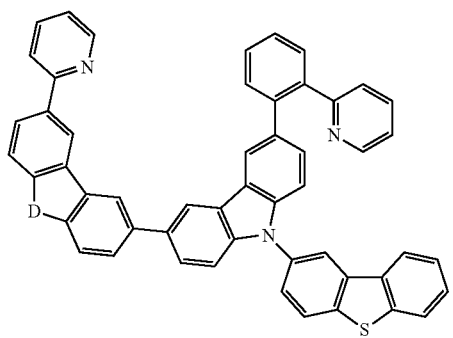

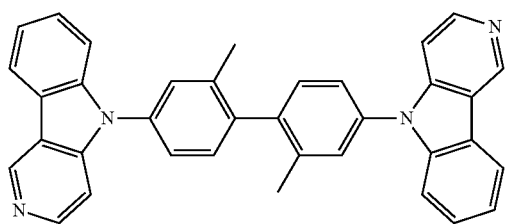
112
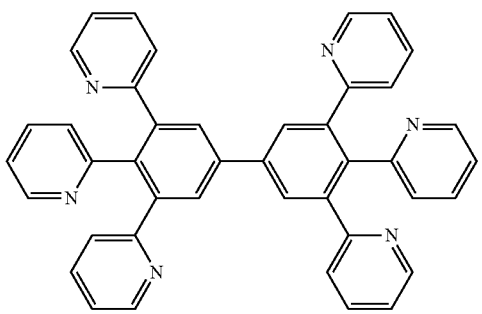
113
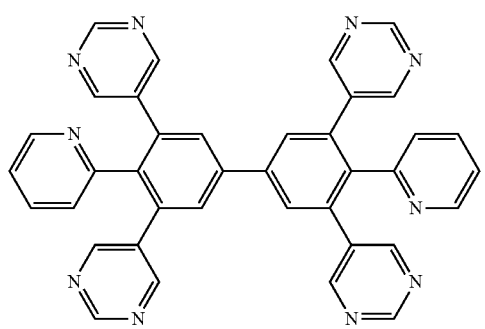
114
[Chem. 47]
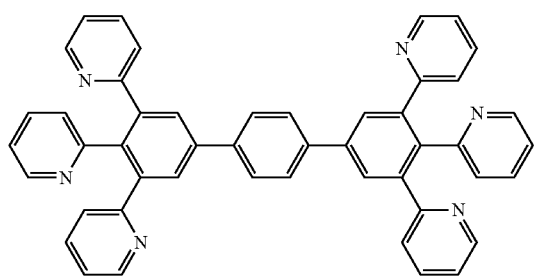
115
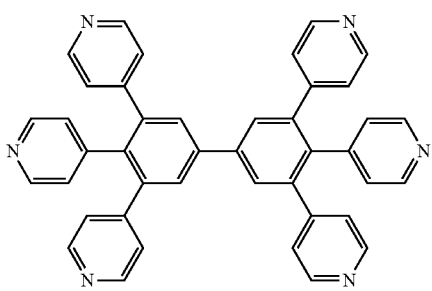
116
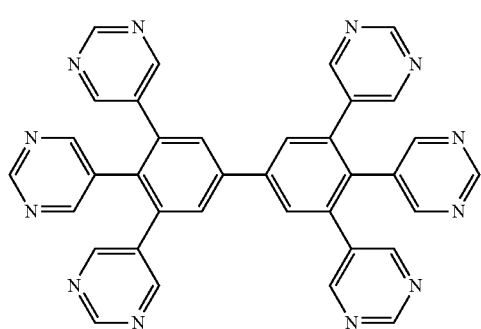
117
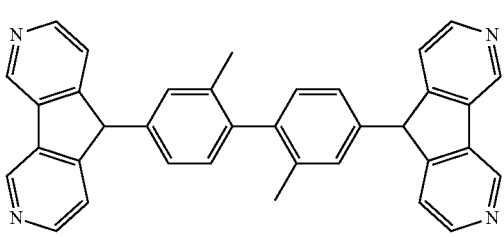
118

-continued
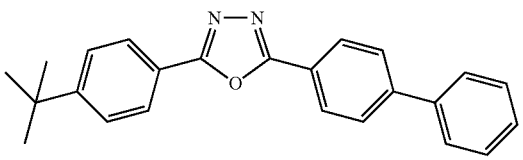
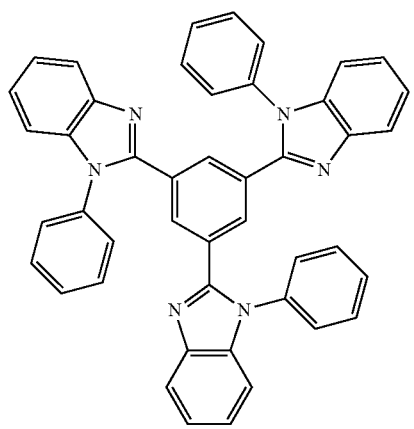
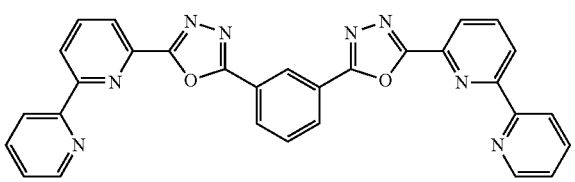
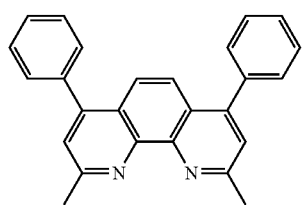
[Chem. 48]
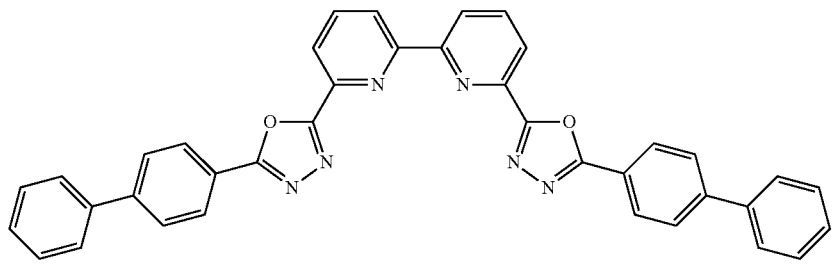
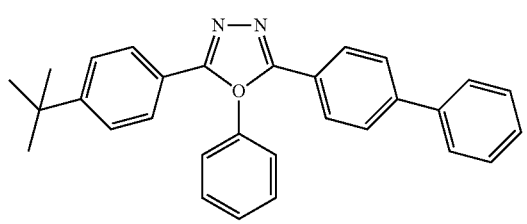
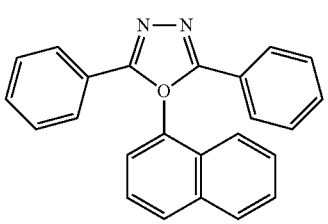
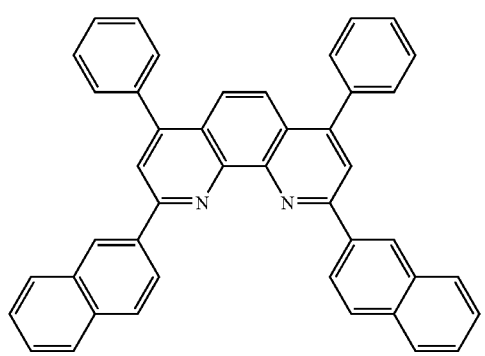

127
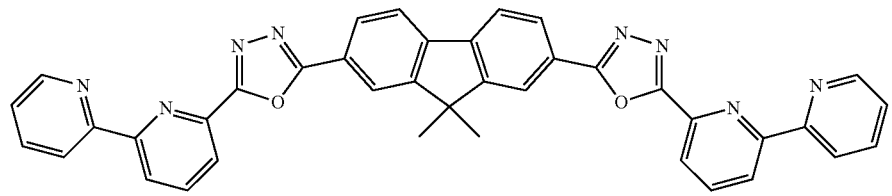
128
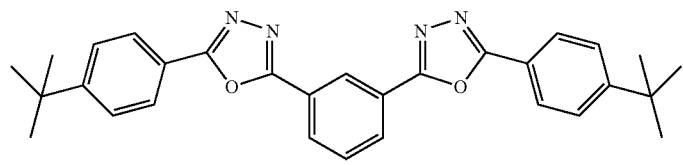
[Chem. 49]
129
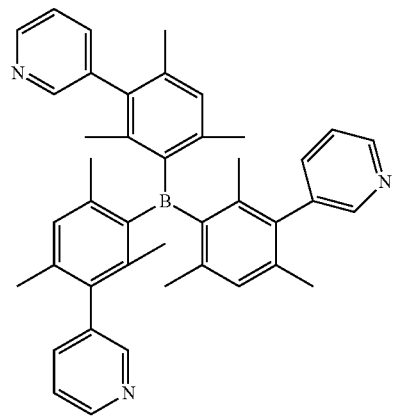
130
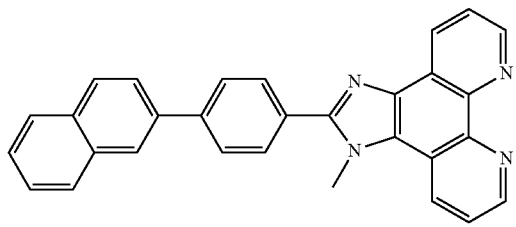
131
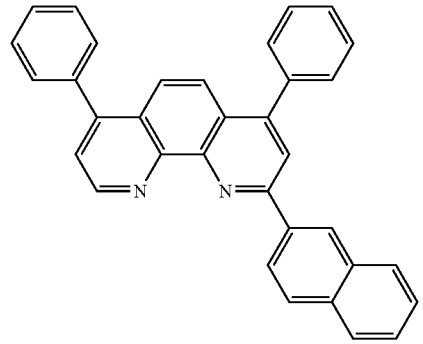
132
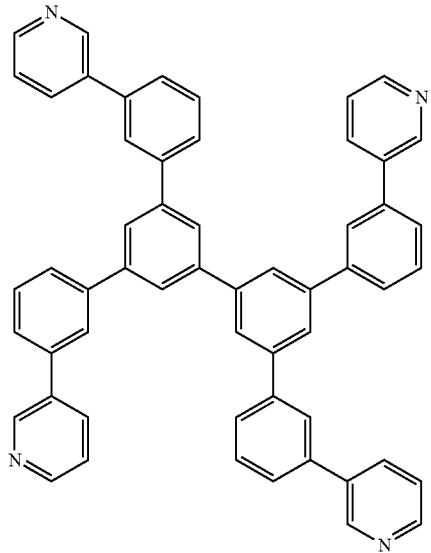

133

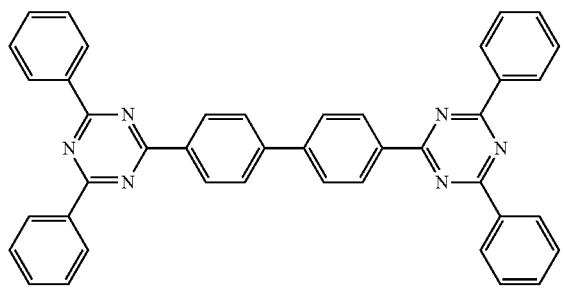

134

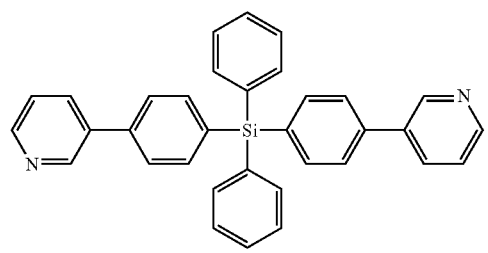

[Synthetic Example of Compound]

Hereinafter, as a synthetic example of a typical compound, a specific synthetic example of Compound 5 will be described, but the present invention is not limited thereto.

[Chem. 50]

Synthesis of Compound 5

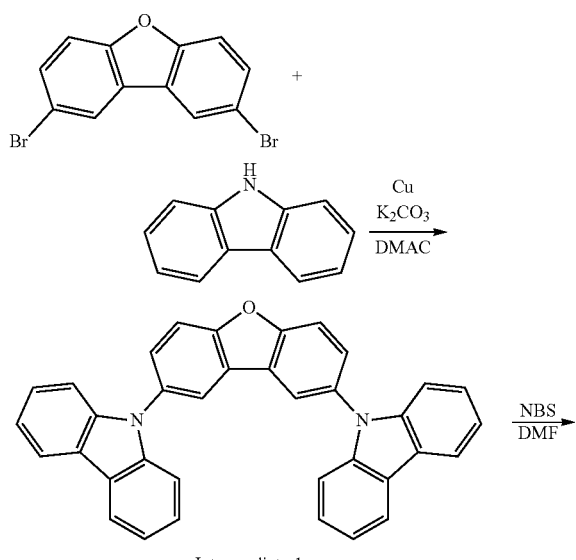

-continued

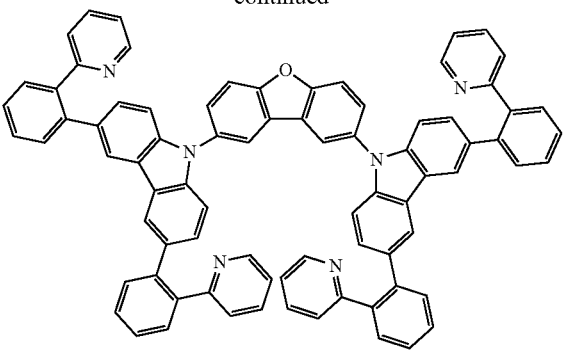

Compound 5

Process 1: (Synthesis of Intermediate 1)

Under nitrogen atmosphere, 2,8-dibromodibenzofuran (1.0 mole), of carbazole (2.0 moles), copper powder (3.0 moles), potassium carbonate (1.5 moles) were mixed in 300 ml of DMAc (dimethylacetamide) and then stirred for 24 hours at 130° C. After the reaction liquid thus obtained was cooled to room temperature, 1 L of toluene was added to the liquid, the resultant liquid was washed three times with distilled water, the solvent was distilled away from the washed layer under reduced pressure, and purification of the residue with silica gel flash chromatography (n-heptane: toluene=4:1 to 3:1) gave Intermediate 1 at a yield of 85%.

Process 2: (Synthesis of Intermediate 2)

At room temperature under atmospheric pressure, Intermediate 1 (0.5 mole) was dissolved into 100 ml of DMF (dimethylformamide), NBS (N-bromosuccinic acid imide) (2.0 moles) was added, and then stirred over one night at room temperature. The obtained precipitate was filtered and washed with methanol, and thus Intermediate 2 was obtained at a yield of 92%.

Process 3: (Synthesis of Compound 5)

Under nitrogen atmosphere, Intermediate 2 (0.25 mole), 2-phenylpyridine (1.0 mole), ruthenium complex [(η6-C6H6)RuCl2]2 (0.05 mole), triphenylphosphine (0.2 mole), potassium carbonate (12 moles) were mixed in 3 L of NMP (N-methyl-2-pyrrolidone), and then stirred over one night at 140° C.

After the reaction liquid was cooled to room temperature, 5 L of dichloromethane was added, and then the liquid was filtered. The solvent was distilled away from the filtrate under reduced pressure (800 Pa, 80° C.), and the residue was purified with silica gel flash chromatography (CH2Cl2: Et3N=20:1 to 10:1).

After the solvent was distilled away under reduced pressure, the residue was again dissolved into dichloromethane and washed three times with water. After the substance obtained by the washing was dried with anhydrous magnesium sulfate, the solvent was distilled away under reduced pressure from the dried substance and thus Compound 5 was obtained at a yield of 68%.

[Method of Film Formation of Nitrogen-Containing Layer 1a]

In case in which the nitrogen-containing layer 1a is formed on the substrate 11 as mentioned above, examples of the film formation include a wet process such as a coating method, an inkjet method or a dipping method, and a dry process such as an evaporation method (resister heating, EB method and the like), a sputtering method or a CVD method, and the like. Among them, the evaporation method is preferably applied.

Particularly, in case in which the nitrogen-containing layer 1a is formed by using a plurality of compounds, a co-deposition method may be employed in which a plurality of compounds is supplied at the same time from a plurality of deposition sources. In case of using a high molecular weight compound, the coating method is preferably employed. In the case, a coating solution in which the compound is dissolved in a solvent is used. The solvent to dissolve the compound is not limited. In the case in which the nitrogen-containing layer 1a is formed by using a plurality of compounds, a coating solution may be prepared by using a solvent which can dissolve such a plurality of compounds.

<Electrode Layer 1b>

The electrode layer 1b is a layer constituted by silver as a main component, and constituted using silver or an alloy having silver as a main component, and is formed adjacent to the nitrogen-containing layer 1a. Examples of the film formation of the electrode layer 1b include a wet process such as a coating method, an inkjet method or a dipping method, and a dry process such as an evaporation method (resister heating, EB method and the like), a sputtering method or a CVD method, and the like. Among them, preferable is the evaporation method. Though the feature of the electrode layer 1b is to have a sufficient electrical conductivity without a high temperature annealing treatment after film formation since the electrode layer 1b is formed on the nitrogen-containing layer 1a, if necessary, the high temperature annealing treatment may be carried out after film formation.

Examples of the alloy having silver (Ag) as a main component which configures the electrode layer 1b include, for instance, silver magnesium (AgMg), silver copper (AgCu), silver palladium (AgPd), silver copper palladium (AgCuPd), silver indium (AgIn), or the like.

The above electrode layer 1b may be a laminated structure in which layers of silver or an alloy having silver as a main component are laminated by dividing to a plurality of layers.

Furthermore, the electrode layer 1b preferably has a film thickness within the range of 4 to 12 nm. When the film thickness is 12 nm or less, since an absorption component or a reflection component can be inhibited at a low level, the light transmission property of the electrode layer 1b can be maintained, and thus, being preferable. When the film thickness is 4 nm or more, the electrical conductivity of the layer can also be ensured.

The aforementioned transparent electrode 1 having a laminated structure comprising the nitrogen-containing layer 1a and the electrode layer 1b provided adjacent to the layer may be covered with a protective film over the upper portion of the electrode layer 1b, or may be laminated with other electrical conductive layer. In this case, the protective film and the electrical conductive layer preferably have light transmission property without spoiling the light transmission property of the transparent electrode 1. In addition, under the nitrogen-containing layer 1a, namely, between the nitrogen-containing layer 1a and the substrate 11, a necessary layer may be provided.

<Effects of Transparent Electrode 1>

The transparent electrode 1 constituted as described above has a configuration in which an electrode layer 1b having silver as a main component is provided adjacent to the nitrogen-containing layer 1a formed using a compound containing nitrogen atoms. According to the configuration, in forming the electrode layer 1b adjacent to the nitrogen-containing layer 1a, silver atoms constituting the electrode layer 1b interact with the compound containing nitrogen atoms constituting the nitrogen-containing layer 1a to thereby reduce a diffusion length of the silver atoms on the surface of the nitrogen-containing layer 1a, which causes the suppression of agglomeration of silver. As a result, generally, a silver thin film that is easily isolated in the form of island due to film growth through Volumer-Weber (VW) type (nucleas growth type) is formed due to film growth through Frank-van der Merwe (FM) type (mono-layer growth type). Therefore, an electrode layer having a uniform thickness can be obtained even though the layer is thin. Accordingly, an electrode layer 1b having a uniform thickness can be obtained even though the layer is thin.

In addition, particularly, as an index of biding stability of the silver constituting the electrode layer 1b with respect to the nitrogen-containing layer 1a, the aforementioned effective unshared electron pair content [n/M] is applied, and the nitrogen-containing layer is constituted using the compound having a value of $2.0 \times 10^{-3} \leq [n/M]$. As a result, it becomes possible to provide the nitrogen-containing layer 1a in which the aforementioned effect of "suppressing agglomeration of silver" can be reliably provided adjacent to the electrode layer. As explained in examples mentioned below in detail, this has been confirmed by the fact that there is formed an electrode layer 1b capable of measuring a sheet resistance even though the electrode layer has a film as remarkably thin as 6 nm, on such a nitrogen-containing layer 1a.

As a result, the electrode layer 1b having ensured electrical conductivity due to uniform film thickness while ensuring light transmission property due to small film thickness can be reliably obtained in the upper portion of such a nitrogen-containing layer 1a, and thus it is possible to attain both of the improvement of electrical conductivity and the improvement of light transmission property, in the transparent electrode 1 using silver.

The transparent electrode 1 is inexpensive since indium (In) being a rare metal is not used, and is excellent in long-term reliability since a chemically unstable material such as ZnO is not used.

<<2. Transparent Electrode Provided with a Cap Layer>>

FIG. 2 is a schematic cross-sectional view of the configuration of the transparent electrode 1' provided with the cap layer as the second embodiment according to the present invention. The different point of the transparent electrode 1' shown in FIG. 2 from the transparent electrode explained by referring to the prior FIG. 1 is that a cap layer 1c is provided by lamination on the nitrogen-containing layer 1a and the electrode layer 1b. The other configurations are the same.

Accordingly, the same symbols are attached to the same elements and thus the repeated explanation thereof is omitted.

Namely, the transparent electrode 1' has a three-laminated structure in which the cap layer 1c is provided in a state in which the electrode layer 1b is held between the nitrogen-containing layer 1a and the cap layer 1c, and the nitrogen-containing layer 1a, the electrode layer 1b and the cap layer 1c are provided in this order in the upper portion of the substrate 11. Among them, the cap layer 1c has the following configuration.

<Cap Layer 1c>

The cap layer 1c is a layer constituted using a compound containing nitrogen atom (N), and is arranged adjacent to the electrode layer 1b. The compound constituting the cap layer 1c is the same as the compound explained with respect to the compound constituting the aforementioned nitrogen-containing layer 1a, and has the range of the effective unshared electron pair content [n/M] of $2.0 \times 10^{-3} \leq [n/M]$, more preferably $3.9 \times 10^{-3} \leq [n/M]$.

The configuration of the cap layer 1c constituted using the compound having the effective unshared electron pair content [n/M] may be the same as that of the nitrogen-containing layer 1a. When the cap layer 1c is constituted using a plurality of compounds and a mixing ratio (content ratio) of the compounds in the direction of the film thickness is different, it is sufficient that an effective unshared electron pair content [n/M] in the interface layer of the cap layer 1c on the side which comes into contact with the electrode layer 1b is within a predetermined range.

As the compounds constituting such a cap layer 1c, the exemplified compounds constituting the nitrogen-containing layer 1a are used.

<Effect of Transparent Electrode 1'>

According to the transparent electrode 1' having the above configuration, by disposing the cap layer 1c containing nitrogen atom (N) adjacent to the electron layer 1b, the migration of the silver constituting the electrode layer is suppressed due to interaction with the nitrogen atom (N) contained in the cap layer 1c. As a result, in addition to the effect of the transparent electrode having the two layered structure explained using FIG. 1, it is possible to enhance the reliability of the electrode layer 1b constituted as a super thin film, namely, to enhance the reliability of the transparent electrode 1'.

<<3. Transparent Electrode Provided with High Refractive Layer>>

FIG. 3 is a schematic cross-sectional view of the configuration of the transparent electrode 1" provided with the high refractive layer as the third embodiment according to the present invention. The different point of the transparent electrode 1" shown in this drawing from the transparent electrode explained using the former FIG. 1 is that a high refractive layer H is laminated on the nitrogen-containing layer 1a between the nitrogen-containing layer 1a and the electrode layer 1b. The other configurations are the same. Accordingly, the same symbols are attached to the same elements and thus the repeated explanation thereof is omitted.

Namely, the transparent electrode 1" has a three-laminated structure in which the high refractive layer H is provided in a state in which the electrode layer 1b is held between the nitrogen-containing layer 1a and the cap layer, and the high refractive layer H, the nitrogen-containing layer 1a and the electrode layer 1b are provided in this order in the upper portion of the substrate 11. In the layers, the high refractive layer H has the following configuration.

<High Refractive Layer H>

The high refractive layer H is a layer having a refractive index higher than that of the upper layer of the nitrogen-containing layer 1a. It is preferable that the refractive index at a wavelength of 550 nm of the high refractive layer H is higher than a refractive index of the nitrogen-containing layer 1a (n=1.7 to 1.8) by 0.1 or more, more preferable by 0.3 more. The high refractive layer H is constituted by the materials having a high refractive index and light transmission property as explained above, and examples include high refractive materials which are generally used for optical films such as titanium oxide (TiO2: n=2.3 to 2.4), zirconium oxide (ZrO: n=2.4), cadmium oxide (CdO: n=2.49), indium tin oxide (ITO: n=2.1 to 2.2), hafnium oxide (HfO2: n=1.9 to 2.1), tantalum pentoxide (Ta2O5: n=2.16), niobium oxide (Nb2O5: n=2.2 to 2.4), and the like.

<Effect of Transparent Electrode 1">>

According to the transparent electrode 1" constituted as above, the transparent electrode 1" has the configuration having the high refractive layer H, and the high refractive layer H, the nitrogen-containing layer 1a and the electrode layer 1b are laminated in this order. Therefore, the reflection generated on the electrode layer 1b having silver as a main component is suppressed. As a result, in addition to the effect of the transparent electrode having the two-layered structure explained using FIG. 1, it becomes possible to enhance the improvement of the light transmission property.

In addition, the transparent electrode 1" having the configuration with the high refractive layer H as explained above can be made into the four layered structure obtained by combining the configuration provided with the cap layer as explained using FIG. 2. The transparent electrode of the four-layered structure is the four-layered structure laminated from the substrate 11 side in order of the high refractive layer H, the nitrogen-containing layer 1a, the electrode layer 1b, and the cap layer 1c, and can gain the effects by combining the effect of the transparent electrodes having each configuration.

<<4. Use of Transparent Electrode>>

The transparent electrode having each of the aforementioned configurations can be used for various electronic devices. Examples of the electronic device include an organic electroluminescent element, an LED (light emitting Diode), a liquid crystal element, a solar cell, a touch panel, and the like. The aforementioned transparent electrode 1 can be used as an electrode member that requires light transmission property, in the electronic device.

Hereinafter, as one intended use, there will be explained embodiments of the organic electroluminescent element in which the electrodes are used as an anode and a cathode.

<<5. One Embodiment (Top Emission Type) of Organic Electroluminescent Element>>

<Configuration of Organic Electroluminescent Element EL-1>

Figure 4:
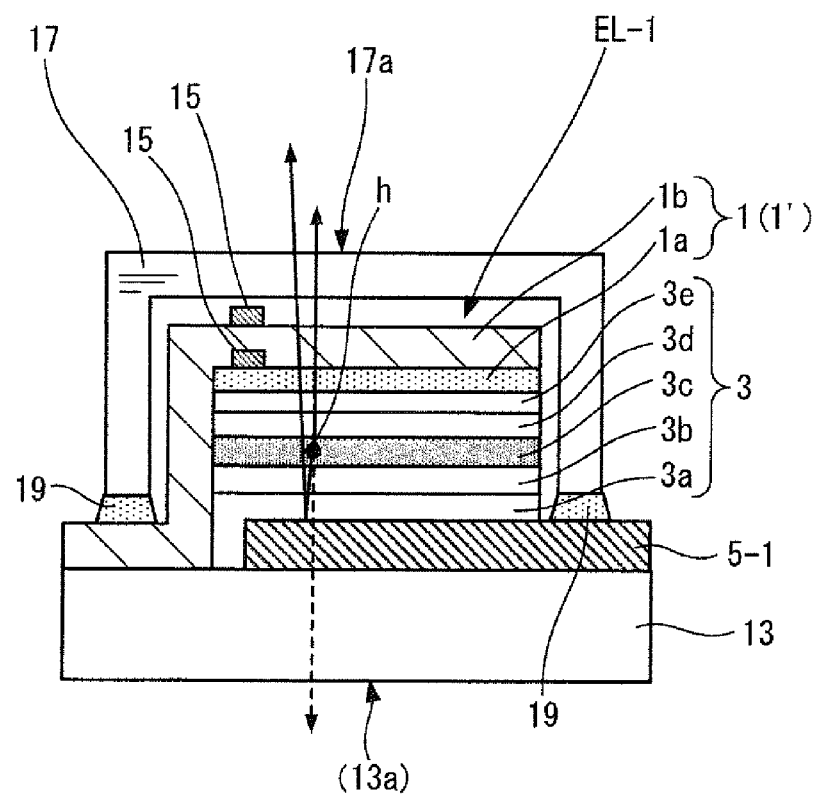
FIG. 4 is a cross-sectional configuration view illustrating the first embodiment of the organic electroluminescent element using the transparent electrode according to the present invention.

FIG. 4 is a cross-sectional configuration view illustrating the first embodiment of the organic electroluminescent element using the transparent electrode 1 explained by using FIG. 1, as one example of the electronic device according to the present invention. Hereinafter, the configuration of the organic electroluminescent element will be explained on the basis of the drawing.

The organic electroluminescent element EL-1 illustrated in FIG. 4 is provided on the substrate 13, and from the substrate side, the counter electrode 5-1, the light emitting functional layer 3 constituted using an organic material or the like, and the transparent electrode 1 are laminated in this order. In the organic electroluminescent element EL-1, the feature thereof is the use of the transparent electrode 1 of the present invention explained above as the transparent electrode 1. Accordingly the organic electroluminescent element EL-1 is constituted as the top emission type in which a generated light (hereinafter, referred to as emitted light h) is extracted at least from the opposite side of the substrate 13.

The whole layer configuration of the organic electroluminescent element EL-1 is not limited and may be a general layer configuration. Here, the transparent electrode 1 is disposed on the side of cathode (i.e. negative electrode) and the electrode layer 1b functions as the cathode, in which the counter electrode 5-1 functions as the anode (namely, positive electrode).

In the case, for example, the light emitting functional layer 3 has an exemplified configuration in which [positive hole injection layer 3a/positive hole transport layer 3b/light emitting layer 3c/electron transport layer 3d/electron injection layer 3e] are laminated in this order from the counter electrode 5-1 side being the anode. Among them, it is essential to have a light emitting layer 3c constituted using at least organic material. The positive hole injection layer 3a and the positive hole transport layer 3b may be provided as a positive transport/injection layer having positive hole transport property and positive hole injection property. The electron transport layer 3d and the electron injection layer 3e may be provided as one layer having electron transport property and electron injection property. Among the light emitting functional layers 3, for example, the electron injection layer 3e may be constituted by an inorganic material.

Furthermore, the nitrogen-containing layer 1a in the transparent electrode 1 provided as the cathode may also double as the electrode injection layer, and may also double as the electron transport layer and the electron injection layer.

In addition, in the light emitting functional layer 3, a positive hole blocking layer, an electron blocking layer and the like also other than these layers may be laminated on a necessary portion, as necessary. Furthermore, the light emitting layer 3c may have light emitting layers of each color corresponding to the respective range of wavelength, and a light emitting layer unit may be formed by laminating the light emitting layers via an intermediate layer having non-light emitting property. The intermediate layer may function as the positive hole blocking layer and the electron blocking layer. Moreover, the counter electrode 5-1 being an anode may have a laminated structure as necessary. In these configurations, only the portion in which the light emitting functional layer is sandwiched between the transparent electrode 1 and the counter electrode 5-1 serves as the light emitting region in the organic electroluminescent element EL-1.

In the above layer configuration, in order to reduce electric resistance of the transparent electrode 1, an auxiliary electrode 15 may be provided in contact with the electrode layer 1b of the transparent electrode 1.

The organic electroluminescent element EL-1 having the above configuration is sealed by a transparent sealing material 17 described below on the substrate 13 in order to prevent the degradation of the light emitting functional layer 3 constituted using organic materials. The transparent sealing material 17 is fixed on the substrate side via an adhesive 19. However, terminal portions of the transparent electrode 1 and the counter electrode 5-1 are set to be provided in a state in which they are exposed from the transparent sealing material 17 while maintaining electric insulation with each other by the light emitting functional layer 3 on the substrate 13.

Hereinafter, the details of the main layers for constituting the above organic electroluminescent element EL-1 will be explained in order of the substrate 13, the transparent electrode 1, the counter electrode 5-1, the light emitting layer 3c of the light emitting functional layer 3, other layers of the light emitting functional layer 3, the auxiliary electrode 15, and the transparent sealing material 17. After that, production method of the organic electroluminescent element EL-1 is explained.

[Substrate 13]

The substrate 13 makes use of the same one as the substrate to which the aforementioned transparent electrode 1 of the present invention. However, when the organic electroluminescent element EL-1 is a top- and bottom emission type in which emitted light h can also be extracted from the counter electrode 5-1 side, as the substrate, a transparent substrate having light transmission property is used from the exemplified substrates.

[Transparent Electrode 1 (Cathode Side)]

The transparent electrode 1 is the aforementioned transparent electrode 1 of the present invention, and has a configuration in which the nitrogen-containing layer 1a and the electrode layer 1b are formed from the light emitting functional layer 3 side in this order. Here, particularly, the electrode layer 1b of the transparent electrode 1 serves as substantially a cathode. In the organic electroluminescent element EL-1 of the present embodiment, the nitrogen-containing layer 1a formed of an organic material is disposed between the light emitting functional layer 3 and the electrode layer 1b used as a substantial cathode. Accordingly, the nitrogen-containing layer 1a of the transparent electrode 1 in the present embodiment is regarded as a layer which constitutes a part of the light emitting functional layer 3.

The nitrogen-containing layer 1a is constituted by using a compound having electron transport property and electron injection property from among the compounds having the effective unshared electron pair content [n/M] of a predetermined range. Alternatively, the nitrogen-containing layer 1a may also be constituted so that the nitrogen-containing layer 1a itself has the aforementioned effective unshared electron pair content [n/M], by using a mixture of a compound having electron transport property or electron injection property and a compound having the effective unshared electron pair content [n/M] of as large as a certain degree. Furthermore, in the nitrogen-containing layer 1a, if only using a compound having the effective unshared electron pair content [n/M] of a predetermined range, the compound may not have the electron transport property and the electron injection property. In the case, the thickness of the nitrogen-containing layer 1a may be controlled to such a thickness (for example, about 5 nm) that does not prevent the property of electron injection from the electron layer 1b of the cathode to the light emitting functional layer 3.

Meanwhile, the transparent electrode 1 in the organic electroluminescent element EL-1 can be replaced by the transparent electrode having the three-layered structure provided with the cap layer 1c explained by using FIG. 2. In the case, the transparent electrode of the three-layered structure has the configuration in which the nitrogen-containing layer 1a, the electrode layer 1b and the cap layer 1c are laminated in the order from the light emitting functional layer 3.

[Counter Electrode 5-1 (Anode)]

The counter electrode 5-1 is an electrode membrane having a function as an anode for supplying a positive hole to the light emitting functional layer 3, and a metal, an alloy, an organic or inorganic electric conductive compound, and a mixture thereof are used for the counter electrode. Examples include gold, aluminum, silver, magnesium, lithium, a mixture of magnesium/copper, a mixture of magnesium/silver, a mixture of magnesium/aluminum, a mixture of magnesium/indium, indium, a mixture of lithium/aluminum, a rare-earth metal, an oxide semiconductor such as ITO, ZnO, TiO2 or SnO2.

The counter electrode 5-1 can be produced by forming a thin film from the electric conductive material through the use of a method such as vapor evaporation or sputtering. The sheet resistance of the counter electrode 5-1 is preferably several hundreds of Ω/sq. or less. The thickness is generally selected within the range of 5 nm to 5 μm, preferably within the range of 5 nm to 200 nm.

When the organic electroluminescent element EL-1 is a top-and-bottom emission type in which emitted light h can also be extracted from the counter electrode 5-1 side, the counter electrode 5-1 may be constituted by selecting an electrically conductive material having a good light transmission property among the aforementioned electrically conductive materials.

[Light Emitting Layer 3c]

The light emitting layer 3c used in the present invention contains a phosphorescence emitting compound as a light emitting material.

The light emitting layer 3c of the present invention is a layer which emits light through recombination of electrons injected from an electrode or an electron transport layer 3d and positive holes injected from the positive hole transport layer 3b. A portion that emits light may be either the inside of the light emitting layer 3c or an interface between the light emitting layer 3c and its adjacent layer.

The configuration of the light emitting layer 3c is not particularly limited as long as the light emitting material contained therein satisfies a light emission requirement. In addition, there may be a plurality of light emitting layers having the same emission spectrum and/or emission maximum wavelength. In the case, it is preferable that non-luminescent intermediate layers (not shown) are present between the light emitting layers 3c.

The total thickness of the light emitting layers 3c is preferably within a range of 1 to 100 nm and, more preferably within a range of 1 to 30 nm from the viewpoint of obtaining a lower driving voltage. Meanwhile, the total thickness of the light emitting layers 3c is a thickness including the thickness of the intermediate layers when the non-luminescent intermediate layers are present between the light emitting layers 3c.

In the case of the light emitting layer 3c constituted by lamination of a plurality of layers, it is preferable to adjust the thickness of individual light emitting layer to be within a range of 1 to 50 nm and it is more preferable to adjust the thickness thereof to be within a range of 1 to 20 nm. When the plurality of the laminated light emitting layers corresponds to the emitted color of blue, green and red, respectively, the relationship between the respective thickness of the light emitting layers of blue, green and red is not particularly limited.

The above light emitting layer 3c can be formed through the film-formation of a light emitting material and a host compound, which are mentioned below, by a well-known thin film forming method such as a vacuum evaporation method, a spin coating method, a casting method, an LB method or an ink-jet method.

In addition, in the light emitting layer 3c, a plurality of light emitting materials may be mixed. Furthermore, a fluorescence emitting material and a fluorescence emitting material (also referred to as fluorescence emitting dopant, fluorescence emitting compound) may be mixed in the same light emitting layer 3c.

It is preferable that the light emitting layer 3c is constituted so as to contain a host compound (also referred to as emitting host) and a light emitting material (also referred to as light emitting dopant compound, a guest compound), and emit light through the light emitting material.

(Host Compound)

The host compound contained in the light emitting layer 3c is preferably a compound having a phosphorescence quantum yield in phosphorescence emission of less than 0.1 at room temperature (25° C.). The host compound more preferably has a phosphorescent quantum yield of less than 0.01. Furthermore, among the compounds contained in the light emitting layer 3c, a volume ratio in the layer of 50% or more is preferable.

A well-known host compound may be used as the host compound, alone or in combination of a plurality of kinds. The use of a plurality of host compounds makes it possible to adjust transfer of charges, and to increase an efficiency of the organic electroluminescent element EL-1. Furthermore, the use of a plurality of light emitting materials mentioned below makes it possible to mix different colors of light to be emitted, and to thereby produce any luminous color.

The host compound to be used may be a well-known low molecular weight compound, a high molecular compound having a repeating unit or a low-molecular-weight compound having a polymerizable group such as a vinyl group or an epoxy group (evaporation-polymerizable light emission host) may be used.

The well-known host compound is preferably a compound preventing a light emission wavelength from becoming longer and having a high Tg (glass transition temperature), while having a positive hole transport ability and an electron transport ability. The glass transition temperature Tg herein is a value measured using DSC (Differential Scanning Colorimetry) in accordance with JIS-K-7121.

Hereinafter, specific examples of the host compounds (H1 to H79) which can be used in the present invention are shown, and the present invention is not limited thereto. Meanwhile, the host compound H68 to H79, x and y represent ratio of random copolymer. The ratio may be set to, for example, x:y=1:10.

[Chem. 51]

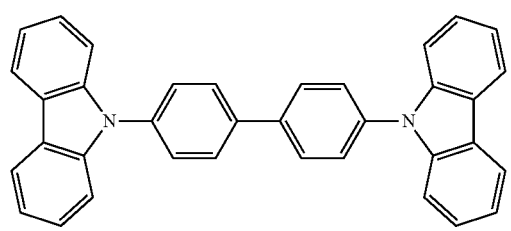

H1

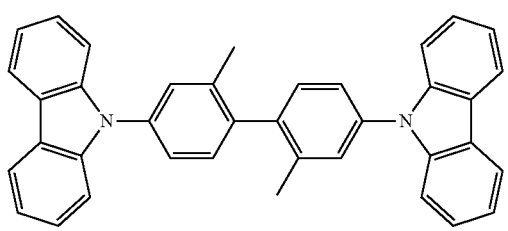

H2

-continued
H3 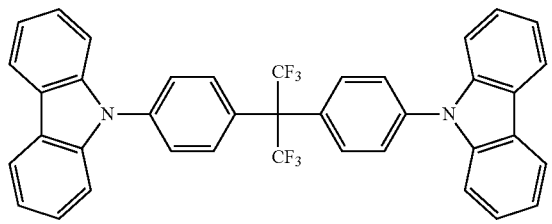 H4 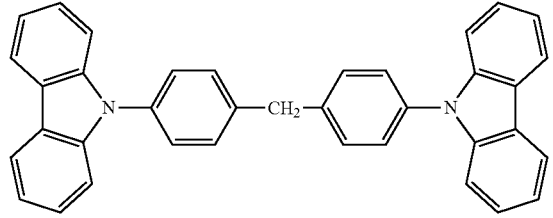
H5 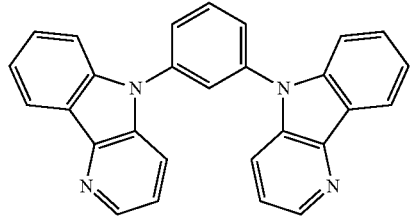 H6 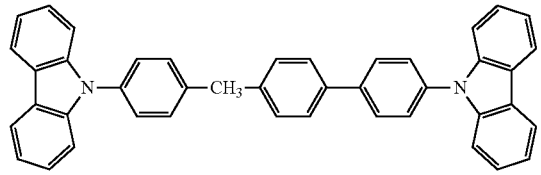
H7 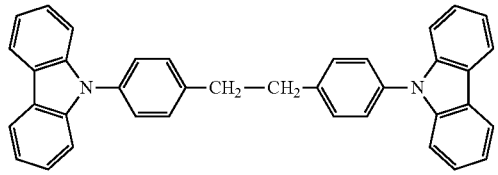 H8
H9 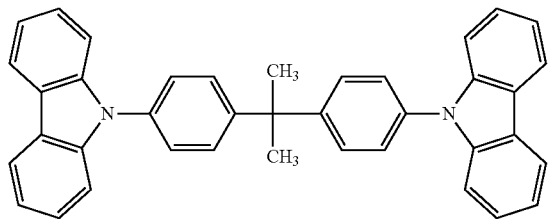
[Chem. 52]
H10 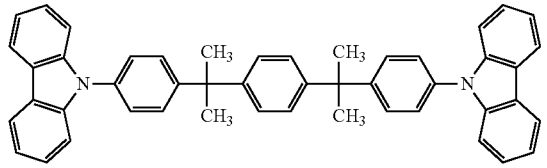 H11 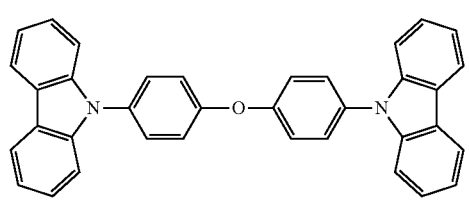
H12 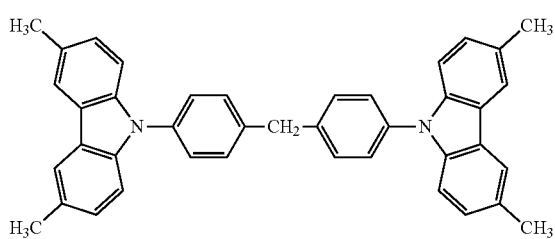 H13

-continued
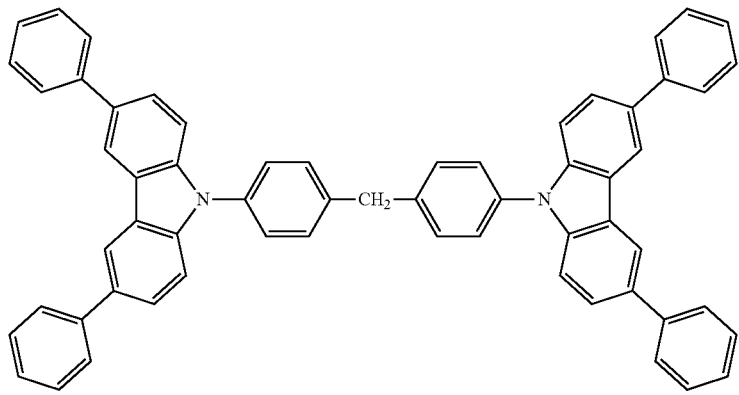
H14
[Chem. 53]
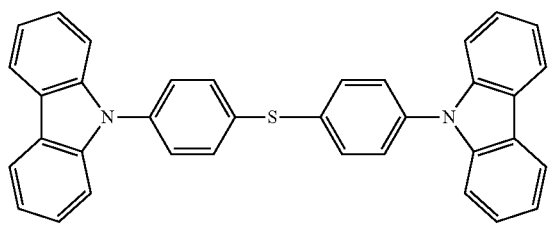
H15
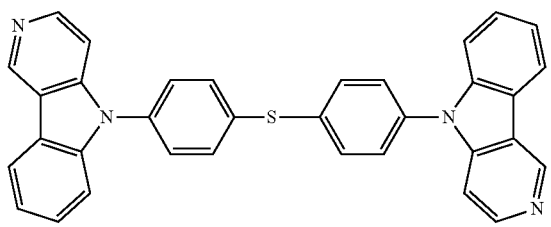
H16
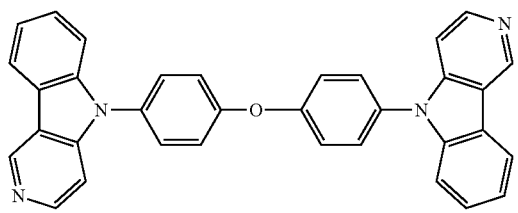
H17
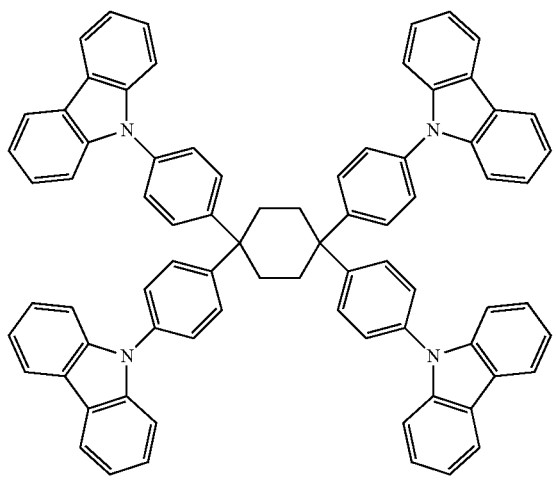
H18
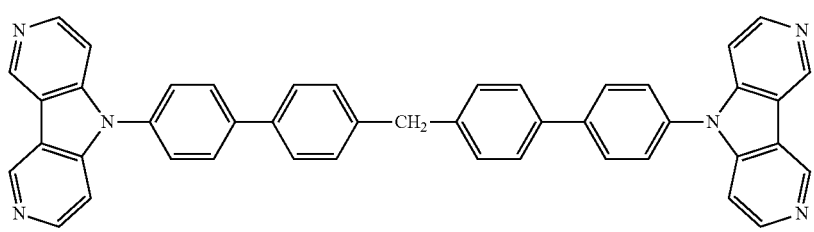
H19
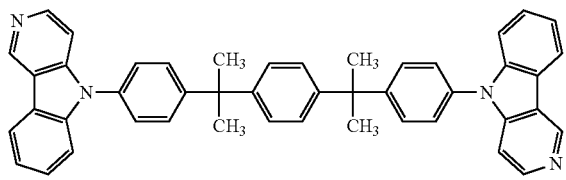
H20
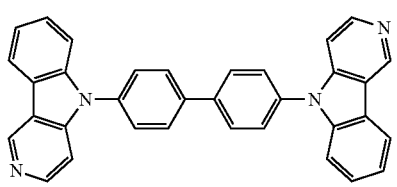
H21

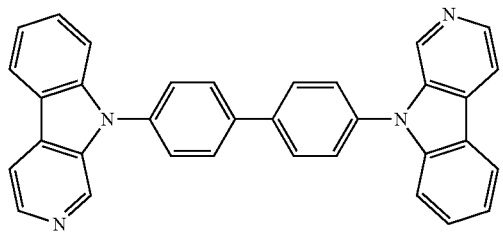
H22
[Chem. 54]
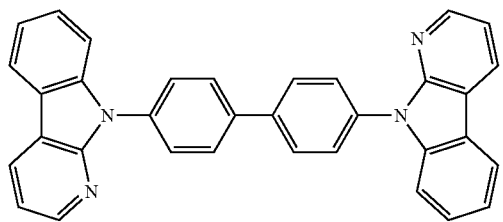
H23
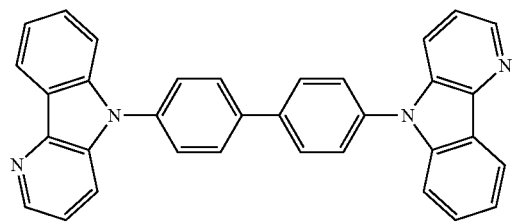
H24
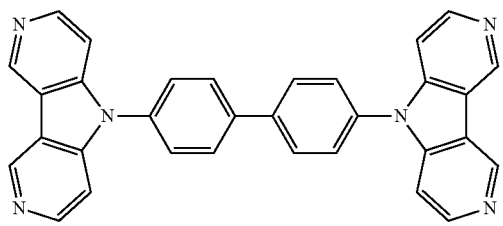
H25
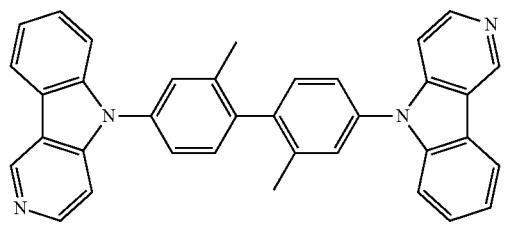
H26
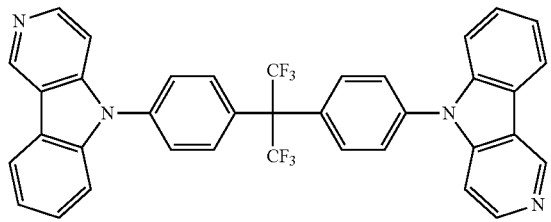
H27
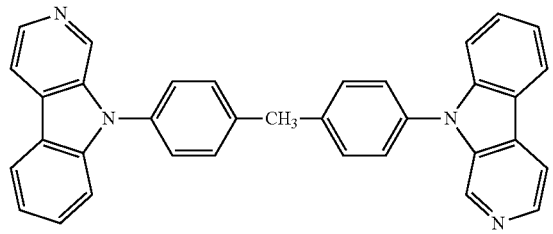
H28
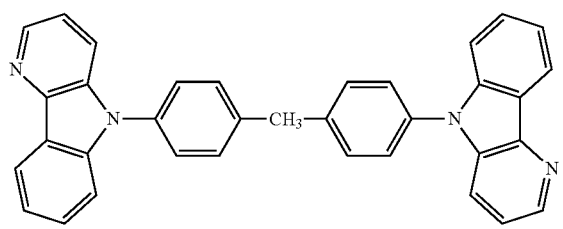
H29
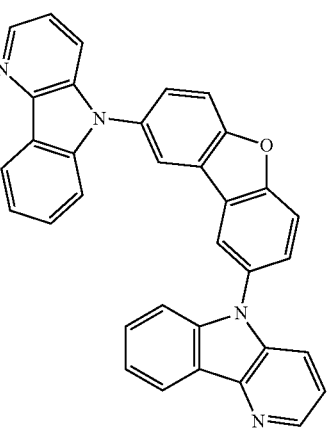
H30

[Chem. 55]
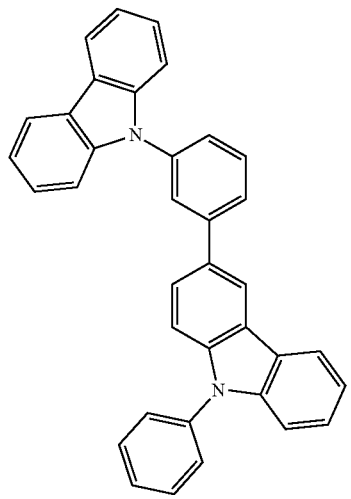
H31
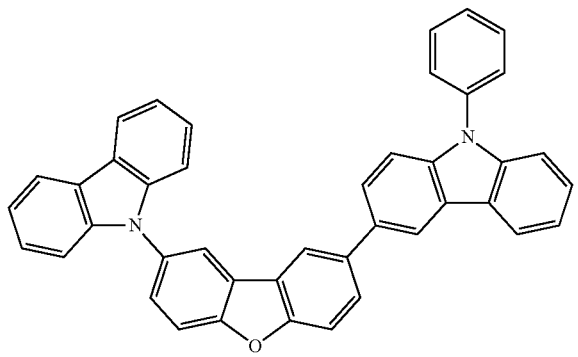
H32
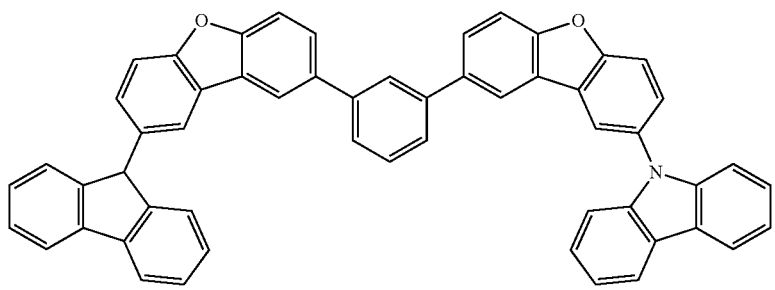
H33
[Chem. 56]
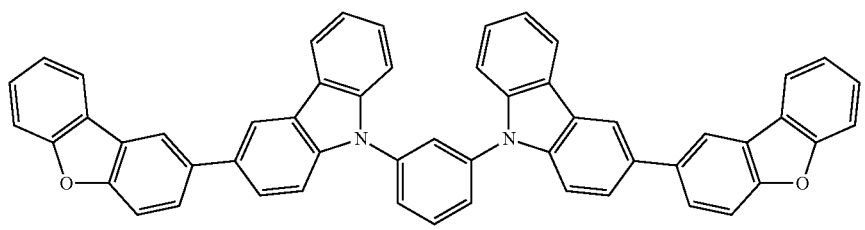
H34
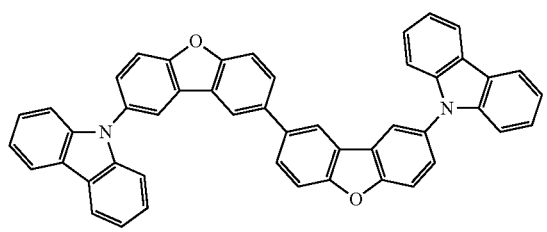
H35
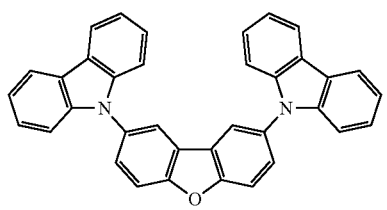
H36

-continued
H37
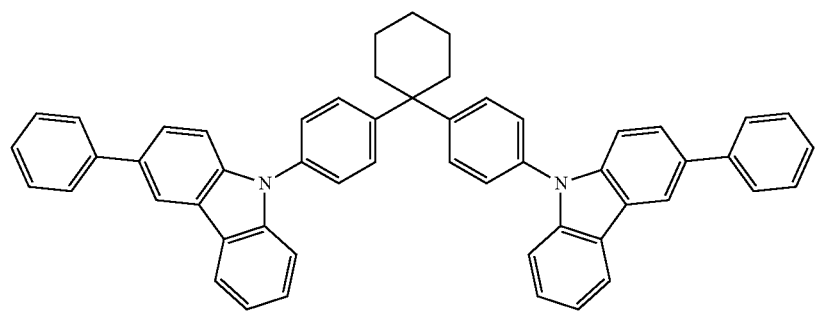
H38
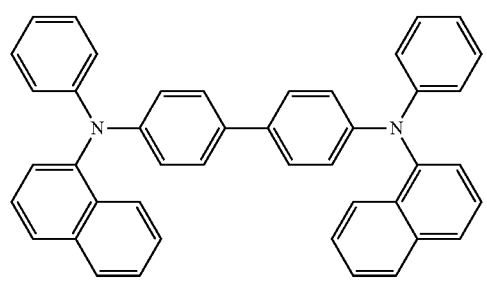
H39
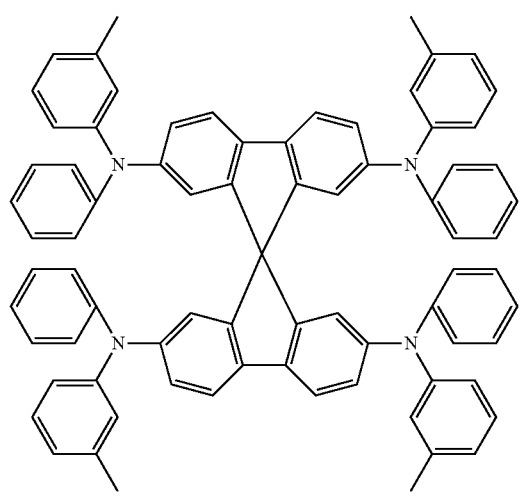
[Chem. 57]
H40
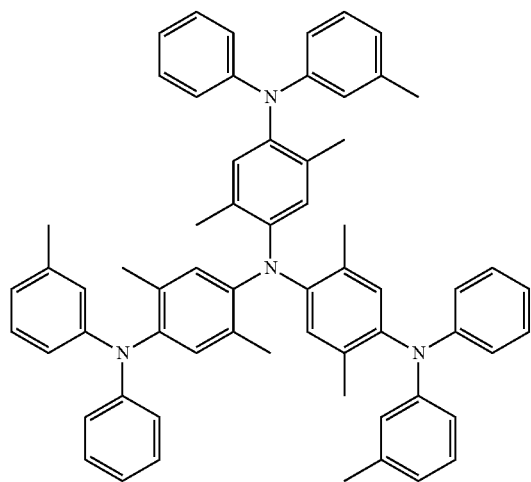
H41
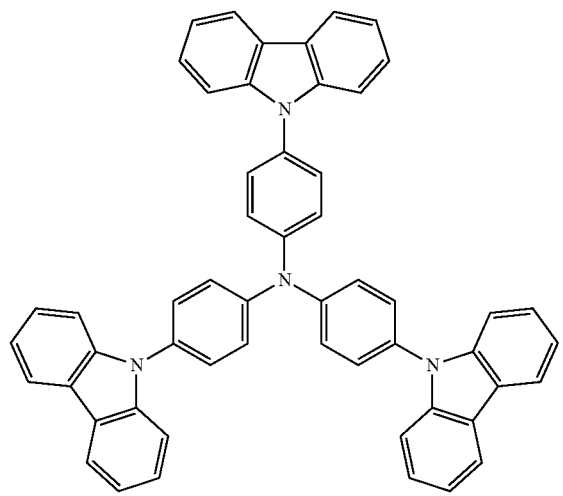

-continued
H42 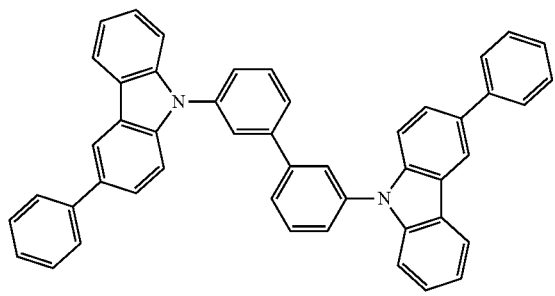
H43 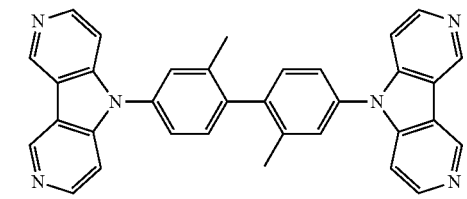
H44 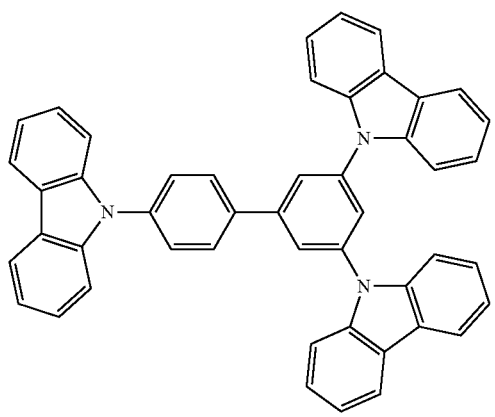
H45 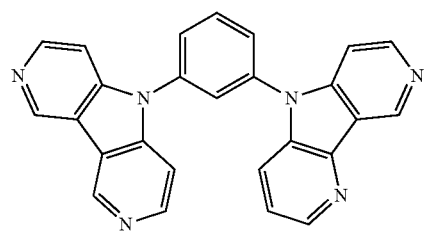
H46 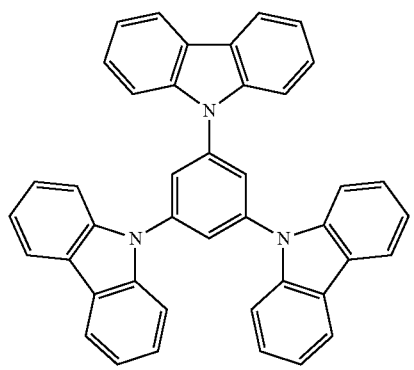
H47 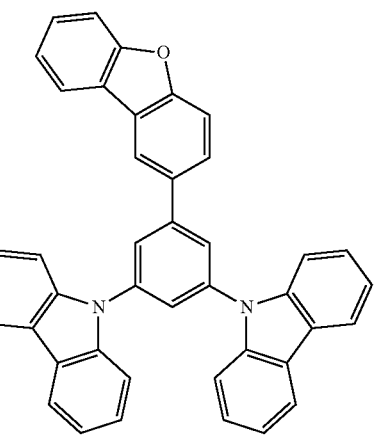
[Chem. 58]
H48 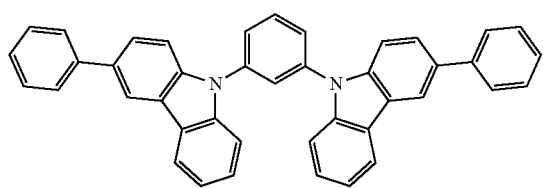
H49 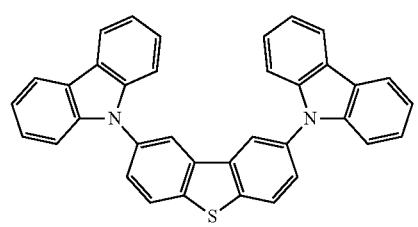

-continued
H50
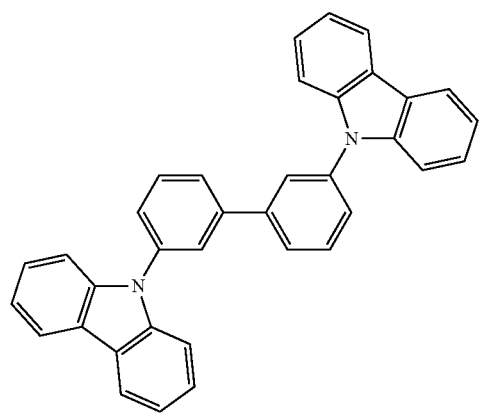
H51
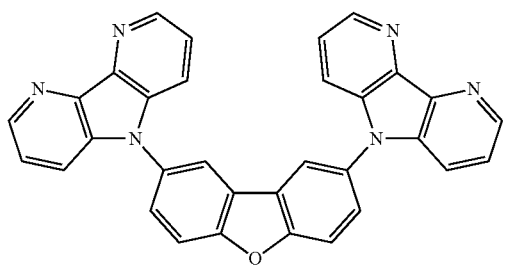
H-52
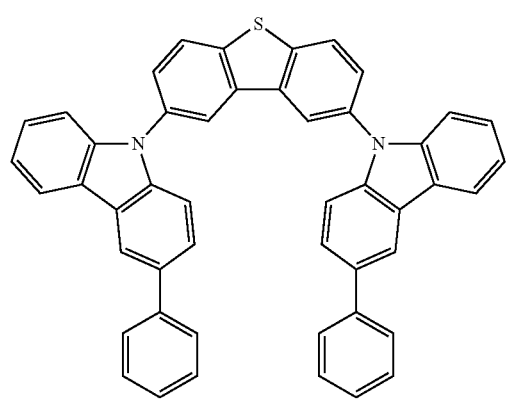
H-53
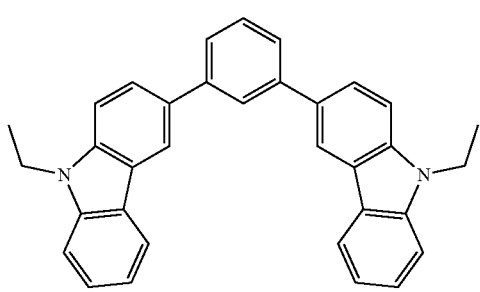
H54
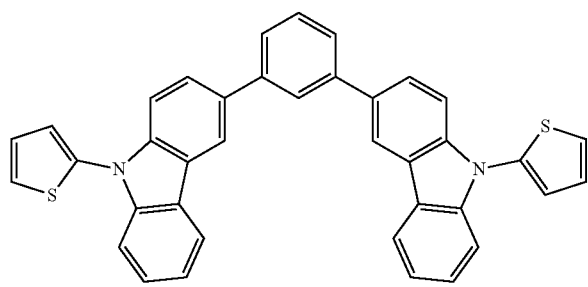
H55
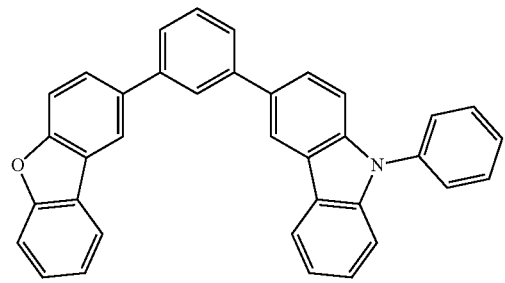

[Chem. 59]
H56
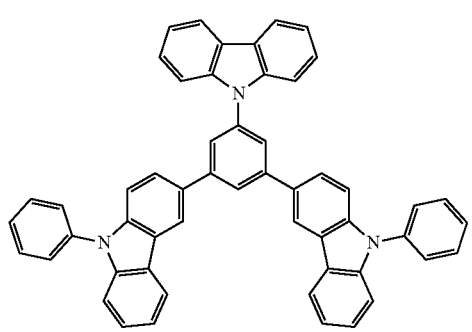
H57
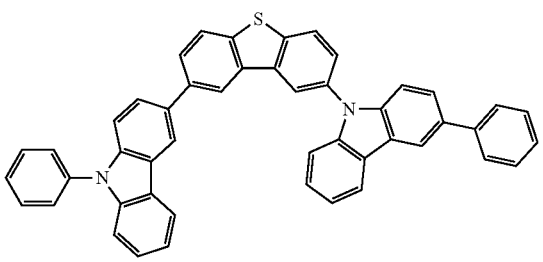
H58
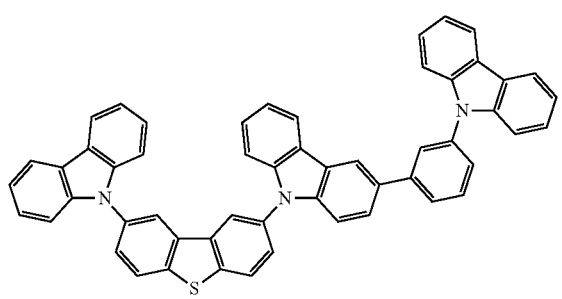
H59
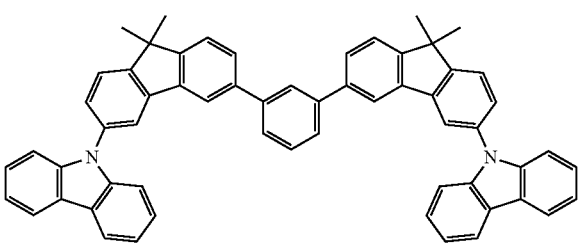
[Chem. 60]
H60
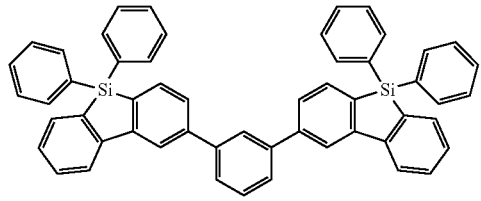
H61
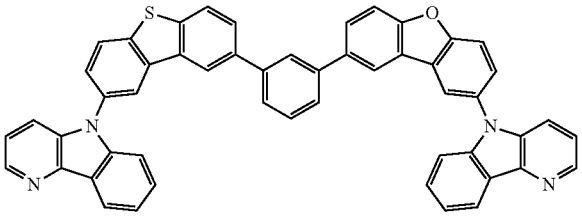
H62
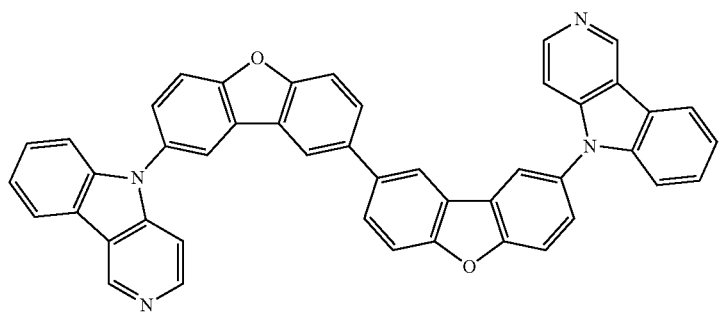
H63
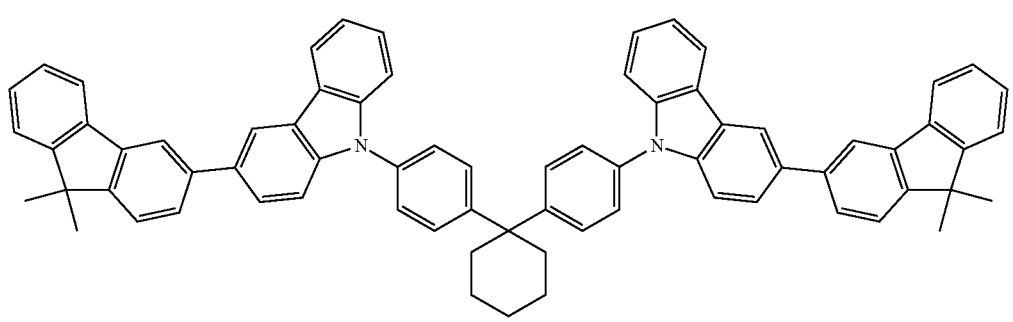

H64
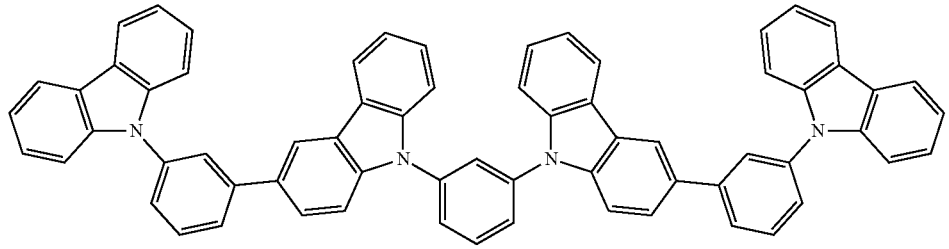
[Chem. 61]
H65
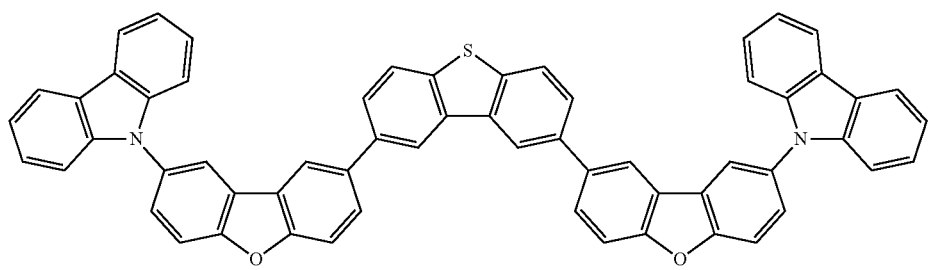
H66
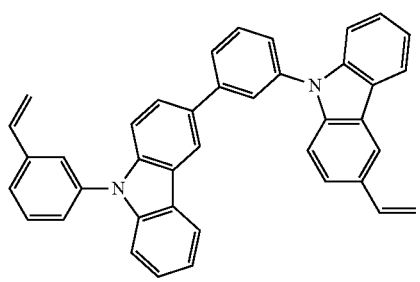
H67
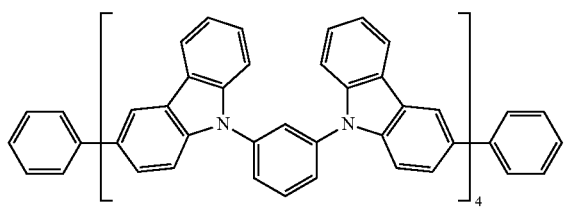
[Chem. 62]
H68
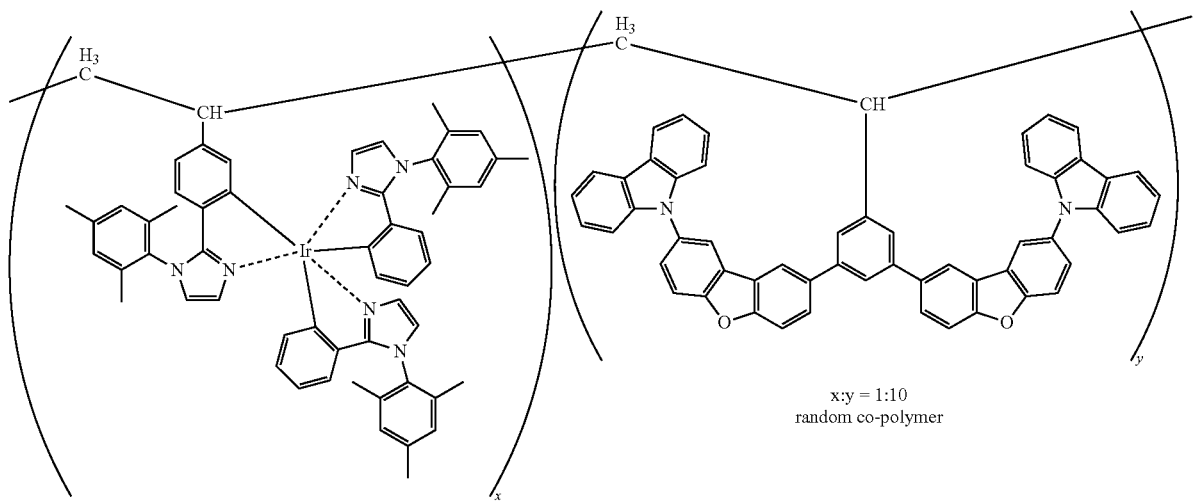
x:y = 1:10
random co-polymer

[Chem. 63]
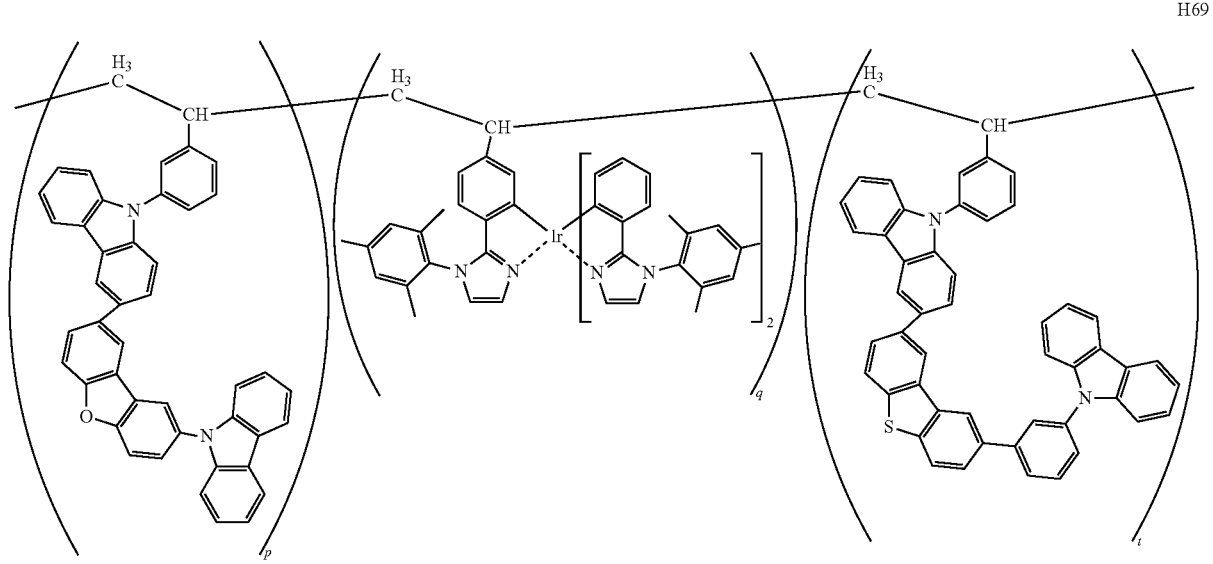
H69
[Chem. 64]
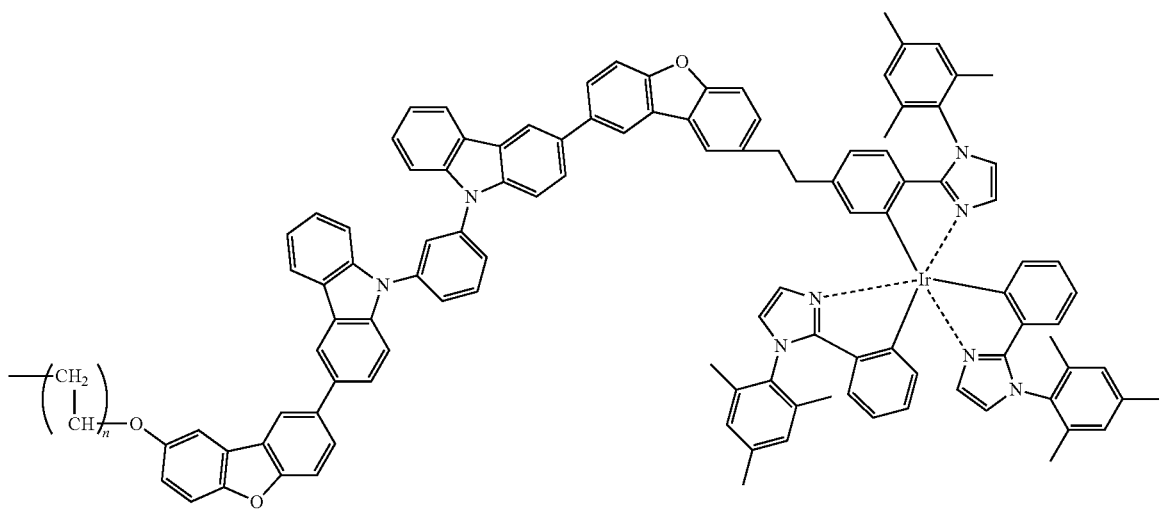
H70
[Chem. 65]
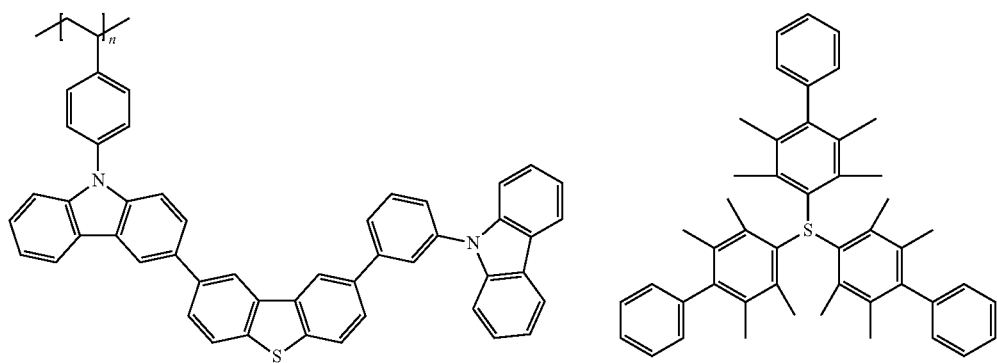
H71     H72

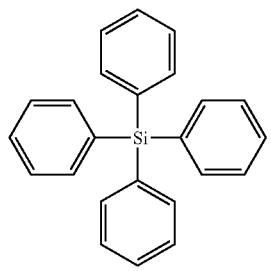

H73

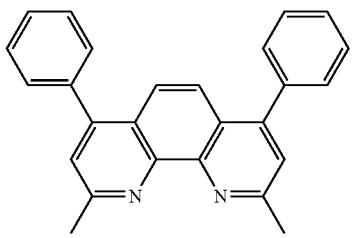

H74

H75

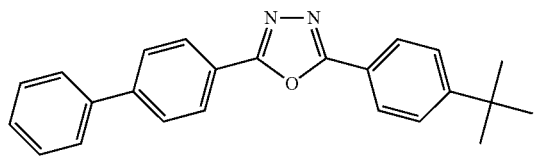

H76

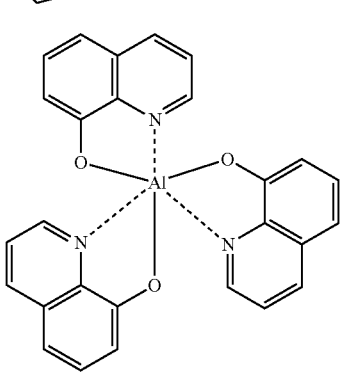

H77

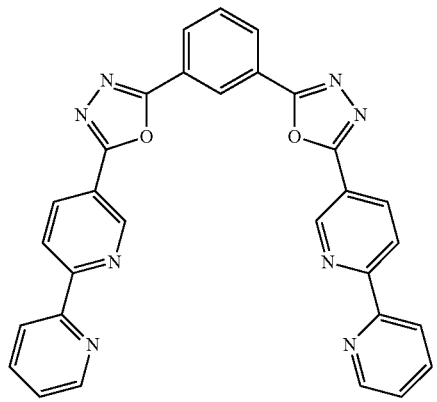

H78

H79

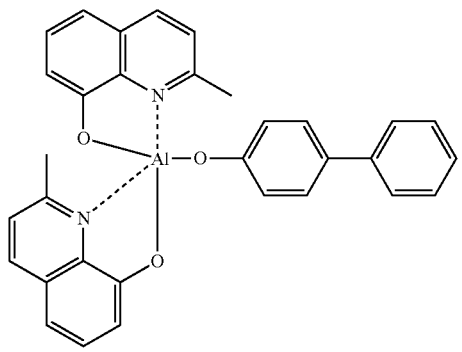

Specific examples of the well-known host compound are compounds described in the following documents; for example, Japanese Patent Application Laid-Open Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

(Light Emitting Material)

The light emitting material that can be used includes a phosphorescence emitting material (also referred to as a phosphorescent compound or a phosphorescence emitting compound).

The phosphorescence emitting material is defined as a compound in which light emission from an excited triplet state is observed, and, specifically, a compound which emits phosphorescence at room temperature (25° C.) and a phosphorescence quantum yield at 25° C. is 0.01 or more, and preferable phosphorescence quantum yield is 0.1 or more.

The phosphorescence quantum yield can be measured by a method described on page 398 of Bunko II of Dai 4 Han Jikken Kagaku Koza 7 (Spectroscopy II of Lecture of Experimental Chemistry vol. 7, 4th edition) (1992, published by Maruzen Co., Ltd.). The phosphorescence quantum yield in a solution can be measured by using various solvents. With respect to the phosphorescence emitting material used in the present invention, it is only necessary to achieve the aforementioned phosphorescence quantum yield (0.01 or more) with one of appropriate solvents.

There are two kinds of principles regarding light emission of the phosphorescence emitting material. One is an energy transfer type, wherein carriers recombine on a host compound which transfers the carriers so as to produce an excited state of the host compound, this energy is transferred to a phosphorescence emitting material, and then light emission from the phosphorescence emitting material is carried out. The other is a carrier trap type, wherein a phosphorescence emitting material serves as a carrier trap, carriers recombine on the phosphorescence emitting material, and then light emission from the phosphorescence emitting material is carried out. In either case, the excited state energy of the phosphorescence emitting material is required to be lower than that of the host compound.

The phosphorescence emitting material can be suitably selected from the well-known phosphorescence emitting compounds used for light emitting layers of organic electroluminescent elements, preferably a complex compound containing metal of the groups 8 to 10 in the element periodic table, and more preferably an iridium compound, an osmium compound, a platinum compound (a platinum complex compound) or a rare earth complex, and most preferably an iridium compound.

In the present invention, at least one light emitting layer 3c may contain two or more types of light emitting materials, and a ratio of concentration of the phosphorescence emitting material in the light emitting layer 3c may vary in the direction of thickness of the light emitting layer 3c.

An amount of the phosphorescence emitting material is preferably o.1% by volume or more and 30% by volume or less to the total volume of the light emitting layer 3c.

(Compound Represented by the General Formula (7))

The compound contained in the light emitting layer 3c (phosphorescence emitting compound) is preferably a compound represented by the following general formula (7).

It is a preferable embodiment that the phosphorescence emitting compound (also referred to as a phosphorescence emitting metal complex) represented by the general formula (7) is contained in the light emitting layer 3c of the organic electroluminescent element EL-1 of the present invention as a light emitting dopant, and may be contained in a light emitting functional layer in the layer other than the light emitting layer 3c.

[Chem. 66]

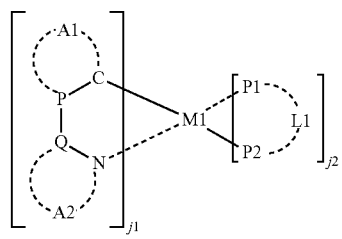

General formula (7)

In the general formula (7), P and Q each represent a carbon atom or a nitrogen atom, A1 represents an atom group which forms an aromatic hydrocarbon ring or an aromatic heterocyclic ring with P—C. A2 represents an atom group which forms an aromatic heterocyclic ring with Q-N. P1-L1-P2 represents a bidentate ligand, P1 and P2 each independently represent carbon atom, nitrogen atom or oxygen atom. L1 represents an atom group which forms a bidentate ligand with P1 and P2. j1 represents an integer of 1 to 3, j2 represents an integer of 0 to 2, but the sum of j1 and j2 is 2 or 3. M1 represents a transition metal element of the groups 8 to 10 in the element periodic table.

In the general formula (7), P, Q each represent carbon atom or nitrogen atom.

Examples of the aromatic hydrocarbon ring which is formed by A1 with P—C in the general formula (7) include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring, and the like.

These rings may have a substituent which is exemplified as R11, R12 in general formula (1).

Examples of the aromatic heterocyclic ring which is formed by A1 with P—C in the general formula (7) include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, benzimidazole ring, benzothiazole ring, benzoxazole ring, quinoxaline ring, quinazoline ring, phthalazine ring, carbazole ring, azacarbazole ring, and the like.

Here, the azacarbazole ring indicates a ring formed in a state in which one or more carbon atoms of benzene ring constituting carbazole ring is substituted by nitrogen atom.

These rings may have a substituent which is exemplified as R11, R12 in general formula (1).

Examples of the aromatic heterocyclic ring which is formed by A2 with Q-N in the general formula (7) include oxazole ring, oxadiazole ring, oxatriazole ring, isoxazole ring, tetrazole ring, thiadiazole ring, thiatriazole ring, isothiazole ring, pyrrole ring, pyridine ring, pyridazine ring, pyrimidine ring, pyrazine ring, triazine ring, imidazole ring, pyrazole ring, triazole ring, and the like.

These rings may have a substituent which is exemplified as R11, R12 in general formula (1).

In the general formula (7), P1-L1-P2 represents a bidentate ligand, P1 and P2 each independently represent carbon atom, nitrogen atom or oxygen atom. L1 represents an atom group which forms a bidentate ligand with P1 and P2.

Examples of the bidentate ligand represented by P1-L1-P2 include phenylpyridine, phenylpyrazole, phenylimidazole, phenyltriazole, phenyltetrazole, pyrazabole, acetylacetone, picolinic acid, and the like.

In the general formula (7), j1 represents an integer of 1 to 3, and j2 represents an integer of 0 to 2, but the sum of j1 and j2 is 2 or 3. Particularly, j2 is preferably 0.

In the general formula (7), M1 represents a transition metal element (simply called a transition metal) of the groups 8 to 10 in the element periodic table. Particularly, M1 is preferably iridium.

(Compound Represented by the General Formula (8))

Among the compounds represented by the general formula (7), the compound represented by the general formula (8) is preferable.

[Chem. 67]

General formula (8)

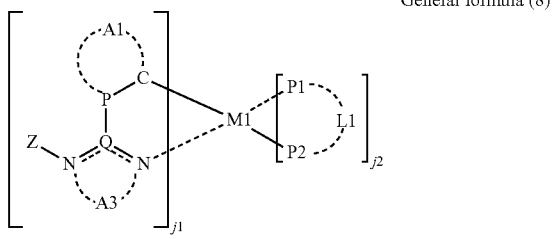

In the above general formula (8), Z represents a hydrocarbon ring group or a heterocyclic ring group. P and Q each represent carbon atom or nitrogen atom, A1 represents an atom group which forms an aromatic hydrocarbon ring or an aromatic heterocyclic ring with P—C. A3 represents —C(R01)=C(R02)-, —N=C(R02)-, —C(R01)=N— or —N=N—, and R01 and R02 each represent hydrogen atom or a substituent. P1-L1-P2 represents a bidentate ligand, P1 and P2 each independently represent carbon atom, nitrogen atom or oxygen atom. L1 represents an atom group which forms the bidentate ligand with P1 and P2. j1 represents an integer of 1 to 3, j2 represents an integer of 0 to 2, but the sum of j1 and j2 is 2 or 3. M1 represents a transition metal element of the groups 8 to 10 in the element periodic table.

Examples of the hydrocarbon ring group represented by Z in the general formula (8) include a non-aromatic hydrocarbon ring group and an aromatic hydrocarbon ring group. Examples of the non-aromatic hydrocarbon ring group include cyclopropyl group, cyclopentyl group, cyclohexyl group, and the like. These groups may be a non-substituted group, or may have a substituent which is exemplified as R11, R12 in general formula (1).

Examples of the aromatic hydrocarbon ring group (also referred to as an aromatic hydrocarbon group, an aryl group or the like) include phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, biphenyl group, and the like.

These groups may be a non-substituted group, or may have a substituent which is exemplified as R11, R12 in general formula (1).

Examples of the heterocyclic ring group represented by Z in the general formula (8) include a non-aromatic heterocyclic ring group and an aromatic heterocyclic ring group. Examples of the non-aromatic heterocyclic ring group include a group derived from epoxy ring, aziridine ring, thiirane ring, oxetane ring, azetidine ring, thietane ring, tetrahydrofuran ring, dioxorane ring, pyrrolidine ring, pyrazolidine ring, imidazolidine ring, oxazolidine ring, tetrahydrothiophene ring, sulforane ring, thiazolidine ring, ε-caprolactone ring, ε-caprolactam ring, piperidine ring, hexahydropyridazine ring, hexahydropyrimidine ring, piperazine ring, morpholine ring, tetrahydropyrane ring, 1,3-dioxane ring, 1,4-dioxane ring, trioxane ring, tetrahydrothiopyrane ring, thiomorpholine ring, thiomorpholine-1,1-dioxide ring, pyranose ring, diazabicyclo[2,2,2]-octane ring, and the like.

These groups may be a non-substituted group, or may have a substituent which is exemplified as R11, R12 in general formula (1).

Examples of the aromatic heterocyclic ring group include pyridyl group, pyrimidinyl group, furyl group, pyrrolyl group, imidazolyl group, benzimidazolyl group, pyrazolyl group, pyradinyl group, triazolyl group (for example, 1,2,4-triazole-1-yl group or 1,2,3-triazole-1-yl group and the like), oxazolyl group, benzoxazolyl group, triazolyl group, isooxazolyl group, isothiazolyl group, furazanyl group, thienyl group, quinolyl group, benzofuryl group, dibenzofuryl group, benzothienyl group, dibenzothienyl group, indolyl group, carbazolyl group, carbolinyl group, diazacarbazolyl group (indicating a ring formed in a state in which one of carbon atoms constituting carboline ring of carbolinyl group is substituted by nitrogen atom), quinoxalinyl group, pyridazinyl group, triazinyl group, quinazolinyl group, phthalazinyl group, and the like.

These groups may be a non-substituted group, or may have a substituent which is exemplified as R11, R12 in general formula (1).

Preferably, the group represented by Z is an aromatic hydrocarbon ring group or an aromatic heterocyclic ring group.

Examples of the aromatic hydrocarbon ring which is formed by A1 with P—C in the general formula (8) include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring, and the like.

Furthermore, these rings may have a substituent which is exemplified as R11, R12 in general formula (1).

Examples of the aromatic heterocyclic ring which is formed by A1 with P—C in the general formula (8) include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, benzimidazole ring, benzothiazole ring, benzoxazole ring, quinoxaline ring, quinazoline ring, phthalazine ring, carbazole ring, carboline ring, azacarbazole ring, and the like.

Here, the azacarbazole ring indicates a ring formed in a state in which one or more carbon atoms of benzene ring constituting carbazole ring is substituted by nitrogen atom.

Furthermore, these rings may have a substituent which is exemplified as R11, R12 in general formula (1).

A substituent each represented by R01 and R02 in —C(R01)=C(R02)-, —N=C(R02)- and —C(R01)=N— which are represented by A3 in the general formula (8) has the same definition as the substituent which is exemplified as R11, R12 in general formula (1).

In the general formula (8), examples of the bidentate ligand represented by P1-L1-P2 include phenylpyridine, phenylpyrazole, phenylimidazole, phenyltriazole, phenyltetrazole, pyrazabole, acetylacetone, picolinic acid, and the like.

j1 represents an integer of 1 to 3, and j2 represents an integer of 0 to 2, but the sum of j1 and j2 is 2 or 3. Particularly, j2 is preferably 0.

In the general formula (8), the transition metal element (simply called a transition metal) of the groups 8 to 10 in the element periodic table represented by M1 has the same definition as the transition metal element of the groups 8 to 10 in the element periodic table represented by M1 in the general formula (7).

(Compound Represented by the General Formula (9))

The following compound represented by the general formula (9) is shown as one of preferable embodiments represented by the general formula (8).

[Chem. 68]

General formula (9)

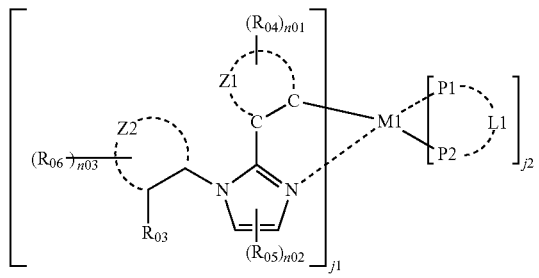

In the above general formula (9), R03 represents a substituent, R04 represents hydrogen atom or a substituent, a plurality of R04s may bond to each other to form a ring. n01 represents an integer of 1 to 4. R05 represents hydrogen atom or a substituent, a plurality of R05s may bond to each other to form a ring. n02 represents an integer of 1 to 2. R06 represents hydrogen atom or a substituent, and may bond to each other to forma ring. n03 represents an integer of 1 to 4. Z1 represents an atom group which is necessary to form a six-membered aromatic hydrocarbon ring together with C—C, or a five- or six-membered aromatic heterocyclic ring. Z2 represents a hydrocarbon ring group or a heterocyclic ring group. P1-L1-P2 represents a bidentate ligand, P1 and P2 each independently represent carbon atom, nitrogen atom or oxygen atom. L1 represents an atom group which forms the bidentate ligand with P1 and P2. j1 represents an integer of 1 to 3, j2 represents an integer of 0 to 2, but the sum of j1 and j2 is 2 or 3. M1 represents a transition metal element of the groups 8 to 10 in the element periodic table. R03 and R06, R04 and R06, and R05 and R06 may bond to each other to form a ring.

The substituent each represented by R03, R04, R05, R06 in the general formula (9) may have a substituent which is exemplified as R11, R12 in general formula (1).

In the general formula (9), examples of the six-membered aromatic hydrocarbon ring which is formed by Z1 with C—C include benzene ring, and the like.

These rings may have a substituent which is exemplified as R11, R12 in general formula (1).

Examples of the aromatic heterocyclic ring which is formed by Z1 together with C—C in the general formula (9) include oxazole ring, oxadiazole ring, oxatriazole ring, isoxazole ring, tetrazole ring, thiadiazole ring, thiatriazole ring, isothiazole ring, thiophene ring, furan ring, pyrrole ring, pyridine ring, pyridazine ring, pyrimidine ring, pyrazine ring, triazine ring, imidazole ring, pyrazole ring, triazole ring, and the like.

These rings may have a substituent which is exemplified as R11, R12 in general formula (1).

Examples of the hydrocarbon ring group represented by Z2 in the general formula (9) include a non-aromatic hydrocarbon ring group and an aromatic hydrocarbon ring group. Examples of the non-aromatic hydrocarbon ring group include cyclopropyl group, cyclopentyl group, cyclohexyl group, and the like. These groups may be a non-substituted group, or may have a substituent which is exemplified as R11, R12 in general formula (1).

Examples of the aromatic hydrocarbon ring group (also referred to as an aromatic hydrocarbon group, an aryl group or the like) include phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, biphenyl group, and the like. These groups may be a non-substituted group, or may have a substituent which is exemplified as R11, R12 in general formula (1).

Examples of the heterocyclic ring group represented by Z2 in the general formula (9) include a non-aromatic heterocyclic ring group and an aromatic heterocyclic ring group. Examples of the non-aromatic heterocyclic ring group include a group derived from epoxy ring, aziridine ring, thiirane ring, oxetane ring, azetidine ring, thietane ring, tetrahydrofuran ring, dioxorane ring, pyrrolidine ring, pyrazolidine ring, imidazolidine ring, oxazolidine ring, tetrahydrothiophene ring, sulforane ring, thiazolidine ring, ε-caprolactone ring, ε-caprolactam ring, piperidine ring, hexahydropyridazine ring, hexahydropyrimidine ring, piperazine ring, morpholine ring, tetrahydropyrane ring, 1,3-dioxane ring, 1,4-dioxane ring, trioxane ring, tetrahydrothiopyrane ring, thiomorpholine ring, thiomorpholine-1,1-dioxide ring, pyranose ring, diazabicyclo[2,2,2]-octane ring, and the like. These groups may be a non-substituted group, or may have a substituent which is exemplified as R11, R12 in general formula (1).

Examples of the aromatic heterocyclic ring group include pyridyl group, pyrimidinyl group, furyl group, pyrrolyl group, imidazolyl group, benzimidazolyl group, pyrazolyl group, pyradinyl group, triazolyl group (for example, 1,2,4-triazole-1-yl group or 1,2,3-triazole-1-yl group and the like), oxazolyl group, benzoxazolyl group, triazolyl group, isooxazolyl group, isothiazolyl group, furazanyl group, thienyl group, quinolyl group, benzofuryl group, dibenzofuryl group, benzothienyl group, dibenzothienyl group, indolyl group, carbazolyl group, carbolinyl group, diazacarbazolyl group (indicating a ring formed in a state in which one of carbon atoms constituting carboline ring of carbolinyl group is substituted by nitrogen atom), quinoxalinyl group, pyridazinyl group, triazinyl group, quinazolinyl group, phthalazinyl group, and the like.

These groups may be a non-substituted group, or may have a substituent which is exemplified as R11, R12 in general formula (1).

In the general formula (9), a group formed by Z1 and Z2 is preferably benzene ring.

In the general formula (9), the bidentate ligand represented by P1-L1-P2 has the same definition as the bidentate ligand represented by P1-L1-P2 in the general formula (7).

In the general formula (9), the transition metal element of the groups 8 to 10 in the element periodic table represented by M1 has the same definition as the transition metal element of the groups 8 to 10 in the element periodic table represented by M1 in the general formula (7).

The phosphorescence emitting material can be suitably selected from the well-known phosphorescence emitting compounds used for light emitting layers 3c of organic electroluminescent elements EL-1.

The phosphorescence emitting material is preferably a complex compound containing metal of the groups 8 to 10 in the element periodic table, and more preferably an iridium compound, an osmium compound, a platinum compound (a platinum complex compound) or a rare earth complex, and most preferably an iridium compound.

Hereinafter, the examples of the phosphorescence emitting material (Pt-1 to Pt-3, A-1, Ir-1 to Ir-50) are shown, but the present invention is not limited thereto. In the compounds, m and n represent the number of repeating unit.
[Chem. 69]
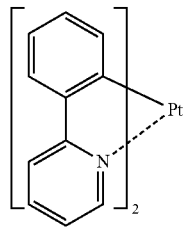
Pt-1
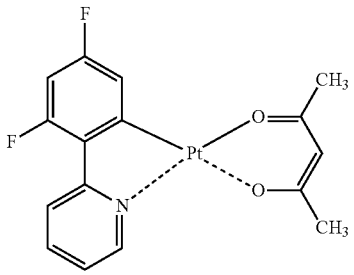
Pt-2
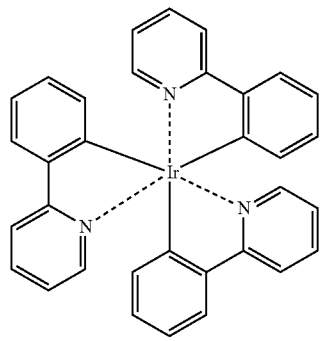
Pt-3
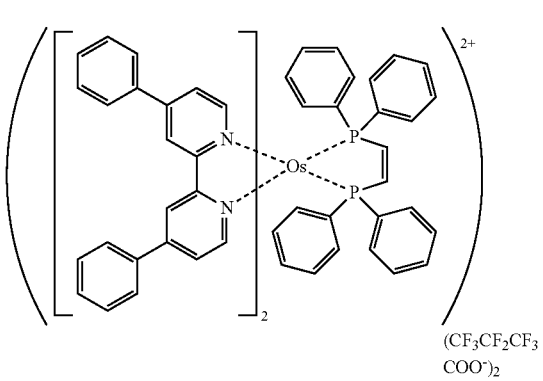
A-1
[Chem. 70]
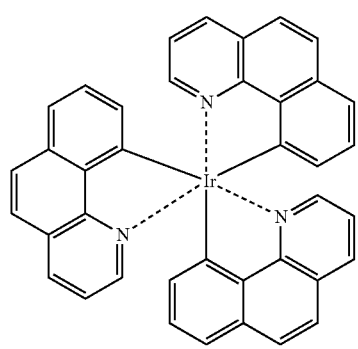
Ir-1
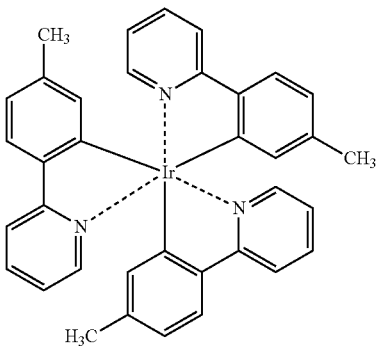
Ir-2
Ir-3
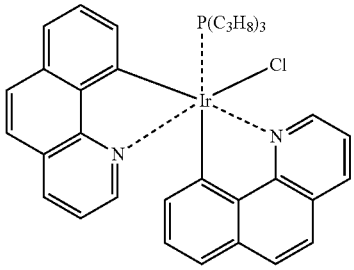
Ir-4

-continued
Ir-5
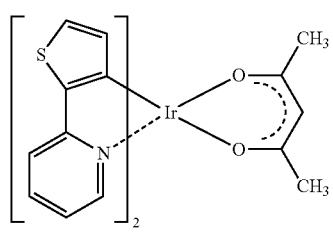
Ir-6
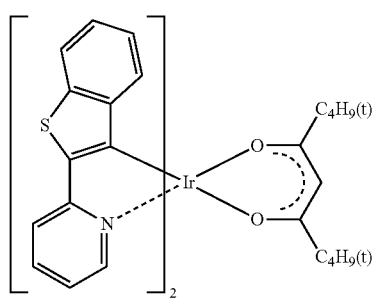
[Chem. 71]
Ir-7
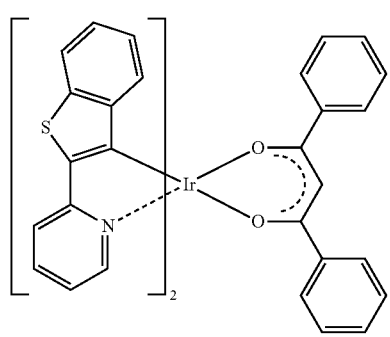
Ir-8
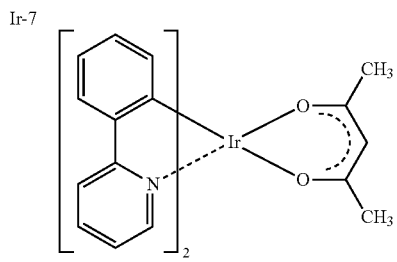
Ir-9
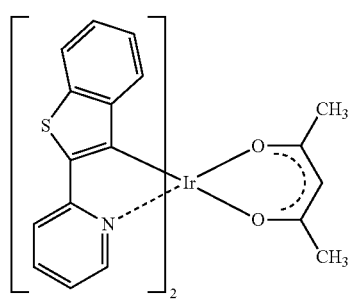
Ir-10
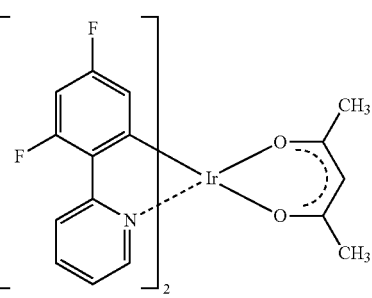
Ir-11
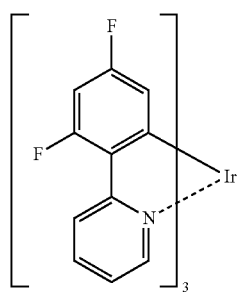
Ir-12
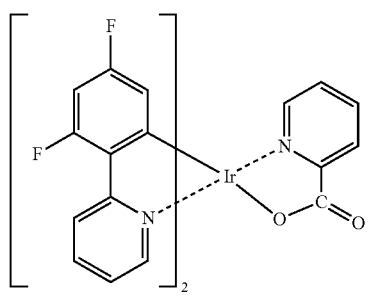
Ir-13
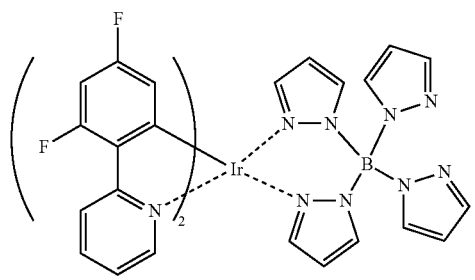
Ir-14
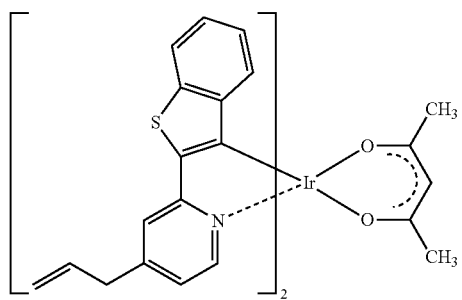

[Chem. 72]
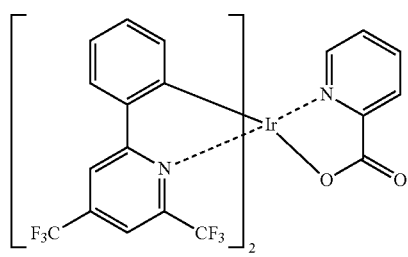
Ir-15
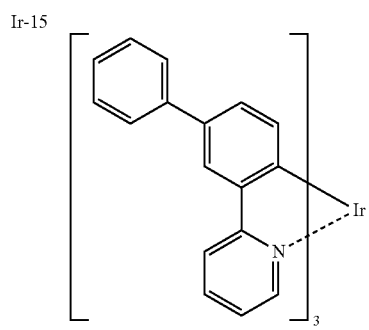
I-16
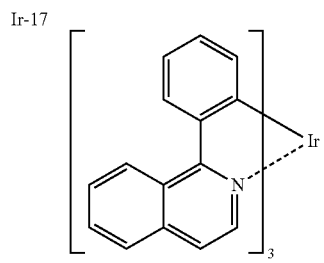
Ir-17
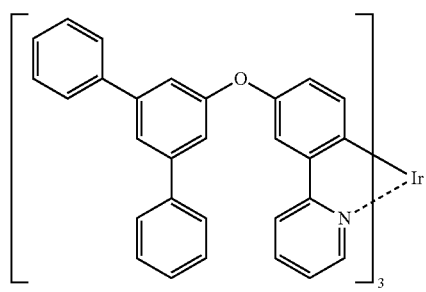
Ir-18
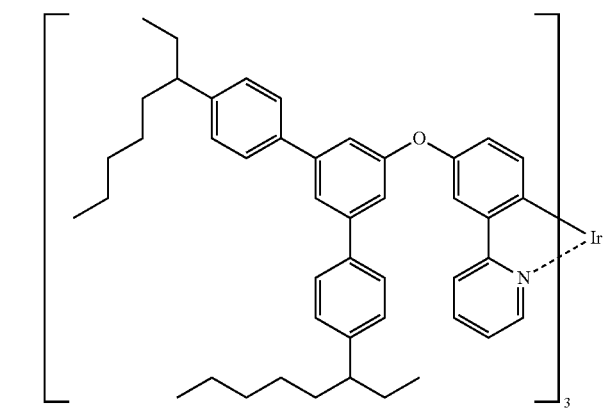
Ir-19
Ir-20
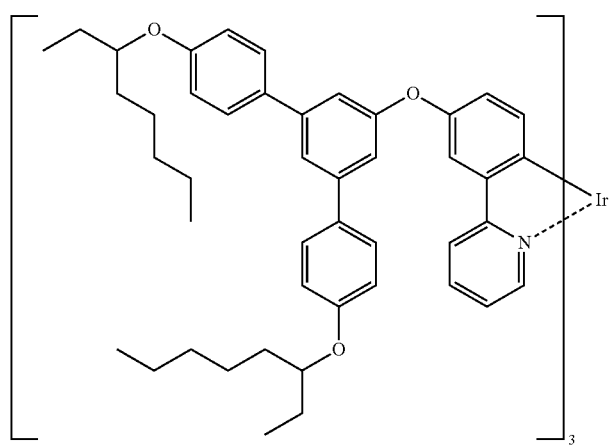
Ir-21

[Chem. 73]
Ir-22
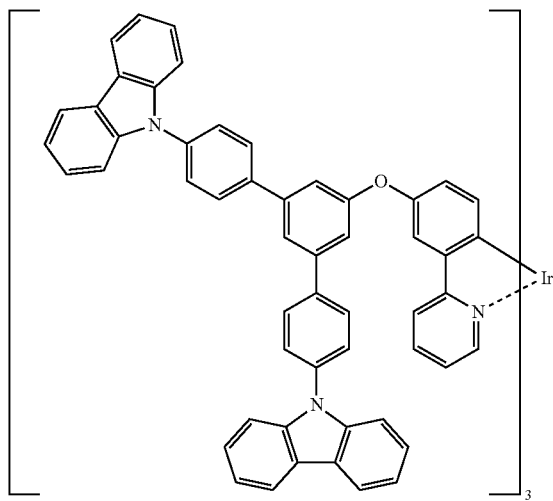
Ir-23
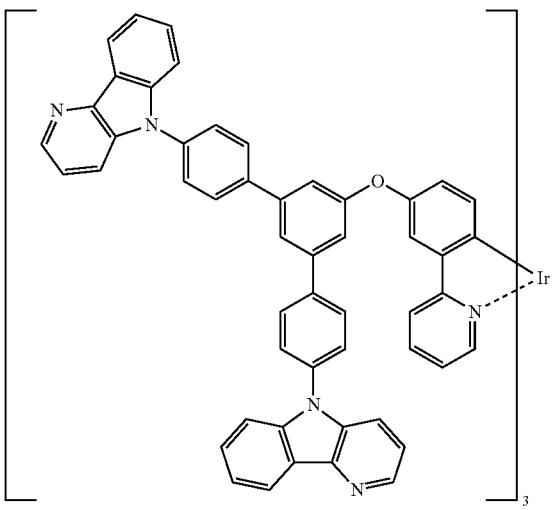
Ir-24
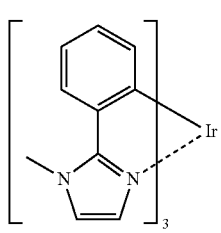
Ir-25
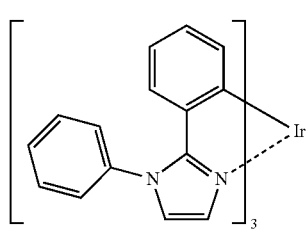
Ir-26
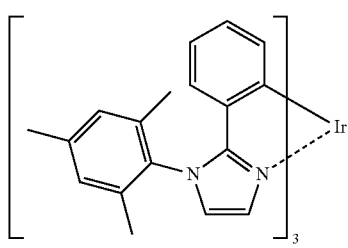
[Chem. 74]
Ir-27
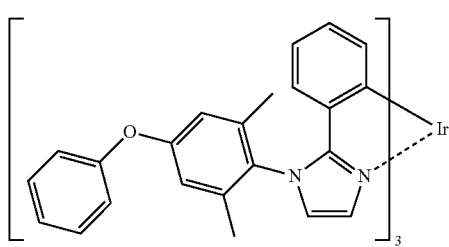
Ir-28
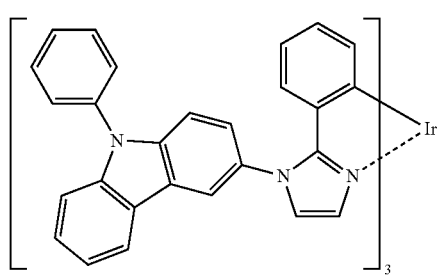
Ir-29
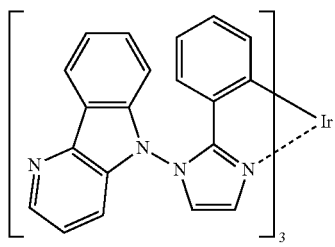
Ir-30
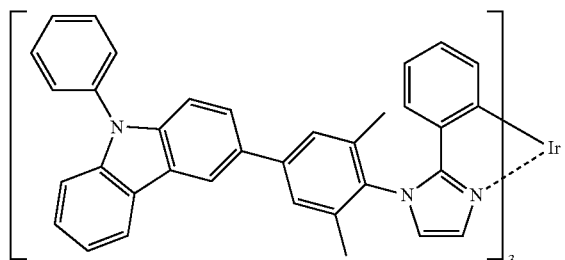

-continued
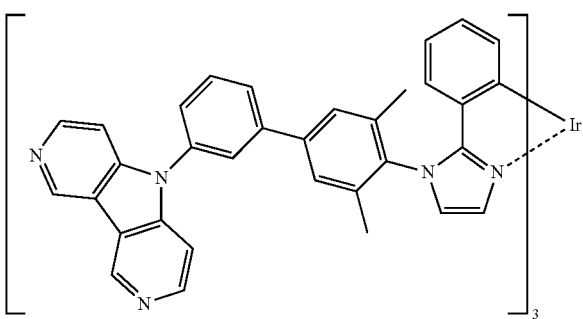
Ir-31
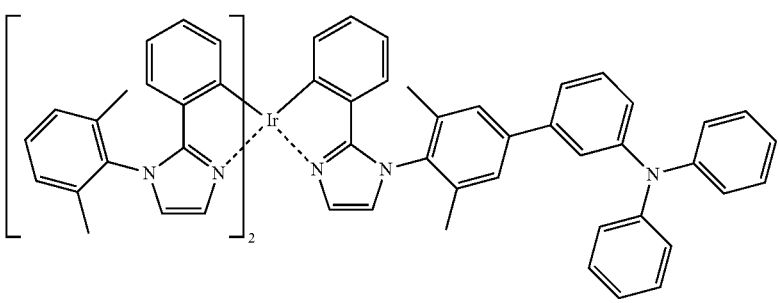
Ir-32
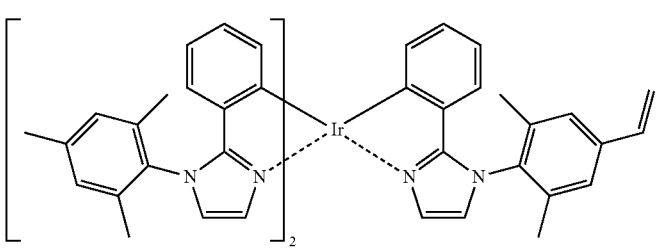
Ir-33
[Chem. 75]
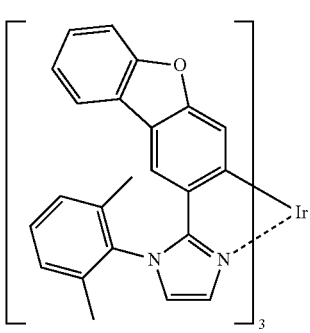
Ir-34
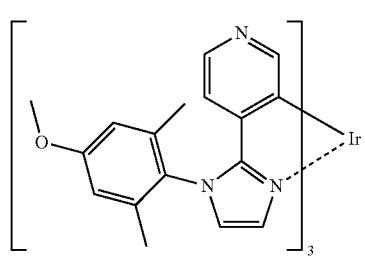
Ir-35
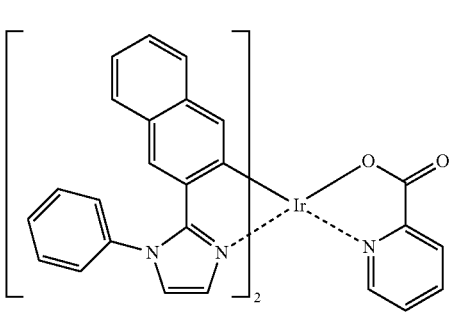
Ir-36
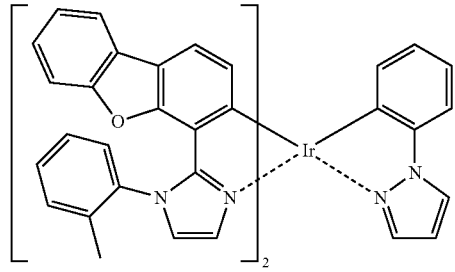
Ir-37

-continued
Ir-38 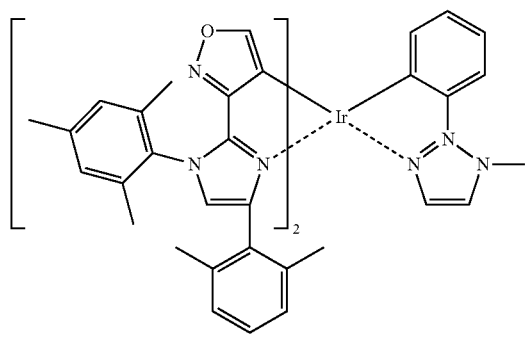
Ir-39 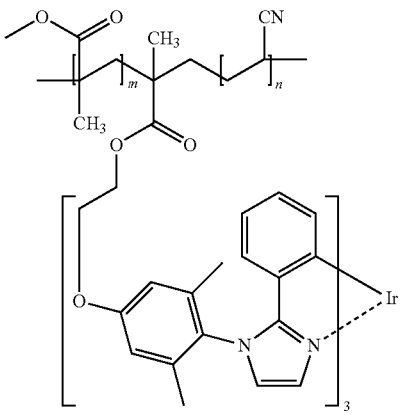
[Chem. 76]
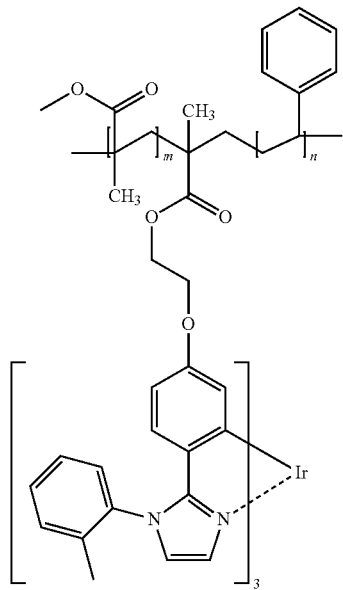
Ir-40
Ir-41
Ir-42 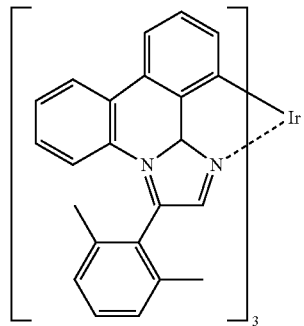
Ir-43 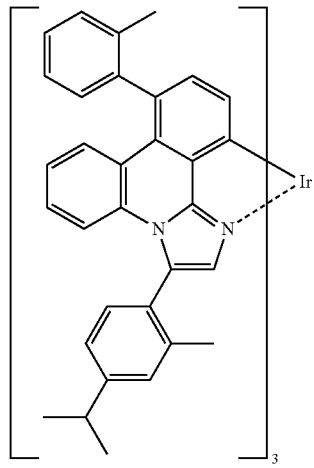

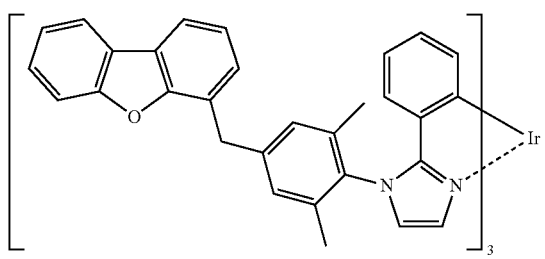
Ir-44

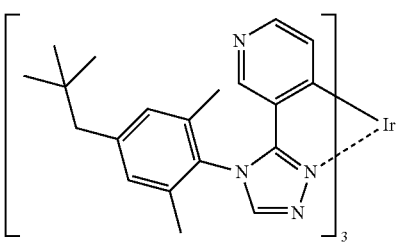
Ir-45

[Chem. 77]

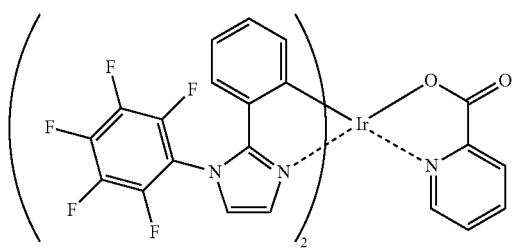
Ir-46

Ir-47
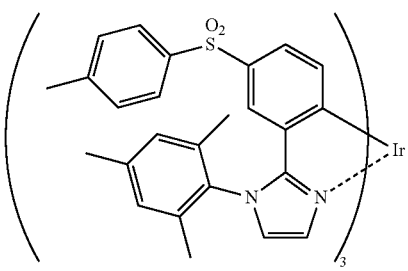

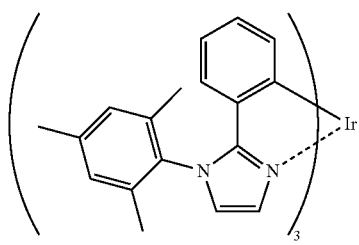
Ir-48

Ir-49
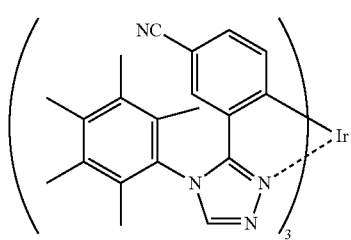

Ir-50
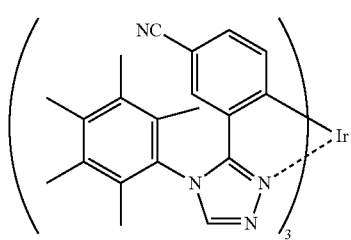

The aforementioned phosphorescence emitting compounds (also referred to as phosphorescence emitting metal complexes and the like) can be synthesized by employing methods described in documents such as Organic Letter, vol. 3, No. 16, pp. 2579-2581 (2001); Inorganic Chemistry, vol. 30, No. 8, pp. 1685-1687 (1991); J. Am. Chem. Soc., vol. 123, p. 4304 (2001); Inorganic Chemistry, vol. 40, No. 7, pp. 1704-1711 (2001); Inorganic Chemistry, vol. 41, No. 12, pp. 3055-3066 (2002); New Journal of Chemistry, vol. 26, p. 1171 (2002); and European Journal of Organic Chemistry, vol. 4, pp. 695-709 (2004); and reference documents described in these documents.

(Fluorescence Emitting Material)

Examples of the fluorescence emitting material include a coumarin-based coloring matter, a pyran-based coloring matter, a cyanine-based coloring matter, a croconium-based coloring matter, a squarylium-based coloring matter, an oxobenzanthracene-based coloring matter, a fluorescein-based coloring matter, a rhodamine-based coloring matter, a pyrylium-based coloring matter, a perylene-based coloring matter, a stilbene-based coloring matter, a polythiophene-based coloring matter, or a rare earth complex-based fluorescent material or the like.

[Injection Layer: Positive Hole Injection Layer 3a, Electron Injection Layer 3e]

The injection layer is a layer disposed between an electrode and the light emitting layer 3c to decrease a driving voltage and to improve luminance of light emitted, which is detailed in Part 2, Chapter 2 "Denkyoku Zairyo" (pp. 123-166) of "Yuki EL Soshi To Sono Kogyoka Saizensen (Nov. 30, 1998, published by N. T. S Co., Ltd.)", and examples thereof include a positive hole injection layer 3a and an electron injection layer 3e.

The injection layer is provided as needed. The positive hole injection layer 3a may be present between an anode and the light emitting layer 3c or the positive transport layer 3b, and the electron injection layer 3e may be present between a cathode and the light emitting layer 3c or the electron transport layer 3d.

The positive hole injection layer 3a is also detailed in documents such as Japanese Patent Application Laid-Open Publication Nos. 9-45479, 9-260062 and 8-288069, and examples include a phthalocyanine layer represented by copper phthalocyanine, an oxide layer represented by vanadium oxide, an amorphous carbon layer, a polymer layer employing a conductive polymer such as polyaniline (emeraldine) or polythiophene, and the like.

The electron injection layer 3e is also detailed in documents such as Japanese Patent Application Laid-Open Publication Nos. 6-325871, 9-17574 and 10-74586 and examples include: a metal layer represented by strontium or aluminum, an alkali metal halide layer represented by potassium fluoride, an alkali earth metal compound layer represented by magnesium fluoride, an oxide layer represented by molybdenum oxide, and the like. It is preferable that the electron injection layer 3e is a very thin film, and the thickness thereof is within a range of 1 nm to 10 μm although it depends on the material thereof.

[Positive Hole Transport Layer 3b]

The positive hole transport layer 3b is formed of a positive hole transport material having a function of transporting positive holes, and a positive hole injection layer 3a and an electron blocking layer are also included in the positive hole transport layer 3b in the broad sense of the word. The positive hole transport layer 3b may be provided as a sole layer or as a plurality of layers.

The positive hole transport material is a material having an injection capability or transport capability of positive holes, and barrier property against electrons and either an organic substance or an inorganic substance may be used. Examples include a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a conductive high molecular oligomer, particularly, a thiophene oligomer and the like.

Those described above can be used as the positive hole transport material. However, it is preferable to use a porphyrin compound, an aromatic tertiary amine compound and a styrylamine compound, particularly, an aromatic tertiary amine compound.

Typical examples of the aromatic tertiary amine compound and the styrylamine compound include N,N,N',N'-tetraphenyl-4,4'-diaminophenyl; N,N'-diphenyl-N,N'-bis(3-methylphenyl)-[1,1'-biphenyl]-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino) quadriphenyl; N,N,N-trip-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; N-phenylcarbazole; those having two condensed aromatic rings in a molecule described in U.S. Pat. No. 5,061,569, for instance, 4,4'-bis[N-(1-naphthyl)-N-phenylamino]biphenyl (NDP), 4,4',4"-tris[N-(3-methylphenyl)-N-phenylamino]triphenylamine (MTDATA) in which three triphenylamine units are bonded in a star burst form described in Japanese Patent Application Laid-Open Publication No. 04-308688 and the like.

Furthermore, polymer materials in which these materials are introduced into a polymer chain or constitute a main chain of a polymer can also be used. Moreover, inorganic compounds such as a p type—Si and a p type—SiC can also be used as the positive hole injection material and the positive hole transport material.

In addition, it is also possible to use so-called p type positive hole transport materials described in documents such as Japanese Patent Application Laid-Open Publication No. 11-251067 and Applied Physics Letters 80 (2002), p. 139 by J. Huang et. al. In the present invention, it is preferable to use these materials in view of producing a light emitting element having high efficiency.

The positive hole transport layer 3b can be formed by making the aforementioned positive hole transport material a thin film by a well-known method such as the vacuum evaporation method, the spin coating method, the casting method, the printing method including the ink-jet method or the LB method. The thickness of the positive hole transport layer 3b is not particularly limited, but the thickness is generally within a range about of 5 nm to 5 μm, preferably within a range of 5 nm to 200 nm. This positive hole transport layer 3b may have a single layer configuration constituted of one or two or more of the aforementioned materials.

Furthermore, it is possible to enhance the p property by doping the material of the positive hole transport layer 3b with impurities. Examples include those described in documents such as Japanese Patent Application Laid-Open Publication Nos. 04-297076, 2000-196140, 2001-102175 and J. Appl. Phys., 95, 5773 (2004).

As described above, it is preferable that enhancement of a high p property of the positive hole transport layer 3b makes it possible to produce an element which consumes lower electric power.

[Electron Transport Layer 3d]

The electron transport layer 3d is formed of a material having a function of transporting electrons, and, in a broad sense, the electron injection layer 3e and a positive hole blocking layer (not shown) are involved in the electron transport layer 3d. The electron transport layer 3d can be provided as a single layer or a laminated layer of a plurality of layers.

In the electron transport layer 3d having a single layer configuration and the electron transport layer 3d having a laminated layer configuration, the electron transport material constituting a layer provided adjacent to the light emitting layer 3c has a function of transporting electrons injected from the cathode to the light emitting layer 3c. The material to be used can be optionally selected from well-known compounds. Examples include a nitro-substituted fluorene derivative, a diphenylquinone derivative, a thiopyrandioxide derivative, carbodiimide, a fluorenylidenemethane derivative, anthraquinonedimethane, an anthrone derivative, and an oxadiazole derivative and the like. Furthermore, in the aforementioned oxadiazole derivative, a thiadiazole derivative which is formed by substituting the oxygen atom of the above oxadiazole ring by a sulfur atom, and a quinoxaline derivative having a quinoxaline ring which is well-known as an electron withdrawing group can be used as the material of the electron transport layer 3d. Moreover, polymer materials in which these materials are introduced into a polymer chain or constitute a main chain of a polymer can also be used.

Additionally, metal complexes of an 8-quinolinol derivative such as: tris(8-quinolinol)aluminum (Alq3), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol) zinc (Znq), and metal complexes in which the central metal of the these metal complexes is substituted by In, Mg, Cu, Ca, Sn, Ga or Pb can also be used as the material of the electron transport layer 3d.

Furthermore, a metal-free or metalphthalocyanine and those in which the terminals thereof are substituted by an alkyl group, a sulfonic acid group or the like can be preferably used as the material of the electron transport layer 3d. Moreover, the distyrylpyrazine derivative mentioned as an example of the material of the light emitting layer 3c can also be used as the material of the electron transport layer 3d. As same as the positive hole injection layer 3a and the positive hole transfer layer 3b, inorganic semiconductors such as an n type—Si and an n type—SiC can also be used as the material of the electron transport layer 3d.

The electron transport layer 3d can be formed by thinning the aforementioned electron transport material by a well-known method such as the vacuum evaporation method, the spin coating method, the casting method, the printing method including the ink-jet method or the LB method. The thickness of the electron transport layer 3d is not particularly limited, but the thickness is generally within a range of 5 nm to 5 μm, preferably within a range of 5 nm to 200 nm. This electron transport layer 3d may have a single layer configuration constituted of one or two or more of the aforementioned materials.

Furthermore, it is possible to enhance the n property by doping the material of the electron transport layer 3d with impurities. Examples thereof include those described in documents such as Japanese Patent Application Laid-Open Publication Nos. 04-297076, 10-270172, 2000-196140 and 2001-102175 and J. Appl. Phys., 95, 5773 (2004). Moreover, it is preferable to introduce potassium or a potassium compound into the electron transport layer 3d. Examples of the potassium compound that can be used include, for example, potassium fluoride, and the like. As described above, by enhancement of an n property of the electron transport layer 3d, an element which consumes lower electric power can be produced.

In addition, the compound represented by the general formula (10) can be preferably used as the material of the electron transport layer 3d (electron transport compound).

(Ar1)n1-Y1    General formula (10)

In the general formula (10), n1 represents an integer of 1 or more, Y1 represents a substituent when n1 is 1, and represents a bond or an n1-valent linking group when n1 is 2 or more. Ar1 represents a group represented by the following general formula (A), and a plurality of Ar1s is identical or different when n1 is 2 or more. However, the compound represented by the general formula (10) has in a molecule at least two condensed aromatic heterocyclic rings obtained by condensing three or more rings.

In the general formula (10), an example of the substituent represented by Y1 has the same meaning as the substituent exemplified as R11, R12 of the general formula (1) which is shown as the compound constituting the nitrogen-containing layer 1a of the transparent electrode 1.

Examples of an n1-valent linking group represented by Y1 in the general formula (10) include a divalent linking group, a trivalent linking group and a tetravalent linking group, and the like.

Examples of the divalent linking group represented by Y1 in the general formula (10) include: an alkylene group (for example, ethylene group, trimethylene group, tetramethylene group, propylene group, ethylethylene group, pentamethylene group, hexamethylene group, 2,2,4-trimethylhexamethylene group, heptamethylene group, octamethylene group, nonamethylene group, decamethylene group, undecamethylene group, dodecamethylene group, a cyclohexylene group (for example, 1,6-cyclohexanediyl group and the like) and a cyclopenthylene group (for example, 1,5-cyclopentanediyl group and the like)), an alkenylene group (for example, vinylene group, propenylene group, butenylene group, pentenylene group, 1-methylvinylene group, 1-methylpropenylene group, 2-methylpropenylene group, 1-methylpentenylene group, 3-methylpentenylene group, 1-ethylvinylene group, 1-ethylpropenylene group, 1-ethylbutenylene group, 3-ethylbutenylene group and the like), an alkynylene group (for example, ethynylene group, 1-propynylene group, 1-butynylene group, 1-pentynylene group, 1-hexynylene group, 2-butynylene group, 2-pentynylene group, 1-methylethynylene group, 3-methyl-1-propynylene group, 3-methyl-1-butynylene group and the like), an arylene group (for example, o-phenylene group, p-phenylene group, naphthalenediyl group, anthracenediyl group, naphthacenediyl group, pyrenediyl group, naphthylnaphthalenediyl group, a biphenyldiyl group (for example, [1,1'-biphenyl]-4,4'-diyl group, 3,3'-biphenyldiyl group, 3,6-biphenyldiyl group and the like), terphenyldiyl group, quaterphenyldiyl group, quinquephenyldiyl group, sexiphenyldiyl group, septiphenyldiyl group, octiphenyldiyl group, nobiphenyldiyl group, deciphenyldiyl group and the like), a heteroarylene group (for example, a divalent group derived from a group consisting of carbazole group, carboline ring, diazacarbazole ring (also referred to as monoazacarboline group, exhibiting a ring structure obtained by substituting one carbon atom constituting the carboline ring, with a nitrogen atom), triazole ring, pyrrole ring, pyridine ring, pyrazine ring, quinoxaline ring, thiophene ring, oxadiazole ring, dibenzofuran ring, dibenzothiophene ring, indole ring and the like), a chalcogen atom such as oxygen or sulfur, a group or the like derived from a condensed aromatic heterocyclic ring obtained by condensing three or more rings (here, the condensed aromatic heterocyclic ring formed by condensing three or more rings preferably contains a hetero atom selected from N, O and S as an element constituting a condensed ring, for example, acridine ring, benzoquinoline ring, carbazole ring, phenazine ring, phenanthridine ring, phenanthroline ring, carboline ring, cycladine ring, quindoline ring, thebenidine ring, quinindoline ring, triphenodithiazine ring, triphenodioxazine ring, phenanthrazine ring, anthrazine ring, perimizine ring, diazacarbazole ring (exhibiting a ring obtained by substituting optional one of carbon atoms constituting the carboline ring, with a nitrogen atom), phenanthroline ring, dibenzofuran ring, dibenzothiophene ring, naphthofuran ring, naphthothiophene ring, benzodifuran ring, benzodithiophene ring, naphthodifuran ring, naphthodithiophene ring, anthrafuran ring, anthradifuran ring, anthrathiophene ring, anthradithiophene ring, thianthrene ring, phenoxathiin ring, thiophanthrene ring (naphthothiophene ring) and the like).

Examples of the trivalent linking group represented by Y1 in the general formula (10) include ethanetriyl group, propanetriyl group, butanetriyl group, pentanetriyl group, hexanetriyl group, heptanetriyl group, octanetriyl group, nonanetriyl group, decanetriyl group, undecanetriyl group, dodecanetriyl group, cyclohexanetriyl group, cyclopentanetriyl group, benzenetriyl group, naphthalenetriyl group, pyridinetriylgroup, carbazoletriylgroup, and the like.

The tetravalent linking group represented by Y1 in the general formula (10) is a group having a combining group added to the above-mentioned trivalent linking group. Examples include propandiylidene group, 1,3-propandiyl-2-ylidene group, butanediylidene group, pentanediylidene group, hexanediylidene group, heptanediylidene group, octanediylidene group, nonanediylidene group, decanediylidene group, undecanediylidene group, dodecanediylidene group, cyclohexanediylidene group, cyclopentanediylidene group, benzenetetrayl group, naphthalenetetrayl group, pyridinetetrayl group, carbazoletetrayl group, and the like.

Meanwhile, each of the aforementioned divalent, trivalent and tetravalent linking groups may further have a substituent exemplified as R11 and R12 of the general formula (1).

As the preferable aspect of the compound represented by the general formula (10), it is preferable that Y1 represent a group which is derived from a condensed aromatic heterocyclic ring formed by condensing three or more rings. Examples of the condensed aromatic heterocyclic ring formed by condensing three or more rings preferably include dibenzofuran ring or dibenzothiophene ring. In addition, preferably n1 is 2 or more.

Furthermore, the compound represented by the general formula (10) has, in the molecule, at least two condensed aromatic heterocyclic rings formed by condensing three or more rings, described above.

Moreover, when Y1 represents an n1-valent linking group, Y1 is preferably non-conjugated in order to keep the triplet excitation energy of the compound represented by the general formula (10) high, and is preferably constituted of aromatic rings (aromatic hydrocarbon ring+aromatic heterocyclic ring) from the viewpoint of improving Tg (also referred to as glass transition point, or glass transition temperature).

Here, the "non-conjugated" means a case in which a linking group cannot be expressed by repetition of a single bond (single bond) and a double bond, or a case in which a conjugation of aromatic rings constituting a linking group is sterically broken.

[Group Represented by the General Formula (A)]

An in the general formula (10) represents the group represented by the general formula (A) below.

[Chem. 78]

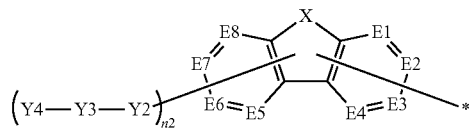

General formula (A)

where X represents —N(R)—, —O—, —S— or —Si(R)(R')—, E1 to E8 each represent —C(R1)= or —N=, R, R' and R1 each represent hydrogen atom, a substituent or a linking moiety with Y1. * represents a linking moiety with Y1. Y2 represents simply a bond or a divalent linking group. Y3 and Y4 each represent a group derived from a five-membered or six-membered aromatic ring, and at least one represents a group derived from an aromatic heterocyclic ring containing a nitrogen atom as a ring constituent atom. n2 represents an integer of 1 to 4.

Here, in —N(R)— or —Si(R)(R')— represented by X of the general formula (A), and further in —C(R1)= represented by E1 to E8, a substituent represented by each of R, R' and R1 has the same meaning as the substituent represented by R11, R12 of the general formula (1).

In addition, a divalent linking group represented by Y2 in the general formula (A) has the same meaning as the divalent linking group represented by Y1 in the general formula (10).

Furthermore, examples of a five-membered or six-membered aromatic ring which is used for the formation of a group derived from a five-membered or six-membered aromatic ring represented by each of Y3 and Y4 in the general formula (A) include benzene ring, oxazole ring, thiophene ring, furan ring, pyrrole ring, pyridine ring, pyridazine ring, pyrimidine ring, pyrazine ring, diazine ring, triazine ring, imidazole ring, isoxazole ring, pyrazole ring, triazole ring, and the like.

Moreover, at least one of the groups derived from five-membered or six-membered aromatic rings each represented by Y3 and Y4 represents a group derived from the aromatic heterocyclic ring containing a nitrogen atom as a ring constituent atom, and examples of the aromatic heterocyclic ring containing a nitrogen atom as a ring constituent atom include oxazole ring, pyrrole ring, pyridine ring, pyridazine ring, pyrimidine ring, pyrazine ring, diazine ring, triazine ring, imidazole ring, isoxazole ring, pyrazole ring, triazole ring, and the like.

(Preferred Aspect of the Group Represented by Y3)

In the general formula (A), the group represented by Y3 is preferably a group derived from the aforementioned six-membered aromatic ring, and is more preferably a group derived from a benzene ring.

(Preferred Aspect of the Group Represented by Y4)

In the general formula (A), the group represented by Y4 is preferably a group derived from the aforementioned six-membered aromatic ring, is more preferably a group derived from the aromatic heterocyclic ring containing nitrogen atom as a ring constituent atom, and is Particularly preferably a group derived from a pyridine ring.

(Preferred Aspect of the Group Represented by the General Formula (A))

The preferable aspect of the group represented by the general formula (A) includes a group represented by any of the general formulae (A-1), (A-2), (A-3) or (A-4).

[Chem. 79]

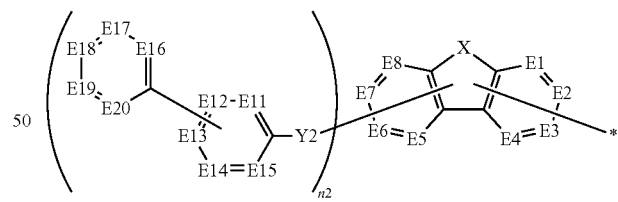

General formula (A-1)

In the general formula (A-1), X represents —N(R)—, —O—, —S— or —Si(R)(R')—, E1 to E8 each represent —C(R1)= or —N=, and R, R' and R1 each represent hydrogen atom, a substituent or a linking moiety with Y1. Y2 represents simply a bond or a divalent linking group. E11 to E20 each represent —C(R2)= or —N=, and at least one represents —N=. R2 represents hydrogen atom, a substituent or a linking moiety. However, at least one of E11 and E12 represents —C(R2)=, and R2 represents a linking moiety. n2 represents an integer of 1 to 4. The symbol * represents a linking moiety with Y1 in the general formula (10).

[Chem. 80]

General formula (A-2)

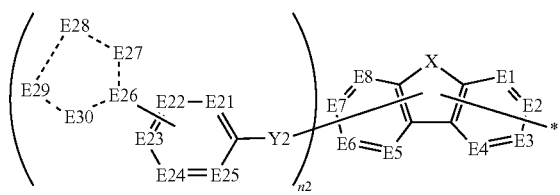

In the general formula (A-2), X represents —N(R)—, —O—, —S— or —Si(R)(R')—, E1 to E8 each represent —C(R1)= or —N=, and R, R' and R1 each represent a hydrogen atom, a substituent or a linking moiety with Y1. Y2 represents simply a bond or a divalent linking group. E21 to E25 each represent —C(R2)= or —N=, E26 to E30 each represent —C(R2)=, —N=, —O—, —S— or —Si(R3)(R4)-, and at least one of E21 to E30 represents —N=. R2 represents hydrogen atom, a substituent or a linking moiety, and R3 and R4 each represent hydrogen atom or a substituent. However, at least one of E21 or E22 represents —C(R2)= and R2 represents a linking moiety. n2 represents an integer of 1 to 4. * represents a linking moiety with Y1 in the general formula (10).

[Chem. 81]

General formula (A-3)

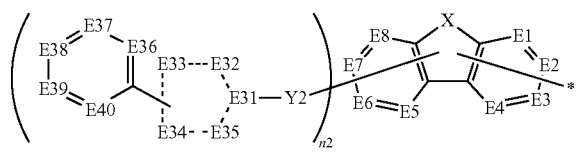

In the general formula (A-3), X represents —N(R)—, —O—, —S— or —Si(R)(R')—, E1 to E8 each represent —C(R1)= or —N=, and R, R' and R1 each represent hydrogen atom, a substituent or a linking moiety with Y1. Y2 represents simply a bond or a divalent linking group. E31 to E35 each represent —C(R2)=, —N=, —O—, —S— or —Si(R3)(R4)-, and E36 to E40 each represent —C(R2)= or —N=, and at least one of E31 to E40 represents —N=. R2 represents hydrogen atom, a substituent or a linking moiety, and R3 and R4 each represent hydrogen atom or a substituent. However, at least one of E32 or E33 represents —C(R2)= and R2 represents a linking moiety. n2 represents an integer of 1 to 4. * represents a linking moiety with Y1 in the general formula (10).

[Chem. 82]

General formula (A-4)

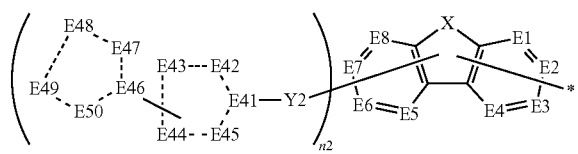

In the general formula (A-4), X represents —N(R)—, —O—, —S— or —Si(R)(R')—, E1 to E8 each represent —C(R1)= or —N=, and R, R' and R1 each represent hydrogen atom, a substituent or a linking moiety with Y1. Y2 represents simply a bond or a divalent linking group. E41 to E50 each represent —C(R2)=, —N=, —O—, —S— or —Si(R3)(R4)-, and at least one represents —N=. R2 represents hydrogen atom, a substituent or a linking moiety, and R3 and R4 each represent hydrogen atom or a substituent. However, at least one of E42 or E43 represents —C(R2)= and R2 represents a linking moiety. n2 represents an integer of 1 to 4. * represents a linking moiety with Y1 in the general formula (10).

Hereinafter, the group represented by any of the general formulae (A-1) to (A-4) will be explained.

In —N(R)— or —Si(R)(R')— represented by X in any of the group represented by the general formulae (A-1) to (A-4), and further in —C(R1)= represented by E1 to E8, a substituent represented by each of R, R' and R1 has the same definition as the substituent represented by R11, R12 of the general formula (1).

In any of the group represented by the general formulae (A-1) to (A-4), the divalent linking group represented by Y2 has the same definition as the divalent linking group represented by Y1 of the general formula (10).

The substituent represented by R2 in —C(R2)= represented by each of E11 to E20 in the general formula (A-1), each of E21 to E30 in the general formula (A-2), each of E31 to E40 in the general formula (A-3) and each of E41 to E50 in the general formula (A-4) has the same definition as the substituent represented by R11, R12 of the general formula (1).

Next, further preferable embodiments of the compound represented by the general formula (10) according to the present invention will be explained.
[Compound Represented by the General Formula (11)]

According to the present invention, among the compounds represented by the aforementioned general formula (10), the compound represented by the following general formula (11) is preferable. The general formula (11) includes the general formula (2) representing the compound constituting the nitrogen-containing layer 1a of the transparent electrode 1. Hereinafter, the compound represented by the general formula (11) will be explained.

[Chem. 83]

General formula (11)

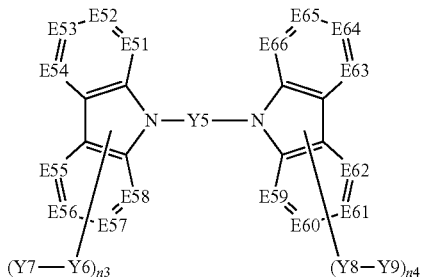

In the general formula (11), Y5 represents a divalent linking group formed of an arylene group, a heteroarylene group or a combination thereof. E51 to E66 each represent —C(R3)= or —N=, and R3 represents hydrogen atom or a substituent. Y6 to Y9 each represent a group derived from an aromatic hydrocarbon ring or a group derived from an aromatic heterocyclic ring, and at least one of Y6 or Y7 and at least one of Y8 or Y9 each represent a group derived from an aromatic heterocyclic ring containing N atom. n3 and n4 each represent an integer of 0 to 4, but n3+n4 is an integer of 2 or more.

Y5 in the general formula (11) has the same definition as Y21 in the general formula (2).

Each of E51 to E66 in the general formula (11) has the same definition as E201 to E216 in the general formula (2), and when R3 of —C(R3)= represented by each of E51 to E66 is a substituent, as examples of the substituent, one exemplified as R11, R12 of the general formula (1) is applied in the same way.

In the general formula (11), it is preferable that as groups represented by E51 to E66, six or more among E51 to E58 and six or more among E59 to E66 each represent —C(R3)=.

In the general formula (11), examples of the aromatic hydrocarbon ring which is used for the formation of a group derived from the aromatic hydrocarbon ring represented by Y6 to Y9 include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring and the like.

Furthermore, the aromatic hydrocarbon ring may also have a substituent represented by R11, R12 of the general formula (1).

In the general formula (11), examples of the aromatic heterocyclic ring used for the formation of a group derived from the aromatic heterocyclic ring represented by each of Y6 to Y9 include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, thiazole ring, indole ring, indazole ring, benzimidazole ring, benzothiazole ring, benzoxazole ring, quinoxaline ring, quinazoline ring, cinnoline ring, quinoline ring, isoquinoline ring, phthalazine ring, naphthylidine ring, carbazole ring, carboline ring, diazacarbazole ring (represents a ring obtained by further substituting one of carbon atoms constituting the carboline ring by a nitrogen atom), and the like.

Moreover, the aromatic hydrocarbon ring may have the substituent exemplified as R11, R12 of the general formula (1).

In the general formula (11), examples of the aromatic heterocyclic ring containing N atom which is used for the formation of a group derived from the aromatic heterocyclic ring containing N atom represented by at least one of Y6 or Y7 and at least one of Y8 or Y9 include oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, thiazole ring, indole ring, indazole ring, benzimidazole ring, benzothiazole ring, benzoxazole ring, quinoxaline ring, quinazoline ring, cinnoline ring, quinoline ring, isoquinoline ring, phthalazine ring, naphthylidine ring, carbazole ring, carboline ring, diazacarbazole ring (represents a ring obtained by further substituting one of carbon atoms constituting the carboline ring by a nitrogen atom), and the like.

In the general formula (11), it is preferable that the group each represented by Y7, Y9 is represented by a group derived from each pyridine ring.

In addition, in the general formula (11), it is preferable that the group each represented by Y6 and Y8 is represented by a group derived from each benzene ring.

More preferable embodiment among the compounds represented by the general formula (11) as explained above includes the compound represented by the general formula (2) exemplified as the compounds constituting the nitrogen-containing layer 1a of the transparent electrode 1.

Examples of the compound represented by each of the above general formulae (10), (11) or the general formula (2) include the aforementioned compounds (1 to 118).

[Blocking Layer: Positive Hole Blocking Layer, Electron Blocking Layer]

The blocking layer is provided as necessary in addition to the basic constituent layers of thin organic compound films described above. Examples thereof include a positive hole blocking layer described in documents such as Japanese Patent Application Laid-Open Publication Nos. 11-204258, 11-204359, and p. 237 of "Yuki EL Soshi To Sono Kogyoka Saizensen (Organic EL Element and Front of Industrialization thereof) (Nov. 30, 1998, published by N. T. S Co., Ltd.)", and the like.

The positive hole blocking layer has a function of the electron transport layer 3d in abroad sense. The positive hole blocking layer is formed of a positive hole blocking material having a remarkably small capability to transport positive holes while having a function of transporting electrons and can increase recombination probability of electrons and positive holes by blocking positive holes while transporting electrons. Furthermore, as necessary, the configuration of an electron transport layer 3d described below can be used as the positive hole blocking layer according to the present invention. It is preferable that the positive hole blocking layer be disposed adjacent to the light emitting layer 3c.

On the other hand, the electron blocking layer has a function as the positive hole transport layer 3b in abroad sense. The electron blocking layer is formed of a material having a very little capability to transport electrons while having a function of transporting positive holes, and can increase the recombination probability of electrons and positive holes by blocking electrons while transporting positive holes. Furthermore, as necessary, the configuration of a positive hole transport layer 3b described below can be applied to the electron blocking layer. The thickness of the positive hole blocking layer according to the present invention is preferably 3 to 100 nm, more preferably 5 to 30 nm.

[Auxiliary Electrode 15]

An auxiliary electrode 15 is provided in order to lower an electric resistance of the transparent electrode 1 and is provided in contact with the electrode layer 1b of the transparent electrode 1. As a material forming the auxiliary electrode 15, a metal having a low electric resistance such as gold, platinum, silver, copper or aluminum is preferable. These metals may be patterned within a range not affecting the extraction of the emitted light h from a light extraction surface 17a due to the low light transmission property. Examples of a method for forming the auxiliary electrode 15 include the vapor evaporation method, the sputtering method, the printing method, the ink-jet method, an aerosol jet method and the like. It is preferable that the line width of the auxiliary electrode 15 is 50 μm or less in view of an aperture ratio for the light extraction, and the thickness of the auxiliary electrode 15 is 1 μm or more in view of electric conductivity.

[Transparent Sealing Material 17]

A transparent sealing material 17 is a material for covering the organic electroluminescent element EL-1, and may be a plate-like (film-like) sealing member which is fixed to a substrate 13 by an adhesive 19, or may be a sealing membrane. The surface of the sealing material 17 serves as a light extraction surface 17a through which an emitted light h of the organic electroluminescent element EL-1 is extracted. The transparent sealing material 17 is provided in a state in which the terminal portions of transparent electrode 1 and the counter electrode 5-1 of the organic electroluminescent element EL-1 are exposed and at least the light emitting functional layer 3 is covered. Alternatively, the transparent sealing material 17 may be constituted so that an electrode is provided on the transparent sealing material 17, and the electrode is electrically conducted with the terminal portions of transparent electrode 1 and the counter electrode 5-1 of the organic electroluminescent element EL-1.

Specific examples of the plate-like (film-like) transparent sealing material 17 include a glass substrate, a polymer substrate, and the transparent sealing material 17 may be used by making these substrates into thinner-type films. Examples of glass substrate can include particularly soda lime glass, barium strontium-containing glass, lead glass, alminosilicate glass, borosilicate glass, barium borosilicate glass, quartz and the like. In addition, examples of the polymer substrate can include polycarbonate, acryl, polyethylene terephthalate, polyethersulfide, polysulfone and the like.

Among them, from the viewpoint of thinning the element, the polymer substrate in the form of a thin film is preferably used as the transparent sealing material 17.

Furthermore, the polymer substrate in the form of a thin film preferably has an oxygen transmittance measured in accordance with the method of JIS-K-7126-1987 of $1\times10^{-3}$ ml/(m$^2$·24 hr·atm) or less and a water vapor transmittance (25±0.5° C., relative humidity (90±2) % RH) measured in accordance with the method of JIS-K-7129-1992 of $1\times10^{-3}$ g/(m$^2$·24 hr) or less.

Moreover, the above substrate material may also be processed into the form of a recessed plate to thereby be used as the transparent sealing material 17. In this case, processing such as sandblast processing or chemical etching processing is performed on the substrate member to thereby form recessed portions.

In addition, the adhesive 19 for fixing the plate-like transparent sealing material 17 to the substrate 13 is also used as a sealant for sealing the organic electroluminescent element EL-1 sandwiched between the transparent sealing material 17 and the substrate 13. Examples of the adhesive 19 can include a photo curable and thermosetting-type adhesive such as an acrylic acid-based oligomer or methacrylic acid-based oligomer having a reactive vinyl group, a moisture curable type adhesive such as 2-cyanoacrylic acid ester and the like.

In addition, examples of the adhesive 19 can include a thermosetting or chemical curable (two liquids mixing type) adhesive such as epoxy-based adhesive. Furthermore, there can be included a hot-melt type adhesive such as polyamide, polyester, polyolefin, or the like. Moreover, there can be included an ultraviolet curable-type epoxy resin adhesive of cationic curable-type.

Meanwhile, there is a case in which the organic materials constituting the organic electroluminescent element EL-1 degrade through heat treatment. Therefore, it is preferable that the adhesive 19 can be adhered and cured at temperatures from room temperature to 80° C. In addition, a drying agent may be dispersed in the adhesive 19.

Coating of the adhesive 19 on the adhesion portion of the transparent sealing material 17 and the substrate 13 may be carried out using a commercially available dispenser, or by printing such as screen-printing.

Furthermore, when a gap is formed among the plate-like transparent sealing material 17 and the substrate 13 and the adhesive 19, it is preferable to inject an inert gas such as nitrogen or argon, or an inert liquid such as a fluorinated hydrocarbon or a silicone oil to the gap, in gaseous phase and liquid phase. It is possible to be set vacuum. Furthermore, it is possible to enclose a hydroscopic compound into the gap.

Examples of the hydroscopic compound include, for instance, a metal oxide (for example, sodium oxide, potassium oxide, calcium oxide, barium oxide, magnesium oxide, aluminum oxide and the like), a sulfate (for example, sodium sulfate, calcium sulfate, magnesium sulfate, cobalt sulfate and the like), a metal halide (for example, calcium chloride, magnesium chloride, cesium fluoride, tantalum fluoride, cesium brominate, magnesium brominate, barium iodide, magnesium iodide and the like), a perchloric acid (for example, barium perchloric acid salt, magnesium perchloric acid salt and the like), and the like. In the sulfate, metal halide and the perchloric acid, an anhydrous salt is suitably used.

In contrast, when using the sealing membrane as the transparent sealing material 17, the sealing membrane is formed on the substrate 13 in a state in which the light emitting functional layer 3 of the organic electroluminescent element EL-1 is completely covered and the terminal portions of the transparent electrode 1 and the counter electrode 5-1 of the organic electroluminescent element EL-1 are exposed.

The sealing membrane is constituted using an inorganic material or an organic material. Particularly, the sealing membrane should be constituted by a material having function of suppressing the immersion of a substance which causes degradation of the light emitting functional layer 3 in the organic electroluminescent element EL-1, such as moisture and oxygen. There is used as such a material, for example, an inorganic material such as silicon oxide, silicon dioxide or silicon nitride. Furthermore, in order to improve its fragility of the sealing membrane, a laminated structure may be formed by using a membrane formed of an organic material, in addition to the membrane formed of the inorganic material.

The method for forming the membranes is not particularly limited, and there can be used, for example, a vacuum deposition method, a sputtering method, a reactive sputtering method, a molecular beam epitaxy method, a cluster ion beam method, an ion plating method, a plasma polymerization method, an atmospheric plasma polymerization method, a plasma CVD method, a laser CVD method, a heat CVD method, a coating method, and the like.

[Protective Membrane, Protective Plate]

Meanwhile, although the illustration here is omitted, a protective membrane or a protective plate may be provided by sandwiching the organic electroluminescent element EL and the transparent sealing material 17 between the substrate 13. The protective membrane or the protective plate is to mechanically protect the organic electroluminescent element EL, and particularly when the transparent sealing material 17 is the protective membrane, it is preferable to provide the protective membrane or the protective plate since the mechanical protection of the organic electroluminescent element EL is not sufficient.

Examples of the protective membrane or the protective plate to be applied include a glass plate, a polymer plate, a thinner polymer film, a metal plate, a thinner metal plate, or a membrane of polymer material and a membrane of metal material. Among them, from the viewpoint of light weight and small thickness, the polymer film is preferably used.

[Production Method of Organic Electroluminescent Element]

Here, as one embodiment, the manufacturing method of the organic electroluminescent element EL-1 shown in FIG. 4 will be explained.

First, a counter electrode 5-1 serving as an anode is formed on the substrate 13 by an optional film forming method such as evaporation method or sputtering method.

Next, a light emitting functional layer 3 was formed on the counter electrode by the formation of a positive hole injection layer 3a, a positive hole transport layer 3b, a light emitting layer 3c, an electron transport layer 3d and an electron injection layer 3e in the order. There are employed, for the film formation of the layers, a spin coating method, a casting method, an inkjet printing method, an evaporation method, a sputtering method, a printing method, and the like. From the viewpoints of obtaining a homogeneous membrane easily, of not generating a pinhole easily and the like, the vacuum deposition method or the spin coating method is particularly preferable. In addition, a different film forming method may be employed to each layer. When employing the evaporation method for film formation of each layer, although the evaporation conditions are varied depending on the kind of the compound to be used, it is desirable to select each condition optionally within the ranges of a heating temperature of boat for housing a compound of 50° C. to 450° C., a degree of vacuum of $10^{-6}$ Pa to $10^{-2}$ Pa, a deposition rate of 0.01 nm/sec. to 50 nm/sec., a temperature of substrate of −50° C. to 300° C., and a thickness of membrane of 0.1 μm to 5 μm.

Subsequently, the nitrogen-containing layer 1a is formed so that a film thickness is 1 μm or less, preferably 10 nm to 100 nm. Thereafter, the electrode layer 1b formed of silver (or alloy having silver as a main component) is formed so that a film thickness is 4 nm to 12 nm and thus the transparent electrode 1 of the cathode side was produced. There are employed for the formation of the nitrogen-containing layer 1a and the electrode layer 1b, a spin coating method, a casting method, an inkjet printing method, an evaporation method, a sputtering method, a printing method, and the like. From the viewpoints of obtaining a homogeneous membrane easily, of not generating a pinhole easily and the like, the vacuum deposition method or the spin coating method is particularly preferable.

In addition, pattern formation of the electrode layer 1b is carried out in the form of pulling out a terminal portion from upper side of the light emitting functional layer 3 to the peripheral of the substrate 13, while keeping insulation state against the counter electrode 5-1 by the light emitting functional layer 3. Furthermore, before or after the formation of the electrode layer 1b, as necessary, the auxiliary electrode 15 may be pattern-formed. Moreover, as a result, the organic electroluminescent element EL-1 is obtained. Moreover, after that, there is provided the transparent sealing material 17 covering at least the light emitting functional layer 3, in a state where the terminal portions of the transparent electrode and the counter electrode 5-1 of the organic electroluminescent element EL-1 are exposed. At this time, the organic electroluminescent element EL-1 is sealed between the transparent sealing material 17 and the substrate 13 by causing the transparent sealing material 17 to adhere to the substrate 13 with the adhesive 19.

By the above procedures, a desired organic electroluminescent element EL-1 is obtained on the substrate 13. In the production of the organic electroluminescent element EL-1, although it is preferable to perform production consistently from the light emitting functional layer 3 to the counter electrode 5-1 through one-time vacuum drawing, it may be possible that the substrate 13 is extracted from the vacuum atmosphere to thereby be subjected to other different film formation. At this time, it is necessary to consider that the procedures are carried out under a dry inert gas atmosphere.

In the case of applying a direct voltage to the organic electroluminescent element EL-1 thus obtained, while setting the counter electrode 5-1 of the anode as +polarity and the electrode layer 1b of the cathode as −polarity, a light emission can be observed when applying a voltage of 2 V or more to 40 V or less to the electrodes. In addition, an alternating voltage may be applied. Meanwhile, a waveform of the alternating voltage to be applied may be optional.

<Effects of Organic Electroluminescent Element EL-1>

The aforementioned organic electroluminescent element EL-1 has the configuration in which the transparent electrode 1 of the present invention having both electrical conductivity and light transmission property is used as the cathode, and the light emitting functional layer 3 and the counter electrode 5-1 serving as the anode are provided in this order on the nitrogen-containing layer 1a side in the transparent electrode 1. Accordingly, while a light emission with a high luminance of the organic electroluminescent element EL-1 can be implemented by applying a sufficient voltage between the transparent electrode 1 and the counter electrode 5-1, it is possible to achieve a high luminance by enhancing an extraction efficiency of the emitted light h from the transparent electrode 1. Furthermore, it is also possible to achieve enhancement of emission life by reducing a driving voltage for obtaining a given luminance.

In addition, in the case of using the transparent electrode 1' having the cap layer 1c explained using FIG. 2 instead of the transparent electrode 1, the emission life performance of the organic electroluminescent element EL-1 can be enhanced by using the highly reliable electrode.

<<6. Second Embodiment (Bottom Emission Type) of Organic Electroluminescent Element>>

<Configuration of Organic Electroluminescent Element>

Figure 5:
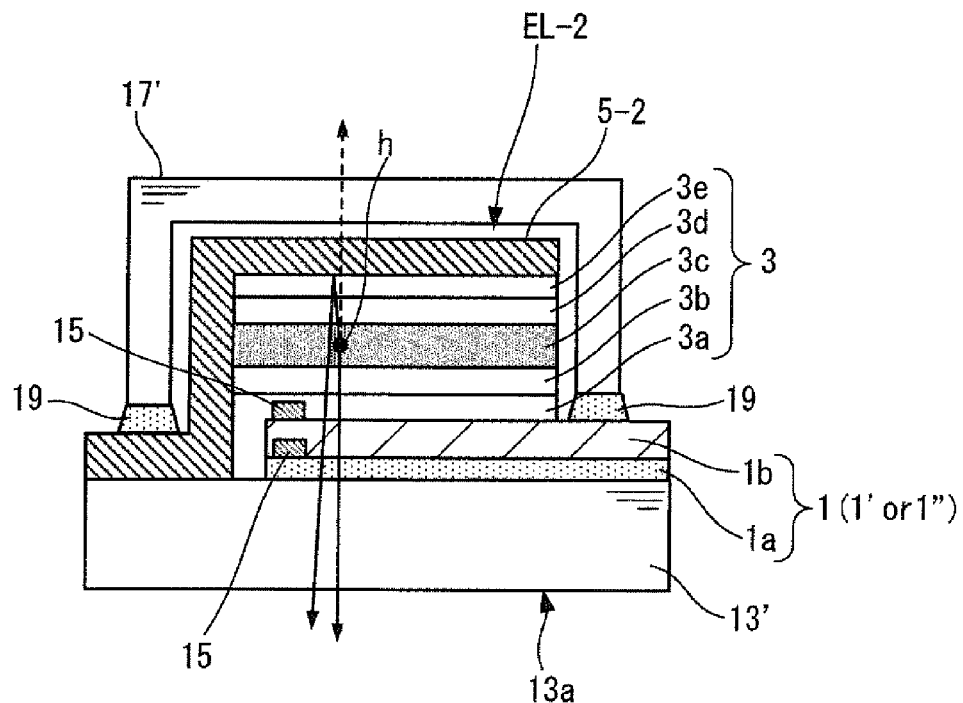
FIG. 5 is a cross-sectional configuration view illustrating the second embodiment of the organic electroluminescent element using the transparent electrode according to the present invention.

FIG. 5 is a cross-sectional configuration view illustrating the second embodiment of the organic electroluminescent element obtained by using the aforementioned transparent electrode as one example of the electronic device according to the present invention. The different point of the second organic electroluminescent element EL-2 shown in FIG. 5 from the organic electroluminescent element EL-1 explained using FIG. 4 is that the transparent electrode 1 is provided on a transparent substrate 13', and the light emitting functional layer 3 and the counter electrode 5-2 are laminated in this order in the upper part thereof. Hereinafter, the repeated explanation as to the same constituent elements as the first embodiment will be omitted and the characteristic configurations of the second organic electroluminescent element EL-2 will be explained.

The organic electroluminescent element EL-2 shown in FIG. 5 is provided on a transparent substrate 13', from the transparent substrate 13' side, there are laminated the transparent electrode 1 serving as an anode, the light emitting functional layer 3 and the counter electrode 5-2 serving as a cathode in this order. Among these, the characteristic is the use of the aforementioned transparent electrode 1 of the present invention, as the transparent electrode 1. Accordingly, the organic electroluminescent element EL-2 is constituted as the bottom emission type that extracts an emitted light h at least from the side of the transparent substrate 13'.

The whole layer configuration of the organic electroluminescent element EL-2 is not limited, and a general layer configuration may be used in the same way as in the first embodiment. As one example in the case of the present second embodiment, a configuration is exemplified in which the positive hole injection layer 3a/the positive hole transport layer 3b/the light emitting layer 3c/the electron transport layer 3d/the electron injection layer 3e are laminated in this order in the upper portion of the transparent electrode 1 having a function as an anode, and furthermore the counter electrode 5-2 for a cathode is laminated in the upper portion thereof. However, among these, it is essential to have, at least, the light emitting layer 3c formed of an organic material. Moreover, the electron transport layer 3d may double as the electron injection layer 3e, and may be provided as the electron.

Meanwhile, various configurations are employed, as necessary, as the light emitting functional layer 3, other than the layers in the same way as that explained in the first embodiment, and the positive hole blocking layer and the electron blocking layer whose drawings are omitted may be provided. In the aforementioned configurations, in the same way as in the first embodiment, only the portion in which the light emitting functional layer 3 is sandwiched between the transparent electrode 1 and the counter electrode 5-2 serves as the light emitting region in the organic electroluminescent element EL-2.

In the organic electroluminescent element EL-2 according to the present embodiment, the light emitting functional layer is directly provided on the electron layer 1b which substantially functions as an anode in the transparent electrode 1. Therefore, the nitrogen-containing layer 1a is constituted using the compound having the aforementioned effective unshared electron pair content [n/M] of the predetermined range, and furthermore the effective unshared electron pair content [n/M] of the nitrogen-containing layer 1a itself is preferably within the predetermined range, and it is not necessary to use a material having positive hole transport property and positive hole injection property.

Furthermore, in the above layer configuration, in the same way as in the first embodiment, in order to lower the electric resistance of the transparent electrode 1, the auxiliary electrode 15 may be provided in contact with the electrode layer 1b of the transparent electrode 1.

Moreover, the counter electrode 5-2 provided in the upper portion of the light emitting functional layer 3 as a cathode is formed of a metal, an alloy, an electrically conductive organic or inorganic compound, and a mixture thereof. Specific examples include a metal such as gold (Au), copper iodide (CuI), an oxide semiconductor such as ITO, ZnO, TiO2 or SnO2, and the like.

The above counter electrode 5-2 can be produced by forming a thin film from the electric conductive material by using a method such as vapor evaporation or sputtering. Furthermore, the sheet resistance of the counter electrode 5-2 is preferably several hundred Ω/sq. or less, and the thickness is generally selected from the range of 5 nm to 5 μm, preferably within the range of 5 nm to 200 nm.

In addition, the sealing material 17' which seals the bottom-emission type organic electroluminescent element EL-2 is not required to have a light transmission property. There can be used, as the sealing material 17', the one constituted by a metal material in addition to the same material as the transparent sealing material used in the previous first embodiment. Examples of the metal material include one or more of metals or alloys selected from the group consisting of stainless steel, iron, copper, aluminum, magnesium, nickel, zinc, chromium, titanium, molybdenum, silicon, germanium and tantalum. By using these metal materials as the sealing material 17' in the form of thin film, the whole light emitting panel in which the organic electroluminescent element is provided can be made thinner.

Meanwhile, in the case where the organic electroluminescent element EL-2 is the type that extracts the emitted light h also from the counter electrode 5-2, the material constituting the counter electrode 5-2 may be used by selection of an electrically conductive material having a good light transmission property among the aforementioned electrically conductive materials. In addition, in the case, a transparent sealing material having a light transmission property is used as the sealing material 17'.

<Effects of Organic Electroluminescent Element EL-2>

The aforementioned organic electroluminescent element EL-2 has a configuration in which the transparent electrode 1 of the present invention having both electrical conductivity and light transmission property is used as an anode, and the light emitting functional layer 3 and the counter electrode 5-2 serving as the cathode are provided in the upper portion thereof. Accordingly, in the same way as in the first embodiment, while a light emission with a high luminance of the organic electroluminescent element EL-2 can be implemented by applying a sufficient voltage between the transparent electrode 1 and the counter electrode 5-2, it is possible to achieve a high luminance by enhancing an extraction efficiency of the emitted light h from the transparent electrode 1. Furthermore, it is also possible to achieve improvement of emission life by reducing a driving voltage for obtaining a given luminance.

Meanwhile, in the organic electroluminescent element EL-2 as explained above, the transparent electrode 1 can be replaced by the transparent electrode 1' having a three-layered structure provided with the cap layer 1c explained by using FIG. 2. In the case, the transparent electrode 1' of the three-layered structure has a configuration in which the nitrogen-containing layer 1a, the electrode layer 1b and the cap layer 1c are laminated in the order from the transparent substrate 13' side. In the configuration, the cap layer 1c may be constituted using a film thickness that has no influence on electron injection from the electron layer 1b to the light emitting functional layer 3, or may have double as the positive hole injection layer 3a. With the configuration, the emission life performance of the organic electroluminescent element EL-2 can be enhanced by using the highly reliable transparent electrode.

Furthermore, in the organic electroluminescent element EL-2 as explained above, the transparent electrode 1 can be replaced by the transparent electrode 1" having a three-layered structure provided with the high refractive layer H explained by using FIG. 3. In the case, the transparent electrode of the three-layered structure has a configuration in which the high refractive layer H, the nitrogen-containing layer 1a and the electrode layer 1b are laminated in the order from the transparent substrate 13' side. With the configuration, it becomes possible to achieve furthermore improvement of the light emission property of the organic electroluminescent element EL-2 by additionally using the transparent electrode having a good light transmission property.

In the organic electroluminescent element EL-2 as explained above, the transparent electrode 1 can be replaced by the transparent electrode having the four-layered structure which has the cap layer and the high refractive layer. In the case, the transparent electrode of the four-layered structure has the configuration in which the high refractive layer H, the nitrogen-containing layer 1a, the electrode layer 1b and the cap layer 1c are laminated in the order from the transparent substrate 13' side. According to the configuration, it is possible to achieve furthermore improvement of the light emission property and the emission life performance of the organic electroluminescent element EL-2.

<<7. Third Embodiment (Top-and-Bottom Emission Type) of Organic Electroluminescent Element>>
<Configuration of Organic Electroluminescent Element>

Figure 6:
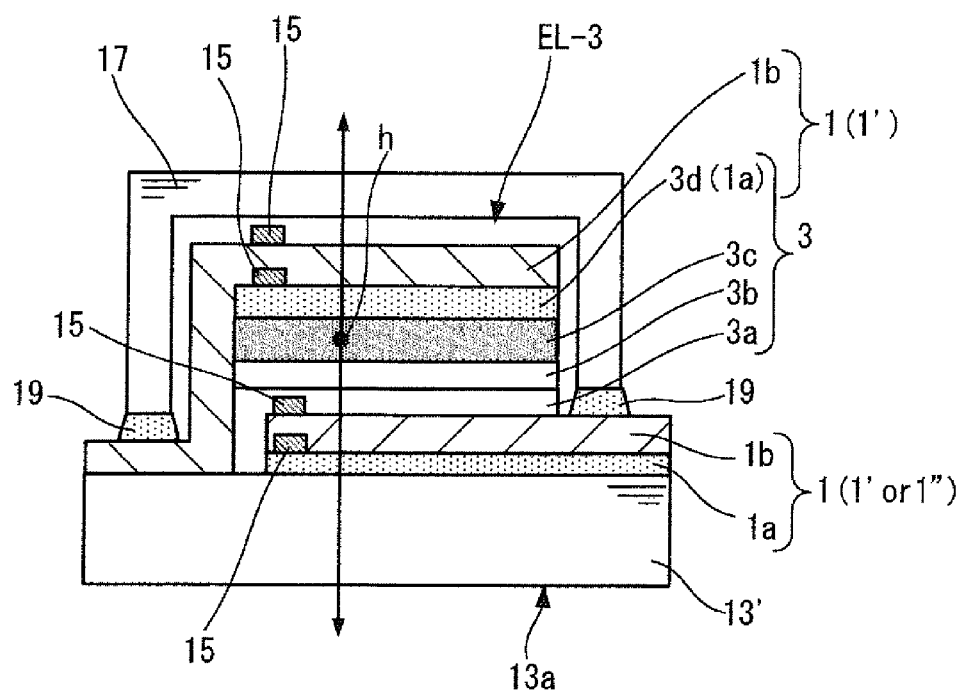
FIG. 6 is a cross-sectional configuration view illustrating the third embodiment of the organic electroluminescent element using the transparent electrode according to the present invention.

FIG. 6 shows a cross-sectional configuration view of the third embodiment of the organic electroluminescent element using the aforementioned transparent electrode as one example of the electronic device according to the present invention. The different point of the organic electroluminescent element EL-3 of the third embodiment shown in FIG. 6 from the organic electroluminescent element EL-1 of the first embodiment explained by using FIG. 4 is that the transparent substrate 13' is used as the substrate, and the light emitting functional layer 3 is sandwiched between the two transparent electrodes 1. Hereinafter, the repeated explanation as to the same elements as the first embodiment will be omitted and the characteristic configurations of the organic electroluminescent element EL-3 of the third embodiment will be explained.

The organic electroluminescent element EL-3 shown in FIG. 6 is provided on the transparent substrate 13', and from the transparent substrate 13' side, there are laminated the transparent electrode 1 serving as an anode, the light emitting functional layer 3 and the transparent electrode 1 serving as a cathode in this order. In the configuration, the characteristic is the use of the aforementioned transparent electrode 1 of the present invention as the transparent electrode 1. Accordingly, the organic electroluminescent element EL-3 is constituted as the top-and-bottom emission type in which an emitted light h is extracted from both of the transparent substrate 13' side and the opposite side, namely the transparent sealing material 17 side.

The whole layer configuration of the organic electroluminescent element EL-3 is not limited, and a general layer configuration may be used in the same way as in the first embodiment. As one example in the case of the present third embodiment, a configuration is exemplified in which the positive hole injection layer 3a/the positive hole transport layer 3b/the light emitting layer 3c/the electron transport layer 3d are laminated in this order in the upper portion of the transparent electrode 1 having a function as an anode, and furthermore, the transparent electrode 1 serving as a cathode is laminated in the upper portion thereof. In the illustrated embodiment, the electron transport layer 3d is provided, doubling as the electron injection layer, and also doubling as the nitrogen-containing layer 1a of the transparent electrode 1 serving as a cathode.

Meanwhile, various configurations are employed as the light emitting functional layer 3 as necessary, as explained in the first embodiment, and the positive hole blocking layer and the electron blocking layer whose drawings are omitted may be provided. In the aforementioned configurations, in the same way as in the first embodiment, only the portion sandwiched between the two transparent electrodes 1 serves as the light emitting region in the organic electroluminescent element EL-3.

Furthermore, in the organic electroluminescent element EL-3 according to the present embodiment, the transparent electrode 1 provided on the transparent substrate 13' side is provided in the order of the nitrogen-containing layer 1a and the electrode layer 1b from the transparent substrate 13' side, and is put into a state where the light emitting functional layer 3 is directly provided in the upper portion of the electron layer 1b which substantially functions as a anode. Therefore, the nitrogen-containing layer 1a on the transparent substrate 13' side may be constituted by using the compound having the aforementioned effective unshared electron pair content [n/M] of the predetermined range, and furthermore the effective unshared electron pair content [n/M] of the nitrogen-containing layer 1a itself is preferably within the predetermined range, and it is not necessary to use a material having positive hole transport property and positive hole injection property.

In the transparent electrode 1 provided on the light emitting functional layer 3, the nitrogen-containing layer 1a and the electrode layer 1b are provided in this order from the light emitting functional layer 3 side, and thus the nitrogen-containing layer 1a is put into a state of being arranged between the electrode layer 1b substantially functioning as a cathode and the light emitting functional layer 3. Accordingly, the nitrogen-containing layer 1a on the light emitting functional layer 3 also serves as a layer constituting a part of the light emitting functional layer 3. The nitrogen-containing layer 1a is constituted using a compound further having electron transport property or electron injection property from among the compounds having the effective unshared electron pair content [n/M] of a predetermined range. Alternatively, the nitrogen-containing layer 1a itself may also be constituted so that the nitrogen-containing layer 1a has the aforementioned effective unshared electron pair content [n/M], by using a mixture of a compound having electron transport property or electron injection property and a compound having the effective unshared electron pair content [n/M] of as large as a certain degree.

In addition, in the above layer configuration, in the same way as in the first embodiment, in order to lower the electric resistance of the transparent electrode 1, the auxiliary electrode 15 may be provided in contact with the electrode layer 1b of the two transparent electrodes 1.

Furthermore, since the instant organic electroluminescent element EL-3 is the top-and-bottom emission type, the transparent sealing material 17 having a light transmission property is used for sealing.

<Effects of Organic Electroluminescent Element EL-3>

The aforementioned organic electroluminescent element EL-3 has the configuration in which the transparent electrode 1 of the present invention having both electrical conductivity and light transmission property is used as the anode and cathode, and the light emitting functional layer 3 is sandwiched therebetween. Accordingly, in the same way as in the first embodiment, while alight emission with a high luminance of the organic electroluminescent element EL-3 can be implemented by applying a sufficient voltage between the two transparent electrodes 1, it is possible to achieve a high luminance by enhancing an extraction efficiency of the emitted light h from the two transparent electrodes 1. Furthermore, it is also possible to achieve improvement of emission life by reducing a driving voltage for obtaining a given luminance.

In the organic electroluminescent element EL-3 as explained above, it possible to replace the transparent electrode 1 on the transparent substrate 13' side by the transparent electrode 1' provided with the cap layer 1c explained by using FIG. 2, by the transparent electrode 1" which has the high refractive layer H explained by using FIG. 3, and furthermore by the transparent electrode having the combined four-layered structure. The replaced structures are the same as those in the organic electroluminescent element EL-2 explained by using FIG. 5, and the respective effect can be obtained.

Furthermore, in the organic electroluminescent element EL-3 as explained above, it possible to replace the transparent electrode 1 on the light emitting functional layer 3 by the transparent electrode 1' provided with the cap layer 1c explained by using FIG. 2. The replaced structure is the same as that in the organic electroluminescent element EL-1 explained by using FIG. 4, and the respective effect can be obtained.

<<8. Fourth Embodiment (Reversely Laminated Configuration) of Organic Electroluminescent Element>>

<Configuration of Organic Electroluminescent Element>

Figure 7:
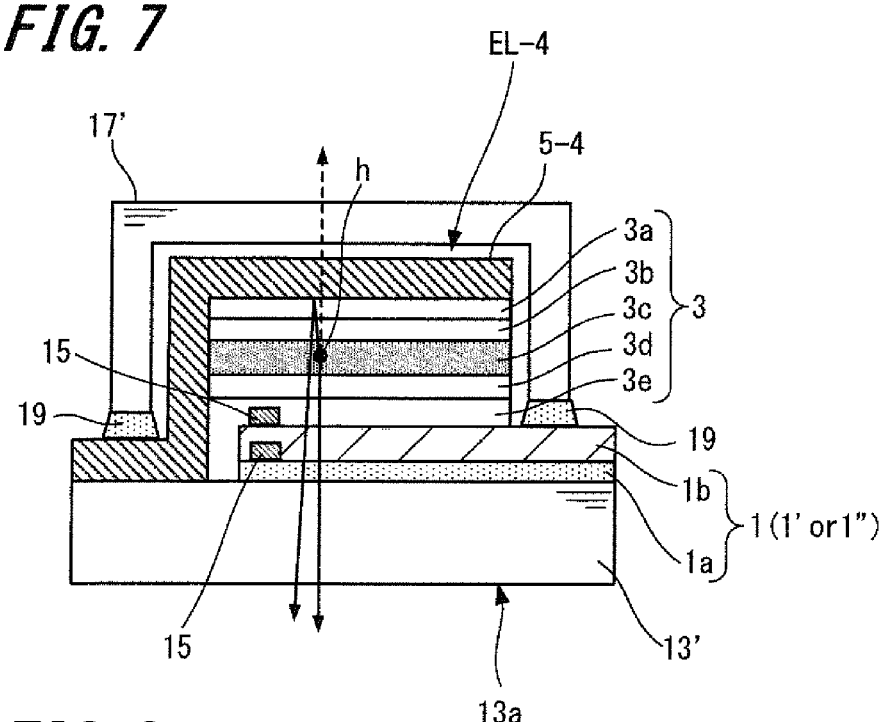
FIG. 7 is a cross-sectional configuration view illustrating the fourth embodiment of the organic electroluminescent element using the transparent electrode according to the present invention.

FIG. 7 shows a cross-sectional configuration view of the fourth embodiment of the organic electroluminescent element using the aforementioned transparent electrode as one example of the electronic device according to the present invention. The different point of the fourth organic electroluminescent element EL-4 shown in this drawing from the organic electroluminescent element EL-1 explained by using the prior FIG. 4 is that the laminating order is reversed by providing the cathode (transparent electrode 1), the light emitting functional layer 3 and the anode (counter electrode 5-4) from the transparent substrate 13 side. Hereinafter, the repeated as to the same elements as the first embodiment is omitted, and the characteristic configurations of the fourth organic electroluminescent element EL-4 will be explained.

The organic electroluminescent element EL-4 shown in FIG. 7 is provided on the transparent substrate 13', and from the transparent substrate 13' side, there are laminated the transparent electrode 1 serving as a cathode, the light emitting functional layer 3 and the counter electrode 5-4 serving as an anode in this order. In the configuration, the organic electroluminescent element has characteristics in which the aforementioned transparent electrode 1 of the present invention is used as the transparent electrode 1. Accordingly, the organic electroluminescent element EL-4 is constituted as the bottom emission type in which an emitted light h is extracted from at least the transparent substrate 13' side.

The whole layer configuration of the organic electroluminescent element EL-4 is not limited, and a general layer configuration may be used in the same way as in the first embodiment. As one example in the case of the present fourth embodiment, a configuration is exemplified in which the electron injection layer 3e/the electron transport layer 3d/the light emitting layer 3c/the positive hole transport layer 3b/the positive hole injection layer 3a are provided in this order in the upper portion of the transparent electrode 1 serving as a cathode, and further the counter electrode 5-4 serving as an anode is laminated in the upper portion thereof.

Meanwhile, various configurations are employed as the light emitting functional layer 3 as necessary, as explained in the first embodiment, and the positive hole blocking layer and the electron blocking layer whose drawings are omitted may be provided. In the aforementioned configurations, in the same way as in the first embodiment, only the portion sandwiched between the transparent electrode 1 and the counter electrode 5-4 serves as the light emitting region in the organic electroluminescent element EL-4.

Furthermore, in the organic electroluminescent element EL-4 according to the present embodiment, the transparent electrode 1 provided on the transparent substrate 13' side is put into a state where the light emitting functional layer 3 is directly provided on the electron layer 1b which substantially functions as a cathode. Therefore, the nitrogen-containing layer 1a may be constituted by using the compound having the aforementioned effective unshared electron pair content [n/M] of the predetermined range, and furthermore the effective unshared electron pair content [n/M] of the nitrogen-containing layer 1a itself is preferably within the predetermined range, and it is not necessary to use a material having electron transport property and electron injection property.

Moreover, in the above layer configuration, in the same way as in the first embodiment, in order to lower the electric resistance of the transparent electrode 1, the auxiliary electrode 15 may be provided in contact with the electrode layer 1b of the transparent electrode 1.

In addition, a metal, an alloy, an electrically conductive organic or inorganic compound, and a mixture thereof, which are the same as in the anode in the first embodiment, are used for the counter electrode 5-4 provided as an anode in the upper portion of the light emitting functional layer 3.

Meanwhile, as a modification of the present invention, a configuration is exemplified in which an anode on the light emitting layer 3 is also the transparent electrode 1. In the case, the electrode layer 1b provided on the light emitting functional layer 3 via the nitrogen-containing layer 1a serves as substantially an anode. In addition, the nitrogen-containing layer 1a provided on the light emitting functional layer 3 serves as a layer which constitutes a part of the light emitting functional layer 3. The nitrogen-containing layer 1a is constituted using a compound further having positive hole transport property or positive hole injection property from among the compounds having the effective unshared electron pair content [n/M] of a predetermined range. Alternatively, the nitrogen-containing layer 1a itself may also be constituted so that the nitrogen-containing layer 1a has the aforementioned effective unshared electron pair content [n/M], by using a mixture of a compound having positive hole transport property or positive hole injection property and a compound having the effective unshared electron pair content [n/M] of as large as a certain degree. Furthermore, as long as the nitrogen-containing layer 1a makes use of a compound having the effective unshared electron pair content [n/M] of a predetermined range, the compound may not have the positive hole transport property and the positive hole injection property. In the case, the thickness of the nitrogen-containing layer 1a may be controlled to the extent that does not inhibit the property of positive hole injection from the positive hole layer 1b being the anode to the light emitting functional layer 3.

<Effects of Organic Electroluminescent Element EL-4>

The aforementioned organic electroluminescent element EL-4 has the configuration in which the transparent electrode 1 of the present invention having both electrical conductivity and light transmission property is used as the cathode, and thereon, the light emitting functional layer 3 and the counter electrode 5-4 as the anode are provided in this order. Accordingly, in the same way as in the first embodiment, while a light emission with a high luminance of the organic electroluminescent element EL-4 can be implemented by applying a sufficient voltage between the transparent electrode 1 and the counter electrode 5-4, it is possible to achieve a high luminance by enhancing an extraction efficiency of the emitted light h from the transparent electrode 1. Furthermore, it is also possible to achieve enhancement of emission life by the reduction in a driving voltage for obtaining a given luminance.

In the organic electroluminescent element EL-4 as explained above, it possible to replace the transparent electrode 1 on the transparent substrate 13' side by the transparent electrode 1' provided with the cap layer 1c explained by using FIG. 2, by the transparent electrode 1" provided with the high refractive layer H explained by using FIG. 3, and furthermore by the transparent electrode having the combined four-layered structure. The replaced structures are the same as those in the organic electroluminescent element EL-2 explained by using FIG. 5, and the respective effect can be obtained.

<<9. Use of Organic Electroluminescent Element>>

The organic electroluminescent elements having the aforementioned various configurations are surface emitting elements, and thus are usable for light emitting sources of various types. Examples include, but are not limited to, a lighting device such as a home lighting device or a car lighting device, a backlight for a timepiece or a liquid crystal, a signboard for advertisement, a light source for a signal, a light source for an optical storage medium, a light source for an electrophotographic copier, a light source for an optical communication processor, a light source for an optical sensor, and the like. Particularly, it can be effectively used as a backlight for a liquid crystal display device which is combined with a color filter and as a light source for lighting.

Furthermore, the organic electroluminescent element may be used as a kind of lamp such as a lighting device or an exposure light source, or may be used as a projection device of an image projecting type, or a display of a type by which a still image or moving image is visually recognized directly. In this case, a light emitting surface area may be enlarged by so-called tiling in which light emitting panels provided with the organic electroluminescent element are combined flatly in response to the recent increasing in size of a lighting device and a display device.

When using the organic electroluminescent element as a display device for reproducing a moving image, a driving system is either a simple matrix (passive matrix) system or active matrix system. When using two or more kinds of the organic electroluminescent element according to the present invention having a different emission color, it is possible to produce a color or full color display device.

Hereinafter, a lighting device will be explained as one example of the uses, and next, a lighting device having an emission area enlarged by tiling will be explained.

<<10. Lighting Device-1>>

The lighting device of the present invention has the aforementioned organic electroluminescent element.

An organic electroluminescent element used in the lighting device according to the present invention may be designed so as to impart a resonator structure to the each organic electroluminescent element of the aforementioned configuration. The objects of using the organic electroluminescent element having the resonator structure include a light source for an optical storage medium, a light source for an electrophotographic copier, a light source for an optical communication processor, a light source for an optical sensor, and the like, but is not limited thereto. Alternatively, the organic electroluminescent element may be used for the aforementioned purpose by oscillating laser beam.

Meanwhile, the material used for the organic electroluminescent element of the present invention can be applied to an organic electroluminescent element which emits a substantial white light (also referred to as white organic electroluminescent element). For example, the simultaneous emission of a plurality of luminescent colors from a plurality of light emitting materials can also give a white color emission by color mixing. Examples of the combination of a plurality of luminescent colors may include a combination containing three maximum emission wavelengths of three primary colors of red, green and blue, or a combination containing two maximum emission wavelengths which are in a complementary color relationship such as blue and yellow, bluish green and orange, or the like.

Furthermore, combinations of light emitting materials for obtaining a plurality of luminescent colors are either a combination of a plurality of light emitting materials which emit a plurality of phosphorescence or fluorescence, or a combination of a light emitting material which emit a plurality of phosphorescence or fluorescence and a material of coloring matter which emits an excitation light from a light emitting material, and may be a combination of a plurality of light emitting dopants in the white color organic electroluminescent element.

The white color organic electroluminescent element has a configuration different from the configuration of obtaining a white color emission by arranging, in parallel, organic electroluminescent elements each of which emits an individual color light, in an array form, and the organic electroluminescent element itself can emit a white color light. Therefore, it is not necessary to use a mask for film-depositing most of layers constituting the element. Thus, for example, the electrode layer can be formed all over by an evaporation method, a casting method, a spin coating method, an ink-jet method, a printing method, and the like, which enhances productivity.

Furthermore, the materials to be used for the light emitting layers of the white color organic electroluminescent element are not particularly limited, and for example, as to a backlight in a liquid crystal display element, whiting is performed by selection and combination of arbitrary materials from among the metal complexes according to the present invention or well-known light emitting materials so as to be suited to a wavelength range corresponding to a CF (color filter) property.

By using the white color organic electroluminescent element explained above, it is possible to produce a lighting device which emits substantial white light.

<<11. Lighting Device-2>>

Furthermore, the organic electroluminescent element can be used as a lighting device having an enlarged light emitting area by using a plurality of the elements. In this case, the enlargement of the light emitting area can be done by arranging (that is, tiling), on a support substrate, a plurality of light emitting panels provided with the organic electroluminescent elements on a transparent substrate. The support substrate may also double as a sealing material, and the light emitting panels are tiled in a state in which the organic electroluminescent elements are sandwiched between the support substrate and a transparent electrode of the light emitting panel. The organic electroluminescent element may be sealed by filling an adhesive between the support substrate and the transparent electrode. Meanwhile, terminals of the transparent electrode and the counter electrode are exposed around the light emitting panel.

In the lighting device having such a configuration, a non-light emitting region is generated between the light emitting panels since the center region of the light emitting panel serves as the light emitting region. Therefore, in order to increase an amount of light to be extracted from the non-light emitting region, a light extraction member may be provided in the non-light emitting region of the light extraction surface. A light condensing sheet or a light diffusing sheet can be used for the light extraction member.

Example 1

<<Production of Transparent Electrode>>

Each of transparent electrodes of Samples 101 to 134 was produced so that an area of an electrical conductivity region was 5 cm×5 cm. The following Table 2 shows the configuration of each layer in each of the transparent electrode of Samples 101 to 134.

<Preparation of Transparent Electrodes of Samples 101 and 102>

In the following way, an electrode layer formed of silver having a film thickness shown in Table 2 was formed on a glass substrate.

First, a transparent substrate formed of an alkali free glass was fixed onto a substrate holder of a commercial vacuum evaporator, and then attached to a vacuum tank of the vacuum evaporator. Silver (Ag) was placed in a tungsten resistive heating boat. After reducing a pressure of the vacuum tank to 4×10-4 Pa, the heating boat was heated by applying an electric current, and there was formed an electrode layer constituted of silver having each of desired thicknesses at a deposition rate of 0.1 nm/sec to 0.2 nm/sec. A film thickness of Sample 101 was 6 nm, and a film thickness of Sample 102 was 15 nm.

<Production of Transparent Electrode of Samples 103 to 125>

In the following way, a nitrogen-containing layer having a film thickness of 25 nm was formed by using the material shown in the following Table 2 on a glass substrate, and then in the upper portion of the nitrogen-containing layer, an electrode layer formed of silver having a film thickness of 6 nm was formed. Meanwhile, in Sample 103, instead of the nitrogen-containing layer, a under coat layer without nitrogen was formed.

First, a transparent substrate formed of an alkali free glass was fixed onto a substrate holder of a commercial vacuum evaporator. In addition, in the production of each transparent electrode, the following compound Nos. 1 to 18 shown in Table 2 was placed in the tantalum resistive heating boat. The substrate holder and the heating boat were attached to the first vacuum tank. Furthermore, silver (Ag) was placed in the tungsten resistive heating boat, which was then attached to the second vacuum tank.

Among the compounds used herein, Compounds Nos.-1 to 5 are shown in the following, and a nitrogen atom having an [effective unshared electron pair] is indicated by o. Among these, Compound No.-1 is anthracene which contains no nitrogen atom, and Compounds Nos.-2 to -5 are compounds containing nitrogen atom, but each Compound has an effective unshared electron pair content [n/M] of [n/M]≤2.0×10-3.

[Chem. 84]

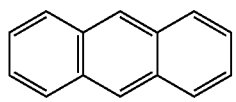
No.-1

(Anthracene)

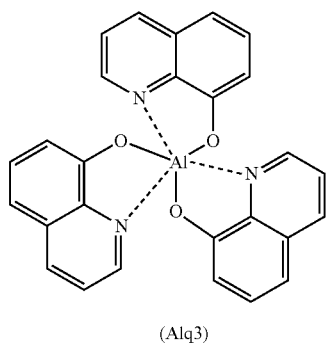
No.-2

(Alq3)

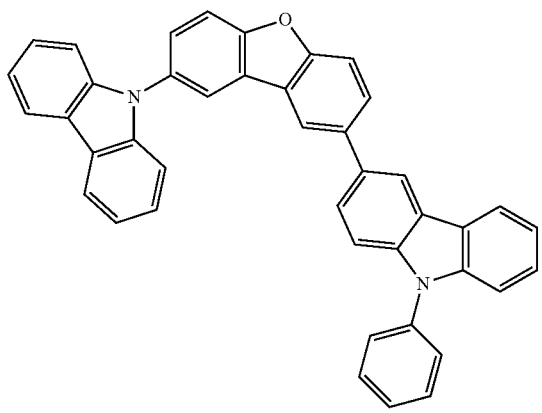
No.-3

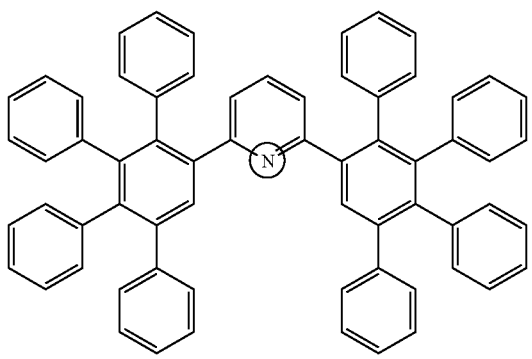
No.-4

-continued

No.-5

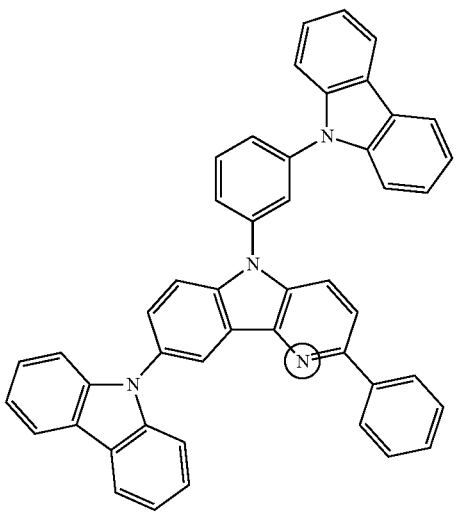

On the other hand, Compounds Nos. 1 to 18 are the exemplified compounds in the prior embodiment in which the effective unshared electron pair content [n/M] is [n/M] 2.0×10-3. In Table 2, the number [n] of effective unshared electron pairs, a molecular weight [M] and also an effective unshared electron pair content [n/M] of the compounds used are shown.

Next, after reducing a pressure of the first vacuum tank to 4×10-4 Pa, the heating boat which contained the respective compound was heated by applying an electric current, and there was provided a nitrogen-containing layer (Sample 103 being under coat layer) formed of the respective compounds each having a film thickness of 25 nm at a deposition rate of 0.1 nm/sec to 0.2 nm/sec.

Subsequently, the substrate obtained by forming the nitrogen-containing layer (under coat layer) was transferred to the second vacuum tank in a vacuum atmosphere, and after reducing a pressure of the second vacuum tank to 4×10-4 Pa, the heating boat containing silver was heated by applying an electric current, and then there were obtained transparent electrodes of Samples 101 to 125 constituted of a laminated structure of the nitrogen-containing layer (under coat layer) and the upper electrode layer, by forming an electrode layer formed of silver having a film thickness of 6 nm at a deposition rate of 0.1 nm/sec to 0.2 nm/sec.

<Production of Transparent Electrode of Samples 126 and 127>

The transparent electrodes of Samples 126 and 127 were obtained in the same procedures as in the above Samples 103 to 125, except that a film thickness of the electrode layer formed of silver was 8 nm. However, Compound No. 7 was used for Sample 126, and Compound No. 14 was used for Sample 127, for forming the nitrogen-containing layer.

<Production of Transparent Electrode of Samples 128 and 129>

The transparent electrodes of Samples 128 and 129 were obtained in the same procedures as in the above Samples 103 to 125, except that a polyethylene terephthalate (PET) was used for the substrate, and a film thickness of the electrode layer formed of silver was 8 nm. However, Compound No. 7 was used for Sample 128, and Compound No. 14 was used for Sample 129, for forming the nitrogen-containing layer.

<Production of Transparent Electrode of Samples 130 and 131>

The transparent electrodes of Samples 130 and 131 were obtained in the same procedures as in the above Samples 103 to 125, except that in the formation of the nitrogen-containing layer Compound No. 7 which contains nitrogen atom and the compound No. 1 (anthracene) which contains no nitrogen atom were deposited together. However, in the formation of the nitrogen-containing layer, a mixing ratio of the compounds was, as a mass ratio, in Sample 130, Compound No. 7: No. 1 (anthracene)=40:60, and in Sample 131, Compound No. 7: No. 1 (anthracene)=60:40. In the following Table 2, the number [n] of effective unshared electron pairs, a molecular weight [M] and also an effective unshared electron pair content [n/M] of the compounds used are shown.

<Production of Transparent Electrode of Samples 132 to 134>

The transparent electrodes of Samples 132 and 134 were obtained in the same procedures as in the above Samples 103 to 125, except that the nitrogen-containing layer using the material shown in the following Table 2 was formed by a coating method. Compounds No. 19, No. 20, and No. 17 used herein are the exemplified compounds in the previous embodiment. The coating of forming the nitrogen-containing layer was carried out in the following way.

A coating solution was obtained by dissolving each compound in a solvent of toluene: TFP (trifluoroethyl phosphate) =1:1 at 80° C. The coating solution was spin-coated on a substrate formed of a transparent alkali-free glass. The coating was carried out at a rotation speed of 1500 rpm for 30 seconds. After that, a nitrogen-containing layer having a film thickness of 25 nm was formed by performing heat treatment at 120° C. for 30 minutes for drying.

After the above procedures, by formation of an electrode layer constituted of silver having a film thickness of 6 nm on the nitrogen-containing layer, there was obtained a transparent electrode of Samples 132 to 134 having a laminated structure of the nitrogen-containing layer and the electrode layer in the upper par thereof.

<Evaluation of Each Sample in EXAMPLE 1>

With respect to each of the transparent electrodes of Samples 101 to 134 produced above, a light transmission property and a sheet resistance value were measured. The light transmission property was measured by using a spectrophotometer (U-3300 manufactured by HITACHI), and the measurement was carried out by using a substrate same as the sample, as a baseline. The sheet resistance value was measured by using a resistivity meter (MCP-T610 manufactured by MITSUBISHI CHEMICALS), and carried out by 4 terminals 4 probes method constant current applying system. The results are shown in the following Table 2 together.

TABLE 2

Example 1: Transparent electrode

Transparent electrode

Nitrogen-containing (under coat layer) film thickness 25 nm

| Sample No. | Substrate | Compound | Film forming method | The number of effective unshared electron Pair [n] | Molecular weight [M] | [n/M] | Electrode layer (Ag) Film thickness (nm) | Evaluation results Light transmittance % (550 nm) | Sheet resistance Ω/sq. | Note |
|---|---|---|---|---|---|---|---|---|---|---|
| 101 | Glass | — | — | — | — | — | 6 | 45 | Not measured | Comparative |
| 102 | | — | — | — | — | — | 15 | 25 | 5.0.E+00 | |
| 103 | | No.-1 (anthracene) | Evaporation | 0 | 178.23 | 0.00E+00 | 6 | 45 | Not measured | |
| 104 | | No.-2 (Alq3) | | 0 | 459.44 | 0.00E+00 | | 50 | Not measured | |
| 105 | | No.-3 | | 0 | 574.67 | 0.00E+00 | | 46 | Not measured | |
| 106 | | No.-4 | | 1 | 839 | 1.20E−03 | | 47 | Not measured | |
| 107 | | No.-5 | | 1 | 650.77 | 1.50E−03 | | 48 | Not measured | |
| 108 | Glass | No. 1 | Evaporation | 1 | 500.55 | 2.00E−03 | 6 | 55 | 280 | Present |
| 109 | | No. 2 | | 2 | 790.95 | 2.50E−03 | | 58 | 245 | invention |
| 110 | | No. 3 | | 2 | 655.81 | 3.00E−03 | | 59 | 200 | |
| 111 | | No. 4 | | 2 | 655.81 | 3.00E−03 | | 60 | 180 | |
| 112 | | No. 5 | | 3 | 974.18 | 3.10E−03 | | 63 | 150 | |
| 113 | | No. 6 | | 3 | 808.99 | 3.70E−03 | | 65 | 100 | |
| 114 | | No. 7 | | 4 | 716.83 | 5.60E−03 | | >70 | 25 | |
| 115 | | No. 8 | | 6 | 1036.19 | 5.80E−03 | | >70 | 23.8 | |
| 116 | | No. 9 | | 4 | 551.64 | 7.30E−03 | | >70 | 22.5 | |
| 117 | | No. 10 | | 4 | 516.6 | 7.70E−03 | | >70 | 20.2 | |
| 118 | | No. 11 | | 5 | 539.63 | 9.30E−03 | | >70 | 19 | |
| 119 | | No. 12 | | 6 | 646.76 | 9.30E−03 | | >70 | 19.5 | |
| 120 | | No. 13 | | 4 | 412.45 | 9.70E−03 | | >70 | 18.7 | |
| 121 | | No. 14 | | 6 | 616.71 | 9.70E−03 | | >70 | 18.5 | |
| 122 | | No. 15 | | 5 | 463.53 | 1.10E−02 | | >70 | 16 | |
| 123 | | No. 16 | | 6 | 540.62 | 1.10E−02 | | >70 | 15 | |
| 124 | | No. 17 | | 9 | 543.58 | 1.70E−02 | | >70 | 14 | |
| 125 | | No. 18 | | 6 | 312.33 | 1.90E−02 | | >70 | 12 | |
| 126 | Glass | No. 7 | Evaporation | 4 | 716.83 | 5.60E−03 | 8 | >70 | 9.5 | Present |
| 127 | | No. 14 | | 6 | 616.71 | 9.70E−03 | | >70 | 9.8 | invention |
| 128 | PET | No. 7 | Evaporation | 4 | 716.83 | 5.60E−03 | 8 | 67 | 15 | Present |
| 129 | | No. 14 | | 6 | 616.71 | 9.70E−03 | | 68 | 18 | invention |
| 130 | Glass | No. 7: No.-1 (anthracene) (40:60) | Co-deposition | 4 × 0.4 | 397.67 | 4.10E−03 | 6 | 65 | 110 | Present invention |
| 131 | | No. 7: No.-1 (anthracene) (60:40) | | 4 × 0.6 | 501.39 | 4.80E−03 | | 67 | 90 | |
| 132 | Glass | No. 19 | Coating | 2 | 512.6 | 3.90E−03 | 6 | 66 | 38 | Present |
| 133 | | No. 20 | | 2 | 408.45 | 4.90E−03 | | 68 | 35 | invention |
| 134 | | No. 17 | | 4 | 716.83 | 5.60E−03 | | >70 | 28 | |

<Results of Evaluation of EXAMPLE 1>

As is clear from Table 2, with respect to the transparent electrodes of Samples 108 to 134 in which the nitrogen-containing layer was constituted by using Compound Nos. 1 to 20 having the effective unshared electron pair content [n/M] within the predetermined range of 2.0×10-3≤[n/M] ≤1.9×10-2, even if the electrode layer obtained by using silver and having a role of substantial electrical conductivity was a very thin film of 6 nm or 8 nm, the sheet resistance was able to be measured, and it has been confirmed that the layer is formed at an approximately uniform thickness through the mono-layer growth type (Frank-van der Merwe: FM type). In contrast, with respect to the transparent electrodes of Sample 101 having a mono-layer configuration which was obtained only by the electrode layer not provided with a nitrogen-containing layer, and the transparent electrodes of Samples 103 to 107 in which the nitrogen-containing layer (under coat layer) was constituted by using Compound Nos.-1 to -5 of 2.0×10-3>[n/M], the sheet resistance was not able to be measured, and the use as an electrode was not possible.

In addition, it has been confirmed that the transparent electrodes of Samples 108 to 134 having the effective unshared electron pair content [n/M] within the predetermined range also have a light transmission property of 50% or more, and can be used as the transparent electrode. The same results were obtained with respect to the glass substrate and the plastic materials (PET) substrate. Furthermore, with respect to the transparent electrodes of Samples 108 to 134, even if the electrode layer had a film thickness of 6 nm or 8 nm, the light transmittance was maintained at a high value of about 70%, and the lowering of the sheet resistance of the electrode layer was confirmed due to enlargement of the film thickness from 6 nm to 8 nm, and also it was confirmed that the enhancement of the light transmission property and the enhancement of the electric conductivity were achieved at the same time. Meanwhile, Sample 102 not provided with an under coat layer such as the nitrogen-containing layer had a thick electrode layer having a film thickness of 15 nm, and thus the sample was not able to be used as the transparent electrode because the light transmittance was low although the sheet resistance was low.

Figure 8:
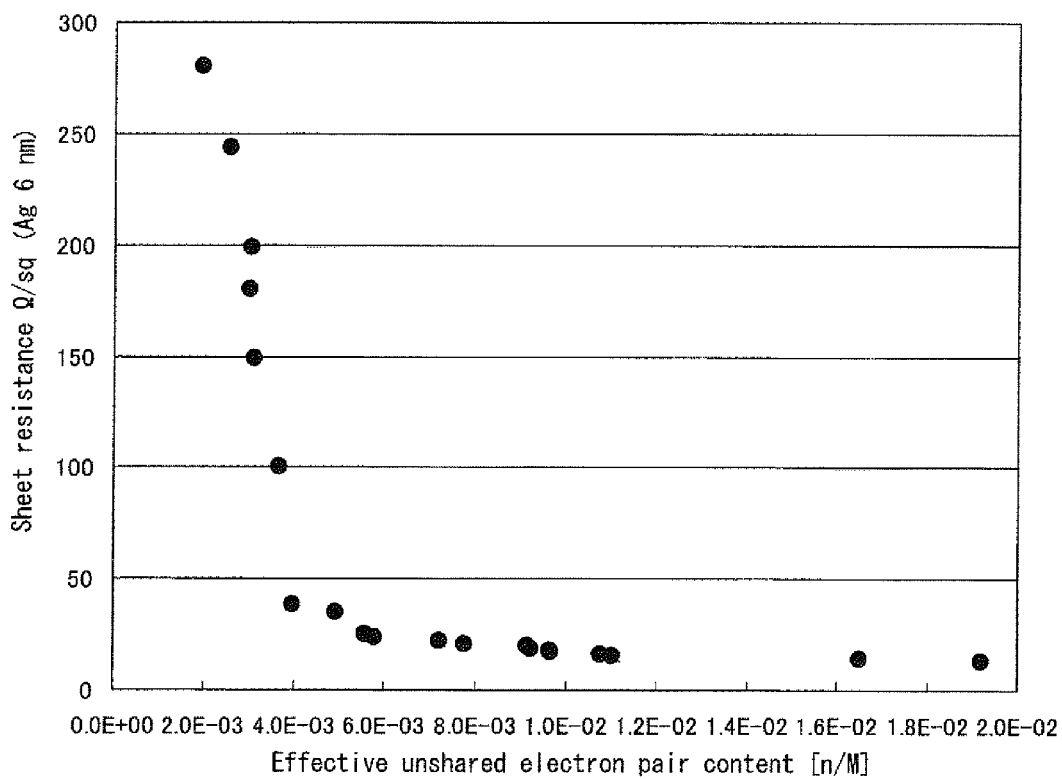
FIG. 8 is a graph illustrating the relation between the effective unshared electron pair content [n/M] of the nitrogen-containing layer constituting the transparent electrode made in Example 1 and the sheet resistance.

Furthermore, FIG. 8 shows a graph in which, as to the transparent electrodes of Samples 108 to 125, 132, 133 provided with the electrode layer having a film thickness of 6 nm was formed in the upper portion of the nitrogen-containing layer using Compound Nos. 1 to 20 having the effective unshared electron pair content [n/M] of 2.0×10-3≤ [n/M]≤1.9×10-2, the relationship between the effective unshared electron pair content [n/M] of the compound constituting the nitrogen-containing layer and the sheet resistance value measured in terms of each of the transparent electrodes are plotted.

From the graph of FIG. 8, there is observed a tendency of the fact that in the case where the effective unshared electron pair content [n/M] was within the range of 2.0×10-3≤[n/M] ≤1.9×10-2, when the value of the effective unshared electron pair content [n/M] became large, the sheet resistance of the transparent electrode became low. In addition, it has been confirmed that, with the effective unshared electron pair content [n/M]=3.9×10-3 [n/M] as a boundary, if the content was within the range of 3.9×10-3≤[n/M], the effect of drastically lowering the sheet resistance was able to be obtained.

The above results were able to be obtained in the same way as in Samples 132 to 133 in which the nitrogen-containing layer was formed by the coating method. Furthermore, the same results were obtained also in Samples 130 and 131 in which the nitrogen-containing layer was constituted by mixing a nitrogen-containing compound with other compound.

From the above results, it has been confirmed that, the low resistive electrode layer (namely the transparent electrode) while having a thin film thickness in order to obtain a light transmission property was able to be obtained by selecting and using the compound constituting the nitrogen-containing layer provided adjacent to the electrode layer by referring the effective unshared electron pair content [n/M] as an index.

<<Production of Top Emission Type Organic Electroluminescent Element>>

As Sample 201 to 219, the top emission type organic electroluminescent elements in which the respective transparent electrodes each having a configuration produced in EXAMPLE 1 was provided as a cathode in the upper portion of the light emitting functional layer. The production procedures will be explained by referring FIG. 9. Meanwhile, in the following Table 3, the configurations of the transparent electrodes used for the organic electroluminescent elements of Samples 201 to 219 are shown.

<Production Procedures of Organic Electroluminescent Elements of Samples 201 to 219>

(Counter Electrode 5-1: Formation of Anode)

First, a counter electrode 5-1 constituted of aluminum and having a film thickness of 100 nm by the sputtering method was patterned as an anode (positive electrode), in the upper part of the transparent substrate 13 formed of an alkali free glass.

The substrate 13 in which the counter electrode 5-1 was formed was fixed onto a substrate holder of a commercial vacuum evaporator, a vapor deposition mask was disposed on the formation surface side of the counter electrode 5-1, and then attached to the first vacuum tank of the vacuum evaporator. In addition, each of the heating boats in the vacuum evaporator was charged with each of the materials constituting the light emitting functional layer 3 and the transparent electrode 1 at an optimum amount for forming each layer, and then was attached to the first vacuum tank. Meanwhile, the heating boat used was formed of a resistive heating material of tungsten.

Next, a pressure in the first vacuum tank of the vacuum evaporator was reduced to 4×10-4 Pa, the respective layers were formed as follows through heating each of the heating boats that contained the respective material by applying an electric current.

(Formation of Positive Hole Transport-Injection Layer 31)

First, the heating boat in which α-NPD represented by the following structural formula was placed as a positive hole transport injection material was heated by applying an electric current, and thus the positive hole transport-injection layer constituted of α-NPD and combining the positive hole injection layer with the positive hole transport layer was formed on the counter electrode 5-1. At this time, the deposition rate was 0.1 nm/sec to 0.2 nm/sec, and a film thickness was 20 nm.

[Chem. 85]

α-NPD

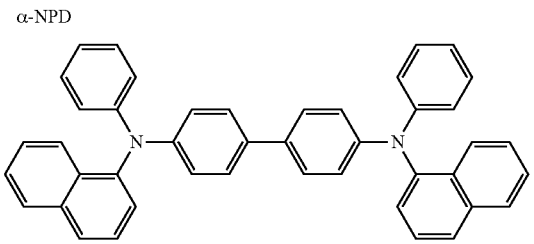

(Formation of Light Emitting Layer 32)

Next, the heating boat in which the host material H4 previously represented by the structural formula was placed and the heating boat in which the phosphorescence emitting compound Ir-4 previously represented by the structural formula was placed were independently heated by applying an electric current, and the light emitting layer 32 constituted of the host material H4 and the phosphorescence emitting compound Ir-4 were formed on the positive hole transport-injection layer 31. At that time, the current to be applied was controlled so that the deposition rate of the host material H4: the phosphorescence emitting compound Ir-4=100:6 holds. The film thickness was set to be 30 nm.

(Formation of Positive Hole Blocking Layer 33)

Next, the heating boat in which BAlq represented by the following structural formula was placed as a positive hole block material was heated by applying an electric current, and thus the positive hole blocking layer 33 constituted of BAlq was formed on the light emitting layer 32. At this time, the deposition rate was set to be 0.1 nm/sec to 0.2 nm/sec, and a film thickness was set to be 10 nm.

[Chem. 86]

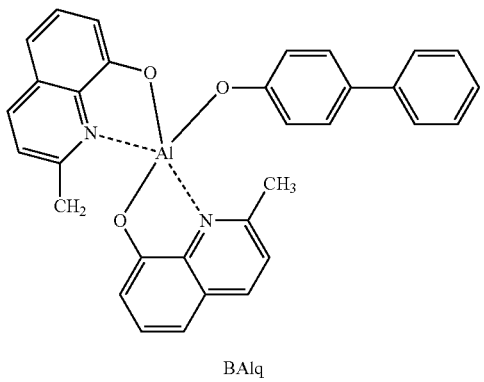

BAlq (Formation of Electron Transport-Injection Layer 34)

After that, the heating boat in which Compound 10 represented by the structural formula before as the electron transport material was placed and the heating boat in which potassium fluoride was placed were independently heated by applying an electric current, and thus the electron transport-injection layer 34 constituted of Compound 10 and the potassium fluoride, and combining electron transport layer with the electron injection layer was formed on the positive hole blocking layer 33. At that time, the current to be applied was controlled so that the deposition rate of Compound 10: the potassium fluoride=75:25 holds. In addition, the film thickness was set to be 30 nm. Compound 10 is also Compound No. 7 which has the effective unshared electron pair content [n/M] within the predetermined range.

(Formation of Nitrogen-Containing Layer 1a of Transparent Electrode 1)

After that, in Samples 201 to 219, the heating boat in which each of the compounds was placed was heated by applying an electric current, and thus each of the nitrogen-containing layers 1a constituted of each of the compounds (in Sample 201, an under coat layer without nitrogen atom) was formed on the electron transport-injection layer 34. At this time, the deposition rate was set to be 0.1 nm/sec to 0.2 nm/sec, and a film thickness was set to be 25 nm.

(Electrode Layer 1b of Transparent Electrode 1: Formation of Cathode)

Consequently, the substrate 13 on which the nitrogen-containing layer 1a (under coat layer) was formed was transferred to the second vacuum tank of the vacuum evaporator in a vacuum atmosphere, and after reduction in a pressure of the second vacuum tank to 4×10-4 Pa, the heating boat which was attached to the second vacuum tank and in which silver was placed was heated by applying an electric current. Therefore, each of transparent electrodes 1 of Samples 201 to 219 having a laminated structure of each of the nitrogen-containing layers 1a and the electrode layer 1b was obtained by the formation of an electrode layer 1b constituted of silver having a film thickness of 5 nm or 8 nm at a deposition rate of 0.3 nm/sec. The electrode layer 1b was used as a cathode. According to the above, the organic electroluminescent element EL-1 of the top emission type was produced on the substrate 13.

(Sealing of Element)

After that, the organic electroluminescent element EL-1 was covered by a transparent sealing material 17 formed of a glass substrate having a thickness of 300 μm, and an adhesive (sealing material) was filled in the space between the transparent sealing material 17 and the substrate 13. An epoxy-based photocurable adhesive (Lackstrack LC0629B manufactured by TOAGOSEI) was used as the adhesive 19. By UV light irradiation from the glass substrate (transparent sealing material 17) side to the adhesive 19 which was filled in the space between the transparent sealing material 17 and the substrate 13, the organic electroluminescent element EL-1 was sealed by curing the adhesive 19.

Meanwhile, in the formation of the organic electroluminescent element EL-1, by using a vapor deposition mask for forming each layer, 4.5 cm×4.5 cm in the center of the substrate 13 of 5 cm×5 cm was set as a light emitting region A, and a non-light emitting region B was provided around the whole peripheral of the light emitting region A with a width of 0.25 cm. Furthermore, the counter electrode 5-1 and the electrode layer 1b of the transparent electrode 1 of a cathode were formed in a state of being insulated by the positive hole transport-injection layer 31 to the nitrogen-containing layer (under coat layer) 1a, and in the form of pulling out the terminal portion to the peripheral of the substrate 13.

As described above, each of the light emitting panels of the organic electroluminescent element of Samples 201 to 219 was obtained by providing the organic electroluminescent element EL-1 on the substrate 13, and sealing with the transparent sealing material 17 and the adhesive 19. In the respective light emitting panel, the emitted light h of each color generated in the light emitting layer 32 was extracted from the transparent sealing material 17 side.

<Evaluation of Each Sample of EXAMPLE 2>

With respect to the organic electroluminescent element EL-1 (light emitting panel) produced in Samples 201 to 219, a driving voltage, a luminance unevenness and a color rendering property were measured. The results are shown in the following Table 3 together.

In the measurement of the driving voltage, a voltage in which a front luminance at the transparent electrode 1 side (namely, the transparent sealing material 17 side) of the organic electroluminescent element EL-1 is 1000 cd/m2 is the driving voltage. The smaller the obtained voltage is, the better the result is.

In the measurement of the luminance unevenness, by applying a current of 2.5 mA/cm2 to the organic electroluminescent element EL-1, a luminance of the center (center luminance) on the light emitting surface of the transparent electrode 1 side (namely the transparent sealing material 17 side) and a luminance at the edge (edge luminance) near the current supplying point pf the transparent electrode 1 side were measured. The aforementioned spectral emission luminance meter CS-1000 (manufactured by CONIKA MINOLTA SENCING) was used. The center luminance to the edge luminance as measured is calculated as the luminance unevenness. Therefore, the luminance unevenness represents uniformity of light emitting luminance in the light emitting surface, and the more close to 100% the luminance unevenness is, the better the obtained results are.

In the measurement of the color rendering property, a value when using a spectral emission luminance meter CS-2000 (manufactured by CONIKA MINOLTA SENCING), and applying a current of 2.5 mA/cm2 to the organic electroluminescent element EL-1 was measured. The color rendering property indicates that the more close to 100 the obtained value is, the more preferable the results are.

TABLE 3

EXAMPLE 2 (Top emission structure)

| Sample No. | Nitrogen-containing layer (under coat layer) film thickness 25 nm | | Electrode layer (Ag) Film thickness (nm) | Evaluation results | | | Note |
|---|---|---|---|---|---|---|---|
| | Compound | [n/M] | | Driving voltage (V) | Luminance unevenness (Uniformity) | Color rendering property (Ra) | |
| 201 | No. -1 (anthracene) | 0.00E+00 | 5 | >10 | <50% | <70 | Comparative |
| 202 | No. -4 | 1.20E−03 | | >10 | <50% | <70 | |
| 203 | No. 7 | 5.60E−03 | 5 | 6 | 90% | >80 | Present |
| 204 | No. 3 | 3.00E−03 | 8 | 5.5 | 96% | >80 | invention |
| 205 | No. 4 | 3.00E−03 | | 5.5 | 96% | >80 | |
| 206 | No. 5 | 3.10E−03 | | 5.5 | 96% | >80 | |
| 207 | No. 6 | 3.70E−03 | | 5.5 | 96% | >80 | |
| 208 | No. 7 | 5.60E−03 | | <5 | 97% | >83 | |
| 209 | No. 8 | 5.80E−03 | | <5 | 97% | >83 | |
| 210 | No. 9 | 7.30E−03 | | <5 | 98% | >83 | |
| 211 | No. 10 | 7.70E−03 | | <5 | 98% | >85 | |
| 212 | No. 11 | 9.30E−03 | | <5 | 98% | >85 | |
| 213 | No. 12 | 9.30E−03 | | <5 | 98% | >85 | |
| 214 | No. 13 | 9.70E−03 | | <5 | 98% | >85 | |
| 215 | No. 14 | 9.70E−03 | | <5 | 98% | >85 | |
| 216 | No. 15 | 1.10E−02 | | <5 | 98% | >85 | |
| 217 | No. 16 | 1.10E−02 | | <5 | 98% | >85 | |
| 218 | No. 17 | 1.70E−02 | | <5 | 99% | >85 | |
| 219 | No. 18 | 1.90E−02 | | <5 | 99% | >85 | |

<Evaluation Results of EXAMPLE 2>

As is clear from Table 3, it has been confirmed that the organic electroluminescent elements of Samples 203 to 219 which has the nitrogen-containing layer using Compound Nos. 3 to 18 having the effective unshared electron pair content [n/M] of $2.0 \times 10^{-3} \leq [n/M]$ gave a front luminance of 1000 cd/m2 at a low driving voltage of 10 V or less. Furthermore, it has been confirmed that the organic electroluminescent element of these Samples 203 to 219 has a value of the luminance unevenness which shows the uniformity in the light emitting surface is 90% or more, and generation of the luminance unevenness can be inhibited at a low level. It has been confirmed that the organic electroluminescent element of these Samples 203 to 219 has a color rendering property of more than 80, and is good.

To the contrary, the organic electroluminescent element of Samples 201 and 202 having the nitrogen-containing layer (under coat layer) using Compound Nos.-1, No.-4 having the effective unshared electron pair content [n/M] out of the above range has a high driving voltage of more than 10 V, and a value of the luminance unevenness of less than 50%.

According to the above results, it has been confirmed that the organic electroluminescent element using the transparent electrode having the configuration according to the present invention can achieve a high luminance light emission at a low driving voltage and stable surface emission. Furthermore, it has been confirmed that the lowering of the driving voltage for obtaining a given luminance and the improvement of light emission life can be expected.

Example 3

<<Production of Bottom Emission Type Organic Electroluminescent Element>>

As Samples 301 to 319, the bottom emission type organic electroluminescent elements in which the transparent electrode produced in EXAMPLE 1 was provided as an anode under the light emitting functional layer. The production procedures will bee explained by referring FIG. 10. In the following Table 4, the configurations of the transparent electrodes used for the organic electroluminescent elements of Samples 301 to 319 are shown.

<Production Procedures of Organic Electroluminescent Element of Samples 301 to 319>

(Formation of Nitrogen-Containing Layer 1a of Transparent Electrode 1)

First, in the production of Samples 301 to 319, the nitrogen-containing layer 1a formed of each compound (as to Sample 301, an under coat layer without a nitrogen atom) in the upper portion of the transparent substrate 13' formed of a transparent alkali free glass at a film thickness of 25 nm. These nitrogen-containing layers 1a (under coat layer) were formed in the same way as in Samples 201 to 219 of EXAMPLE 2.

(Electrode Layer 1b of Transparent Electrode 1: Formation of Anode)

Next, the electrode layer 1b formed of silver and having a film thickness of 5 nm or 8 nm was formed on the nitrogen-containing layer 1a (under coat layer) in the same way as in Samples 201 to 219 of EXAMPLE 2. This electrode layer 1b was used as an anode.

(Formation of Positive Hole Transport-Injection Layer 31 to Electron Transport-Injection Layer 34)

After that, in the same configuration as that of each Sample 201 to 219 of the prior EXAMPLE 2, the positive hole transport-injection layer 31 (film thickness 20 nm) combined with the positive hole injection layer formed of α-NPD and the positive hole transport layer, the light emitting layer 32 (film thickness 30 nm) formed of the host material H4 and the phosphorescence emitting compound Ir-4, the positive hole blocking layer 33 (film thickness 10 nm) formed of BAlq, the electron transport-injection layer 34 (film thickness 30 nm) formed of Compound 10 and potassium fluoride were formed. The respective layers were formed in the same manner as in EXAMPLE 2.

(Counter Electrode 5-2: Formation of Cathode)

After the aforementioned procedures, the transparent substrate 13' that the light emitting functional layer 3 was formed was transferred to the second vacuum tank of the vacuum evaporator, and after reducing a pressure of the second vacuum tank to 4×10-4 Pa, the heating boat in which aluminum was placed and attached in the second vacuum tank was heated by applying an electric current, and thus the counter electrode 5-2 formed of aluminum having a film thickness of 100 nm at a deposition rate of 0.3 nm/sec was formed. The counter electrode 5-2 was used as a cathode. From the above, the organic electroluminescent element EL-2 of the bottom emission type was produced on the transparent substrate 13'.

After that, the organic electroluminescent element EL-2 was sealed by a glass substrate (sealing material 17') in the same manner as in EXAMPLE 2. In the formation of the organic electroluminescent element EL-2, by using a vapor deposition mask for forming each layer, a light emitting region A of 4.5 cm×4.5 cm in the center of the substrate 13' of 5 cm×5 cm was prepared, and a non-light emitting region B was prepared around the whole peripheral of the light emitting region A with a width of 0.25 cm. Furthermore, the electrode layer 1b of the transparent electrode 1 of a cathode and the counter electrode 5-2 were formed so as to be insulated by the positive hole transport-injection layer 31 to the electron transport-injection layer 34, and so that the terminal portions were pull out to the peripheral of the substrate 13'.

According to the above procedures, each of the light emitting panels of the organic electroluminescent element of Samples 301 to 319 was obtained by providing the organic electroluminescent element EL-2 on the substrate 13', and sealing with the transparent sealing material 17' and the adhesive 19. In the instant light emitting panel, the emitted light h of each color generated in the light emitting layer 32 was extracted from the transparent substrate 13' side.

<Evaluation of Each Sample of EXAMPLE 3>

With respect to the organic electroluminescent element EL-2 (light emitting panel) produced in Samples 301 to 319, a driving voltage, a luminance unevenness and a color rendering property were measured in the same manner as in EXAMPLE 2. The results are shown in the following Table 4 together.

TABLE 4

EXAMPLE 3 (Bottom emission structure)

| Sample No. | Configuration of transparent electrode (anode: under electrode) | | Electrode layer (Ag) Film thickness (nm) | Evaluation results | | | Note |
|---|---|---|---|---|---|---|---|
| | Nitrogen-containing layer (under coat layer) film thickness 25 nm | | | Driving voltage (V) | Luminance unevenness (Uniformity) | Color rendering property (Ra) | |
| | Compound | [n/M] | | | | | |
| 301 | No. -1 (anthracene) | 0.00E+00 | 5 | >10 | <50% | <70 | Comparative |
| 302 | No. -4 | 1.20E-03 | | >10 | <50% | <70 | |
| 303 | No. 7 | 5.60E-03 | 5 | 6 | 90% | >80 | Present invention |
| 304 | No. 3 | 3.00E-03 | 8 | 5.5 | 96% | >80 | |
| 305 | No. 4 | 3.00E-03 | | 5.5 | 96% | >80 | |
| 306 | No. 5 | 3.10E-03 | | 5.5 | 96% | >80 | |
| 307 | No. 6 | 3.70E-03 | | 5.5 | 96% | >80 | |
| 308 | No. 7 | 5.60E-03 | | <5 | 97% | >83 | |
| 309 | No. 8 | 5.80E-03 | | <5 | 97% | >83 | |
| 310 | No. 9 | 7.30E-03 | | <5 | 98% | >83 | |
| 311 | No. 10 | 7.70E-03 | | <5 | 98% | >85 | |
| 312 | No. 11 | 9.30E-03 | | <5 | 98% | >85 | |
| 313 | No. 12 | 9.30E-03 | | <5 | 98% | >85 | |
| 314 | No. 13 | 9.70E-03 | | <5 | 98% | >85 | |
| 315 | No. 14 | 9.70E-03 | | <5 | 98% | >85 | |
| 316 | No. 15 | 1.10E-02 | | <5 | 98% | >85 | |
| 317 | No. 16 | 1.10E-02 | | <5 | 98% | >85 | |
| 318 | No. 17 | 1.70E-02 | | <5 | 99% | >85 | |
| 319 | No. 18 | 1.90E-02 | | <5 | 99% | >85 | |

<Evaluation Results of EXAMPLE 3>

As is clear from Table 4, it has been confirmed that the organic electroluminescent element of Samples 303 to 319 which has the nitrogen-containing layer prepared by using Compound Nos. 3 to 18 having the effective unshared electron pair content [n/M] of $2.0 \times 10^{-3} \leq [n/M]$ cloud give a front luminance of 1000 cd/m2 at a low driving voltage of 10 V or less. Furthermore, it has been confirmed that the organic electroluminescent element of these Samples 303 to 319 has a value of the luminance unevenness which shows the uniformity in the light emitting surface is 90% or more, and generation of the luminance unevenness can be inhibited at a low level. It has been confirmed that the organic electroluminescent element of these Samples 303 to 319 has a color rendering property of more than 80, and is good.

To the contrary, the organic electroluminescent element of Samples 301 and 302 which has the nitrogen-containing layer (under coat layer) prepared by using Compound Nos.-1, No.-4 having the effective unshared electron pair content [n/M] out of the above range has a high driving voltage of more than 10 V, and a value of the luminance unevenness of less than 50%.

According to the above results, it has been confirmed that the organic electroluminescent element prepared by using the transparent electrode having the configuration according to the present invention can achieve a high luminance light emission at a low driving voltage and stable surface emission. Furthermore, it has been confirmed that the lowering of the driving voltage for obtaining a given luminance and the improvement of light emission life can be expected.

Example 4

<<Production of Transparent Electrode Provided with Cap Layer, and Comparative Transparent Electrode>>

Each of transparent electrodes of Samples 401 to 434 provided with the cap layer and a comparative transparent electrode were produced so that an area of an electrical conductivity region is 5 cm×5 cm. The following Table 5 shows the configuration of each layer in the each transparent electrode of Samples 401 to 434.

<Production of Samples 401 to 407>

The transparent electrodes which were the same as those of Samples 101 to 107 of EXAMPLE 1 were produced.

<Production of Sample 408>

First, instead of the nitrogen-containing layer, an under coat layer formed of aluminum having a film thickness of 1 nm was formed on the transparent alkali-free glass substrate by the spattering method. Then on the under coat layer, the electrode layer formed of silver having a film thickness of 6 nm was formed by the evaporation method. The electrode layer deposition was carried out bay the same manner as in EXAMPLE 1. As the result, the transparent electrode having two layers of the aluminum layer (1 nm) and the electrode layer (6 nm) formed of silver was obtained.

<Production of Transparent Electrodes of Samples 409 to 412>

The transparent electrodes of Samples 409 to 412 were obtained in the same manner in Samples 103 to 125 of EXAMPLE 1 except that the compounds shown in the following Table 5 were used as the nitrogen-containing layer.

<Production of Transparent Electrodes of Samples 413 to 434>

As shown in the following Table 5, the transparent electrodes having three-layered structure of the nitrogen-containing layer, the electrode layer formed of silver (Ag), the cap layer were produced.

At that time, first, as shown in the following Table 5, the nitrogen-containing layer was formed above each substrate by using each Compound (prior No. 1 to No. 40), and furthermore the electrode layer formed of silver (Ag) was formed. The forming methods of the nitrogen-containing layer and the electrode layer were the same as the procedures of the transparent electrode formed in EXAMPLE 1.

After that, On the electrode layer, the cap layer formed of the compound shown in the following Table 5 was formed. At that time, in the case of Samples 413 to 433, the substrate in which the electrode layer was formed was transferred to another vacuum tank, and the cap layer was formed in the thus transferred vacuum tank by the evaporation method. To the contrary in Sample 434, on the electrode layer formed by the evaporation method, the cap layer was formed by the coating method. The formation of the evaporation method and the coating method were carried out in the same manner as in the formation of the nitrogen-containing layer in EXAMPLE 1.

<Evaluation of Each Sample of EXAMPLE 4>

With respect to each of the thus prepared transparent electrode of Samples 401 to 434, a storage property under high temperature and high humidity was measured, in addition to measurements of the light transmission property and the sheet resistance, as in the same evaluation in EXAMPLE 1. In the storage property under high temperature and high humidity, each transparent electrode of Samples 401 to 434 was preserved under the circumstance of high temperature and high humidity (temperature 60° C., humidity 90%) for 300 hours, and then the sheet resistance was measured. An elevating rate of resistance of the sheet resistance after the preservation to the sheet resistance before the preservation was calculated as the storage property under high temperature and high humidity. The obtained value is smaller, the result is better. The results are also shown in the following Table 5.

TABLE 5

EXAMPLE 4: Transparent electrode having cap layer

| | | Transparent electrode | | | | | |
|---|---|---|---|---|---|---|---|
| | | Nitrogen-containing layer (under coat layer) film thickness 25 nm | | | | Electrode layer (Ag) | |
| Sample No. | Substrate | Compound | Number of the effective unshared electron pair [n] | Molecular weight [M] | [n/M] | Film thickness (nm) | Cap layer Compound |
| 401 | Glass | — | | | | 6 | — |
| 402 | | — | | | | 15 | |
| 403 | | No. -1 (anthracene) | 0 | 178.23 | 0.00E+00 | 6 | |
| 404 | | No. -2 (Alq3) | 0 | 459.44 | 0.00E+00 | | |
| 405 | | No. -3 | 0 | 574.67 | 0.00E+00 | | |
| 406 | | No. -4 | 1 | 839 | 1.20E-03 | | |
| 407 | | No. -5 | 1 | 650.77 | 1.50E-03 | | |
| 408 | Glass | Al | — | — | — | 6 | — |
| 409 | Glass | No. 1 | 1 | 500.55 | 2.00E-03 | 6 | — |
| 410 | | No. 39 | 3 | 537.65 | 5.60E-03 | | |
| 411 | | No. 40 | 2 | 332.4 | 6.00E-03 | | |
| 412 | | No. 38 | 4 | 538.64 | 7.40E-03 | | |
| 413 | Glass | No. 1 | 1 | 500.55 | 2.00E-03 | 6 | No. -2 (Alq3) |
| 414 | | | 1 | 500.55 | 2.00E-03 | | No. 1 |
| 415 | | | 1 | 500.55 | 2.00E-03 | | No. 7 |

TABLE 5-continued

EXAMPLE 4: Transparent electrode having cap layer

| Sample No. | Substrate | | | | | | | Transparent electrode Cap layer | | Evaluation result | | Storage property under high temperature and high humidity (elevating rate of resistance) | Note |
|---|---|---|---|---|---|---|---|---|---|---|---|---|---|
| | | | | | | | | Film thickness [n/M] | (nm) | Permeability % (550 nm) | Sheet resistance Ω/sq | | |
| 401 | | | | | | | | — | — | 45 | Not measured | — | Comparative |
| 402 | | | | | | | | | | 25 | 5.0.E+00 | 700% | |
| 403 | | | | | | | | | | 45 | Not measured | — | |
| 404 | | | | | | | | | | 50 | Not measured | — | |
| 405 | | | | | | | | | | 46 | Not measured | — | |
| 406 | | | | | | | | | | 47 | Not measured | — | |
| 407 | | | | | | | | | | 48 | Not measured | — | |
| 408 | | | | | | | | — | — | 60 | 65 | 300% | Comparative |
| 409 | | | | | | | | — | — | 55 | 280 | 200% | Present invention |
| 410 | | | | | | | | | | 60 | 50 | 150% | |
| 411 | | | | | | | | | | 60 | 45 | 130% | |
| 412 | | | | | | | | | | 60 | 30 | 120% | |
| 413 | | | | | | | | 0.00E+00 | 3 | 60 | 270 | 110% | Present invention (with cap layer) |
| 414 | | | | | | | | 2.00E−03 | | 60 | 260 | 105% | |
| 415 | | | | | | | | 5.60E−03 | | 60 | 250 | 100% | |
| 416 | Glass | No. 4 | 2 | 655.81 | 3.00E−03 | 6 | No. 7 | 5.60E−03 | 3 | 62 | 170 | 100% | Present invention (with cap layer) |
| 417 | | No. 39 | 3 | 537.65 | 5.60E−03 | | | | | 65 | 45 | 100% | |
| 418 | | No. 40 | 2 | 332.4 | 6.00E−03 | | | | | 65 | 35 | 100% | |
| 419 | | No. 38 | 4 | 538.64 | 7.40E−03 | | | | | 65 | 20 | 100% | |
| 420 | | No. 7 | 4 | 716.83 | 5.60E−03 | | | | | >70 | 23 | 100% | |
| 421 | | No. 8 | 6 | 1036.2 | 5.80E−03 | | | | | >70 | 24 | 100% | |
| 422 | | No. 9 | 4 | 551.64 | 7.30E−03 | | | | | >70 | 20 | 100% | |
| 423 | | No. 10 | 4 | 516.6 | 7.70E−03 | | | | | >70 | 18 | 100% | |
| 424 | | No. 11 | 5 | 539.63 | 9.30E−03 | | | | | >70 | 16 | 100% | |
| 425 | | No. 12 | 6 | 646.76 | 9.30E−03 | | | | | >70 | 15 | 100% | |
| 426 | | No. 13 | 4 | 412.45 | 9.70E−03 | | | | | >70 | 15 | 100% | |
| 427 | | No. 14 | 6 | 616.71 | 9.70E−03 | | | | | >70 | 15 | 100% | |
| 428 | | No. 15 | 5 | 463.53 | 1.10E−02 | | | | | >70 | 12 | 100% | |
| 429 | | No. 18 | 6 | 312.33 | 1.90E−02 | | | | | >70 | 9 | 100% | |
| 430 | Glass | No. 7 | 4 | 716.83 | 5.60E−03 | 8 | No. 7 | 5.60E−03 | 1 | >70 | 25 | 100% | Present invention (with cap layer) |
| 431 | | No. 14 | 6 | 616.71 | 9.70E−03 | | | | | >70 | 17 | 100% | |
| 432 | PET | No. 7 | 4 | 716.83 | 5.60E−03 | 8 | No. 7 | 5.60E−03 | 3 | >70 | 8 | 100% | Present invention (with cap layer) |
| 433 | | No. 14 | 6 | 616.71 | 9.70E−03 | | | | | >70 | 7 | 100% | |
| 434 | | No. 14 (Coating) | 6 | 616.71 | 9.70E−03 | 8 | No. 7 | 5.60E−03 | 3 | >70 | 7 | 100% | Present invention (with cap layer) |

<Evaluation Results of EXAMPLE 4>

As is clear from Table 5, Samples 409 to 412, namely the transparent electrode having the nitrogen-containing layer prepared by using the compound having the effective unshared electron pair content [n/M] of 2.0×10-3 [n/M] had a high permeability and was able to measure its sheet resistance, and furthermore was excellent in the storage property under high temperature and high humidity in making a comparison among Samples 401 to 408 in which the nitrogen-containing layer was not provided. The results are the same as in EXAMPLE 1.

Furthermore, Samples 413 to 434, namely the transparent electrode of three-layered structure by providing the cap layer had a high permeability and a low sheet resistance, and furthermore was excellent in the storage property under high temperature and high humidity in making a comparison among Samples 409 to 412 in which the cap layer was not provided. By the results, the effect obtained by providing the cap layer formed of the compound having nitrogen atom has been confirmed.

Furthermore, when making a comparison among Samples 413 to 415 of the transparent electrodes in which only the compound constituting the cap layer were different from each other, it has been confirmed that, when the effective unshared electron pair content [n/M] is high, the sheet resistance is low and the storage property under high temperature and high humidity is good.

Example 5

<<Production of Organic Electroluminescent Element of Top Emission Type>>

Figure 9:
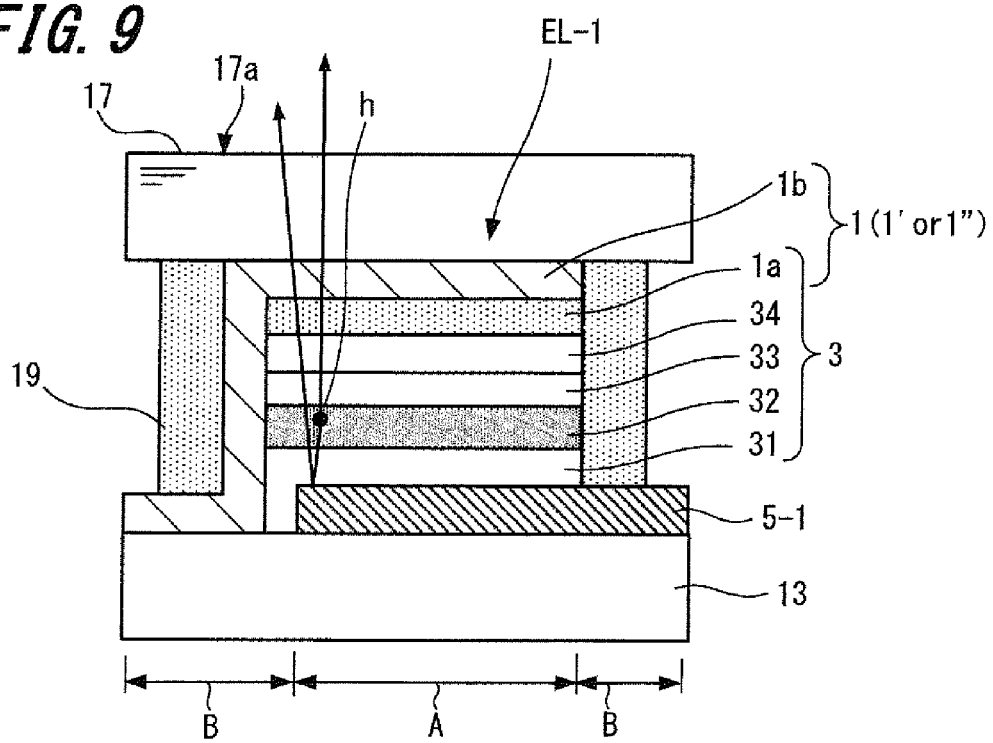
FIG. 9 is a cross-sectional configuration view for explaining the organic electroluminescent element of the top emission type fabricated in Example 2.

The organic electroluminescent element of top emission type in which each transparent electrode having the configuration of EXAMPLE 4 was provided on the light emitting functional layer as a cathode was produced as Samples 501 to 520 (see FIG. 9). However, the thickness of each layer is shown in the following Table 6. The organic electroluminescent element EL-1 of Samples 501 to 520 was produced in the same manner as in EXAMPLE 2 except for the producing procedures of the transparent electrode 1 used as the cathode. In the following Table 6, the configuration of the transparent electrode 1 used as the cathode is shown.

<Evaluation of Each Sample of EXAMPLE 5>

With respect to the organic electroluminescent element EL-1 (light emitting panel) produced in Samples 501 to 520, a driving voltage, a luminance unevenness, a color rendering property, and a storage property under high temperature and high humidity were measured.

The driving voltage, the luminance unevenness, and the color rendering property were measured according to the same manner as in EXAMPLE 2.

With respect to the storage property under high temperature and high humidity, the evaluation was carried out to 10 samples of each organic electroluminescent element EL-1 of Samples 501 to 520 in view of the number of emitted lights (n/10 samples) after preserving under the circumstance of high temperature and high humidity, and the differential of the driving voltage before and after the preservation. The circumstance of high temperature and high humidity was at a temperature of 60° C. and a humidity of 90%, and the preserving period of time was 300 hours. During the preservation, the organic electroluminescent element EL-1 was driven at a driving voltage so that a luminance was 1000 cd. The number of emitted lights (n/10 samples) is the number of samples which are confirmed the light emission after preserving for 300 hours among 10 samples of each Sample 501 to 520, and it is preferable near 10. The differential of the driving voltage is calculated as an average value of the organic electroluminescent element EL-1 which is confirmed the light emission after the preservation of Samples 501 to 520, and a smaller value is preferable.

The above results are shown in the following Table 6 together.

TABLE 6

EXAMPLE 5 (Top emission structure)

| | Configuration of transparent electrode (cathode: upper elcectrode) | | | | | | |
|---|---|---|---|---|---|---|---|
| | Nitrogen-containing layer (under coat layer) | | | Electrode layer (Ag) | Cap layer | | |
| Sample No. | Compound | [n/M] | Film thickness (nm) | Film thickness (nm) | Compound | [n/M] | Film thickness (nm) |
| 501 | No. -2 (Alq3) | 0.00E+00 | 3 | 8 | — | — | — |
| 502 | No. -4 | 1.20E−03 | | | | | |
| 503 | Al | — | 1 | | | | |
| 504 | No. 39 | 5.60E−03 | 3 | 8 | — | — | — |
| 505 | No. 1 | 2.00E−03 | 3 | 8 | No. -2 (Alq3) | 0.00E+00 | 3 |
| 506 | | 2.00E−03 | | | No. 1 | 2.00E−03 | |
| 507 | | 2.00E−03 | | | No. 7 | 5.60E−03 | |
| 508 | No. 39 | 5.60E−03 | 3 | 8 | No. 7 | 5.60E−03 | 3 |
| 509 | No. 40 | 6.00E−03 | | | | | |
| 510 | No. 38 | 7.40E−03 | | | | | |
| 511 | No. 7 | 5.60E−03 | | | | | |
| 512 | No. 8 | 5.80E−03 | | | | | |
| 513 | No. 9 | 7.30E−03 | | | | | |
| 514 | No. 10 | 7.70E−03 | | | | | |
| 515 | No. 11 | 9.30E−03 | | | | | |
| 516 | No. 12 | 9.30E−03 | | | | | |
| 517 | No. 13 | 9.70E−03 | | | | | |
| 518 | No. 14 | 9.70E−03 | | | | | |
| 519 | No. 15 | 1.10E−02 | | | | | |
| 520 | No. 18 | 1.90E−02 | | | | | |

TABLE 6-continued

EXAMPLE 5 (Top emission structure)

Evaluation results

| Sample No. | Driving voltage (V) | Luminance unevenness (uniformity) | Color rendering property (Ra) | Storage property under high temperature and high humidity | | Note |
|---|---|---|---|---|---|---|
| | | | | The number of emitted lights (n/10 samples) | Differential of driving voltage [DV] | |
| 501 | >10 | <50% | <70 | 0 | — | Comparative |
| 502 | >10 | <50% | <70 | 0 | — | |
| 503 | 6.5 | 80% | <70 | 2 | >10 | |
| 504 | 6.5 | 90% | >85 | 6 | 6 | Present invention |
| 505 | 6.5 | 95% | >80 | 10 | 2 | Present invention |
| 506 | 6.5 | 95% | >80 | 10 | 1.5 | (with cap layer) |
| 507 | 6.5 | 95% | >80 | 10 | <1 | |
| 508 | 6.5 | 95% | >85 | 10 | <1 | Present invention |
| 509 | <5 | 98% | >85 | 10 | <1 | (with cap layer) |
| 510 | <5 | 98% | >85 | 10 | <1 | |
| 511 | <5 | 98% | >85 | 10 | <1 | |
| 512 | <5 | 98% | >85 | 10 | <1 | |
| 513 | <5 | 99% | >85 | 10 | <1 | |
| 514 | <5 | 99% | >88 | 10 | <1 | |
| 515 | <5 | 99% | >88 | 10 | <1 | |
| 516 | <5 | 99% | >88 | 10 | <1 | |
| 517 | <5 | 99% | >88 | 10 | <1 | |
| 518 | <5 | 99% | >88 | 10 | <1 | |
| 519 | <5 | 99% | >88 | 10 | <1 | |
| 520 | <5 | 99% | >88 | 10 | <1 | |

<Evaluation Results of EXAMPLE 5>

As is clear from Table 6, Samples 505 to 520, namely the organic electroluminescent elements EL-1 in which the transparent electrode of three-layered structure by providing the cap layer was used as a cathode were excellent in the storage property under high temperature and high humidity in making a comparison among Samples 501 to 504 in which the cap layer was not provided. In addition, it was confirmed that the driving voltage was low, and the value of the luminance unevenness which represents uniformity in the light emitting surface was 95% or more to thereby make the generation of luminance unevenness low, and the color rendering property was more than 80, which was good.

Furthermore, when making a comparison among Samples 505 to 507 of the transparent electrodes in which only the compound constituting the cap layer were different from each other, it has been confirmed that, when the effective unshared electron pair content [n/M] of the compound is high, the differential driving voltage which is the index of the storage property under high temperature and high humidity is inhibited to a small level.

Example 6

<<Production of Organic Electroluminescent Element of Bottom Emission Type>>

Figure 10:
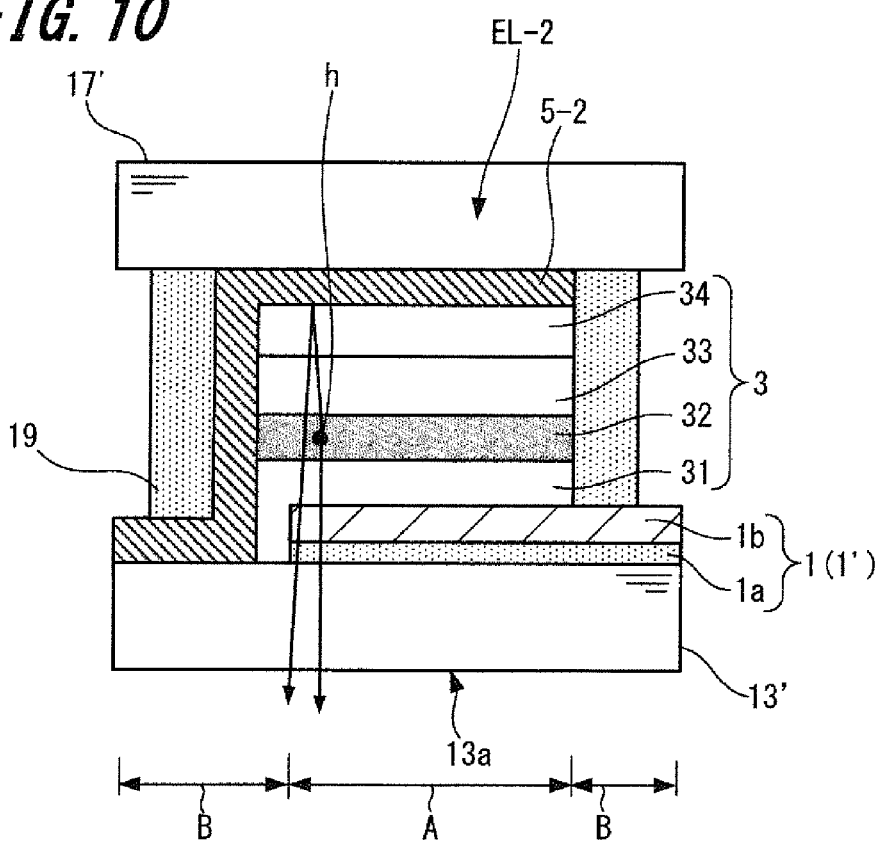
FIG. 10 is a cross-sectional configuration view for explaining the organic electroluminescent element of the bottom emission type fabricated in Example 3.

The organic electroluminescent element of top emission type in which each transparent electrode having the configuration of EXAMPLE 4 was provided under the light emitting functional layer as an anode was produced as Samples 601 to 621 (see FIG. 10). However, the thickness of each layer is shown in the following Table 7. The organic electroluminescent elements EL-2 of Samples 601 to 621 were produced in the same manner as in EXAMPLE 3 except for the producing procedures of the transparent electrode 1 used as the anode. In the following Table 7, the configuration of the transparent electrode 1 used as the anode is shown.

<Evaluation of Each Sample of EXAMPLE 6>

With respect to the organic electroluminescent element EL-2 (light emitting panel) produced in Samples 601 to 621, a driving voltage, a luminance unevenness, a color rendering property, and a storage property under high temperature and high humidity were measured in the same manner as in EXAMPLE 5. The results are shown in the following Table 7 together.

TABLE 7

EXAMPLE 6 (Bottom emission structure)

Configuration of transparent electrode (anode: under elcectrode)

| Sample No. | Nitrogen-containing layer (under coat layer) | | | Electrode layer (Ag) | Cap layer | | |
|---|---|---|---|---|---|---|---|
| | Compound | [n/M] | Film thickness (nm) | Film thickness (nm) | Compound | [n/M] | Film thickness (nm) |

TABLE 7-continued

EXAMPLE 6 (Bottom emission structure)

Configuration of transparent electrode (anode: under elcectrode)

| | | | | | | | |
|---|---|---|---|---|---|---|---|
| 601 | No. -2 (Alq3) | 0.00E+00 | 25 | 8 | — | — | — |
| 602 | No. -4 | 1.20E−03 | | | | | |
| 603 | Al | — | 1 | | | | |
| 604 | No. 39 | 5.60E−03 | 25 | 8 | — | — | — |
| 605 | No. 1 | 2.00E−03 | 25 | 8 | No. -2 (Alq3) | 0.00E+00 | 3 |
| 606 | | | | | No. 1 | 2.00E−03 | |
| 607 | | | | | No. 7 | 5.60E−03 | |
| 608 | No. 39 | 5.60E−03 | 25 | 8 | No. 7 | 2.00E−03 | 3 |
| 609 | No. 40 | 6.00E−03 | | | | | |
| 610 | No. 38 | 7.40E−03 | | | | | |
| 611 | No. 7 | 5.60E−03 | | | | | |
| 612 | No. 8 | 5.80E−03 | | | | | |
| 613 | No. 9 | 7.30E−03 | | | | | |
| 614 | No. 10 | 7.70E−03 | | | | | |
| 615 | No. 11 | 9.30E−03 | | | | | |
| 616 | No. 12 | 9.30E−03 | | | | | |
| 617 | No. 13 | 9.70E−03 | | | | | |
| 618 | No. 14 | 9.70E−03 | | | | | |
| 619 | No. 15 | 1.10E−02 | | | | | |
| 620 | No. 18 | 1.90E−02 | | | | | |
| 621 | No. 14 (coating) | 9.70E−03 | 25 | 8 | No. 7 | 2.00E−03 | 3 |

Evaluation results

| Sample No. | Driving voltage (V) | Luminance unevenness (uniformity) | Color rendering property (Ra) | Storage property under high temperature and high humidity — The number of emitted lights (n/10 samples) | Storage property under high temperature and high humidity — Differential of driving voltage [DV] | Note |
|---|---|---|---|---|---|---|
| 601 | >10 | <50% | <70 | 0 | — | Comparative |
| 602 | >10 | <50% | <70 | 0 | — | |
| 603 | 6.5 | 80% | <70 | 2 | >10 | |
| 604 | 6.5 | 90% | >85 | 6 | 6 | Present Invention |
| 605 | 6.5 | 95% | >80 | 10 | 2 | Present invention (with cap layer) |
| 606 | 6.5 | 95% | >80 | 10 | 1.5 | (with cap layer) |
| 607 | 6.5 | 95% | >80 | 10 | <1 | |
| 608 | 6.5 | 95% | >85 | 10 | <1 | Present invention (with cap layer) |
| 609 | <5 | 98% | >85 | 10 | <1 | |
| 610 | <5 | 98% | >85 | 10 | <1 | |
| 611 | <5 | 98% | >85 | 10 | <1 | |
| 612 | <5 | 98% | >85 | 10 | <1 | |
| 613 | <5 | 99% | >85 | 10 | <1 | |
| 614 | <5 | 99% | >88 | 10 | <1 | |
| 615 | <5 | 99% | >88 | 10 | <1 | |
| 616 | <5 | 99% | >88 | 10 | <1 | |
| 617 | <5 | 99% | >88 | 10 | <1 | |
| 618 | <5 | 99% | >88 | 10 | <1 | |
| 619 | <5 | 99% | >88 | 10 | <1 | |
| 620 | <5 | 99% | >88 | 10 | <1 | |
| 621 | <5 | 99% | >88 | 10 | <1 | Present invention (with cap layer) |

<Evaluation Results of EXAMPLE 6>

As is clear from Table 7, Samples 605 to 621, namely the organic electroluminescent element EL-2 in which the transparent electrode of three-layered structure by providing the cap layer was used as an anode were excellent in the storage property under high temperature and high humidity in making a comparison among Samples 601 to 604 in which the cap layer was not provided. In addition, the driving voltage was low, and the value of the luminance unevenness which represents uniformity in the light emitting surface was 95% or more to make the generation of luminance unevenness low, and the color rendering property was more than 80, which was good.

Furthermore, when making a comparison among Samples 605 to 607 of the transparent electrodes in which only the compound constituting the cap layer were different from each other, it has been confirmed that, when the effective unshared electron pair content [n/M] of the compound is high, the differential driving voltage which is the index of the storage property under high temperature and high humidity is inhibited to a small level.

Example 7

<<Production of Transparent Electrode Provided with High Refractive Layer, and Comparative Transparent Electrode>>

As the transparent electrode of Samples 701 to 735, the transparent electrodes provided with the high refractive layer, and the comparative transparent electrodes were produced so that an area of an electrical conductivity region was 5 cm×5 cm. The following Table 8 shows the configuration of each layer in the each transparent electrode of Samples 701 to 735.

<Production of Transparent Electrodes of Samples 701 and 702>

According to the same way as in Samples 101 and 102 of EXAMPLE 1, the electrode layers constituted of silver (Ag) were formed in the respective film thicknesses.

<Production of Transparent Electrode of Sample 703>

In the following way, the high refractive layer constituted of titanium oxide (TiO2) having a film thickness of 30 nm was formed on the glass substrate, and thereon the electrode layer formed of silver having a film thickness of 6 nm was formed.

First, a transparent substrate formed of an alkali free glass was fixed onto a substrate holder of a commercial electron beam evaporator, titanium oxide (TiO2) was placed in the heating boat, and then the substrate holder and the heating boat were attached to a vacuum tank of the electron beam evaporator. Silver (Ag) was placed in a tungsten resistive heating boat, which was then attached to the vacuum tank of the commercial vacuum evaporator.

Consequently, after reducing a pressure of the vacuum tank of the electron beam evaporator to 4×10-4 Pa, the heating boat in which titanium oxide (TiO2) was placed was heated by irradiation with the electron beam, and there was formed the high refractive layer constituted of titanium oxide (TiO2) having a film thickness of 30 nm at a deposition rate of 0.1 nm/sec to 0.2 nm/sec on the substrate.

Next, the substrate that the high refractive layer was formed was transferred to the vacuum tank of the vacuum evaporator in a vacuum atmosphere, and after reducing a pressure of the vacuum tank to 4×10-4 Pa, the heating boat which contained silver (Ag) was heated by applying an electric current. Thereby, the electrode layer constituted of silver (Ag) having a film thickness of 6 nm was formed at a deposition rate of 0.1 nm/sec to 0.2 nm/sec, and then the transparent electrode of Sample 703 having the laminated structure of the high refractive layer and the electrode layer in the upper portion thereof was obtained.

<Production of Transparent Electrode of Sample 704 to 728>

In the following way, the high refractive layer constituted of titanium oxide (TiO2) having a film thickness of 30 nm was formed in the upper portion of the glass substrate, and thereon the nitrogen-containing layer formed of the compound shown in the following Table 8 having a film thickness shown in the following Table 8 was formed, and the electrode layer constituted of silver having a film thickness of 6 nm was formed in the upper portion thereof. However, in Sample 704, the under coat layer without nitrogen atom was formed instead of the nitrogen-containing layer.

First, a transparent substrate formed of an alkali free glass was fixed onto a substrate holder of a commercial electron beam evaporator, titanium oxide (TiO2) was placed in the heating boat, and then the substrate holder and the heating boat were attached to a vacuum tank of the electron beam evaporator. Next, the following compound Nos. 1 to 18 shown in Table 8 was placed in the tantalum resistive heating boat, which was then attached to the first vacuum tank of the vacuum evaporator. In addition, silver (Ag) was placed in the tungsten resistive heating boat, which was then attached to the second vacuum tank of the vacuum evaporator.

On the other hand, Compounds Nos. 1 to 18 are the exemplified compounds in the prior embodiment in which the effective unshared electron pair content [n/M] is [n/M] ≥2.0×10-3. In Table 8, the number [n] of effective unshared electron pair, a molecular weight [M] and also an effective unshared electron pair content [n/M] of the compounds used are shown.

Consequently, after reducing a pressure of the vacuum tank of the electron beam evaporator to 4×10-4 Pa, the heating boat was heated by irradiation with the electron beam, and there was formed the high refractive layer constituted of titanium oxide having a film thickness of 30 nm at a deposition rate of 0.1 nm/sec to 0.2 nm/sec on the substrate.

Subsequently, the substrate that the high refractive layer was formed was transferred to the first vacuum tank of the vacuum evaporator in a vacuum atmosphere, and after reducing a pressure of the first vacuum tank to 4×10-4 Pa, the heating boat in which each compound was placed was heated by applying an electric current, and then the nitrogen-containing layer constituted of the respective compound (in Sample 704, under coat layer) having the respective film thickness (10 nm, 5 nm or 3 nm) was formed at a deposition rate of 0.1 nm/sec to 0.2 nm/sec.

Next, the substrate that the nitrogen-containing layer (under coat layer) was formed was transferred to the second vacuum tank in a vacuum atmosphere, and after reducing a pressure of the second vacuum tank to 4×10-4 Pa, the heating boat containing silver was heated by applying an electric current, and then there was obtained a transparent electrode of Samples 704 to 728 having a laminated structure of the high refractive layer, the nitrogen-containing layer (under coat layer) and the upper electrode layer in this order by formation of an electrode layer constituted of silver having a film thickness of 6 nm at a deposition rate of 0.1 nm/sec to 0.2 nm/sec.

<Production of Transparent Electrode of Samples 729 and 730>

The transparent electrodes of Samples 729 and 730 were obtained in the same procedures as in the above Samples 704 to 728, except that a film thickness of the electrode layer formed of silver was 8 nm. However, for forming the nitrogen-containing layer, Compound No. 7 was used for Sample 729, and Compound No. 14 was used for Sample 730.

<Production of Transparent Electrode of Samples 731 and 732>

The transparent electrodes of Samples 731 and 732 were obtained in the same procedures as in the above Samples 704 to 728, except that a polyethylene terephthalate (PET) was used for the substrate, and a film thickness of the electrode layer formed of silver was 8 nm. However, for forming the nitrogen-containing layer, Compound No. 7 was used for Sample 731, and Compound No. 14 was used for Sample 732.

<Production of Transparent Electrode of Samples 733 to 735>

The transparent electrodes of Samples 733 to 735 having the same configuration of Sample 729 were obtained except that the material used for the high refractive layer was the compound shown in the following Table 8, respectively.

<Evaluation of Each Sample of EXAMPLE 7>

With respect to each transparent electrode of Sample 701 to 735, the light transmission property and the sheet resistance value were measured in the same evaluation method as in EXAMPLE 1. The results are shown in the following Table 8 together.

TABLE 8

EXAMPLE 7: Transparent electrode having high refractive layer

| | | | Configuration | | | | | | | |
|---|---|---|---|---|---|---|---|---|---|---|
| | | | Nitrogen-containing layer (under coat layer) | | | | Electrode layer (Ag) | Evaluation results | | |
| Sample No. | Substrate Material | High refractive layer (film thickness 30 nm) Compound | Compound | Film thickness (nm) | The number of effective unshared electron pairs [n] | Molecular weight [M] | [n/M] | Film thickness (nm) | Light transmittance % (550 nm) | Sheet resistance Ω/sq. | Note |
| 701 | Glass | — | — | — | — | — | — | 6 | 45 | Not measured | Comparative |
| 702 | | | | | | | | 15 | 25 | 5 | |
| 703 | Glass | TiO$_2$ | — | — | — | — | — | 6 | 48 | Not measured | Comparative (with high refractive layer) |
| 704 | Glass | TiO$_2$ | No. -1 (anthracene) | 10 | 0 | 178.23 | 0.00E+00 | 6 | 45 | Not measured | |
| 705 | | | No. -2 (Alq3) | | 0 | 459.44 | 0.00E+00 | | 50 | Not measured | |
| 706 | | | No. -3 | | 0 | 574.67 | 0.00E+00 | | 46 | Not measured | |
| 707 | | | No. -4 | | 1 | 839 | 1.20E−03 | | 47 | Not measured | |
| 708 | | | No. -5 | | 1 | 650.77 | 1.50E−03 | | 48 | Not measured | |
| 709 | Glass | TiO$_2$ | No. 1 | 10 | 1 | 500.55 | 2.00E−03 | 6 | 57 | 270 | Present invention (with high refractive layer) |
| 710 | | | | 5 | | | | | 62 | 269 | |
| 711 | | | | 3 | | | | | 65 | 268 | |
| 712 | Glass | TiO$_2$ | No. 2 | 3 | 2 | 790.95 | 2.50E−03 | 6 | 65 | 246 | Present invention (with high refractive layer) |
| 713 | | | No. 3 | | 2 | 655.81 | 3.00E−03 | | 69 | 200 | |
| 714 | | | No. 4 | | 2 | 655.81 | 3.00E−03 | | 70 | 180 | |
| 715 | | | No. 5 | | 3 | 974.18 | 3.10E−03 | | 71 | 150 | |
| 716 | | | No. 6 | | 3 | 808.99 | 3.70E−03 | | 75 | 100 | |
| 717 | | | No. 7 | | 4 | 716.83 | 5.60E−03 | | >80 | 25 | |
| 718 | | | No. 8 | | 6 | 1036.19 | 5.80E−03 | | >80 | 23.8 | |
| 719 | | | No. 9 | | 4 | 551.64 | 7.30E−03 | | >80 | 22.5 | |
| 720 | | | No. 10 | | 4 | 516.6 | 7.70E−03 | | >80 | 20.2 | |
| 721 | | | No. 11 | | 5 | 539.63 | 9.30E−03 | | >80 | 19 | |
| 722 | | | No. 12 | | 6 | 646.76 | 9.30E−03 | | >80 | 19.5 | |
| 723 | | | No. 13 | | 4 | 412.45 | 9.70E−03 | | >80 | 18.7 | |
| 724 | | | No. 14 | | 6 | 616.71 | 9.70E−03 | | >80 | 18.5 | |
| 725 | | | No. 15 | | 5 | 463.53 | 1.10E−02 | | >80 | 16 | |
| 726 | | | No. 16 | | 6 | 540.62 | 1.10E−02 | | >80 | 15 | |
| 727 | | | No. 17 | | 9 | 543.58 | 1.70E−02 | | >80 | 14 | |
| 728 | | | No. 18 | | 6 | 312.33 | 1.90E−02 | | >80 | 12 | |
| 729 | Glass | TiO$_2$ | No. 7 | 3 | 4 | 716.83 | 5.60E−03 | 8 | >80 | 0.5 | Present invention (with high refractive layer) |
| 730 | | | No. 14 | | 6 | 616.71 | 9.70E−03 | | >80 | 9.8 | |
| 731 | PET | TiO$_2$ | No. 7 | 3 | 4 | 716.83 | 5.60E−03 | 8 | 17 | 15 | Present invention (with high refractive layer) |
| 732 | | | No. 14 | | 6 | 616.71 | 9.70E−03 | | 78 | 18 | |
| 733 | Glass | Nb$_2$O$_5$ | No. 7 | 3 | 4 | 716.83 | 5.60E−03 | 8 | 75 | 9.5 | Present invention (with high refractive layer) |
| 734 | | CdO | | | 4 | | | | 75 | 9.5 | |
| 735 | | ITO | | | 4 | | | | 72 | 9.4 | |

<Results of Evaluation of EXAMPLE 7>

As is clear from Table 8, with respect to the transparent electrodes of Samples 709 to 735 in which the high refractive layer was provided and the nitrogen-containing layer was constituted by using Compound Nos. 1 to 18 which have the effective unshared electron pair content [n/M] within the predetermined range of $2.0 \times 10^{-3} \leq [n/M] \leq 1.9 \times 10^{-2}$, even though the electrode layer using silver having a role of substantial electrical conductivity was a very thin film of 6 nm or 8 nm, the sheet resistance was able to be measured, and it has been confirmed that the layer was formed by a film having an almost uniform thickness through the mono-layer growth type (Frank-van der Merwe: FM type).

In contrast, with respect to the transparent electrodes of Sample 701 having mono-layer configuration which was formed only by the electrode layer, the transparent electrode of Sample 703 in which the electrode layer was formed on the high refractive layer without a nitrogen-containing layer, and the transparent electrodes of Samples 704 to 708 in which the nitrogen-containing layer (under coat layer) was constituted by using Compound Nos.-1 to -5 of 2.0×10-3> [n/M], the sheet resistance was not able to be measured, and it was not possible to use as an electrode.

In addition, it had been confirmed that the transparent electrodes of Samples 709 to 735 having the effective unshared electron pair content [n/M] within the predetermined range also had a light transmittance of 50% or more, and was not able to be used as the transparent electrode. The same results were obtained with respect to the glass substrate and the plastic materials (PET) substrate. Furthermore, with respect to the transparent electrodes of Samples 709 to 735, even though the electrode layer had a film thickness of 6 nm or 8 nm, the light transmittance was maintained at a high value of about 70%, and the lowering of the sheet resistance of the electrode layer has been confirmed due to enlargement of the film thickness from 6 nm to 8 nm, and also it has been confirmed that the improvement of the light transmittance and the improvement of the electric conductivity were achieved at the same time. Since Sample 702 which was not provided with an under coat layer such as the nitrogen-containing layer had a thick electrode layer having a film thickness of 15 nm, although the sheet resistance was low, it was not able to be used as the transparent electrode since the light transmittance was low.

From the above results, it has been confirmed that, the low resistive electrode layer (namely the transparent electrode) having a thin film thickness for obtaining a light transmission property was able to be obtained by selecting and using the compound which constitutes the nitrogen-containing layer provided adjacent to the electrode layer by referring the effective unshared electron pair content [n/M] as an index. These results are the same as in EXAMPLE 1.

Moreover, when making a comparison among Samples 709 to 728 of the example 7 and the evaluation results (see Table 2) of Samples 108 to 125 of the prior EXAMPLE 1 which have the configuration of using the similar compound as the nitrogen-containing layer, the transparent electrode having the high refractive layer of Samples 709 to 728 of the example 7 had a high light transmittance, which confirms the effect of provision of the high refractive layer.

Furthermore, with respect to the transparent electrodes of Samples 709 to 711 which were different only in the film thicknesses of the nitrogen-containing layer, it has been confirmed that when the film thickness of the nitrogen-containing layer become smaller, the light transmittance was high and the sheet resistance was low.

In addition, with respect to the transparent electrodes of Samples 729, 733 to 735 which were different only in the compound used for the high refractive layer, the refractivity of the compound is TiO2: n=2.3 to 2.4, Nb2O5: n=2.3, CdO: n=2.49, ITO n=2.1 to 2.2. Since every compound has a higher refractivity than the nitrogen-containing layer (n=1.7 to 1.8) by 0.3 or more, it has been confirmed that the light transmittance was kept 70% or more, and the sheet resistance value was kept at a low level of one digit.

The above results are the same as even in the case where the nitrogen-containing layer was formed by the coating method.

Example 8

<<Production of Bottom Emission Type Organic Electroluminescent Element>>

As Samples 801 to 827, the bottom emission type organic electroluminescent elements in which the transparent electrode produced in EXAMPLE 7 was provided under the light emitting functional layer as an anode (see FIG. 10). However, the thickness of each layer is shown in the following Table 9. The organic electroluminescent elements EL-2 of Samples 801 to 827 were produced in the same way as in EXAMPLE 3 except for the producing procedures of the transparent electrode 1 used as the anode. In the following Table 9, the configuration of the transparent electrode 1 used as the anode is shown.

<Evaluation of Each Sample of EXAMPLE 8>

With respect to the organic electroluminescent element EL-2 (light emitting panel) produced in Samples 801 to 827, the driving voltage, the color change (differential of chromaticity), and the color rendering property were measured. The results are shown in the following Table 9 together.

In the measurement of the driving voltage, a voltage in which a front luminance at the transparent electrode 1 side (namely, the transparent substrate 13' side) of the organic electroluminescent element EL-2 is 1000 cd/m2 is the driving voltage. The aforementioned spectral emission luminance meter CS-1000 (manufactured by CONIKA MINOLTA SENCING) was used. The smaller the obtained voltage is, the more preferable the result is.

Furthermore, in the measurement of the color change (differential of chromaticity), by applying a current of 2.5 mA/cm2 to the organic electroluminescent element EL-2, the chromaticity in the CIE1931 colorimetric system was measured from a position of different angle. At that time, the chromaticity at the position of 0 degree that is the normal direction against the light emitting on the transparent electrode 1 side was measured, and the chromaticities at the positions of 45 degrees from the vertical and horizontal (up and down, right and left) directions were measured. The differential of the chromaticities measured at the positions of different angles is shown in the following Table 9 as the differential of chromaticity. The differential of chromaticity indicates the viewing angle characteristic, and when the value is small, preferable results can be obtained.

In the measurement of the color rendering property, a value when using a spectral emission luminance meter CS-2000 (manufactured by CONIKA MINOLTA SENCING), and applying a current of 2.5 mA/cm2 to the organic electroluminescent element EL-1 was measured. The color rendering property indicates that the more close to 100 the obtained value is, the more preferable the results are.

TABLE 9

EXAMPLE 8 (Bottom emission structure)

Configuration of transparent electrode (Anode: Lower electrode)

| Sample No. | High refractive layer (film thickness 30 nm) Compound | Nitrogen-containing layer Compound | Film thickness | [n/M] | Electrode layer (Ag) Film thickness nm | Driving voltage (V) | Differential of the chromaticity Δxy | Color rendering property (Ra) | Note |
|---|---|---|---|---|---|---|---|---|---|
| 801 | — | — | — | — | 5 | | Not emitted | | Comparative |
| 802 | | | | | 15 | <5 | 0.15 | <70 | |
| 803 | TiO$_2$ | — | v | | 5 | | Not emitted | | Comparative (with high |
| 804 | TiO$_2$ | No. -1 (anthracene) | 10 | 0.00E+00 | 5 | | Not emitted | | refractive layer) |
| 805 | | No. -4 | 10 | 1.20E−03 | | | Not emitted | | |
| 806 | TiO$_2$ | No. 7 | 10 | 5.60E−03 | 5 | 6 | 0.12 | >85 | Present invention |
| 807 | | | 5 | | | 6 | 0.08 | <85 | (with high refractive layer) |
| 808 | | | 3 | | | 6 | 0.05 | <85 | |
| 809 | TiO2 | No. 3 | 3 | 3.00E−03 | 8 | 5.5 | 0.05 | <85 | Present invention |
| 810 | | No. 4 | | 3.00E−03 | | 5.5 | 0.05 | <88 | (with high refractive layer) |
| 811 | | No. 5 | | 3.10E−03 | | 5.5 | 0.05 | <88 | |
| 812 | | No. 6 | | 3.70E−03 | | 5.5 | 0.05 | >88 | |
| 813 | | No. 7 | | 5.60E−03 | | <5 | <0.03 | >88 | |
| 814 | | No. 8 | | 5.80E−03 | | <5 | <0.03 | >88 | |
| 815 | | No. 9 | | 7.30E−03 | | <5 | <0.03 | >88 | |
| 816 | | No. 10 | | 7.70E−03 | | <5 | <0.03 | >88 | |
| 817 | | No. 11 | | 9.30E−03 | | <5 | <0.03 | >88 | |
| 818 | | No. 12 | | 9.30E−03 | | <5 | <0.03 | >88 | |
| 819 | | No. 13 | | 9.70E−03 | | <5 | <0.03 | >88 | |
| 820 | | No. 14 | | 9.70E−03 | | <5 | <0.03 | >88 | |
| 821 | | No. 15 | | 1.10E−02 | | <5 | <0.03 | >88 | |
| 822 | | No. 16 | | 1.10E−02 | | <5 | <0.03 | >88 | |
| 823 | | No. 17 | | 1.70E−02 | | <5 | <0.03 | >88 | |
| 824 | | No. 18 | | 1.90E−02 | | <5 | <0.03 | >88 | |
| 825 | Nb$_2$O$_5$ | No. 7 | 3 | 5.60E−03 | 8 | <5 | 0.05 | >88 | Present invention |
| 826 | CdO | | | | | <5 | 0.05 | >88 | (with high refractive layer) |
| 827 | ITO | | | | | <5 | 0.07 | >88 | |

<Evaluation Results of EXAMPLE 8>

As is clear from Table 9, it has been confirmed that the organic electroluminescent elements of Samples 806 to 827 having the nitrogen-containing layer 1a using Compound Nos. 3 to 18 having the effective unshared electron pair content [n/M] of 2.0×10-3≤[n/M] gave a front luminance of 1000 cd/m2 at a low driving voltage of 6 V or less. Furthermore, it has been confirmed that the organic electroluminescent elements of these Samples 806 to 827 have a value of the color change were inhibited to 0.12 or less. It has been also confirmed that the organic electroluminescent elements of these Samples 806 to 827 have a color rendering property of more than 85, which is good.

In contrast, no light emission was not able to be obtained with respect to the organic electroluminescent element of Sample 801 having mono-layer configuration which was formed only by the electrode layer, the organic electroluminescent element of Sample 803 in which the electrode layer was formed on the high refractive layer without a nitrogen-containing layer, and the organic electroluminescent elements of Samples 804 and 805 having the nitrogen-containing layer (under coat layer) using Compound Nos.-1 to -4 having the effective unshared electron pair content [n/M] outside of the aforementioned range.

With respect to the organic electroluminescent element of Sample 802 without an under coat layer such as the nitrogen-containing layer, since the electrode layer has a film thickness of 15 nm, the organic electroluminescent element acts as an electrode due to its low sheet resistance, and thus, it has been confirmed that the light emission could be observed at a low driving voltage. However, it has been confirmed that the electrode formed of silver having a large film thickness had a large differential of chromaticity in the view angle.

Furthermore, with respect to the organic electroluminescent elements of Samples 806 to 808 which were different only in the film thicknesses of the nitrogen-containing layer, it has been confirmed that the smaller the film thickness of the nitrogen-containing layer is, smaller, the lower the color change is It has been confirmed that when the film thickness of the nitrogen-containing layer is smaller, namely when the distance between the high refractive layer and the electrode layer is smaller, the view angle dependency of chromaticity can be inhibited.

In addition, with respect to the organic electroluminescent elements of Samples 813, 825 to 827 which were different only in the compound used for the high refractive layer, as explained in the prior EXAMPLE 7, every compound has a higher refractivity than the nitrogen-containing layer by 0.3 or more. It has been confirmed that the organic electroluminescent element of these Samples was not able to be inhibited in the driving voltage and the color change at a low level.

From the above results, it has been confirmed that the organic electroluminescent element using the transparent electrode having the high refractive layer with the configuration according to the present invention can achieve a high luminance light emission at a low driving voltage and stable surface emission. Furthermore, it has been confirmed that the lowering of the driving voltage for obtaining a given luminance and the improvement of light emission life can be expected.

1 ... Transparent electrode, 1a ... Nitrogen-containing layer, 1b ... Electrode layer, 1c ... Cap layer, EL, EL-1, EL-2, EL-3, EL-4 ... Organic electroluminescent element (Electronic device), H ... High refractive layer

The invention claimed is:

1. A transparent electrode comprising:
a nitrogen-containing layer comprising a compound which contains nitrogen atoms, and whose effective unshared electron pair content [n/M] satisfies "$2.0 \times 10^{-3} \leq [n/M]$" where n is a number of unshared electron pairs that are not involved in aromaticity and that are not coordinated with a metal from among the unshared electron pairs of the nitrogen atom and M is a molecular weight, and
an electrode layer formed separately from the nitrogen-containing layer provided in contact with the nitrogen-containing layer, and having silver as a main component.

2. The transparent electrode according to claim 1, wherein the effective unshared electron pair content [n/M] of the compound satisfies $3.9 \times 10^{-3} \leq [n/M]$.

3. The transparent electrode according to claim 1, wherein, with respect to the nitrogen-containing layer, the effective unshared electron pair content [n/M] in an interface layer on the electrode side is $2.0 \times 10^{-3} \leq [n/M]$.

4. The transparent electrode according to claim 1, wherein the nitrogen-containing layer contains a compound represented by the following general formula (1):

[Chem. 1]

General formula (1)

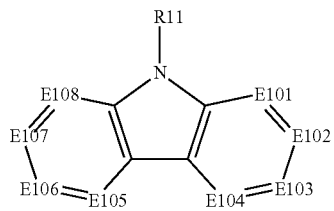

where, in the general formula (1), E101 to E108 each represent —C(R12)= or —N=; at least one of E101 to E108 is —N=;
and R11 and the aforementioned R12 represent hydrogen atom or a substituent.

5. The transparent electrode according to claim 1,
wherein the nitrogen-containing layer contains a compound represented by the following general formula (2):

[Chem. 2]

General formula (2)

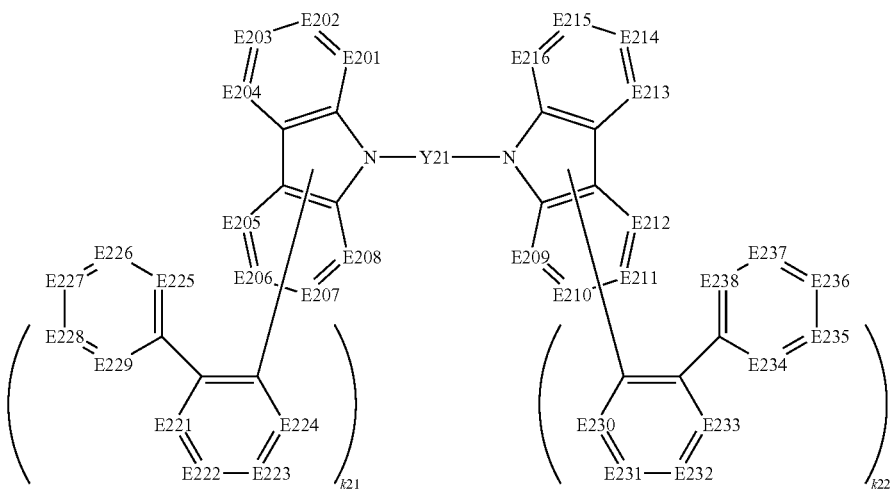

where, in the general formula (2), Y21 represents a divalent linking group of an arylene group, a heteroarylene group or combination thereof;
E201 to E216, E221 to E238 each represent —C(R21)= or —N=, and the aforementioned R21 represents hydrogen atom or a substituent;
at least one of E221 to E229 and at least one of E230 to E238 represent —N=; and
k21 and k22 represent an integer of 0 to 4, and k21+k22 is an integer of 2 or more.

6. The transparent electrode according to claim 1,
wherein the nitrogen-containing layer contains a compound represented by the following general formula (3):

[Chem. 3]

General formula (3)

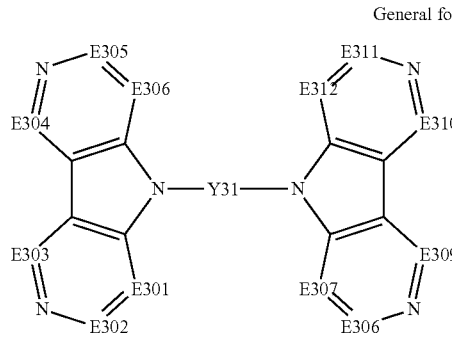

where, in the general formula (3), E301 to E312 each represent —C(R31)-, and the aforementioned R31 represents hydrogen atom or a substituent; and Y31 represents a divalent linking group of an arylene group, a heteroarylene group or combination thereof.

7. A transparent electrode comprising:

a nitrogen-containing layer that is constituted using a compound containing nitrogen atoms, and that has an effective unshared electron pair content [n/M] of $2.0 \times 10^{-3} \leq [n/M]$ when n is a number of unshared electron pairs that are not involved in aromaticity and that are not coordinated with a metal from among the unshared electron pairs of the nitrogen atom and M is a molecular weight, and an electrode layer provided adjacent to the nitrogen-containing layer, and having silver as a main component, wherein the nitrogen-containing layer contains a compound represented by the following general formula (4):

[Chem. 4]

General formula (4)

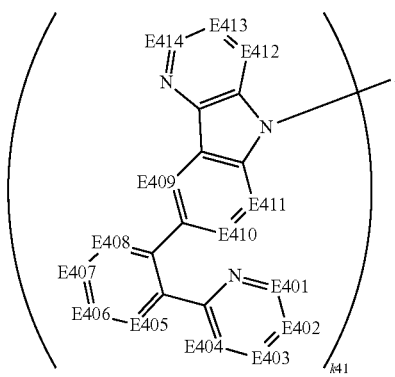

where, in the general formula (4), E401 to E414 each represent —C(R41), and the aforementioned R41 represents hydrogen atom or a substituent;

Ar41 represents a substituted or un-substituted aromatic hydrocarbon ring or aromatic heterocyclic ring; and k41 represents an integer of 3 or more.

8. A transparent electrode comprising:

a nitrogen-containing layer that is constituted using a compound containing nitrogen atoms, and that has an effective unshared electron pair content [n/M] of $2.0 \times 10^{-3} \leq [n/M]$ when n is a number of unshared electron pairs that are not involved in aromaticity and that are not coordinated with a metal from among the unshared electron pairs of the nitrogen atom and M is a molecular weight, and an electrode layer provided adjacent to the nitrogen-containing layer, and having silver as a main component, wherein the nitrogen-containing layer contains a compound represented by the following general formula (5):

[Chem. 5]

General formula (5)

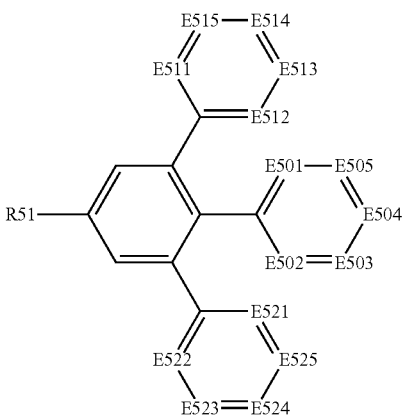

where, in the general formula (5),

R51 represents a substituent,

E501, E502, E511 to E515, E521 to E525 each represent —C(R52)= or —N=,

E503 to E505 each represent —C(R52)=, the aforementioned R52 represents hydrogen atom (H) or a substituent, at least one of E501 and E502 is —N=, at least one of E511 to E515 is —N=, and at least one of E521 to E525 is —N=.

9. A transparent electrode comprising:

a nitrogen-containing layer that is constituted using a compound containing nitrogen atoms, and that has an effective unshared electron pair content [n/M] of $2.0 \times 10^{-3} \leq [n/M]$ when n is a number of unshared electron pairs that are not involved in aromaticity and that are not coordinated with a metal from among the unshared electron pairs of the nitrogen atom and M is a molecular weight, and an electrode layer provided adjacent to the nitrogen-containing layer, and having silver as a main component, wherein the nitrogen-containing layer contains a compound represented by the following general formula (6):

[Chem. 6]

General formula (6)

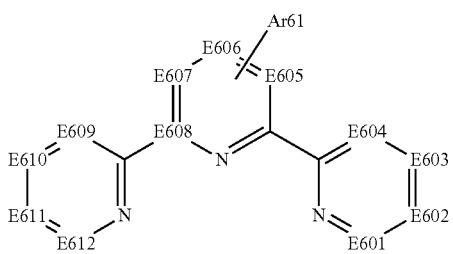

where, in the general formula (6), E601 to E612 each represent —C(R61)= or —N=, R61 represents hydrogen atom or a substituent; and Ar61 represents a substituted or un-substituted aromatic hydrocarbon ring or aromatic heterocyclic ring.

10. A transparent electrode comprising:
a nitrogen-containing layer that is constituted using a compound containing nitrogen atoms, and that has an effective unshared electron pair content [n/M] of $2.0\times10^{-3} \leq$[n/M] when n is a number of unshared electron pairs that are not involved in aromaticity and that are not coordinated with a metal from among the unshared electron pairs of the nitrogen atom and M is a molecular weight, and
an electrode layer provided adjacent to the nitrogen-containing layer, and having silver as a main component,
wherein the transparent electrode further comprises
a cap layer that holds the electrode layer between the nitrogen-containing layer and the cap layer, and that is constituted using a compound containing nitrogen atoms.

11. The transparent electrode according to claim 10,
wherein the cap layer is constituted using a compound having the effective unshared electron pair content [n/M] of $2.0\times10^{-3} \leq$[n/M].

12. The transparent electrode according to claim 10, wherein the cap layer is constituted using a compound having the effective unshared electron pair content [n/M] of $3.9\times10^{-3} \leq$[n/M].

13. The transparent electrode according to claim 10,
wherein, with respect to the cap layer, the effective unshared electron pair content [n/M] in an interface layer on the electrode side is $2.0\times10^{-3} \leq$[n/M].

14. A transparent electrode comprising:
a nitrogen-containing layer that is constituted using a compound containing nitrogen atoms, and that has an effective unshared electron pair content [n/M] of $2.0\times10^{-3} \leq$[n/M] when n is a number of unshared electron pairs that are not involved in aromaticity and that are not coordinated with a metal from among the unshared electron pairs of the nitrogen atom and M is a molecular weight, and
an electrode layer provided adjacent to the nitrogen-containing layer, and having silver as a main component,
wherein the transparent electrode further comprises
a high refractive layer that is provided by holding the nitrogen-containing layer between the electrode layer and the high refractive layer, and that has a refractive index higher than the refractive index of the nitrogen-containing layer.

15. The transparent electrode according to claim 14,
wherein the high refractive layer is constituted of titanium oxide or niobium oxide.

16. An electronic device comprising the transparent electrode according to claim 1.

17. The electronic device according to claim 16,
wherein the electronic device is an organic electroluminescent element.

18. An organic electroluminescent element, comprising:
the transparent electrode according to claim 1,
a light emitting functional layer that is provided in a state of holding the electrode layer between the nitrogen-containing layer and the light emitting functional layer, and
a counter electrode which is provided in a state of holding the light emitting functional layer between the transparent electrode and the counter electrode.

19. An organic electroluminescent element, comprising:
the transparent electrode according to claim 1,
a light emitting functional layer which is provided in a state of holding the nitrogen-containing layer between the electrode layer and the light emitting functional layer, and
a counter electrode which is provided in a state of holding the light emitting functional layer between the transparent electrode and the counter electrode.

20. A transparent electrode comprising:
a nitrogen-containing layer comprising a compound which contains nitrogen atoms, and whose effective unshared electron pair content [n/M] satisfies "$3.9\times10-3 \leq$[n/M]" where n is a number of unshared electron pairs that are not involved in aromaticity and that are not coordinated with a metal from among the unshared electron pairs of the nitrogen atom and M is a molecular weight, and
an electrode layer provided adjacent to the nitrogen-containing layer, and having silver as a main component.

* * * * *